US008426866B2

(12) United States Patent
Kimura et al.

(10) Patent No.: US 8,426,866 B2
(45) Date of Patent: Apr. 23, 2013

(54) DISPLAY DEVICE AND DRIVING METHOD THEREOF, SEMICONDUCTOR DEVICE, AND ELECTRONIC APPARATUS

(75) Inventors: Hajime Kimura, Atsugi (JP); Takuya Kimishima, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1157 days.

(21) Appl. No.: 11/667,194

(22) PCT Filed: Nov. 28, 2005

(86) PCT No.: PCT/JP2005/022228
§ 371 (c)(1),
(2), (4) Date: May 7, 2007

(87) PCT Pub. No.: WO2006/059737
PCT Pub. Date: Jun. 8, 2006

(65) Prior Publication Data
US 2009/0051674 A1 Feb. 26, 2009

(30) Foreign Application Priority Data
Nov. 30, 2004 (JP) ................................ 2004-347502

(51) Int. Cl.
*G06F 3/038* (2006.01)
(52) U.S. Cl.
USPC ............. 257/72; 257/59; 257/296; 257/369; 257/E27.016; 257/E27.062; 345/204

(58) Field of Classification Search .............. 257/59, 257/72
See application file for complete search history.

(56) References Cited

U.S. PATENT DOCUMENTS

| | | | |
|---|---|---|---|
| 6,753,834 B2 | 6/2004 | Mikami et al. | |
| 6,876,345 B2 | 4/2005 | Akimoto et al. | |
| 6,950,081 B2 | 9/2005 | Akimoto et al. | |
| 7,142,180 B2 | 11/2006 | Akimoto et al. | |

(Continued)

FOREIGN PATENT DOCUMENTS

| JP | 2002-297097 | 10/2002 |
|---|---|---|
| JP | 2003-005709 | 1/2003 |

(Continued)

OTHER PUBLICATIONS

International Search Report (Application No. PCT/JP2005/022228) dated Mar. 7, 2006.

(Continued)

*Primary Examiner* — Minh-Loan T Tran
*Assistant Examiner* — Fazli Erdem
(74) *Attorney, Agent, or Firm* — Eric J. Robinson; Robinson Intellectual Property Law Office, P.C.

(57) ABSTRACT

To constitute a display panel only by transistors having the same conductivity type is difficult if a p-type transistor is adopted as a driving transistor. By constituting a circuit formed in the display panel by transistors having the same conductivity type, manufacturing process can be reduced, and cost reduction can be achieved. In the invention, an n-type transistor is used as a driving transistor for driving a light emitting element, and the driving transistor and the light emitting element constitute a source follower circuit.

22 Claims, 82 Drawing Sheets

U.S. PATENT DOCUMENTS

| | | |
|---|---|---|
| 7,176,857 B2 | 2/2007 | Osame et al. |
| 7,205,713 B2 | 4/2007 | Kiguchi |
| 7,327,168 B2 | 2/2008 | Kimura |
| 7,436,376 B2 | 10/2008 | Akimoto et al. |
| 7,468,715 B2 | 12/2008 | Akimoto et al. |
| 7,564,433 B2 | 7/2009 | Hector et al. |
| 8,102,387 B2 | 1/2012 | Akimoto et al. |
| 2002/0070909 A1 | 6/2002 | Asano et al. |
| 2002/0196213 A1* | 12/2002 | Akimoto et al. ................. 345/82 |
| 2003/0067424 A1* | 4/2003 | Akimoto et al. ................. 345/55 |
| 2003/0160745 A1* | 8/2003 | Osame et al. .................... 345/82 |
| 2003/0214469 A1 | 11/2003 | Kageyama et al. |
| 2003/0214493 A1 | 11/2003 | Akimoto et al. |
| 2004/0004591 A1 | 1/2004 | Akimoto et al. |
| 2005/0007316 A1 | 1/2005 | Akimoto et al. |
| 2005/0078067 A1 | 4/2005 | Akimoto et al. |
| 2005/0140609 A1 | 6/2005 | Akimoto et al. |
| 2005/0285829 A1 | 12/2005 | Akimoto et al. |
| 2006/0077134 A1* | 4/2006 | Hector et al. ................... 345/76 |
| 2006/0082566 A1* | 4/2006 | Akimoto et al. ............. 345/204 |
| 2006/0103429 A1* | 5/2006 | Nonaka ........................... 326/88 |
| 2007/0152925 A1 | 7/2007 | Osame et al. |
| 2008/0277707 A1 | 11/2008 | Kimura |
| 2009/0033600 A1 | 2/2009 | Osame et al. |
| 2009/0102761 A1 | 4/2009 | Akimoto et al. |

FOREIGN PATENT DOCUMENTS

| | | |
|---|---|---|
| JP | 2003-122301 | 4/2003 |
| JP | 2003-150116 | 5/2003 |
| JP | 2003-255895 | 9/2003 |
| JP | 2003-330415 | 11/2003 |
| JP | 2003-330422 | 11/2003 |
| JP | 2004-117921 | 4/2004 |
| JP | 2004-325885 A | 11/2004 |
| JP | 2004-341144 | 12/2004 |
| KR | 2001-0055654 A | 7/2001 |
| KR | 2003-0030846 A | 4/2003 |
| KR | 2004-0094628 A | 11/2004 |
| WO | WO 02/27700 | 4/2002 |
| WO | WO 2004/066249 | 8/2004 |

OTHER PUBLICATIONS

Written Opinion (Application No. PCT/JP2005/022228) dated Mar. 7, 2006.

Kageyama et al., *51.1: A 2.5-inch OLED Display with a Three-TFT Pixel Circuit for Clamped Inverter Driving*, SID 04 Digest, International Symposium Digest of Technical Papers, 2004, pp. 1394-1397.

Goh, J., "P-15: A New Pixel Design for Amorphous-Silicon Backplane of Active-Matrix Organic Light-Emitting Diode Displays," SID Digest 2004, vol. XXXV, pp. 276-279.

Search Report (Application No. 05811311.9) Dated Jul. 24, 2009.

European Office Action (Application No. 05811311.9) Dated May 9, 2011.

Korean Office Action (Application No. 2007-7013918) Dated Mar. 20, 2012.

* cited by examiner

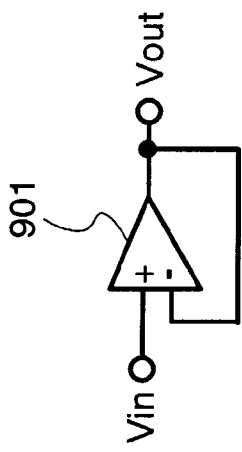
FIG. 9A
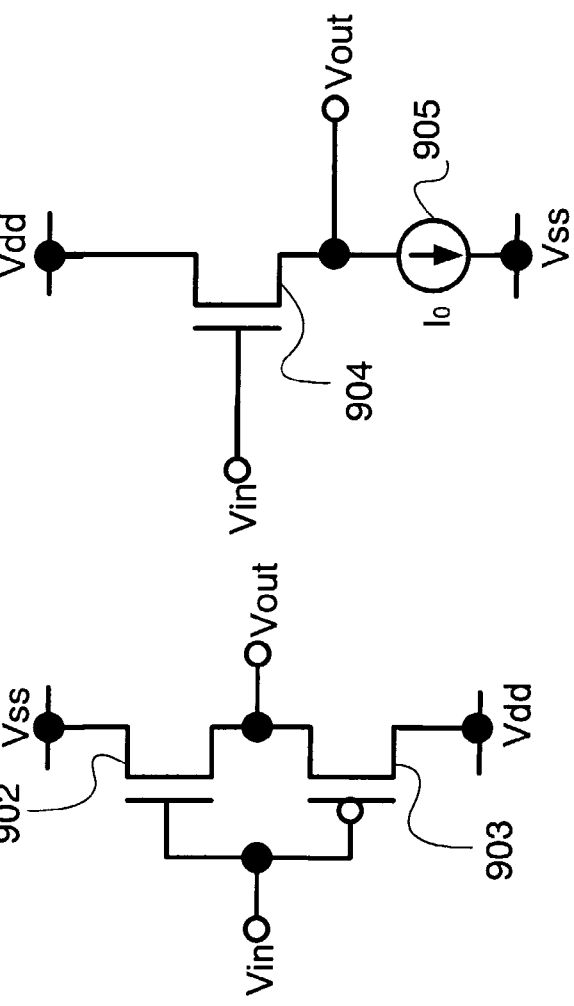
FIG. 9D
FIG. 9C
FIG. 9B

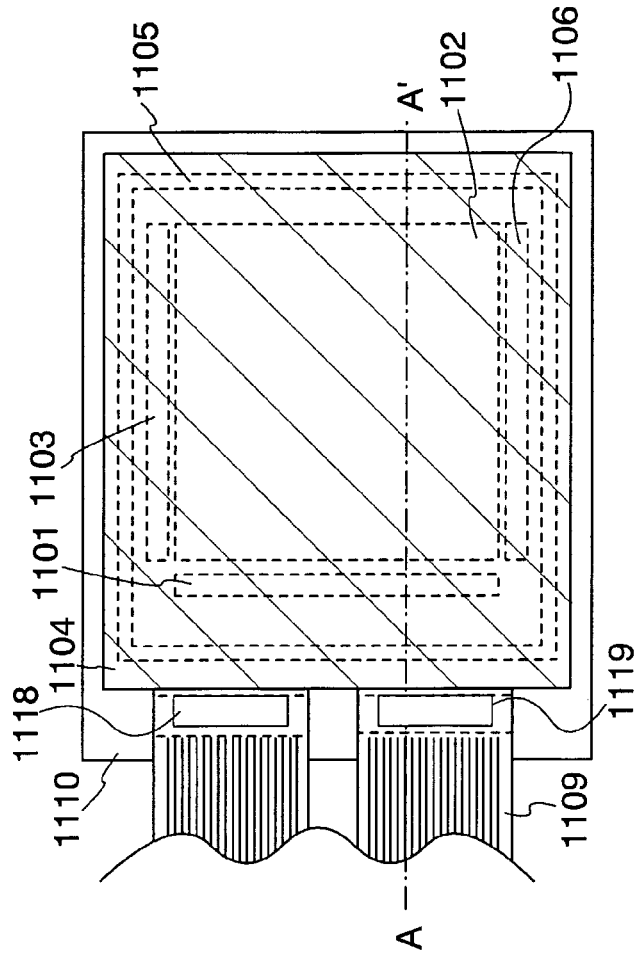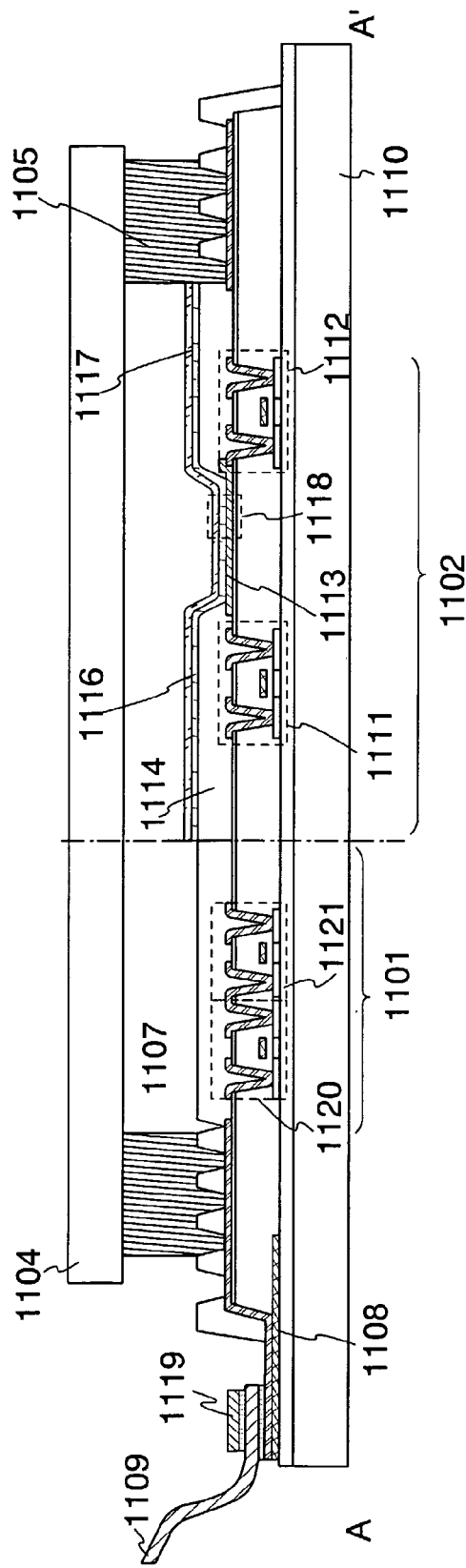
FIG. 11A
FIG. 11B

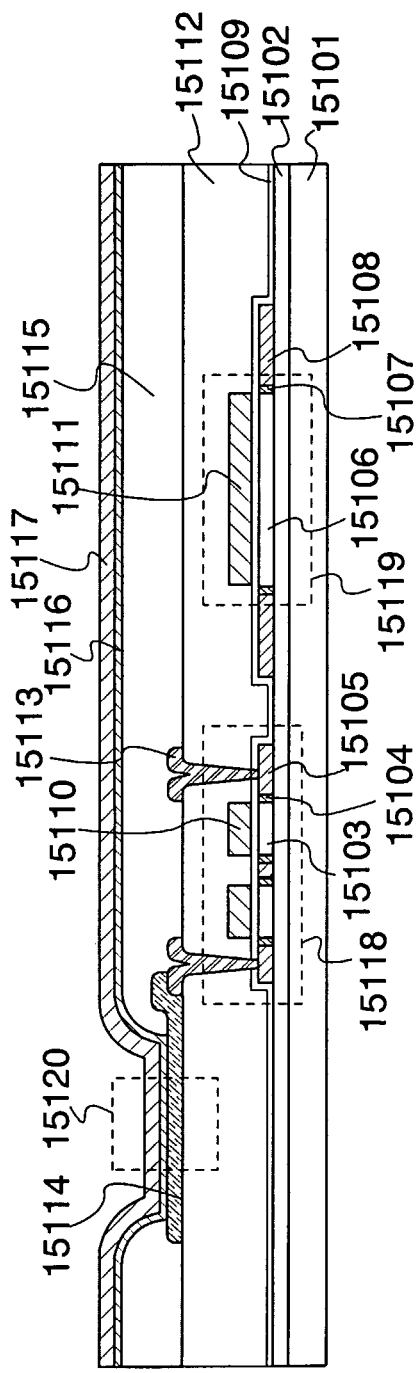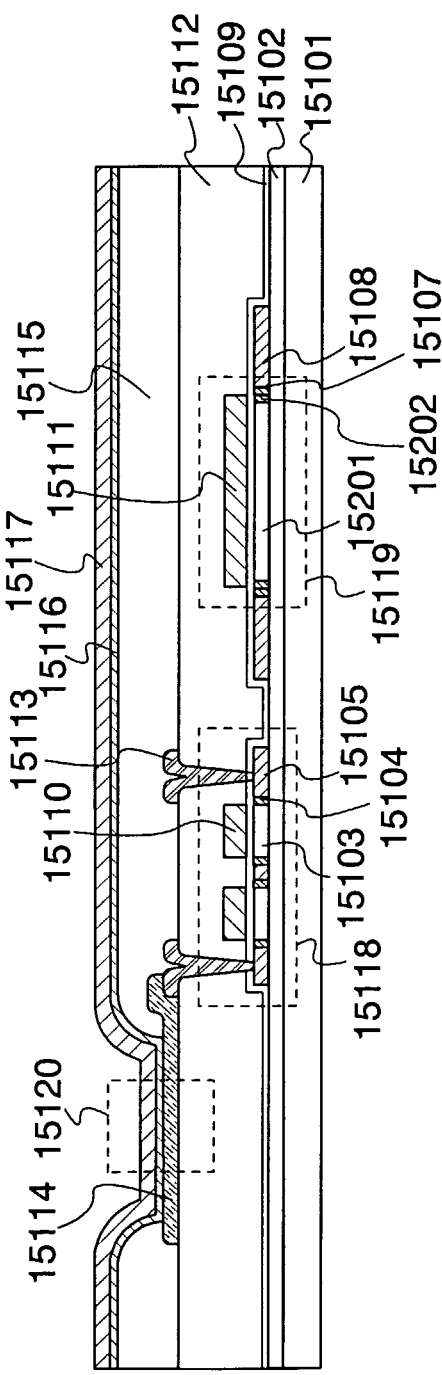

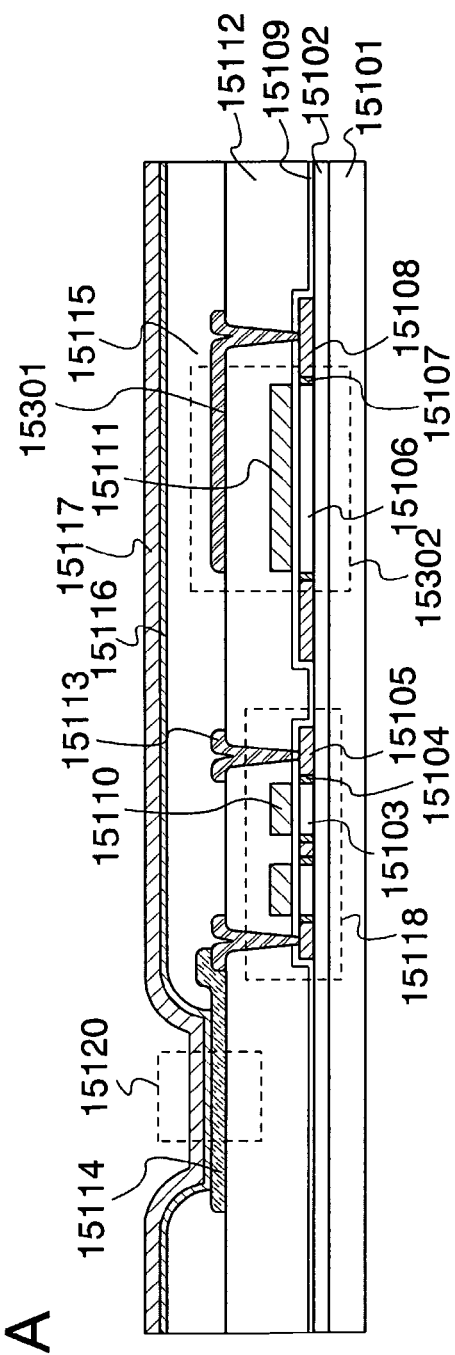

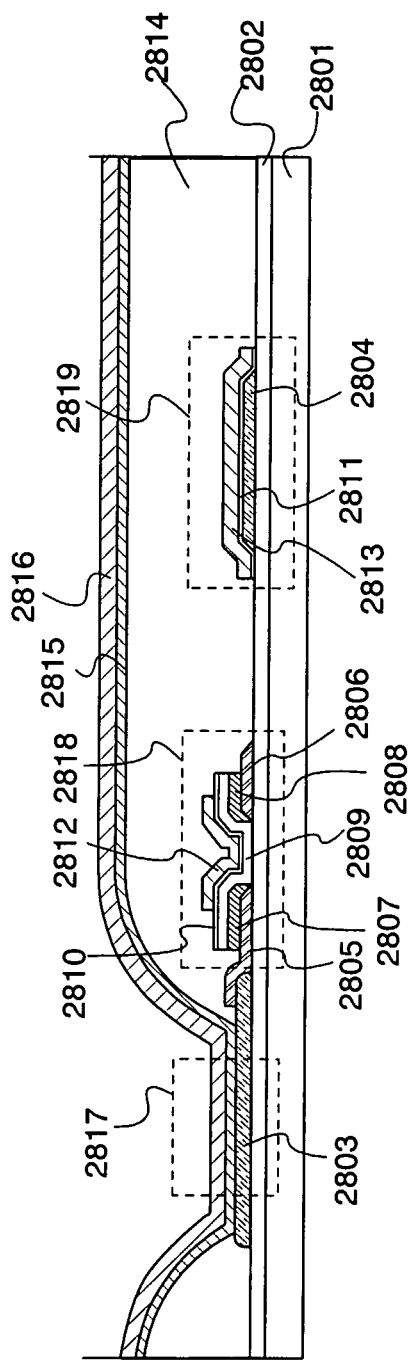
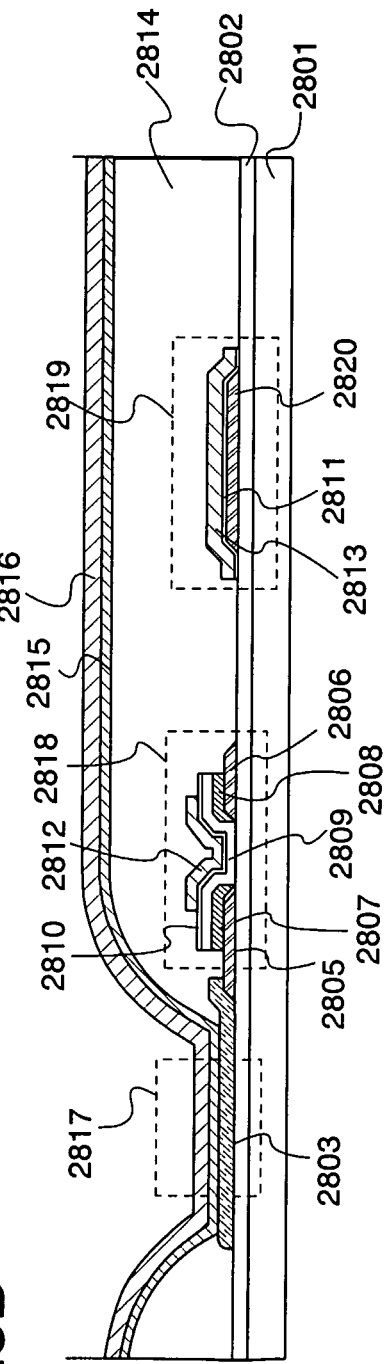
FIG. 28A
FIG. 28B

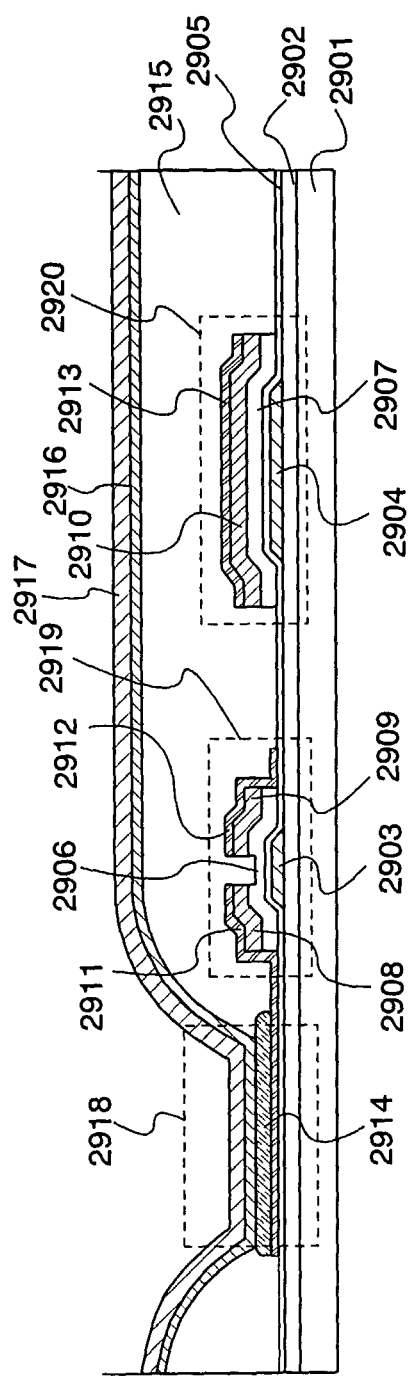
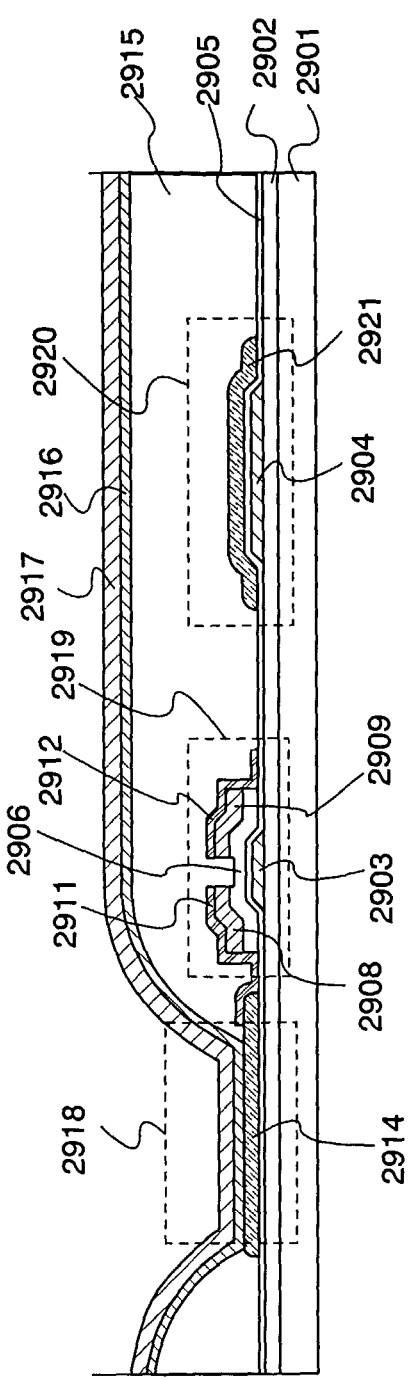
FIG. 29A
FIG. 29B

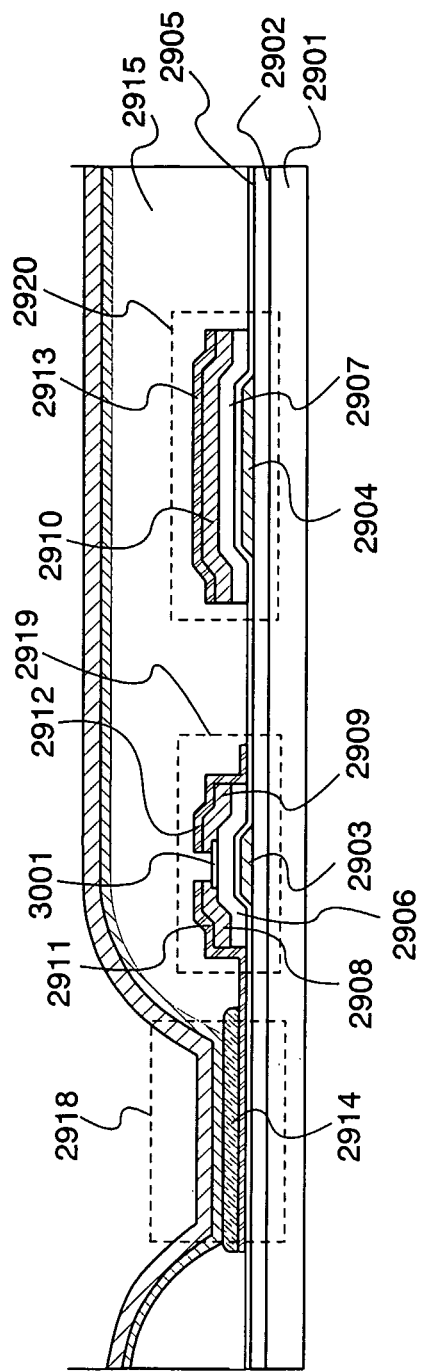
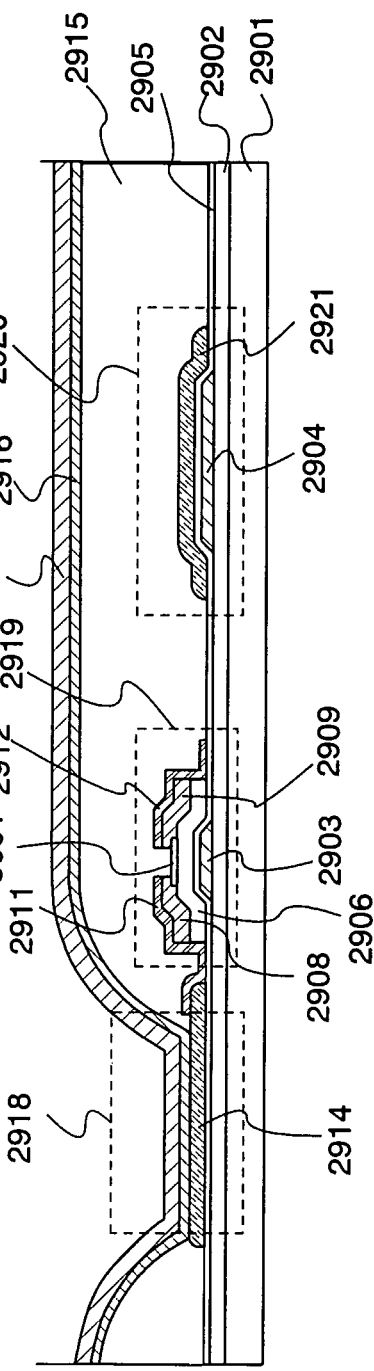
FIG. 30A
FIG. 30B

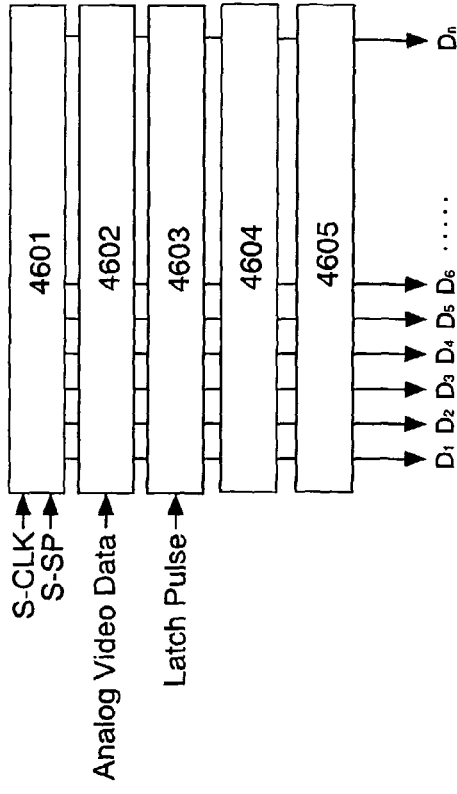
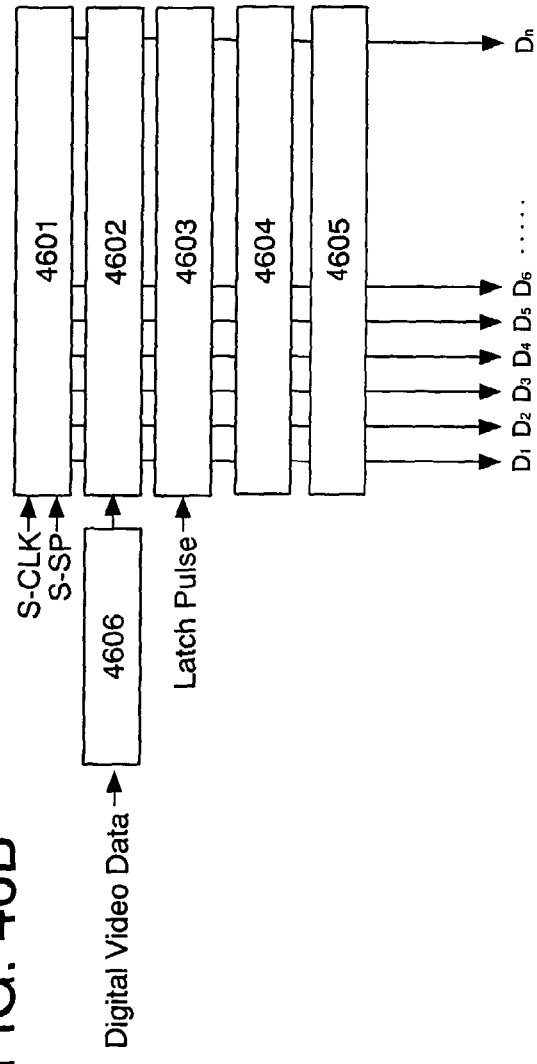
FIG. 46A
FIG. 46B

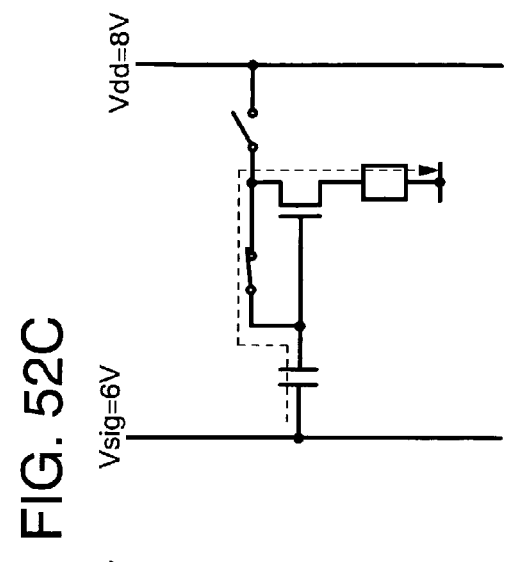
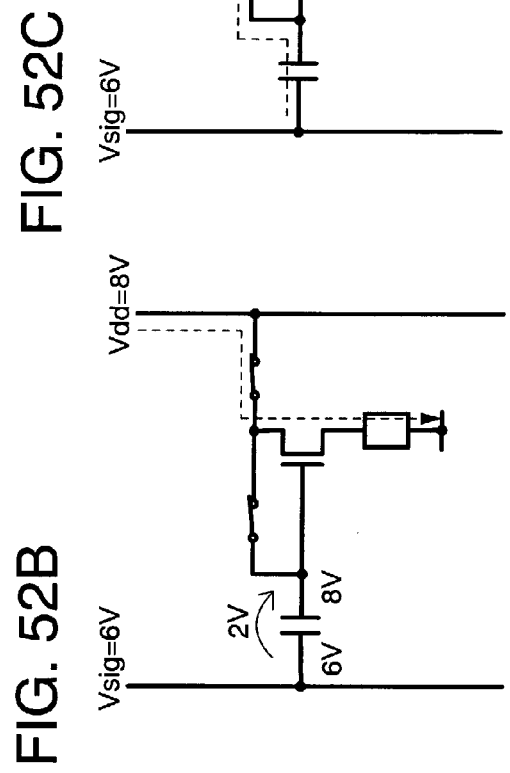
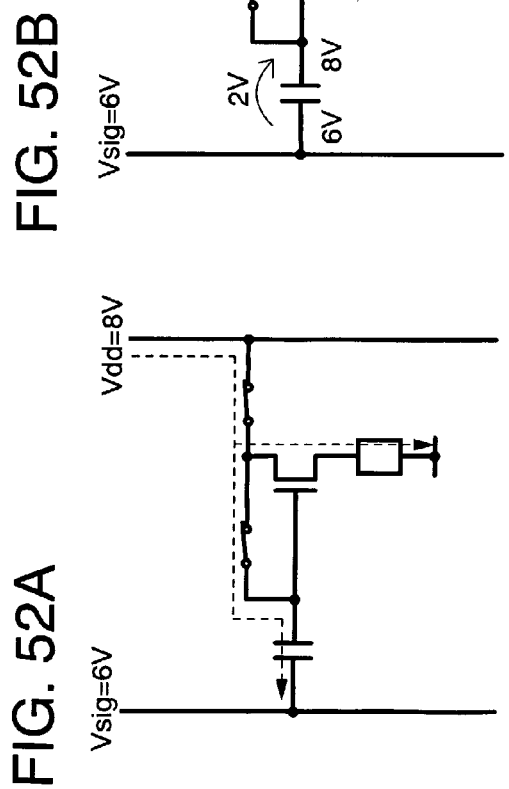
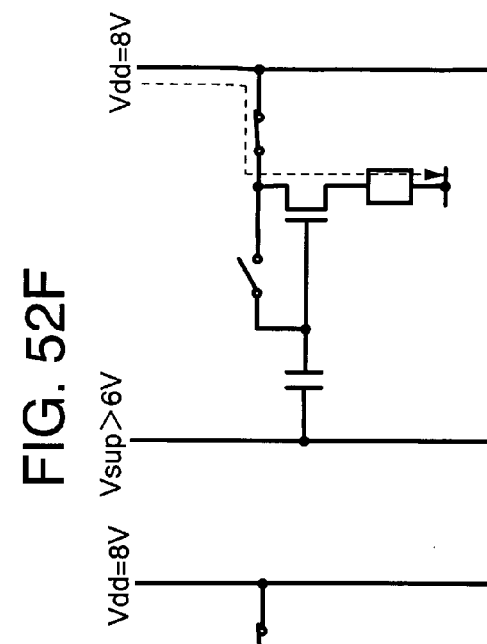
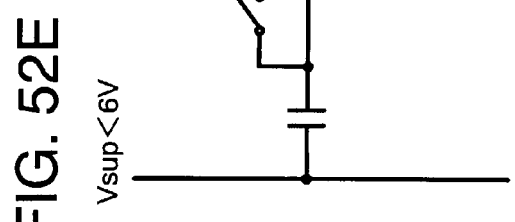
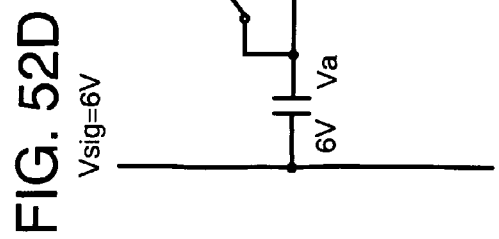

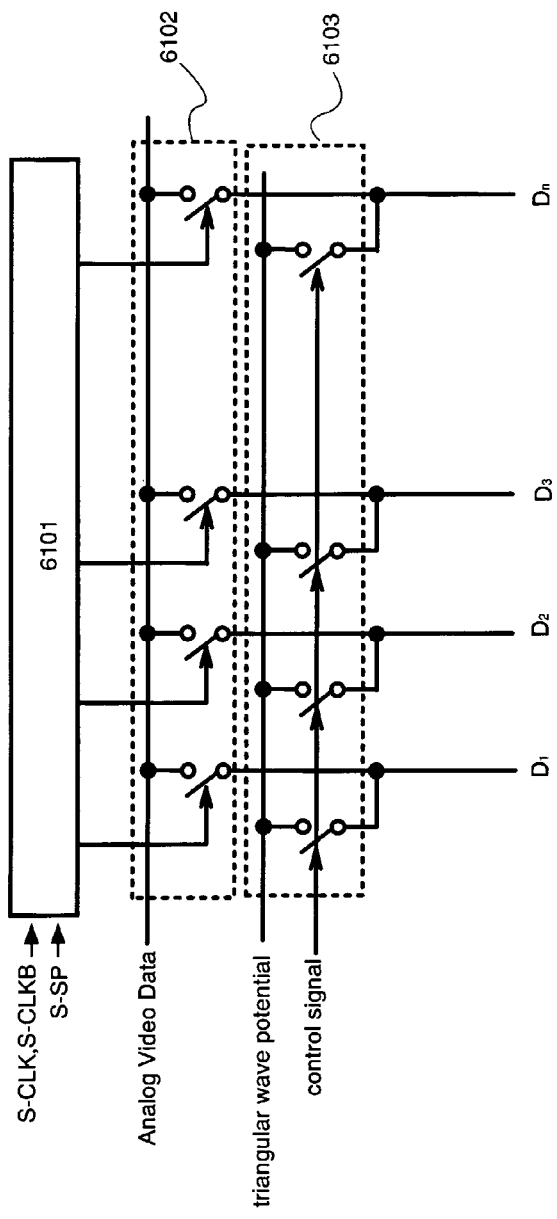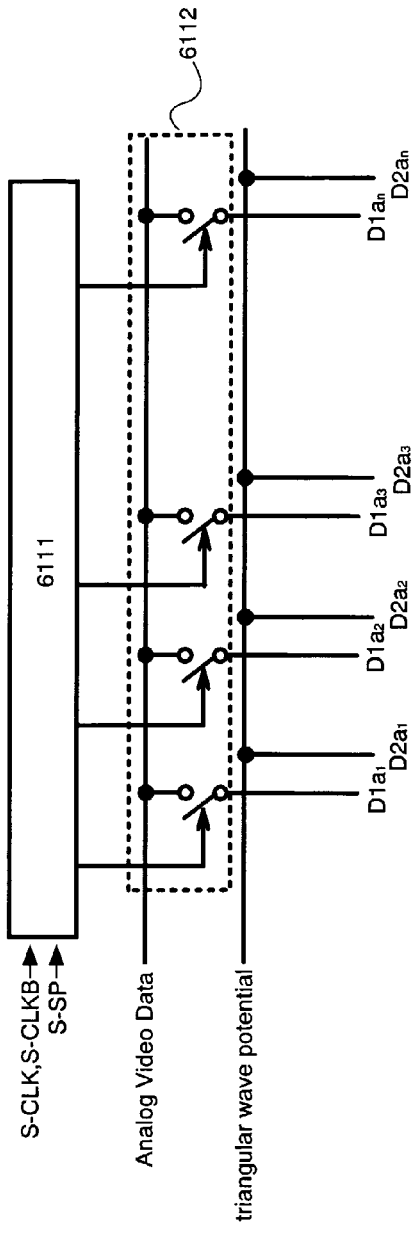

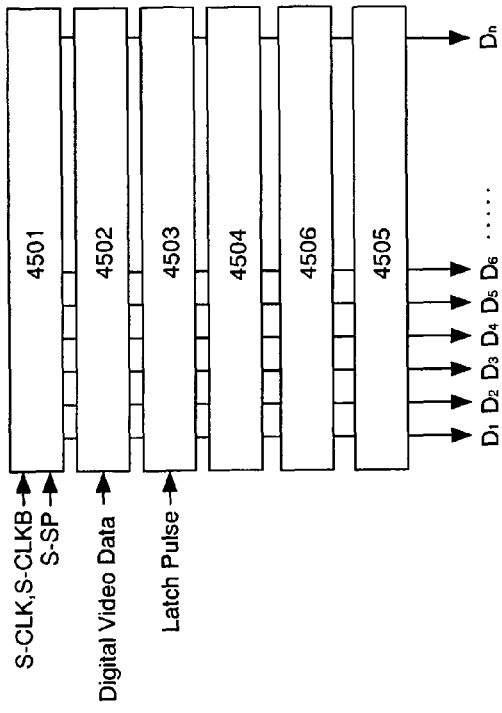
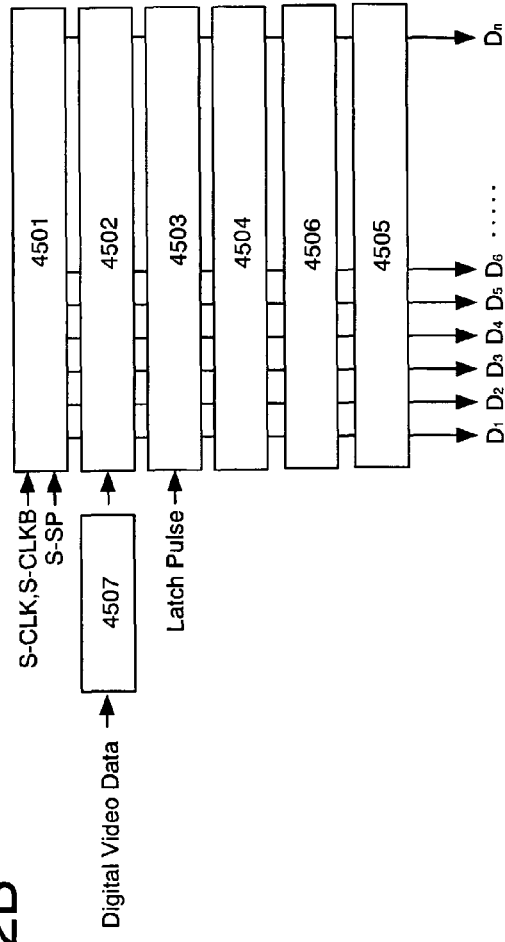
FIG. 62A
FIG. 62B

DISPLAY DEVICE AND DRIVING METHOD THEREOF, SEMICONDUCTOR DEVICE, AND ELECTRONIC APPARATUS

TECHNICAL FIELD

The present invention relates to a semiconductor device provided with a function for controlling by a transistor a current supplied to a load, and in particular relates to a display device having a pixel constituted by a current driving display element of which luminance changes by current, and a signal line driver circuit thereof. In addition, the invention relates to a driving method of the same. Furthermore, the invention relates to an electronic apparatus having a display portion applying the display device.

BACKGROUND ART

In recent years, a self-luminous type display device of which pixel is constituted by a light emitting diode (LED) or the like as a display element has attracted attention. As a display element used in such a self-luminous type display device, an organic light emitting diode (OLED which is also referred to as an organic EL element, an electroluminescence (EL) element, or the like) has attracted attention and became to be used in an organic EL display and the like. Since the display element such as an OLED is self-luminous type, the visibility of a pixel is higher as compared to a liquid crystal display, a backlight is not required and the response is fast. In addition, the luminance of the display element is controlled by a current value flowing through it.

As a driving method of controlling the light emission gradation in such a display device, there are a digital method and an analog method. In a digital method, the display element is turned on/off by digital control, and a light emitting time is controlled to express gradation; this method is advantageous in that the uniformity of luminance of each pixel is high, while the frequency is required to be increased and power consumption becomes large. On the other hand, an analog method includes a method of controlling the light emission intensity of the display element by analog control and a method of controlling a light emitting time of the display element by analog control. The method of controlling the light emission intensity by analog control is easily affected by variation of characteristics of a thin film transistor (hereinafter also referred to as a TFT) for each pixel and light emission for each pixel is also varied. Meanwhile, the analog time gradation method controls a light emitting time by analog control, so that the uniformity of luminance of each pixel is high; a display device with the analog time gradation method has been described in Non-Patent Document 1 (see Non-Patent Document 1).

Specifically, in a pixel of a display device described in Non-Patent Document 1, an inverter is constituted by a display element and a transistor for driving the display element. A gate terminal of the driving transistor corresponds to an input terminal of the inverter and an anode of the display element corresponds to an output terminal of the inverter. In the case where an image signal voltage is written into the pixel, the inverter is set to be intermediate between on and off. Then, a triangular wave voltage is inputted into the pixel in a light emitting period to control an output of the inverter. That is, by controlling an output of the inverter which is a potential supplied to the anode of the display element, whether the display element emits light or not is controlled.

[Non-Patent Document 1] SID 04 DIGEST P1394-1397

DISCLOSURE OF INVENTION

In the display device described in Non-Patent Document 1, a p-type transistor is used as a driving transistor for driving a display element.

In this case, an n-type transistor is required as a switching transistor in the pixel in many cases because a p-type transistor tends to have high off current. It is thus difficult to constitute a pixel only by p-type transistors. Therefore, if a p-type transistor is used as a driving transistor, it is difficult to constitute a display panel by transistors having the same conductivity type.

Meanwhile, demand for a display device such as an organic EL display and an FED (Field Emission Display) has been increased. However, since quite a large number of TFTs is required to be manufactured, it is difficult to reduce the manufacturing cost to be sufficiently low from the aspect of the yield and the like.

The manufacturing cost of a display device is directly affected by the number of manufacturing steps of a display panel; therefore, it is preferable to manufacture by the small number of steps as much as possible. In view of this, TFTs having the same conductivity type which is an n-channel type or a p-channel type have been tried to be used in a display panel. According to this method, an ion doping step can be partially omitted and the number of photo masks can be reduced. Consequently, cost reduction of a display device can be realized.

In view of the foregoing, it is an object of the invention to provide a semiconductor device in which a circuit constituting a pixel is included with the manufacturing cost reduced.

In addition, it is an object of the invention to provide a display device in which a pixel is included with the manufacturing cost reduced.

In addition, it is an object of the invention to provide a driving method of the display device.

In addition, it is an object of the invention to provide an electronic apparatus in which the above-described display device is included in its display portion.

In a circuit constituting a pixel, the circuit comprises a driving transistor for driving a display element, a signal line into which an analog potential is inputted, a holding means for holding a potential difference between a potential of a gate terminal of the driving transistor and a potential of the signal line, and a switching means for electrically connecting/not-connecting between a drain terminal and the gate terminal of the driving transistor, wherein an n-type transistor is used as the driving transistor.

In a circuit constituting a pixel, the circuit comprises a display element, a driving transistor for driving the display element, a signal line into which an analog potential is inputted, a holding means for holding a potential difference between a potential of a gate terminal of the driving transistor and a potential of the signal line, and a switching means for electrically connecting/not-connecting between a drain terminal and the gate terminal of the driving transistor, wherein a source follower is constituted by the driving transistor and the display element.

A semiconductor device of the invention includes a circuit constituting a pixel, the circuit comprises a driving transistor for driving a display element, a signal line into which an analog potential is inputted, a setting means for setting a gate-source voltage of the driving transistor to be a threshold voltage of the driving transistor, and a holding means for holding a potential difference between a potential inputted into the signal line and a potential of a gate terminal of the driving transistor, in which the driving transistor is an n-type transistor.

In addition, a semiconductor device of the invention includes a circuit constituting a pixel, the circuit comprises a driving transistor for driving a display element, a signal line into which an analog potential is inputted, a holding means for holding a potential difference between a potential of a gate terminal of the driving transistor and a potential of the signal line, and a switching means for making a portion between a drain terminal and the gate terminal of the driving transistor conductive/non-conductive, in which the driving transistor is an n-type transistor.

In addition, a semiconductor device of the invention includes a circuit constituting a pixel, the circuit comprises a driving transistor for driving a display element, a capacitor, a signal line into which an analog potential is inputted, and a switching means for making a portion between a drain terminal and a gate terminal of the driving transistor conductive/non-conductive, in which the driving transistor is an n-type transistor and the gate terminal of the driving transistor is connected to the signal line via the capacitor.

In addition, a semiconductor device of the invention includes a circuit constituting a pixel, the circuit comprises a driving transistor for driving a display element, a capacitor, a signal line into which an analog potential is inputted, and a switching means for making a portion between a drain terminal and the gate terminal of the driving transistor conductive/non-conductive, in which the driving transistor is an n-type transistor, the gate terminal of the driving transistor is connected to the signal line via the capacitor, and a source terminal of the driving transistor is connected to a pixel electrode which is an anode of the display element.

In addition, a semiconductor device of the invention includes a circuit constituting a pixel, the circuit comprises a driving transistor for driving a display element, a capacitor, a switch, and a signal line into which an analog potential is inputted, in which the driving transistor is an n-type transistor, a gate terminal of the driving transistor is connected to the signal line via the capacitor, and a drain terminal of the driving transistor is connected to the gate terminal via the switch.

In addition, a semiconductor device of the invention includes a circuit constituting a pixel, the circuit comprises a driving transistor for driving a display element, a capacitor, a switch, and a signal line into which an analog potential is inputted, in which the driving transistor is an n-type transistor, a gate terminal of the driving transistor is connected to the signal line via the capacitor, a source terminal of the driving transistor is connected to a pixel electrode which is an anode of the display element, and a drain terminal of the driving transistor is connected to the gate terminal via the switch.

In addition, a semiconductor device of the invention includes a circuit constituting a pixel, the circuit comprises a driving transistor for driving a display element, a capacitor, a first switch, a second switch, a signal line into which an analog potential is inputted, and a power supply line, in which the driving transistor is an n-type transistor, a gate terminal of the driving transistor is connected to the signal line via the capacitor, a first terminal of the driving transistor is connected to a pixel electrode of the display element, and a second terminal of the driving transistor is connected to the power supply line via the first switch and connected to the gate terminal via the second switch.

In addition, a semiconductor device of the invention includes a circuit constituting a pixel, the circuit comprises a driving transistor for driving a display element, a capacitor, a first switch, a second switch, a signal line into which an analog potential is inputted, and a power supply line, in which the driving transistor is an n-type transistor, a gate terminal of the driving transistor is connected to the signal line via the capacitor, a source terminal of the driving transistor is connected to a pixel electrode which is an anode of the display element, and a drain terminal of the driving transistor is connected to the power supply line via the first switch and connected to the gate terminal via the second switch.

In addition, a semiconductor device of the invention includes a circuit constituting a pixel, the circuit comprises a driving transistor for driving a display element, a capacitor, a first switch, a second switch, a third switch, a signal line into which an analog potential is inputted, a power supply line, and a wire, in which the driving transistor is an n-type transistor, a gate terminal of the driving transistor is connected to the signal line via the capacitor, a first terminal of the driving transistor is connected to a pixel electrode of the display element and connected to the wire via the third switch, and a second terminal of the driving transistor is connected to the power supply line via the first switch and connected to the gate terminal via the second switch.

In addition, a semiconductor device of the invention includes a circuit constituting a pixel, the circuit comprises a driving transistor for driving a display element, a capacitor, a first switch, a second switch, a third switch, a fourth switch, a first signal line into which an analog image signal potential is inputted, a second signal line into which an analog potential having a regular waveform is inputted, and a power supply line, in which the driving transistor is an n-type transistor, a gate terminal of the driving transistor is connected to one electrode of the capacitor, the other electrode of the capacitor is connected to the first signal line via the third switch and connected to the second signal line via the fourth switch, a first terminal of the driving transistor is connected to a pixel electrode of the display element, and a second terminal of the driving transistor is connected to the power supply line via the first switch and connected to the gate terminal via the second switch.

In addition, a semiconductor device of the invention includes a circuit constituting a pixel, the circuit comprises a driving transistor for driving a display element, a capacitor, a first switch, a second switch, a third switch, a fourth switch, a first signal line into which an analog image signal potential is inputted, a second signal line into which an analog potential having a regular waveform is inputted, and a power supply line, in which the driving transistor is an n-type transistor, a gate terminal of the driving transistor is connected to one electrode of the capacitor, the other electrode of the capacitor is connected to the first signal line via the third switch and connected to the second signal line via the fourth switch, a source terminal of the driving transistor is connected to a pixel electrode which is an anode of the display element, and a drain terminal of the driving transistor is connected to the power supply line via the first switch and connected to the gate terminal via the second switch.

In addition, a semiconductor device of the invention has the above-described configuration, in which the first switch and the second switch are n-type transistors.

In addition, a semiconductor device of the invention has the above-described configuration, in which the first switch is a p-type transistor while the second switch is an n-type transistor.

In addition, a semiconductor device of the invention has the above-described configuration, in which a potential supplied to the power supply line of the circuit constituting the pixel is different per pixel for each element of RGB.

In addition, a semiconductor device of the invention has the above-described configuration, in which the circuits each constituting the pixel have delta arrangement.

In addition, in a pixel comprising a display element and a driving transistor for driving the display element, an n-type transistor is used as the driving transistor.

In addition, a source terminal of a driving transistor is connected to an anode of a display element.

A display device of the invention includes a pixel comprising a display element, a transistor for driving the display element, a capacitor, a signal line into which an analog potential is inputted, and a switching means for making a portion between a drain terminal and a gate terminal of the driving transistor conductive/non-conductive, in which the gate terminal of the driving transistor is connected to the signal line via the capacitor, the display element and the driving transistor constitute a source follower, the gate terminal of the driving transistor is an input terminal of the source follower, and a source terminal of the driving transistor is an output terminal of the source follower.

A display device of the invention includes a pixel comprising a display element, a driving transistor for driving the display element, a signal line into which an analog potential is inputted, a setting means for setting a gate-source voltage of the driving transistor to be a threshold voltage of the driving transistor, and a holding means for holding a potential difference between a potential inputted into the signal line and a potential of a gate terminal of the driving transistor, in which the driving transistor is an n-type transistor, and a source terminal of the driving transistor is connected to an anode of the display element.

In addition, a display device of the invention includes a pixel comprising a display element, a driving transistor for driving the display element, a signal line into which an analog potential is inputted, a holding means for holding a potential difference between a potential of a gate terminal of the driving transistor and a potential of the signal line, and a switching means for making a portion between a drain terminal and the gate terminal of the driving transistor conductive/non-conductive, in which the driving transistor is an n-type transistor, and a source terminal of the driving transistor is connected to an anode of the display element.

In addition, a display device of the invention includes a pixel comprising a display element, a driving transistor for driving the display element, a capacitor, a signal line into which an analog potential is inputted, and a switching means for making a portion between a drain terminal and a gate terminal of the driving transistor conductive/non-conductive, in which the driving transistor is an n-type transistor, the gate terminal of the driving transistor is connected to the signal line via the capacitor, and a source terminal of the driving transistor is connected to an anode of the display element.

In addition, a display device of the invention includes a pixel comprising a display element, a driving transistor for driving the display element, a capacitor, a switch, and a signal line into which an analog potential is inputted, in which the driving transistor is an n-type transistor, a gate terminal of the driving transistor is connected to the signal line via the capacitor, a source terminal of the driving transistor is connected to an anode of the display element, and a drain terminal of the driving transistor is connected to the gate terminal via the switch.

In addition, a display device of the invention includes a pixel comprising a display element, a driving transistor for driving the display element, a capacitor, a first switch, a second switch, a signal line into which an analog potential is inputted, and a power supply line, in which the driving transistor is an n-type transistor, a gate terminal of the driving transistor is connected to the signal line via the capacitor, a first terminal of the driving transistor is connected to a pixel electrode of the display element, a second terminal of the driving transistor is connected to the power supply line via the first switch and connected to the gate terminal via the second switch, and a potential higher than a potential supplied to an opposing electrode of the display element is supplied to the power supply line.

In addition, a display device of the invention includes a pixel comprising a display element, a driving transistor for driving the display element, a capacitor, a first switch, a second switch, a signal line into which an analog potential is inputted, and a power supply line, in which the driving transistor is an n-type transistor, a gate terminal of the driving transistor is connected to the signal line via the capacitor, a source terminal of the driving transistor is connected to an anode of the display element, and a drain terminal of the driving transistor is connected to the power supply line via the first switch and connected to the gate terminal via the second switch.

In addition, a display device of the invention includes a pixel comprising a display element, a driving transistor for driving the display element, a capacitor, a first switch, a second switch, a third switch, a signal line into which an analog potential is inputted, a power supply line, and a wire, in which the driving transistor is an n-type transistor, a gate terminal of the driving transistor is connected to the signal line via the capacitor, a first terminal of the driving transistor is connected to a pixel electrode of the display element and connected to the wire via the third switch, and a second terminal of the driving transistor is connected to the power supply line via the first switch and connected to the gate terminal via the second switch.

In addition, a display device of the invention includes a pixel comprising a display element, a driving transistor for driving the display element, a capacitor, a first switch, a second switch, a third switch, a fourth switch, a first signal line into which an analog image signal potential is inputted, a second signal line into which an analog potential having a regular waveform is inputted, and a power supply line, in which the driving transistor is an n-type transistor, a gate terminal of the driving transistor is connected to one electrode of the capacitor, the other electrode of the capacitor is connected to the first signal line via the third switch and connected to the second signal line via the fourth switch, a first terminal of the driving transistor is connected to a pixel electrode of the display element, a second terminal of the driving transistor is connected to the power supply line via the first switch and connected to the gate terminal via the second switch, and a potential higher than a potential supplied to an opposing electrode of the display element is supplied to the power supply line.

In addition, a display device of the invention includes a pixel comprising a display element, a driving transistor for driving the display element, a capacitor, a first switch, a second switch, a third switch, a fourth switch, a first signal line into which an analog image signal potential is inputted, a second signal line into which an analog potential having a regular waveform is inputted, and a power supply line, in which the driving transistor is an n-type transistor, a gate terminal of the driving transistor is connected to one electrode of the capacitor, the other electrode of the capacitor is connected to the first signal line via the third switch and connected to the second signal line via the fourth switch, a source terminal of the driving transistor is connected to an anode of the display element, and a drain terminal of the driving transistor is connected to the power supply line via the first switch and connected to the gate terminal via the second switch.

In addition, a display device of the invention has the above-described configuration, in which the first switch and the second switch are n-type transistors.

In addition, a display device of the invention has the above-described configuration, in which the first switch is a p-type transistor while the second switch is an n-type transistor.

In addition, a display device of the invention has the above-described configuration, in which a potential supplied to the power supply line of the pixel is different per pixel for each element of RGB.

In addition, a display device of the invention includes a pixel comprising a display element, a signal line into which an analog potential is inputted, a setting means for setting a gate-source voltage of a driving transistor to be a threshold voltage of the driving transistor, a holding means for holding a potential difference between a potential inputted into the signal line and a potential of a gate terminal of the driving transistor, a first path for supplying a forward current to the display element, and a second path for supplying a reverse current to the display element, in which the driving transistor for driving the display element is provided in the first path, a controlling means for controlling current supply is provided in the second path, and the driving transistor is an n-type transistor.

In addition, a display device of the invention includes a display element, a signal line into which an analog potential is inputted, a holding means for holding a potential difference between a potential of a gate terminal of a driving transistor and a potential of the signal line, a switching means for making a portion between a drain terminal and the gate terminal of the driving transistor conductive/non-conductive, a first path for supplying a forward current to the display element, and a second path for supplying a reverse current to the display element, in which the driving transistor for driving the display element is provided in the first path, a controlling means for controlling current supply is provided in the second path, and the driving transistor is an n-type transistor.

In addition, a display device of the invention has the above-described configuration, in which the pixels have delta arrangement.

In addition, an electronic apparatus of the invention is a display, a camera, a computer, a mobile computer, an image reproducing device, a goggle-type display, a video camera, or a mobile phone in which a display device having the above-described configuration is included in its display portion.

In a driving method of a display device of the invention, the display device includes a pixel comprising a display element, a driving transistor for driving the display element, a signal line into which an analog potential is inputted, a holding means for holding a potential difference between a potential of a gate terminal of the driving transistor and a potential of the signal line, and a switching means for making a portion between a drain terminal and the gate terminal of the driving transistor conductive/non-conductive, in which the driving transistor is an n-type transistor, a source terminal of the driving transistor is connected to an anode of the display element, a signal is written into the pixel by supplying an analog signal potential to the signal line in a writing period, and the driving transistor is turned on by supplying a potential higher than the analog signal potential to the signal line in a light emitting period.

In addition, in a driving method of a display device of the invention, the display device includes a pixel comprising a display element, a driving transistor for driving the display element, a signal line into which an analog potential is inputted, a holding means for holding a potential difference between a potential of a gate terminal of the driving transistor and a potential of the signal line, and a switching means for making the portion between a drain terminal and the gate terminal of the driving transistor conductive/non-conductive, in which the driving transistor is an n-type transistor, a source terminal of the driving transistor is connected to an anode of the display element, a signal is written into the pixel by supplying an analog signal potential to the signal line and making a portion between the drain terminal and the gate terminal of the driving transistor conductive by the switching means and a potential difference between the potential of the gate terminal of the driving transistor and the potential of the signal line is held by the holding means by making the portion between the drain terminal and the gate terminal of the driving transistor non-conductive by the switching means in a writing period, and the display element is made to emit light by supplying a potential higher than the analog signal potential to the signal line and emit no light by supplying a potential lower than the analog signal potential in a light emitting period.

In addition, in a driving method of a display device of the invention, the display device includes a pixel comprising a display element, a driving transistor for driving the display element, a signal line into which an analog potential is inputted, a holding means for holding a potential difference between a potential of a gate terminal of the driving transistor and a potential of the signal line, and a switching means for making a portion between a drain terminal and the gate terminal of the driving transistor conductive/non-conductive, in which the driving transistor is an n-type transistor, a source terminal of the driving transistor is connected to an anode of the display element, a signal is written into the pixel by supplying an analog signal potential to the signal line and making the portion between the drain terminal and the gate terminal of the driving transistor conductive by the switching means and the potential difference between the potential of the gate terminal of the driving transistor and the potential of the signal line is held by the holding means by making the portion between the drain terminal and the gate terminal of the driving transistor non-conductive by the switching means in a writing period, and the display element is controlled to emit light or not by supplying a triangular wave potential to the signal line in a light emitting period.

In addition, in a driving method of a display device of the invention, the display device includes a pixel comprising a display element, a driving transistor for driving the display element, a capacitor, a switch, and a signal line into which an analog potential is inputted, in which a gate terminal of the driving transistor is connected to the signal line via the capacitor, a source terminal of the driving transistor is connected to an anode of the display element, a drain terminal of the driving transistor is connected to the gate terminal via the switch, the driving transistor is an n-type transistor, the switch is turned on when a signal is written into the pixel while turned off in a light emitting period, and the signal line supplies an analog signal potential in a period for writing a signal to the pixel while supplies a triangular wave potential in the light emitting period.

In addition, in a driving method of a display device of the invention, the display device includes a pixel comprising a display element, a driving transistor for driving the display element, a capacitor, a first switch, a second switch, a signal line into which an analog potential is inputted, and a power supply line, in which a gate terminal of the driving transistor is connected to the signal line via the capacitor, a source terminal of the driving transistor is connected to an anode of the display element, a drain terminal of the driving transistor is connected to the power supply line via the first switch and connected to the gate terminal via the second switch, the driving transistor is an n-type transistor, the second switch is turned on when a signal is written into the pixel, the first switch is turned on in a light emitting period while switched from on to off during a period in which the second switch is on in a writing period, and the signal line supplies an analog signal potential in a period for writing a signal to the pixel while supplies a triangular wave potential in the light emitting period.

In addition, in a driving method of a display device of the invention, the display device includes a pixel comprising a display element, a driving transistor for driving the display element, a capacitor, a first switch, a second switch, a third switch, a fourth switch, a first signal line into which an analog image signal potential is inputted, a second signal line into which an analog potential having a regular waveform is inputted, and a power supply line, in which a gate terminal of the driving transistor is connected to one electrode of the capacitor, the other electrode of the capacitor is connected to the first signal line via the third switch and connected to the second signal line via the fourth switch, a source terminal of the driving transistor is connected to an anode of the display element, a drain terminal of the driving transistor is connected to the power supply line via the first switch and connected to the gate terminal via the second switch, and the driving transistor is an n-type transistor, wherein the second switch and the third switch are turned on when a signal is written into the pixel, and the first switch is turned off in a part of the period in which the second switch and the third switch are on, and the fourth switch is turned on in a period in which the second switch and the third switch are not on.

In addition, in a driving method of a display device of the invention, the display device includes a pixel comprising a display element, a driving transistor for driving the display element, a capacitor, a first switch, a second switch, a third switch, a fourth switch, a first signal line into which an analog signal potential is inputted, a second signal line into which a triangular wave potential is inputted, and a power supply line, in which a gate terminal of the driving transistor is connected to one electrode of the capacitor, the other electrode of the capacitor is connected to the first signal line via the third switch and connected to the second signal line via the fourth switch, a source terminal of the driving transistor is connected to an anode of the display element, a drain terminal of the driving transistor is connected to the power supply line via the first switch and connected to the gate terminal via the second switch, the driving transistor is an n-type transistor, the second switch and the third switch are turned on when a signal is written into the pixel, the first switch is turned off in a part of the period in which the second switch and the third switch are on, and the fourth switch is turned on in a period in which the second switch and the third switch are not on.

It is to be noted in this invention that connection means electrical connection; therefore, another element or switch, or the like may be interposed in the connection.

It is to be noted that the display element is not limited; any display element can be used such as an EL element (an organic EL element, an inorganic EL element, or an EL element containing organic and inorganic matter), an element used for an FED (Field Emission Display), and an element used for an SED (Surface-conduction Electron-emitter Display) which is a kind of the FED, an LCD (Liquid Crystal Display), a PDP (Plasma Display Panel), an electronic paper display, a DMD (Digital Micromirror Device), a piezoceramic display, or the like.

In the invention, any kind of transistor can be employed such as a thin film transistor (TFT) using a non-monocrystalline semiconductor film typified by amorphous silicon and polycrystalline silicon, a MOS transistor formed by using a semiconductor substrate or an SOI substrate, a junction transistor, a bipolar transistor, a transistor using an organic semiconductor or a carbon nanotube, and other transistors. In addition, the transistor may be disposed over any kind of substrate such as a monocrystalline substrate, an SOI substrate, a glass substrate, and a plastic substrate.

In this specification, a pixel means one color element. Thus, in the case of a full-color display device having color elements R(Red) G(Green) B(Blue), one pixel means one element of elements RGB.

It is to be noted in this specification that pixels arranged in matrix means the lattice arrangement in which a perpendicular stripe and a horizontal stripe are combined with each other, and besides, means the case where respective pixels of three color elements corresponding to the minimum element for one image have delta arrangement when full color display is performed using three color elements (e.g., RGB).

In addition, in this specification, a semiconductor device means a device including a circuit comprising a semiconductor element (e.g., transistor or diode).

By using an n-type transistor as a driving transistor for driving a display element, a display panel constituted by transistors having the same conductivity type can be provided. Accordingly, a display device at low cost can be provided.

In addition, a driving method of the display device can be provided.

In addition, by applying the above-described display device in a display portion, an electronic apparatus at low cost can be provided.

BRIEF DESCRIPTION OF DRAWINGS

FIGS. 9A to 9D are diagrams each showing a buffer applicable in a display device having a pixel configuration of the invention.

FIGS. 11A and 11B are diagrams illustrating a display panel having a pixel configuration of the invention.

FIGS. 15A and 15B are partial cross sectional diagrams respectively of a display panel.

FIGS. 16A and 16B are partial cross sectional diagrams respectively of a display panel.

FIGS. 28A and 28B are partial cross sectional diagrams respectively of a display panel.

FIGS. 29A and 29B are partial cross sectional diagrams respectively of a display panel.

FIGS. 30A and 30B are partial cross sectional diagrams respectively of a display panel.

FIGS. 46A and 46B show examples of a signal line driver circuit applicable in a display device of the invention.

FIGS. 52A to 52F are diagrams illustrating operation of a pixel configuration of the invention.

FIGS. 61A and 61B show examples of a signal line driver circuit applicable in a display device of the invention.

FIGS. 62A and 62B show examples of a signal line driver circuit applicable in a display device of the invention.

BEST MODE FOR CARRYING OUT THE INVENTION

Figure 1:
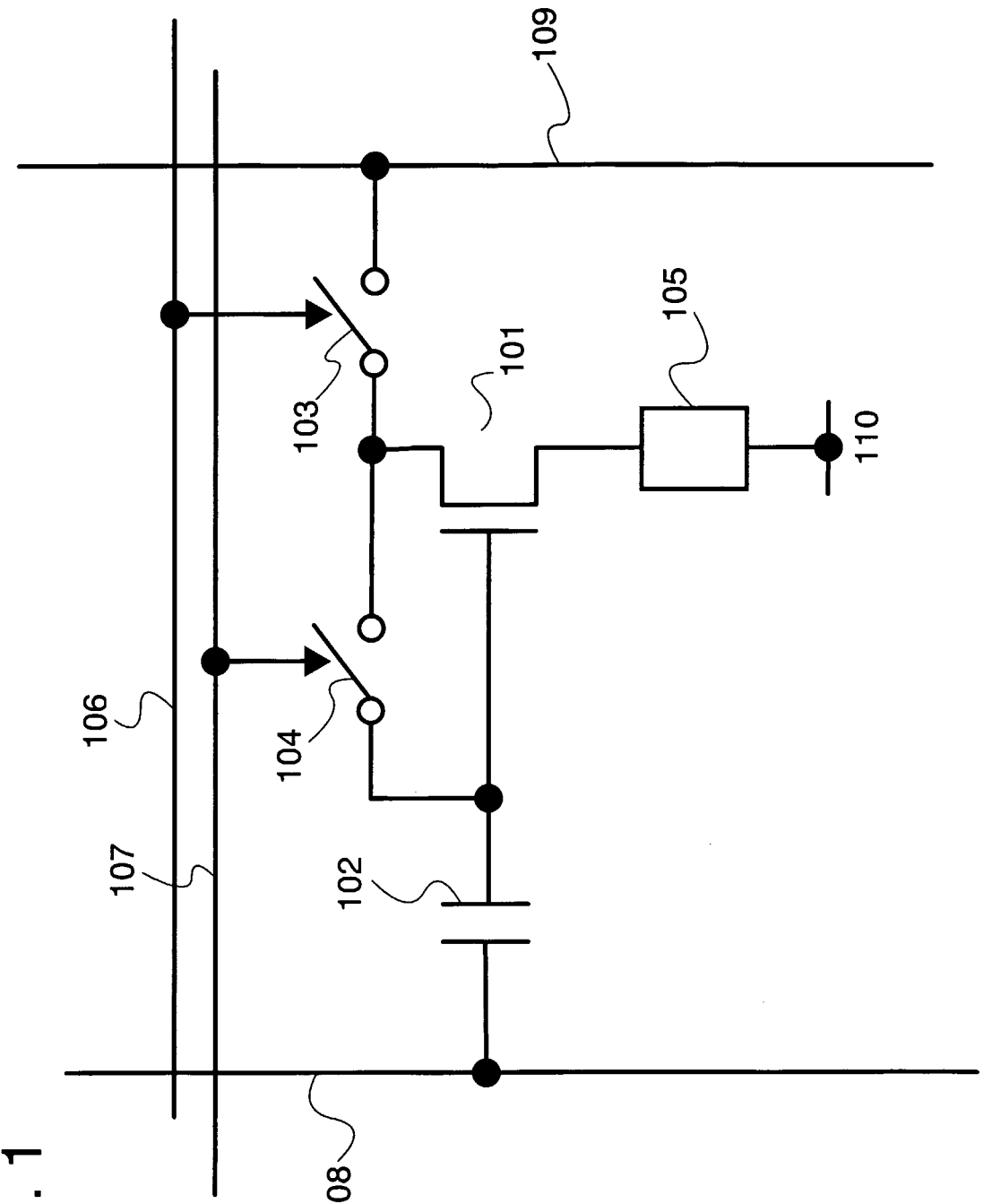
FIG. 1 is a diagram showing a pixel configuration of the invention.

Although the invention will be fully described by way of embodiment modes with reference to the accompanying drawings, it is to be understood that various changes and modifications will be apparent to those skilled in the art. Therefore, unless such changes and modifications depart from the scope of the invention, they should be construed as being included therein.

Embodiment Mode 1

Described in this embodiment mode are a pixel configuration of a display device of the invention, and a principle of operation thereof.

First, a pixel configuration of a display device of the invention is described in detail with reference to FIG. 1. A pixel comprises a driving transistor 101, a capacitor 102, a first switch 103, a second switch 104, a display element 105, a first scan line (G1 line) 106, a second scan line (G2 line) 107, a signal line (Data line) 108, and a power supply line (Supply line) 109. It is to be noted that the driving transistor 101 is an n-type transistor.

A source terminal of the driving transistor 101 is connected to an anode of the display element 105, a gate terminal thereof is connected to the signal line 108 via the capacitor 102, and a drain terminal thereof is connected to the power supply line 109 via the first switch 103. It is to be noted that a power supply potential Vdd is supplied to the power supply line 109. In addition, the gate terminal and the drain terminal of the driving transistor 101 are connected to each other via the second switch 104. Therefore, when the second switch 104 is on, the portion between the gate terminal and the drain terminal of the driving transistor 101 becomes conductive. Then, when the second switch 104 is turned off, the portion between the gate terminal and the drain terminal of the driving transistor 101 becomes non-conductive, and a potential difference (a voltage) between a potential of the gate terminal (or the drain terminal) of the driving transistor 101 and a potential of the signal line 108 at this moment can be held in the capacitor 102. Furthermore, a cathode of the display element 105 is connected to a wire 110 to which a potential Vss is supplied. It is to be noted that Vss is a potential satisfying Vss<Vdd; for example, there may be Vss=GND (a ground potential).

Next, a principle of operation of the pixel configuration shown in FIG. 1 is described.

In a writing period of the pixel, signals are inputted into the first scan line 106 and the second scan line 107 respectively to turn on the first switch 103 and the second switch 104. Then, the power supply potential (Vdd) of the power supply line 109 is supplied to the drain terminal and the gate terminal of the driving transistor 101. Current flows into the capacitor 102, the driving transistor 101 and the display element 105, and the capacitor 102 accumulates or discharges charge. It is to be noted that an analog signal potential is supplied to the signal line 108 in the writing period of the pixel; this analog signal potential corresponds to a video signal.

After a while, current stops flowing into the capacitor 102, and then current flows into the driving transistor 101 and the display element 105. This is because the driving transistor 101 is on since the portion between the gate terminal and the drain terminal thereof is conductive by the second switch 104 and a potential of the gate terminal is the power supply potential (Vdd).

In this state, the first switch 103 is turned off. Then, current keeps flowing into the driving transistor 101 and the capacitor 102 for a while, and stops at last. In this manner, the driving transistor 101 is turned off. A gate-source voltage Vgs of the driving transistor 101 is, at this time, approximately equal to a threshold voltage Vth thereof.

Reaching this state, the second switch 104 is turned off. Consequently, the capacitor 102 holds a potential difference (Vp) between a potential of the gate terminal of the driving transistor 101 to turn off the transistor and an analog signal potential supplied to the signal line 108 at the moment when the second switch 104 is turned off. In this manner, an analog signal is written into the pixel.

It is to be noted that on/off of the first switch 103 and the second switch 104 as described above are controlled by inputting pulse signals into the first scan line 106 and the second scan line 107 respectively.

After an analog signal has been written into the pixel, on/off of the driving transistor 101 is controlled in accordance with change of a potential of the signal line 108, based on the analog signal potential which has been supplied to the signal line 108 when the analog signal is written. That is, in the case where the potential of the signal line 108 is lower than the analog signal potential when the analog signal is written into the pixel in the writing period, the driving transistor 101 is turned off while in the case where the potential of the signal line 108 is higher than the analog signal potential when the analog signal is written into the pixel in the writing period, the driving transistor 101 is turned on.

The potential difference (Vp) has been held by the capacitor 102 when an analog signal has been written into the pixel; therefore, in the case where a potential of the signal line 108 is lower than an analog signal potential when the analog signal has been written into the pixel, a potential of the gate terminal of the driving transistor 101 also becomes lower than a potential of the gate terminal when the analog signal has been written into the pixel, thereby the driving transistor 101 is turned off. On the other hand, in the case where a potential of the signal line 108 is higher than the analog signal potential when the analog signal has been written into the pixel in a writing period, the potential of the gate terminal of the driving transistor 101 also becomes higher than the potential of the gate terminal when the analog signal has been written into the pixel, thereby the driving transistor 101 is turned on.

Accordingly, in a light emitting period of the pixel, by changing the potential supplied to the signal line 108 in an analog manner while the second switch 3104 is turned off and the first switch 103 is turned on, on/off of the driving transistor 101 is controlled so that time for supplying current to the display element 105 is controlled in an analog manner to express gradation.

Described next is a potential supplied to the signal line 108 in the light emitting period of the pixel.

Figure 59:
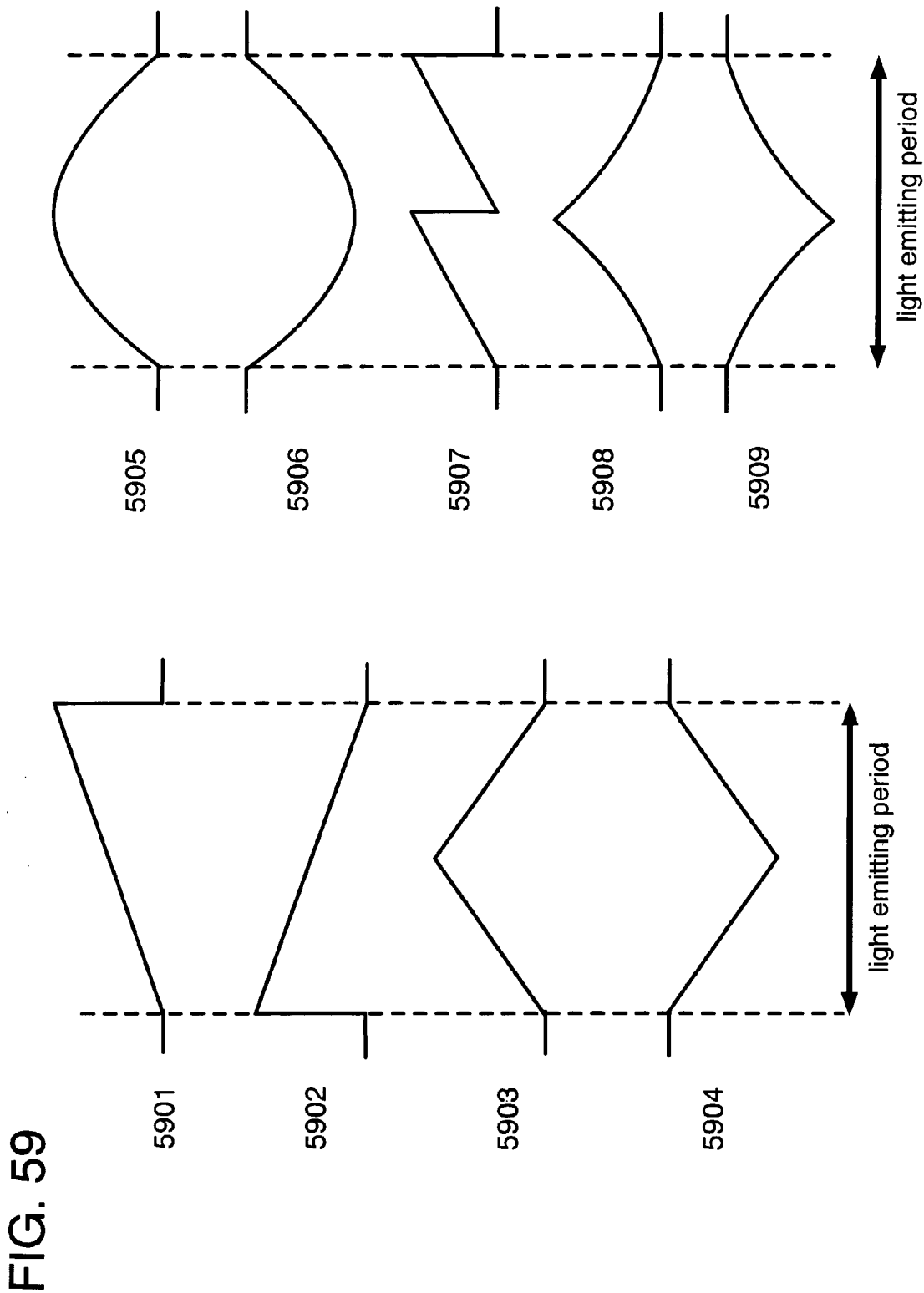
FIG. 59 illustrates examples of a waveform of a potential varying in an analog manner for controlling on/off of a driving transistor.

For example, a potential varying from low potential to high potential in an analog manner is supplied to the signal line 108 in the light emitting period. As one example, the potential may be increased linearly as a waveform 5901 shown in FIG. 59.

In addition, a potential varying from high potential to low potential in an analog manner may be supplied as well. For example, the potential may be decreased linearly as a waveform 5902.

In addition, a waveform combining them may be supplied as well. That is, as one example, a potential linearly increasing from low potential to high potential and decreasing from the high potential to the low potential as a waveform 5903 in FIG. 59 may be supplied. It is to be noted hereinafter that the waveform 5903 is called a triangular wave potential. In addition, a potential linearly decreasing from high potential to low potential and linearly increasing from the low potential to the high potential as a waveform 5904 may be supplied as well.

Furthermore, the potential supplied to the signal line 108 may not vary linearly; a potential of a waveform corresponding to one cycle of an output waveform of a full-wave rectifier circuit as a waveform 5905 may be supplied or a potential of a waveform 5906 obtained by reversing the waveform 5905 may be supplied. A potential of a waveform as a waveform 5908 or a waveform 5909 may be supplied as well.

By using the above-described waveforms, a light emitting time for a video signal can be arbitrarily set. Therefore, gamma correction and the like can also be performed.

In the light emitting period of the pixel also, a plurality of pulses of the waveform 5901, the waveform 5902, the waveform 5903, the waveform 5904, the waveform 5905, the waveform 5906, the waveform 5908, or the waveform 5909 may be supplied in succession. As one example, as a waveform 5907, a pulse of the waveform 5901 may be supplied twice in succession in the light emitting period of the pixel.

According to this, light emitting time can be dispersed within one frame. Consequently, the frame frequency appears to be improved and screen flicker can be prevented.

Moreover, in the light emitting period of the pixel, the first switch 103 is turned on to supply the power supply potential Vdd of the power supply line 109 to the drain terminal of the driving transistor 101. The second switch 104 is, on the other hand, turned off.

In this manner, analog time gradation display of a pixel can be performed by an analog signal potential which is supplied to the signal line 108 when an analog signal is written into the pixel. It is to be noted that the smaller the gradation level is, the higher the analog signal potential is.

This is because on/off of the driving transistor 101 is determined depending on the magnitude correlation between the triangular wave potential supplied in the light emitting period of the pixel and the analog signal potential inputted into the pixel in the writing period of the pixel. In the case where the analog signal potential inputted into the pixel in the writing period of the pixel is lower than the triangular wave potential supplied in the light emitting period of the pixel, the driving transistor 101 is turned on and light emission is performed. Therefore, as the analog signal potential inputted into the pixel in the writing period of the pixel is decreased, the period in which the analog signal potential is lower than the triangular wave potential supplied in the light emitting period of the pixel becomes longer, and thus the period for emitting light becomes longer. Consequently, the gradation level is increased. Meanwhile, as the analog signal potential inputted into the pixel in the writing period of the pixel is increased, the period in which the analog signal potential is lower than the triangular wave potential supplied in the light emitting period of the pixel becomes shorter, and thus the period for emitting light becomes shorter. Consequently, the gradation level is decreased.

Subsequently, a display device including a pixel region having the pixel configuration shown in FIG. 1 is described with reference to FIG. 2. A display device in FIG. 2 includes a first scan line driver circuit 201, a second scan line driver circuit 202, a signal line driver circuit 203, and a pixel region 204 provided with a plurality of pixels 205. The pixels 205 are arranged in matrix corresponding to respective first scan lines (G1 lines) $G1a_1$ to $G1a_m$ and second scan lines (G2 lines) $G2b_1$ to $G2b_m$ which are arranged in row, and respective signal lines (Data lines) D1 to Dn and power supply lines (Supply lines) P1 to Pn which are arranged in column.

The pixel 205 comprises a driving transistor 206, a capacitor 207, a first switch 208, a second switch 209, a display element 210, a first scan line $G1a_i$ (one of $G1a_1$ to $G1a_m$), a second scan line $G2b_i$ (one of $G2b_1$ to $G2b_m$), a signal line Dj (one of D1 to Dn), and a power supply line Pj (one of P1 to Pn). It is to be noted that the driving transistor 206 is an n-type transistor. In addition, the pixel 205 corresponds to one of the plurality of pixels arranged in the pixel region 204.

A source terminal of the driving transistor 206 is connected to an anode of the display element 210, a gate terminal thereof is connected to the signal line Dj via the capacitor 207, and a drain terminal thereof is connected to the power supply line Pj via the first switch 208. A power supply potential Vdd is supplied to the power supply lines (P1 to Pn). It is to be noted that the potential supplied to the power supply lines (P1 to Pn) is not limited to Vdd. For example, in the case where full color display is performed using color elements RGB, the power supply potential may be changed per pixel for each color element of RGB. That is, for example, Vdd1 may be supplied to a column of pixels for a color element R, Vdd2 may be supplied to a column of pixels for a color element G, and Vdd3 may be supplied to a column of pixels for a color element B.

In addition, the gate terminal and the drain terminal of the driving transistor 206 are connected to each other via the second switch 209. Therefore, when the second switch 209 is on, the portion between the gate terminal and the drain terminal of the driving transistor 206 becomes conductive. On the other hand, when the second switch 209 is turned off, the portion between the gate terminal and the drain terminal of the driving transistor 206 becomes non-conductive, and a potential difference (a voltage) between a potential of the gate terminal (or the drain terminal) of the driving transistor 206 and a potential of the signal line Dj at this moment can be held in the capacitor 207. Furthermore, a cathode of the display element 210 is connected to a wire 211 to which a potential Vss is supplied. It is to be noted that Vss is a potential satisfying Vss<Vdd; for example, there may be Vss=GND (a ground potential).

It is to be noted that although the scan line driver circuits are arranged on right and left sides, the invention is not limited to this. They may be arranged on one side.

Next, a principle of operation of the display device of the invention is described with reference to FIGS. 2 and 3. FIG. 3 is a diagram showing a timing chart of one pixel column (the j-th column) in the pixel region 204 of the display device shown in FIG. 2. It is to be noted that a driving transistor, a capacitor, a first switch, a second switch, and a display element of each pixel are denoted by the same reference numerals of the pixel 205 for description since the plurality of pixels arranged in the pixel region 204 has the same configuration as the pixel 205.

As shown in FIG. 3, an analog signal potential is inputted into Data line (the signal line Dj) of pixels of the j-th column in the writing period. When pulse signals are inputted into G1 line (the first scan line G1$a_i$) and G2 line (the second scan line G2$b_i$) of the i-th row respectively to turn on the first switch 208 and the second switch 209, the power supply potential (Vdd) from the power supply line Pj is supplied to the drain terminal of the driving transistor 206 of the pixel of the i-th row, and current flows into the capacitor 207, the driving transistor 206, and the display element 210. Then, the capacitor 207 accumulates or discharges charge; specifically, depending on the correlation between charge stored originally in the capacitor 207 and a potential (Va) supplied to Data line (the signal line Dj), either charge accumulation or discharge is performed. Then, since the pulse width of the pulse signal inputted into the second signal line G2$b_i$ is longer than the pulse width of the pulse signal inputted into the first signal line G1$a_i$, the first switch 208 is turned off while the second switch 209 is on. At the moment when the first switch 208 is turned off, the driving transistor 206 is on because the power supply potential (Vdd) is supplied to the gate terminal thereof; thus, current flows into the driving transistor 206, the display element 210, and the capacitor 207. After a while, current stops flowing into the driving transistor 206, the display element 210, and the capacitor 207; that is, the steady state is reached. Consequently, the driving transistor 206 is turned off. A gate-source voltage Vgs of the driving transistor 206 is, at this time, approximately equal to a threshold voltage Vth thereof. It is to be noted that a complete steady state may not be reached if a gate potential necessary to control on/off of the driving transistor 206 can be obtained. Subsequently, the second switch 209 is turned off, and the capacitor 207 holds a potential difference between a potential of the gate terminal of the driving transistor 206 to turn off the transistor and the analog signal potential supplied to the signal line Dj at the moment when the second switch 209 is turned off. In this manner, an analog signal is written into the pixel of the i-th row and the j-th column from Data line (the signal line Dj). It is to be noted that, at this time, respective analog signal potentials are supplied to all pixel columns from Data lines (the signal lines D1 to Dn) and each analog signal is written into the pixel of the i-th row of each column.

Next, pulse signals are inputted into G1 line of the (i+1)-th row (the first scan line G1$a_{i+1}$) and G2 line of the (i+1)-th row (the second scan line G2$b_{i+1}$) respectively, a potential (Vb) is inputted into Data line (the signal line Dj) of the pixel of the (i+1)-th row and the j-th column, and an analog signal is written into the pixel. It is to be noted that, at this time, respective analog signal potentials are supplied to all pixel columns from Data lines (the signal lines D1 to Dn) and each analog signal is written into the pixel of the (i+1)-th row of each column.

In this manner, pulse signals are inputted into G1 lines (the first scan lines G1$a_1$ to G1$a_m$) and G2 lines (the second scan lines G2$b_1$ to G2$b_m$) of rows of pixels respectively, and an analog signal is written into each pixel to complete a period for writing analog signals into the pixel region 204 for one frame period.

Subsequently, signals are inputted into the first scan lines G1$a_1$ to G1$a_m$ and the second scan lines G2$b_1$ to G2$b_m$ respectively so as to turn on the first switches 208 of pixels of all rows while turn off the second switches 209 thereof. A triangular wave potential is supplied to Data line (the signal lines D1 to Dn) as shown in FIG. 3. Accordingly, the pixel of the i-th row of the j-th column keeps the non-light emitting state of the display element 210 during a period in which the potential of Data line is lower than Va while the display element 210 emits light during a period (Ta) in which the potential of Data line is higher than Va. Similarly, in the pixel of the (i+1)-th row of the j-th column, the display element 210 emits light during a period (Tb).

As for the principle that, after a writing period is completed, the pixel does not emit light during a period in which a potential lower than the analog signal potential when the analog signal is written is supplied to Data line (one of the signal lines D1 to Dn) while the pixel emits light when the potential supplied to Data line is higher than the written analog signal potential, the above description using the pixel configuration in FIG. 1 can be applied and thus specific description is omitted here.

As described above, in a light emitting period, a triangular wave potential is supplied to the signal lines D1 to Dn of all pixels, and the light emitting time of the display element 210 is set depending on an analog signal potential when an analog signal is written in a writing period. Analog time gradation display can be performed in this manner.

It is to be noted that on/off of the driving transistor 206 for controlling light emission/non-light emission of the display element 210 is, as described above, determined whether the analog signal potential supplied to Data line (one of the signal lines D1 to Dn) in the writing period is higher than the triangular wave potential supplied to the Data line (one of the signal lines D1 to Dn) in the light emitting period or lower than the same, which can be controlled in a digital manner. Therefore, on/off of the driving transistor 206 can be controlled with less effect of variations of characteristics of the driving transistor 206; that is, variations of light emission of pixels can be improved.

In addition, in the pixel configuration of the invention, an n-type transistor can be used as a driving transistor for controlling light emission/non-light emission of a display element. The mobility μ of an n-type transistor is, in general, higher than that of a p-type transistor. Therefore, for flowing the same current, an n-type transistor can be made smaller than a p-type transistor, thereby a high definition display device can be provided. Furthermore, the opening ratio of a pixel can be increased since the transistor size can be reduced. Consequently, a display device with the power consumption reduced can be provided and the reliability of an EL element can be improved.

In addition, a circuit constituted only by n-type transistors, including a whole pixel region and a peripheral driver circuit, can be provided. Accordingly, a display panel having a single conductivity type can be provided at low cost by a reduced number of steps.

In addition, since thin film transistors used in a circuit included in the display device panel can be formed only by n-type transistors, a display device including a circuit constituted by a thin film transistor in which an amorphous semiconductor or a semi-amorphous semiconductor (also called a microcrystalline semiconductor) is used in its semiconductor layer can be provided. For example, amorphous silicon (a-Si: H) may be used as an amorphous semiconductor. Consequently, further cost reduction can be achieved. It is to be noted that the switches shown in FIGS. 1, 2, or the like may be any switch such as an electrical switch or a mechanical switch. It may be anything if it can control a current flow. It may be a transistor, a diode, or a logic circuit configured with them. Therefore, in the case of adopting a transistor as the switch, conductivity thereof is not in particular limited because the transistor functions just as a switch. However, when off current is preferred to be small, a transistor of conductivity with a small off-current is favorably employed; for example, a transistor provided with an LDD region and the like have a small off-current. Further, it is desirable that an n-type transistor be employed when a potential of a source terminal of the transistor functioning as the switch is closer to a low potential-side power supply (e.g., Vss, GND, or 0V), while a p-type transistor be employed when the potential of the source terminal thereof is closer to a high potential-side power supply (e.g., Vdd). This is because the switch can operate easily since an absolute value of a gate-source voltage of the transistor can be increased. It is to be noted that a CMOS type switch may also be employed by using both n-type and p-type transistors.

It is to be noted in this embodiment mode that the source and drain terminals of the driving transistor for driving the display element, and the anode and cathode of the display element mean respective terminals and electrodes when a forward voltage is applied to the display element.

Embodiment Mode 2

Described in this embodiment mode is a pixel configuration different from the pixel configuration described in Embodiment Mode 1. In a pixel configuration described in this embodiment mode, different wires are used for supplying an analog signal potential when an analog signal is written into the pixel, and for supplying an analog signal potential for controlling light emission/non-light emission of the pixel respectively.

First, a pixel configuration of a display device of the invention is described in detail with reference to FIG. 4. A pixel comprises a driving transistor 401, a capacitor 402, a first switch 403, a second switch 404, a display element 405, a third switch 406, a fourth switch 407, a first scan line (G1 line) 408, a second scan line (G2 line) 409, a first signal line (Data1 line) 410, a second signal line (Data2 line) 411, and a power supply line (Supply line) 412. It is to be noted that the driving transistor 401 is an n-type transistor.

A source terminal of the driving transistor 401 is connected to an anode of the display element 405, and a gate terminal thereof is connected to one electrode of the capacitor 402. The other electrode of the capacitor 402 is connected to the first signal line 410 via the third switch 406 and connected to the second signal line 411 via the fourth switch 407. A drain terminal of the driving transistor 401 is connected to the power supply line 412 via the first switch 403. It is to be noted that a power supply potential Vdd is supplied to the power supply line 412. The potential supplied to the power supply line is not limited to Vdd. For example, in the case where full color display is performed using color elements RGB, the power supply potential may be changed per pixel for each color element of RGB.

In addition, the gate terminal and the drain terminal of the driving transistor 401 are connected to each other via the second switch 404. Therefore, when the second switch 404 is on, the portion between the gate terminal and the drain terminal of the driving transistor 401 becomes conductive. Then, when the second switch 404 is turned off, the portion between the gate terminal and the drain terminal of the driving transistor 401 becomes non-conductive, and a potential difference (a voltage) between a potential of the gate terminal (or the drain terminal) of the driving transistor 401 and an analog signal potential supplied to the first signal line 410 at the moment is held in the capacitor 402. Furthermore, a cathode of the display element 405 is connected to a wire 413 to which a potential Vss is supplied. It is to be noted that Vss is a potential satisfying Vss<Vdd; for example, there may be Vss=GND (a ground potential).

Figure 4:
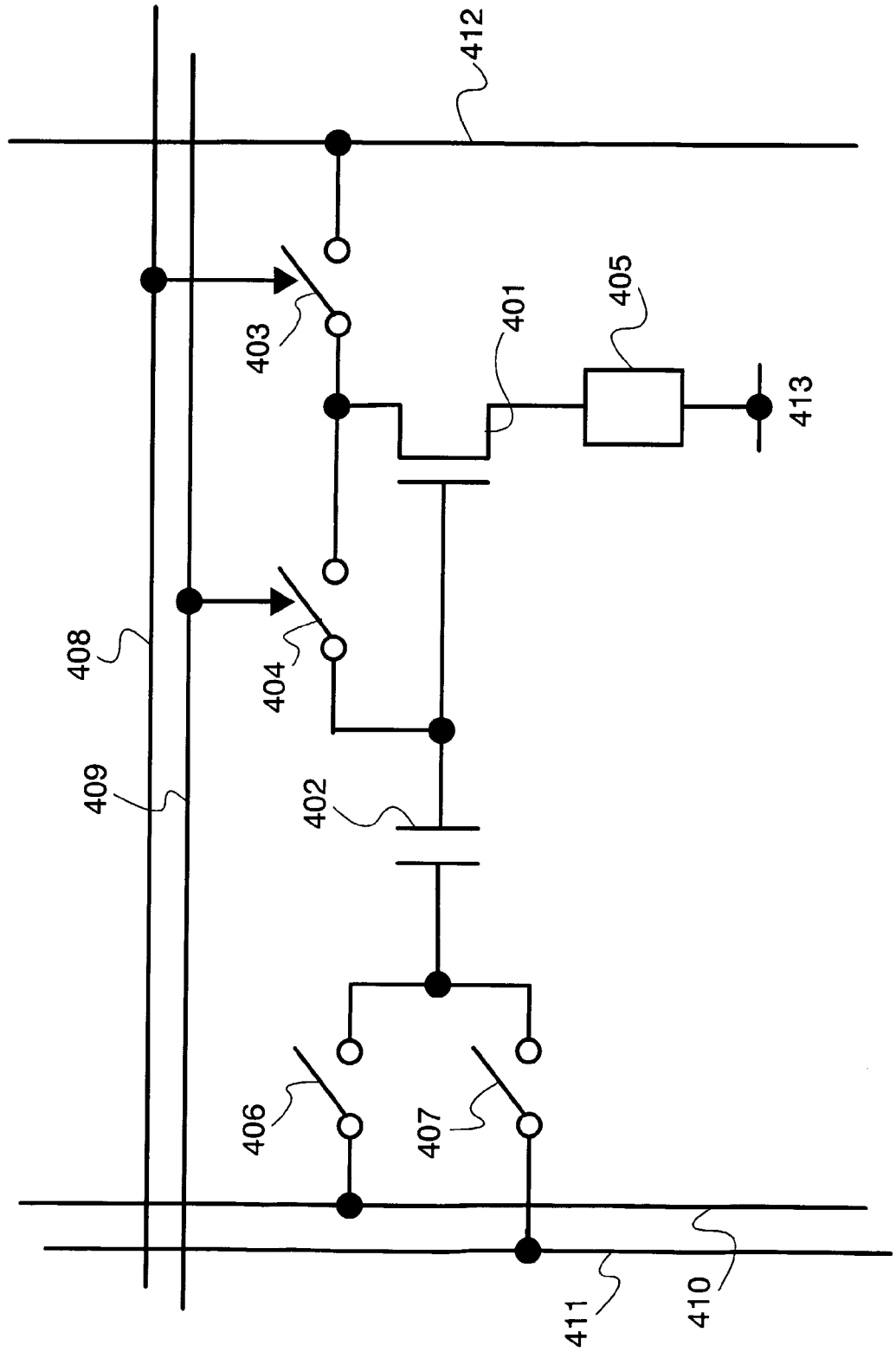
FIG. 4 is a diagram showing a pixel configuration of the invention.
Figure 5:
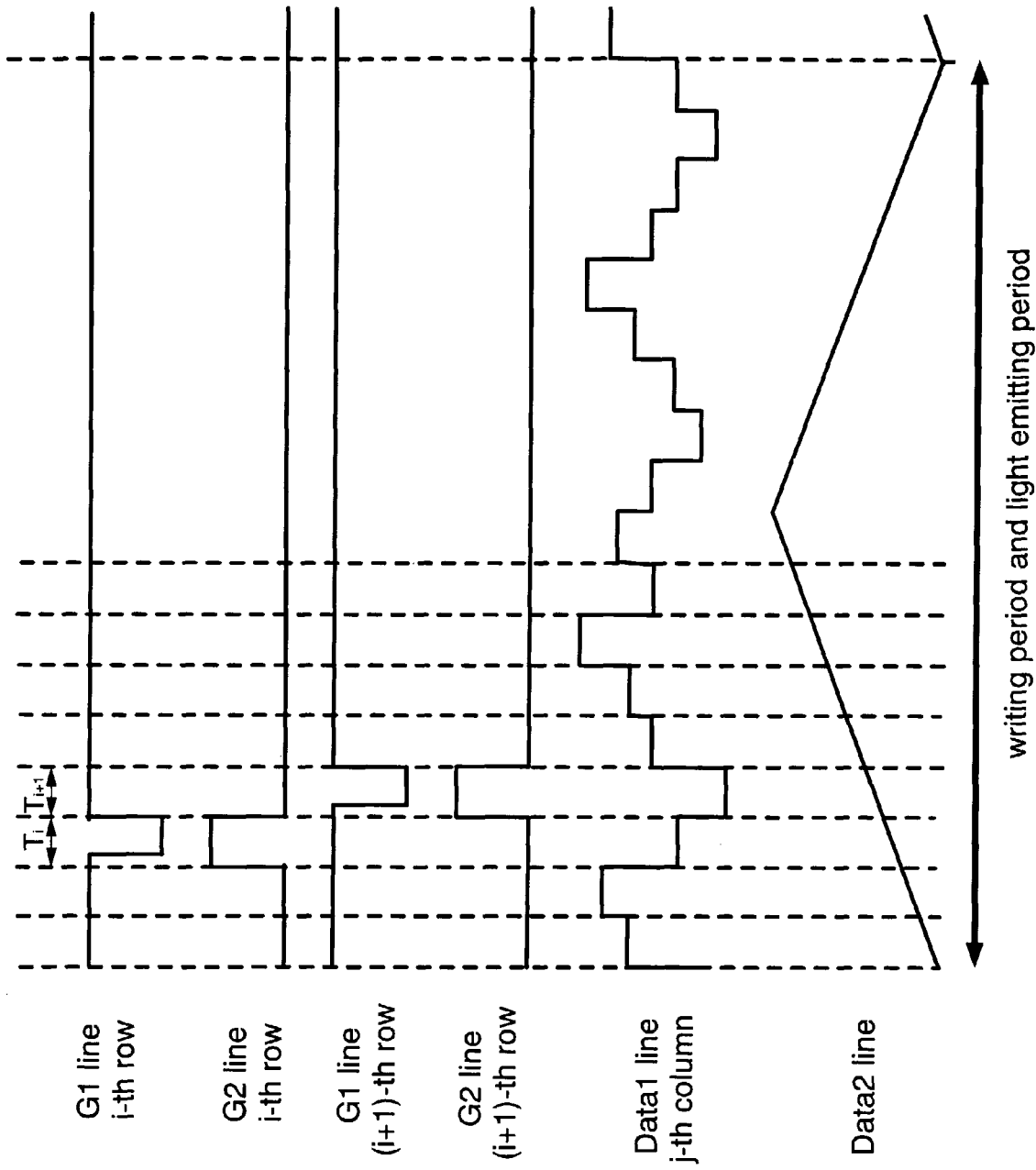
FIG. 5 is a diagram showing a timing chart of a display device having a pixel configuration of the invention.

Next, a principle of operation of the pixel configuration shown in FIG. 4 is described briefly with reference to FIG. 5. FIG. 5 is a diagram showing a timing chart of one pixel column of the j-th column in a display device including a plurality of the pixels shown in FIG. 4 arranged in matrix. In addition, in the timing chart shown in FIG. 5, when signals of G1 line (the first scan line) and G2 line (the second scan line) are H level, the first switch 403 and the second switch 404 are turned on respectively while they are L level, the first switch 403 and the second switch 404 are turned off respectively.

In the pixel shown in FIG. 4, an analog signal potential for determining a gradation of each pixel is supplied to the first signal line 410, and a potential for controlling a light emitting time of each pixel is supplied to the second signal line 411.

It is to be noted that as the potential supplied to the second signal line 411 as shown in Embodiment Mode 1, the waveform 5901, the waveform 5902, the waveform 5903, the waveform 5904, the waveform 5905, the waveform 5906, the waveform 5907, the waveform 5908, or the waveform 5909 may be supplied or a plurality of one of them may be supplied in succession.

By supplying in succession, light emitting time can be dispersed within one frame. Consequently, the frame frequency appears to be improved and screen flicker can be prevented.

It is to be noted that, in the display device having the pixel configuration in this embodiment mode, a writing period and a light emitting period are set for each row of the pixel region.

A writing period of pixels of the i-th row is described below. A period Ti shown in FIG. 5 corresponds to a writing period of pixels of the i-th row. A period other than the period Ti corresponds to a light emitting period of the pixels of the i-th row.

First, in the writing period Ti of the pixel, the third switch 406 is turned on and the fourth switch 407 is turned off. Then, a signal of H level is inputted into G2 line (the second scan line 409) in the writing period Ti, and a signal of G1 line (the first scan line 408) falls from H level to L level in the writing period. Thus, during a period in which the second scan line 409 and the first scan line 408 are H level, the second switch 404 and the first switch 403 are on. The power supply potential (Vdd) from the power supply line 412 is supplied to the drain terminal of the driving transistor 401 of the pixel of the i-th row, and current flows into the capacitor 402, the driving transistor 401, and the display element 405. Then, the capacitor 402 accumulates or discharges charge; specifically, depending on the correlation between charge stored originally in the capacitor 402 and a potential supplied to Data1 line (the first signal line 410), either charge accumulation or discharge is performed. Then, the signal of G1 line (the first scan line 408) falls from H level to L level, thereby the first switch 403 is turned off while the second switch 404 is on. At the moment when the first switch 403 is turned off, the driving transistor 401 is on because the power supply potential (Vdd) is supplied to the gate terminal thereof; thus, current flows into the driving transistor 401, the display element 405, and the capacitor 402. After a while, current stops flowing into the driving transistor 401, the display element 405, and the capacitor 402; that is, the steady state is reached.

Consequently, the driving transistor 401 is turned off. It is to be noted that a complete steady state may not be reached if a gate potential necessary to control on/off of the driving transistor 401 can be obtained.

Subsequently, the signal supplied to G1 line (the first scan line 408) rises to H level and the signal supplied to G2 line (the second scan line 409) falls to L level; that is, the first switch 403 is turned on and the second switch 404 is turned off. Then, the capacitor 402 holds a potential difference between a potential of the gate terminal of the driving transistor 401 to turn off the transistor and the analog signal potential supplied to the first signal line 410 at the moment when the second switch 404 is turned off.

In this manner, an analog signal is written into the pixel of the j-th column and the i-th row from Data1 line (the first signal line 410). It is to be noted that, at this time, respective analog signal potentials are supplied to all pixel columns from Data1 lines (the first signal lines 410) and each analog signal is written into the pixel and the i-th row of each column.

When the writing period Ti of the pixels of the i-th row is completed, a writing period $T_{i+1}$ of pixels of the (i+1)-th row is started and a light emitting period starts in the pixels of the i-th row.

In the light emitting period of the pixels of the i-th row, the third switch 406 of the pixel of the i-th row is turned off and the fourth switch 407 thereof is turned on.

It is to be noted that a triangular wave potential is supplied to Data2 line (the second signal line 411) as shown in FIG. 5. The pixel of the j-th column of the i-th row keeps the non-light emitting state of the display element 405 during a period in which the potential of Data2 line (the second signal line 411) is lower than the analog signal potential supplied to Data1 line (the first signal line 410) in the writing period Ti of the pixels of the i-th row, while the display element 405 emits light during a period in which the potential of Data2 line (the second signal line 411) is higher than the same analog signal potential. Accordingly, the light emitting time of the display element 405 is set depending on an analog signal potential when an analog signal is written in a writing period. Analog time gradation display can be performed in this manner.

As described above, in the display device having the pixel configuration in this embodiment mode, a writing period starts sequentially for each pixel row, and followed by a light emitting period for each pixel row when the writing period is completed. In the case where a signal is written into pixels in a line-sequential manner as is in this embodiment mode, the required writing period may be for one pixel, so that a light emitting period can be made long. That is, the duty ratio (the ratio of the light emitting period to one frame period) is high, so that the moment luminance of the display element can be reduced. Consequently, the reliability of the display element can be improved.

In addition, since the writing period of pixels for each row can be made long, the frequency of a signal line driver circuit for inputting an analog signal potential into Data1 line (the first signal line 410) can be reduced. Consequently, power consumption can be reduced.

It is to be noted that on/off of the driving transistor 401 for controlling light emission/non-light emission of the display element 405 is, as described above, determined whether the analog signal potential supplied to Data1 line (the first signal lines 410) in the writing period is higher than the triangular wave potential supplied to Data2 line (the second signal line 411) or lower in the light emitting period, which can be controlled in a digital manner. Therefore, on/off of the driving transistor 401 can be controlled with less effect of variations of characteristics of the driving transistor 401; that is, variations of light emission of pixels can be improved.

In addition, in the pixel configuration of the invention, an n-type transistor can be used as a driving transistor for controlling light emission/non-light emission of a display element. The mobility μ of an n-type transistor is, in general, higher than that of a p-type transistor. Therefore, for flowing the same current, the transistor size can be reduced; consequently, the opening ratio of a pixel can be increased and high definition display, a display device with the power consumption reduced, and the like can be provided.

In addition, a circuit constituted only by n-type transistors, including a whole pixel region and a peripheral driver circuit, can be provided. Accordingly, a display device panel having a single conductivity type can be provided at low cost by a reduced number of steps.

In addition, since thin film transistors used in a circuit included in the display device panel can be formed only by n-type transistors, a display device including a circuit constituted by a thin film transistor in which an amorphous semiconductor or a semi-amorphous semiconductor (also called a microcrystalline semiconductor) is used in its semiconductor layer can be provided. For example, amorphous silicon (a-Si: H) may be used as an amorphous semiconductor.

It is to be noted in this embodiment mode that the source and drain terminals of the driving transistor for driving the display element, and the anode and cathode of the display element mean respective terminals and electrodes when a forward voltage is applied to the display element.

Embodiment Mode 3

In this embodiment mode, a case where n-type transistors are used as switches in the pixel configurations described in Embodiment Mode 1 and Embodiment Mode 2 is described.

First, a case where n-type transistors are used as the switches in the pixel configuration shown in FIG. 1 described in Embodiment Mode 1 is described with reference to FIG. 6. A pixel comprises a driving transistor 601, a capacitor 602, a first switching transistor 603, a second switching transistor 604, a display element 605, a first scan line (G1 line) 606, a second scan line (G2 line) 607, a signal line (Data line) 608, and a power supply line (Supply line) 609. It is to be noted that the driving transistor 601, the first switching transistor 603, and the second switching transistor 604 are n-type transistors.

A source terminal of the driving transistor 601 is connected to an anode of the display element 605, a gate terminal thereof is connected to the signal line 608 via the capacitor 602, and a drain terminal thereof is connected to a source terminal of the first switching transistor 603 and a first terminal (a source terminal or a drain terminal) of the second switching transistor 604. A drain terminal of the first switching transistor 603 is connected to the power supply line 609, and a gate terminal thereof is connected to the first scan line 606. Therefore, by supplying a signal of H level to the first scan line 606, the first switching transistor 603 is turned on, and a power supply potential Vdd supplied to the power supply line 609 can be supplied to the drain terminal of the driving transistor 601. In addition, a second terminal (a source terminal or a drain terminal) of the second switching transistor 604 is connected to the gate terminal of the driving transistor 601. Therefore, by supplying a signal of H level to the second scan line 607, the second switching transistor 604 is turned on, and the portion between the drain terminal and the gate terminal of the driving transistor 601 becomes conductive. When the second switching transistor 604 is turned off, the portion between the gate terminal and the drain terminal of the driving transistor 601 becomes non-conductive, and a potential difference (a voltage) between a potential of the gate terminal (or the drain terminal) of the driving transistor 601 and a potential of the signal line 608 at this moment can be held in the capacitor 602. Furthermore, a cathode of the display element 605 is connected to a wire 610 to which a potential Vss is supplied. It is to be noted that Vss is a potential satisfying Vss<Vdd; for example, there may be Vss=GND (a ground potential). It is to be noted that the potential supplied to the power supply line is not limited to Vdd. For example, in the case where full color display is performed using color elements RGB, the power supply potential may be changed per pixel for each color element of RGB.

Figure 6:
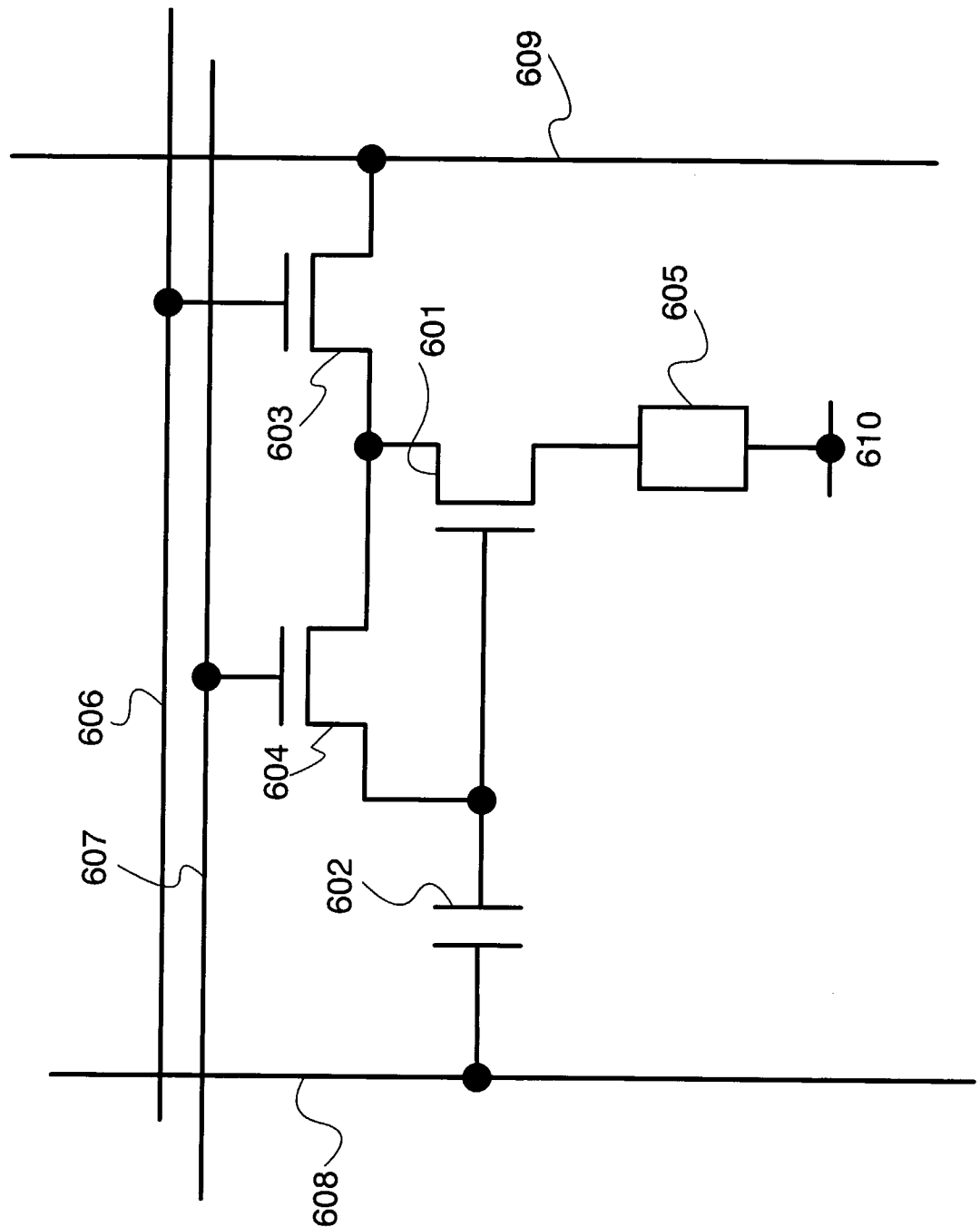
FIG. 6 is a diagram showing a pixel configuration of the invention.

It is to be noted that since operation of the pixel configuration shown in FIG. 6 is identical to the pixel configuration shown in FIG. 1, description thereof is omitted.

It is here preferable that the switching transistors have less leakage current (off current or gate leakage current). Off current means a current flowing between a source and a drain and gate leakage current means a current flowing between a gate and a source or a drain through a gate insulating film, when a transistor is off.

Therefore, each of n-type transistors used as the first switching transistor 603 and the second switching transistor 604 has preferably a low-concentration impurity region (also called a "Lightly Doped Drains: LDD region"). This is because a transistor having an LDD region can reduce off current. Alternatively, only the second switching transistor 604 may be provided with an LDD region. This is because, if off current flows into the second switching transistor 604, charge of the capacitor 602 cannot be held, and the first switching transistor 603 needs to increase the on current when supplying current to the display element 605.

More preferably, the second switching transistor 604 and the first switching transistor 603 may be provided with an LDD region such that at least the LDD region of the first switching transistor 603 is partially overlapped with a gate electrode thereof. Accordingly, the second switching transistor 604 can reduce the off current, and the first switching transistor 603 can increase the on current and reduce generation of hot electrons. Consequently, the reliability of the first switching transistor 603 is improved.

In addition, the driving transistor 601 may also be provided with an LDD region so as to overlap with a gate electrode thereof, thereby the reliability can be improved.

Furthermore, by reducing the thickness of a gate insulating film, off current can be reduced as well. Therefore, respective thicknesses of the first switching transistor 603 and the second switching transistor 604 may be preferably thinner than that of the driving transistor 601.

Moreover, by forming the first switching transistor 603 and the second switching transistor 604 to be multigate transistors, gate leakage current can be reduced.

In particular, the capacitor 602 cannot hold the voltage written in the writing period if off current flows into the second switching transistor 604; therefore, to provide an LDD region, to make a gate insulating film thin, or to form to have a multigate may be carried out only for the second switching transistor 604.

It is to be noted that a potential of H level of the first scan line 606 is preferably higher than a potential of the power supply line 609 by at least a threshold voltage Vth of the first switching transistor 603. Similarly, a potential of H level of the second scan line 607 is preferably higher than a potential of the power supply line 609 by at least a threshold voltage Vth of the second switching transistor 604.

Next, a case where n-type transistors are used as the switches in the pixel configuration shown in FIG. 4 described in Embodiment Mode 2 is described with reference to FIG. 7.

A pixel comprises a driving transistor 701, a capacitor 702, a first switching transistor 703, a second switching transistor 704, a display element 705, a third switching transistor 706, a fourth switching transistor 707, a first scan line (G1 line) 708, a second scan line (G2 line) 709, a first signal line (Data line1) 710, a second signal line (Data line2) 711, a power supply line (Supply line) 712, a third scan line 714, and a fourth scan line 715. It is to be noted that the driving transistor 701, the first switching transistor 703, the second switching transistor 704, the third switching transistor 706, and the fourth switching transistor 707 are n-type transistors.

A source terminal of the driving transistor 701 is connected to an anode of the display element 705, a gate terminal thereof is connected to one electrode of the capacitor 702. The other electrode of the capacitor 702 is connected to a first terminal (a source terminal or a drain terminal) of the third switching transistor 706 and a first terminal (a source terminal or a drain terminal) of the fourth switching transistor 707. A second terminal (the source terminal or the drain terminal) of the third switching transistor 706 is connected to the first signal line 710, and a second terminal (the source terminal or the drain terminal) of the fourth switching transistor 707 is connected to the second signal line 711. A drain terminal of the driving transistor 701 is connected to a source terminal of the first switching transistor 703 and a first terminal of the second switching transistor 704. A drain terminal of the first switching transistor 703 is connected to the power supply line 712. In addition, the gate terminal of the driving transistor 701 is connected to a second terminal of the second switching transistor 704. Therefore, when the second switching transistor 704 is on, the portion between the gate terminal and the drain terminal of the driving transistor 701 becomes conductive. Then, when the second switching transistor 704 is turned off, the portion between the gate terminal and the drain terminal of the driving transistor 701 becomes non-conductive, and a potential difference (a voltage) of a potential of the gate terminal (or the drain terminal) of the driving transistor 701 and an analog signal potential supplied from the first signal line 710 at this moment can be held in the capacitor 702. Furthermore, a cathode of the display element 705 is connected to a wire 713 to which a potential Vss is supplied. It is to be noted that Vss is a potential satisfying Vss<Vdd; for example, there may be Vss=GND (a ground potential). It is to be noted that the potential supplied to the power supply line is not limited to Vdd. For example, in the case where full color display is performed using color elements RGB, the power supply potential may be changed per pixel for each color element of RGB.

Note that on/off of the first switching transistor 703 is controlled by a signal inputted into the first scan line 708 which is connected to the gate terminal thereof, on/off of the second switching transistor 704 is controlled by a signal inputted into the second scan line 709 which is connected to the gate terminal thereof, on/off of the third switching transistor 706 is controlled by a signal inputted into the third scan line 714 which is connected to the gate terminal thereof, and on/off of the fourth switching transistor 707 is controlled by a signal inputted into the fourth scan line 715 which is connected to the gate terminal thereof. Specific operation of the pixel configuration shown in FIG. 7 is identical to the pixel configuration described in Embodiment Mode 1 shown in FIG. 4, and therefore, description thereof is omitted.

It is here preferable that the switching transistors have less leakage current (off current or gate leakage current). Off current means a current flowing between a source and a drain and gate leakage current means a current flowing between a gate and a source or a drain through a gate insulating film, when a transistor is off.

Therefore, each of n-type transistors used as the first switching transistor 703, the second switching transistor 704, the third switching transistor 706, and the fourth switching transistor 707 is preferably provided with an LDD region. This is because a transistor having an LDD region can reduce off current. Alternatively, the second switching transistor 704, the third switching transistor 706, and the fourth switching transistor 707 other than the first switching transistor 703 may be provided with an LDD region. This is because, if off current flows into the second switching transistor 704, charge of the capacitor 702 cannot be held, and the first switching transistor 703 needs to increase the on current when supplying current to the display element 705.

More preferably, the second switching transistor 704 and the first switching transistor 703 may be provided with an LDD region such that at least the LDD region of the first switching transistor 703 is partially overlapped with a gate electrode thereof. Accordingly, the second switching transistor 704 can reduce the off current, and the first switching transistor 703 can increase the on current and reduce generation of hot electrons. Consequently, the reliability of the first switching transistor 703 is improved.

In addition, the driving transistor 701 may also be provided with an LDD region so as to overlap with a gate electrode thereof, thereby the reliability can be improved.

Furthermore, by reducing the thickness of a gate insulating film, off current can be reduced as well. Therefore, respective thicknesses of the first switching transistor 703 and the second switching transistor 704 may be preferably thinner than that of the driving transistor 701.

Furthermore, by forming the first switching transistor 703 and the second switching transistor 704 to be multigate transistors, gate leakage current can be reduced.

In particular, the capacitor 702 cannot hold the voltage written in the writing period if off current flows into the second switching transistor 704; therefore, to provide an LDD region, to make a gate insulating film thin, or to form to have a multigate may be carried out only for the second switching transistor 704.

It is to be noted that a potential of H level of the first scan line 708 is preferably higher than a potential of the power supply line 712 by at least a threshold voltage Vth of the first switching transistor 703. Similarly, a potential of H level of the second scan line 709 is preferably higher than a potential of the power supply line 712 by at least a threshold voltage Vth of the second switching transistor 704. Similarly, a potential of H level of the third scan line 714 is preferably higher than a potential of the first signal line 710 by at least a threshold voltage Vth of the third switching transistor 706. Similarly, a potential of H level of the fourth scan line 715 is preferably higher than a potential of the second signal line 711 by at least a threshold voltage Vth of the fourth switching transistor 707.

Figure 7:
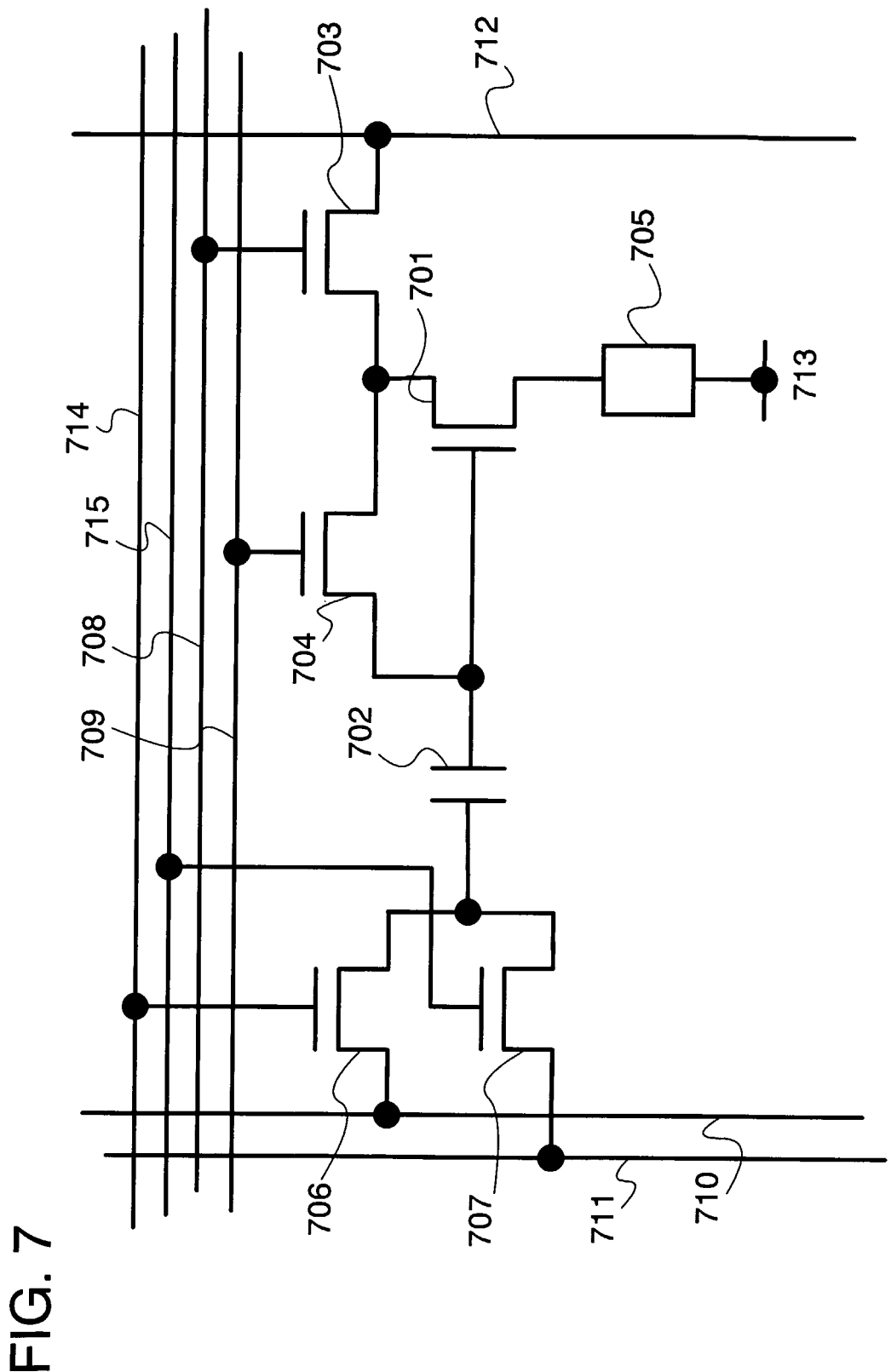
FIG. 7 is a diagram showing a pixel configuration of the invention.
Figure 18:
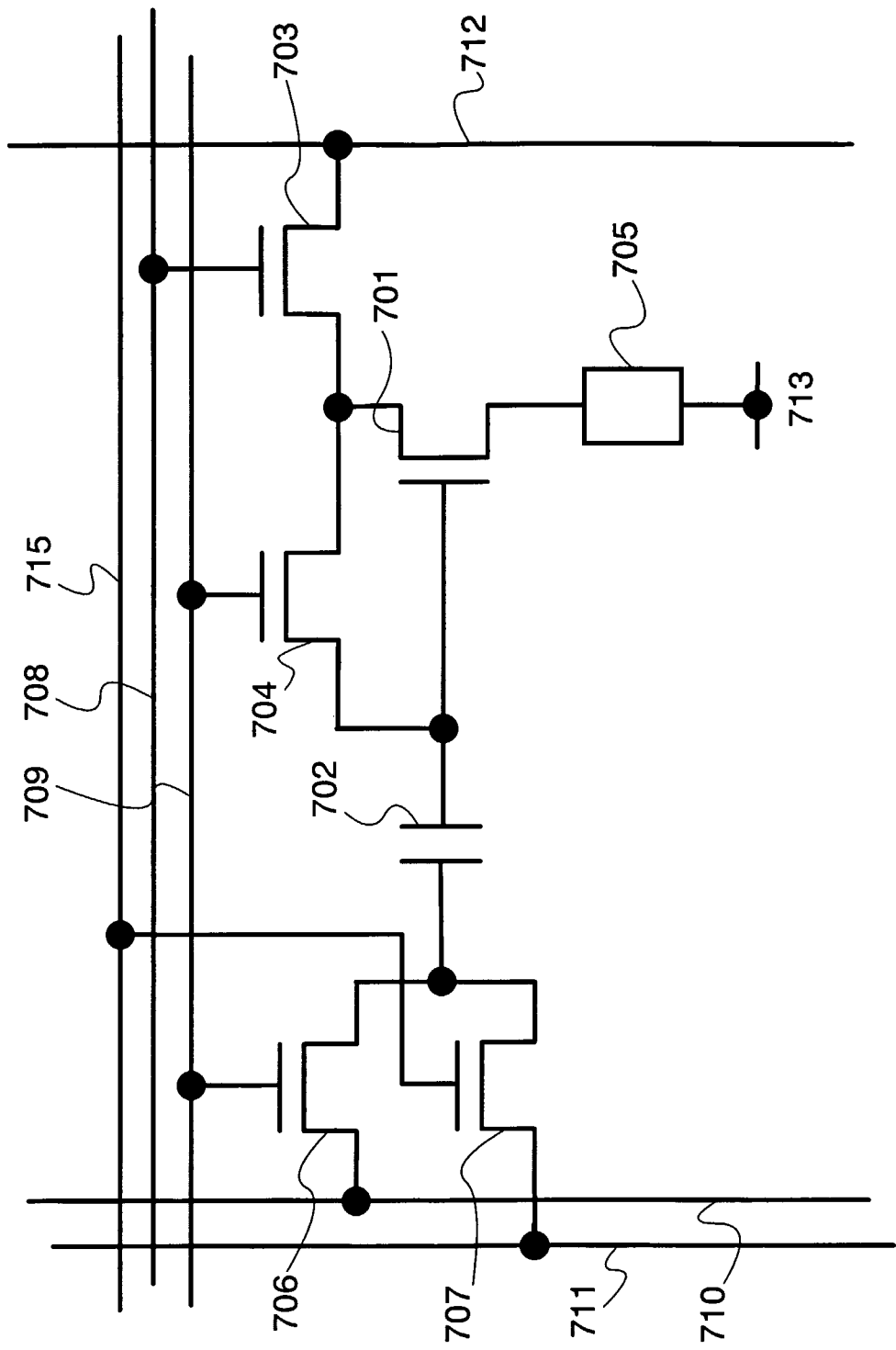
FIG. 18 is a diagram showing a pixel configuration of the invention.

It is to be noted that on/off of the third switching transistor 706 and the second switching transistor 704 can be controlled at the same timing, thus the third scan line 714 may not be provided in the configuration shown in FIG. 7 by connecting the gate terminal of the third switching transistor 706 to the second scan line 709 as shown in FIG. 18.

An LDD region can be easily formed in an n-type transistor. Therefore, by using an n-type transistor as a switching transistor as described in this embodiment mode, the switching transistor can reduce the off current. Furthermore, by forming the switching transistor to have a multigate, further reduction of the gate leakage current can be realized. Therefore, a switching function of the switching transistor can be further improved.

In addition, a circuit constituted only by n-type transistors, including a whole pixel region and a peripheral driver circuit, can be provided. Accordingly, a display device panel having a single conductivity type can be provided at low cost by a reduced number of steps.

In addition, since thin film transistors used in a circuit included in the display device panel can be formed only by n-type transistors, a display device including a circuit constituted by a thin film transistor in which an amorphous semiconductor or a semi-amorphous semiconductor (also called a microcrystalline semiconductor) is used in its semiconductor layer can be provided. For example, amorphous silicon (a-Si: H) may be used as an amorphous semiconductor.

It is to be noted in this embodiment mode that the source and drain terminals of the driving transistor for driving the display element, and the anode and cathode of the display element mean respective terminals and electrodes when a forward voltage is applied to the display element.

Embodiment Mode 4

In this embodiment mode, a case where a p-type transistor is used as at least one of the switches in the pixel configurations described in Embodiment Mode 1 and Embodiment Mode 2 is described.

Figure 20:
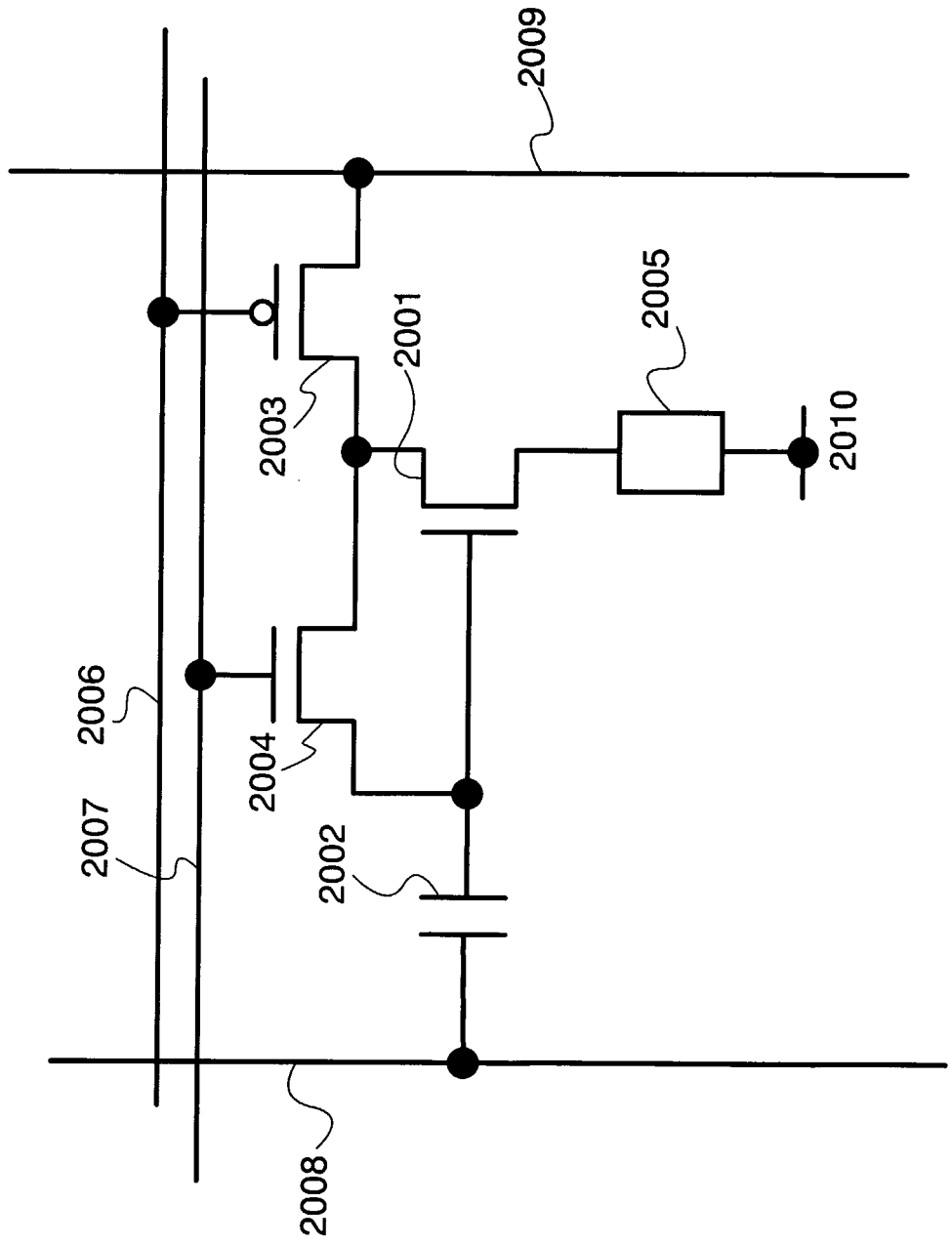
FIG. 20 is a diagram showing a pixel configuration of the invention.

First, a case where a p-type transistor is used as the first switch 103 and an n-type transistor is used as the second switch 104 in the pixel configuration shown in FIG. 1 is described with reference to FIG. 20.

A pixel comprises a driving transistor 2001, a capacitor 2002, a first switching transistor 2003 which is a p-type transistor, a second switching transistor 2004 which is an n-type transistor, a display element 2005, a first scan line (G1 line) 2006, a second scan line (G2 line) 2007, a signal line (Data line) 2008, and a power supply line (Supply line) 2009. It is to be noted that the driving transistor 2001 is an n-type transistor.

A source terminal of the driving transistor 2001 is connected to an anode of the display element 2005, a gate terminal thereof is connected to the signal line 2008 via the capacitor 2002, and a drain terminal thereof is connected to a drain terminal of the first switching transistor 2003 and a first terminal (a source terminal or a drain terminal) of the second switching transistor 2004. A source terminal of the first switching transistor 2003 is connected to the power supply line 2009, and a gate terminal thereof is connected to the first scan line 2006. Therefore, by supplying a signal of L level to the first scan line 2006, the first switching transistor 2003 is turned on, and a power supply potential Vdd supplied to the power supply line 2009 can be supplied to the drain terminal of the driving transistor 2001. In addition, a second terminal (the source terminal or the drain terminal) of the second switching transistor 2004 is connected to the gate terminal of the driving transistor 2001. Therefore, by supplying a signal of H level to the second scan line 2007, the second switching transistor 2004 is turned on, and the portion between the drain terminal and the gate terminal of the driving transistor 2001 becomes conductive. Then, when the second switching transistor 2004 is turned off, the portion between the gate terminal and the drain terminal of the driving transistor 2001 becomes non-conductive, and a potential difference (a voltage) between a potential of the gate terminal (or the drain terminal) of the driving transistor 2001 and a potential of the signal line 2008 at this moment can be held in the capacitor 2002. Furthermore, a cathode of the display element 2005 is connected to a wire 2010 to which a potential Vss is supplied. It is to be noted that Vss is a potential satisfying Vss<Vdd; for example, there may be Vss=GND (a ground potential). It is also to be noted that the potential supplied to the power supply line is not limited to Vdd. For example, in the case where full color display is performed using color elements RGB, the power supply potential may be changed per pixel for each color element of RGB.

Figure 21:
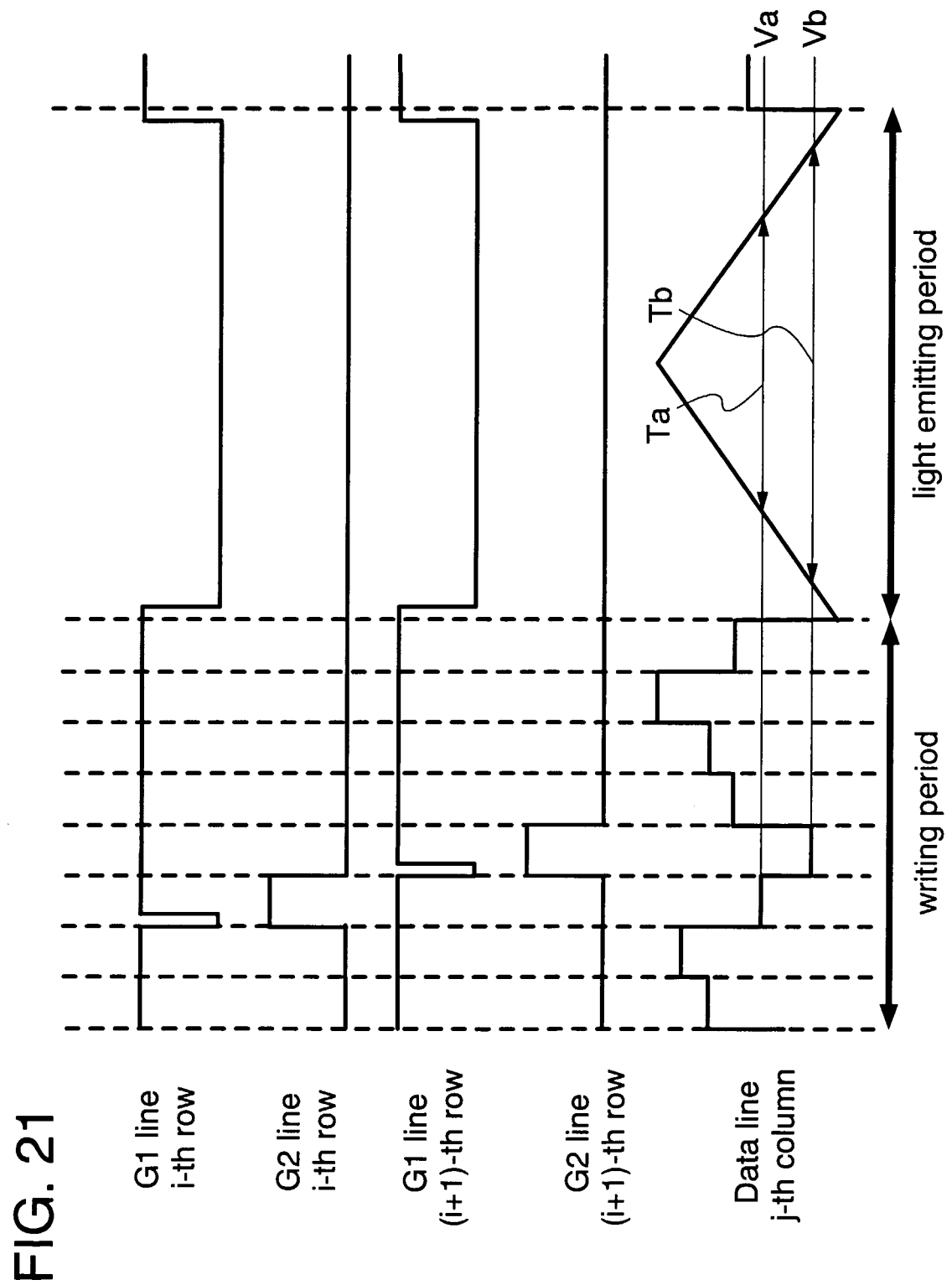
FIG. 21 is a diagram showing a timing chart of a display device having a pixel configuration of the invention.

FIG. 21 is a timing chart of this pixel configuration. The timing chart shown in FIG. 21 is different from that shown in FIG. 3 in that the rectangular wave of G1 line (the first scan line) is inverted from H level to L level. That is, in the pixel configuration shown in FIG. 20, the first switching transistor 2003 is turned on when a signal of the first scan line 2006 falls from H level to L level. The other operations are identical to those in the pixel configuration shown in FIG. 1 described in Embodiment Mode 1, and therefore, description thereof is omitted.

It is to be here that a potential of the source terminal of the first switching transistor 2003 is fixed since the source terminal is connected to the power supply line 2009 to which a power supply potential Vdd is supplied. Therefore, a signal supplied to the first scan line 2006 in order to control on/off of the first switching transistor 2003 can be determined regardless of a load connected to the drain terminal thereof. That is, the signal for controlling on/off of the first switching transistor 2003 is determined such that a potential difference between the fixed power supply potential Vdd and a potential of the gate terminal is larger than a threshold voltage thereof. Accordingly, the amplitude of the signal can be suppressed to the minimum, thereby power consumption can be reduced.

In addition, the first switching transistor 2003 such that the off current is not small does not affect so much since the drain terminal thereof is connected to the capacitor 2002 via the second switching transistor 2004.

Therefore, a p-type transistor is preferably used as the first switching transistor 2003.

Furthermore, the second switching transistor 2004 which is an n-type transistor is easily provided with an LDD region, thereby the off current can be reduced. Accordingly, voltage holding capability of the capacitor 2002 can be improved.

Next, a case where a p-type transistor is used as at least one of the switches in the pixel configuration shown in FIG. 4 is described with reference to FIG. 22.

A pixel comprises a driving transistor 2201, a capacitor 2202, a first switching transistor 2203, a second switching transistor 2204, a display element 2205, a third switching transistor 2206, a fourth switching transistor 2207, a first scan line (G1 line) 2208, a second scan line (G2 line) 2209, a first signal line (Data1 line) 2210, a second signal line (Data2 line) 2211, a power supply line (Supply line) 2212, and a third scan line 2214. It is to be noted that the driving transistor 2201, the second switching transistor 2204, and the third switching transistor 2206 are n-type transistors, and the first switching transistor 2203 and the fourth switching transistor 2207 are p-type transistors.

A source terminal of the driving transistor 2201 is connected to an anode of the display element 2205, a gate terminal thereof is connected to one electrode of the capacitor 2202. The other electrode of the capacitor 2202 is connected to a first terminal (a source terminal or a drain terminal) of the third switching transistor 2206 and a first terminal (a source terminal or a drain terminal) of the fourth switching transistor 2207. A second terminal (the source terminal or the drain terminal) of the third switching transistor 2206 is connected to the first signal line 2210, and a second terminal (the source terminal or the drain terminal) of the fourth switching transistor 2207 is connected the second signal line 2211. A drain terminal of the driving transistor 2201 is connected to a drain terminal of the first switching transistor 2203. In addition, the drain terminal of the driving transistor 2201 is connected a first terminal (a source terminal or a drain terminal) of the second switching transistor 2204, and the gate terminal of the driving transistor 2201 is connected to a second terminal (the source terminal or the drain terminal) of the second switching transistor 2204. Therefore, when the second switching transistor 2204 is on, the portion between the gate terminal and the drain terminal of the driving transistor 2201 becomes conductive. Then, when the second switching transistor 2204 is turned off, the portion between the gate terminal and the drain terminal of the driving transistor 2201 becomes non-conductive, and a potential difference (a voltage) between a potential of the gate terminal (or the drain terminal) of the driving transistor 2201 and an analog signal potential supplied from the first signal line 2210 at this moment can be held in the capacitor 2202. Furthermore, a source terminal of the first switching transistor 2203 is connected to the power supply line 2212. A cathode of the display element 2205 is connected to a wire 2213 to which a potential Vss is supplied. It is to be noted that Vss is a potential satisfying Vss<Vdd; for example, there may be Vss=GND (a ground potential). It is also to be noted that the potential supplied to the power supply line is not limited to Vdd. For example, in the case where full color display is performed using color elements RGB, the power supply potential may be changed per pixel for each color element of RGB.

Note that on/off of the first switching transistor 2203 is controlled by a signal inputted into the first scan line 2208 which is connected to the gate terminal thereof, on/off of the second switching transistor 2204 is controlled by a signal inputted into the second scan line 2209 which is connected to the gate terminal thereof, and on/off of the third switching transistor 2206 and the fourth switching transistor 2207 are controlled by a signal inputted into the third scan line 2214 which is connected to the gate terminals thereof. That is, when a signal of the third scan line 2214 is H level, the third switching transistor 2206 is turned on while when it is L level, the fourth switching transistor 2207 is turned on. In this manner, a wire connected to the pixel can be changed between a writing period and a light emitting period.

Figure 22:
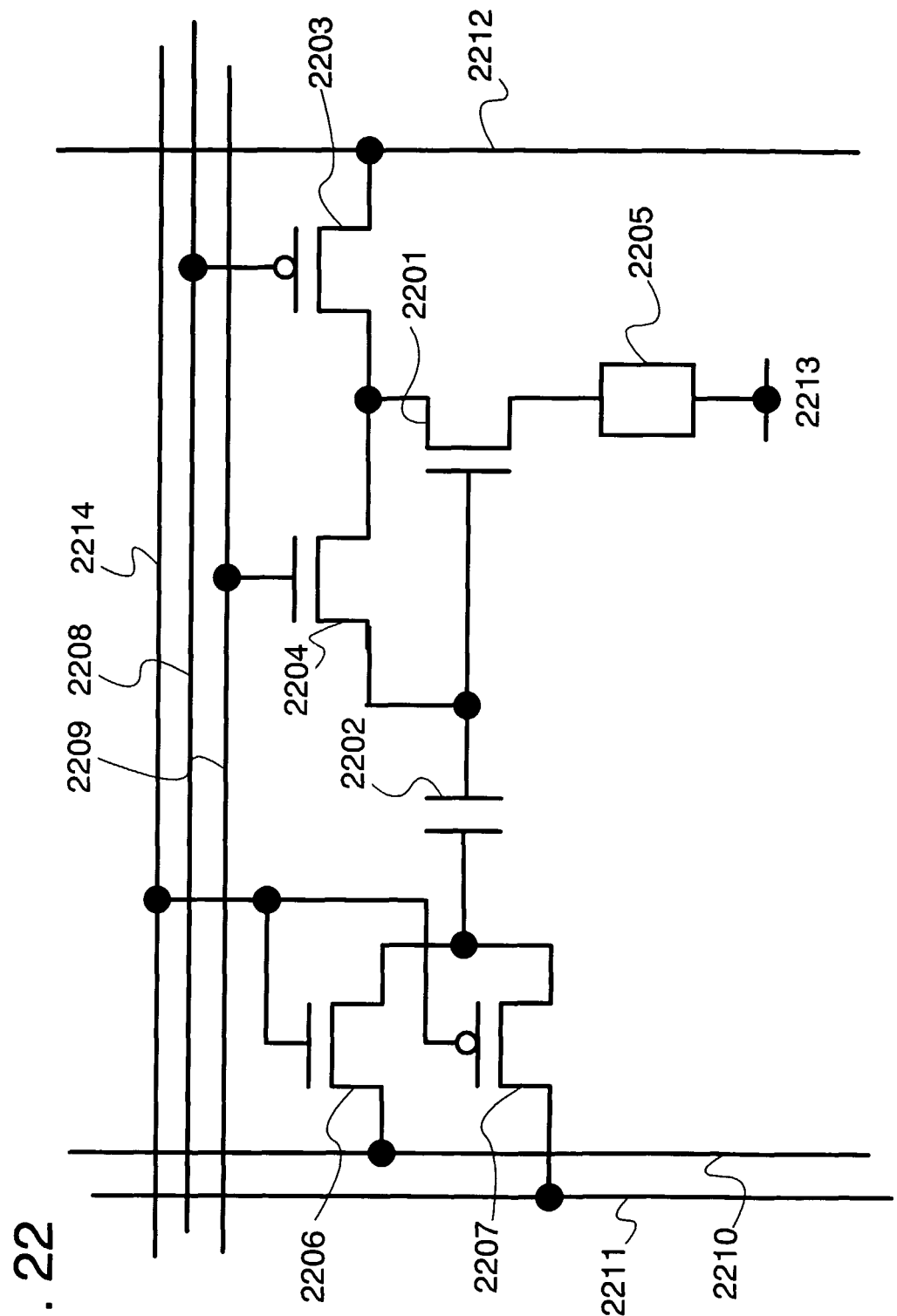
FIG. 22 is a diagram showing a pixel configuration of the invention.

Although on/off of the third switching transistor 2206 and the fourth switching transistor 2207 may be controlled by different scan lines respectively, the opening ratio of a pixel can be increased by controlling them by the common scan line as shown in FIG. 22.

Figure 24:
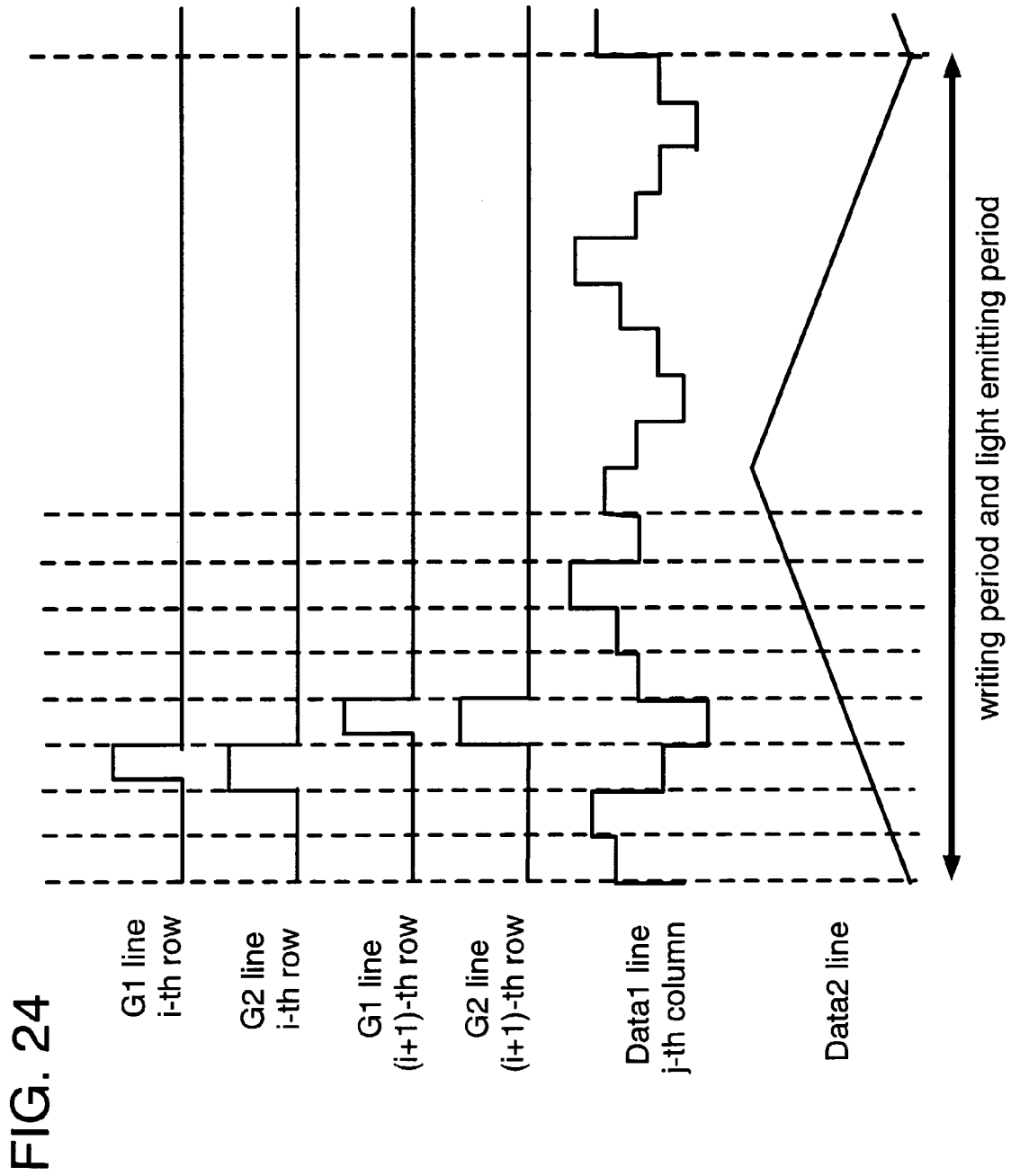
FIG. 24 is a diagram showing a timing chart of a display device having a pixel configuration of the invention.

FIG. 24 is a timing chart of this pixel configuration. The timing chart shown in FIG. 24 is different from that shown in FIG. 5 in that the rectangular wave of G1 line (the first scan line) is inverted from H level to L level. That is, in the pixel configuration shown in FIG. 22, the first switching transistor 2203 is turned on when a signal of the first scan line 2208 is L level. When the signal of the first scan line 2208 rises from L level to H level, the first switching transistor 2203 is turned off. The other operations are identical to those in the pixel configuration shown in FIG. 4 described in Embodiment Mode 2, and therefore, description thereof is omitted.

It is to be noted here that a potential of the source terminal of the first switching transistor 2203 is fixed since the source terminal is connected to a power supply potential Vdd. Therefore, a signal supplied to the first scan line 2208 in order to control on/off of the first switching transistor 2203 can be determined regardless of a load connected to the drain terminal thereof. That is, the signal for controlling on/off of the first switching transistor 2203 is determined such that a potential difference between the fixed power supply potential Vdd and a potential of the gate terminal is larger than a threshold voltage thereof. Accordingly, the amplitude of the signal can be suppressed to the minimum, thereby power consumption can be reduced.

In addition, the first switching transistor 2203 such that the off current is not small does not affect so much since the drain terminal thereof is connected to the capacitor 2202 via the second switching transistor 2204.

Therefore, a p-type transistor is preferably used as the first switching transistor 2203.

Furthermore, the second switching transistor 2204 which is an n-type transistor is easily provided with an LDD region, thereby the off current can be reduced. Accordingly, the capacitor 2202 can hold voltage.

Figure 23:
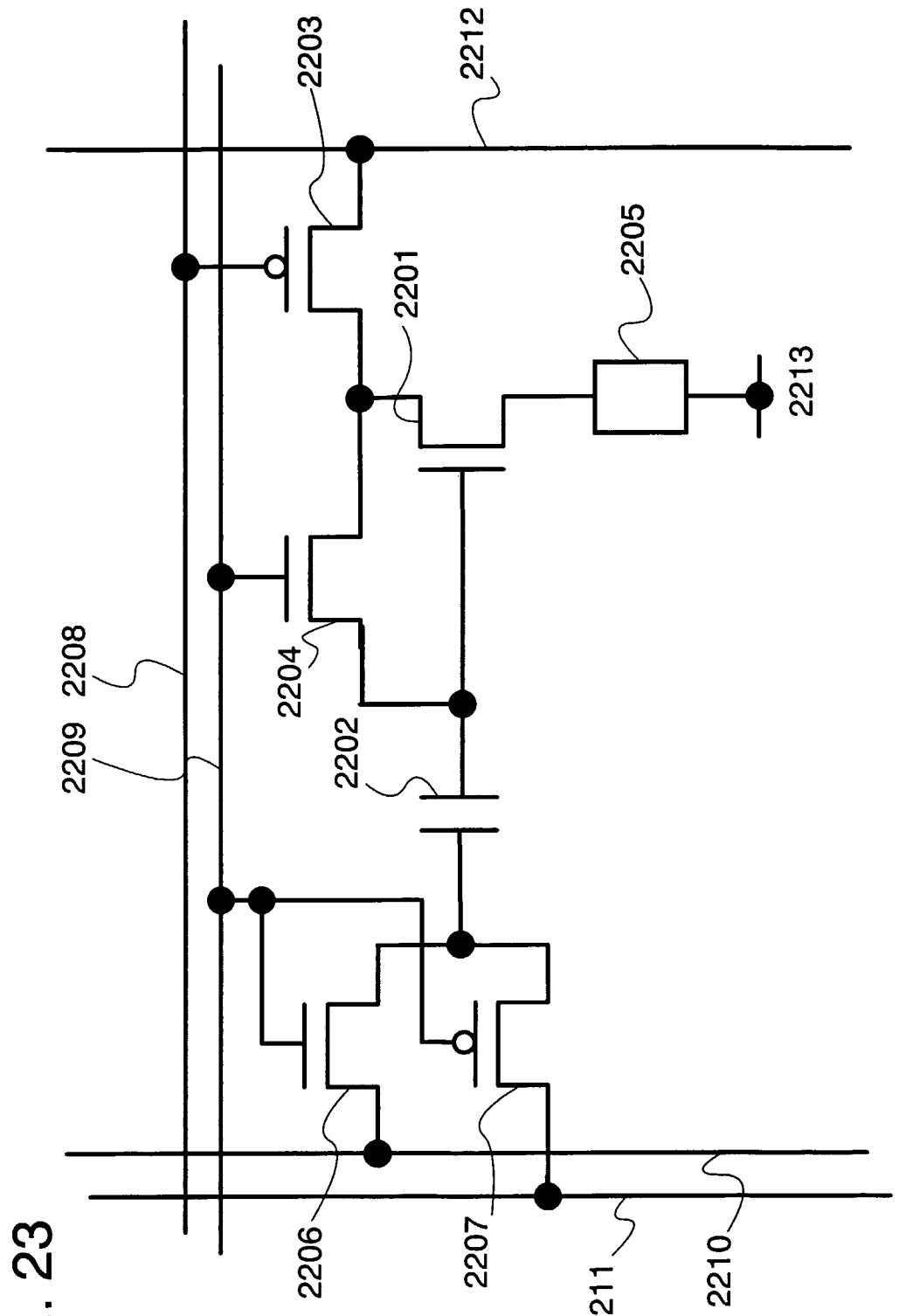
FIG. 23 is a diagram showing a pixel configuration of the invention.

Then, FIG. 23 shows a configuration after further reducing the number of wires in the configuration shown in FIG. 22. In the configuration shown in FIG. 23, a wire connected to the gate terminals of the third switching transistor 2206 and the fourth switching transistor 2207 is connected to the second scan line 2209. That is, as a signal for changing between a writing period and a light emitting period, a signal inputted to one electrode of the capacitor 2202 is inputted into the third scan line 2214 in the configuration shown in FIG. 22, while in the configuration shown in FIG. 23, a signal inputted into the second scan line 2209 is used as the signal for changing between a writing period and a light emitting period.

The configuration shown in FIG. 23 can improve the opening ratio of a pixel because the number of wires can be further reduced than the configuration shown in FIG. 22.

Subsequently, a configuration in which p-type transistors are used as the first switch 101 and the second switch 104 and the number of wires is reduced in the configuration shown in FIG. 1, and operation thereof are described with reference to FIGS. 25 and 26.

Figure 25:
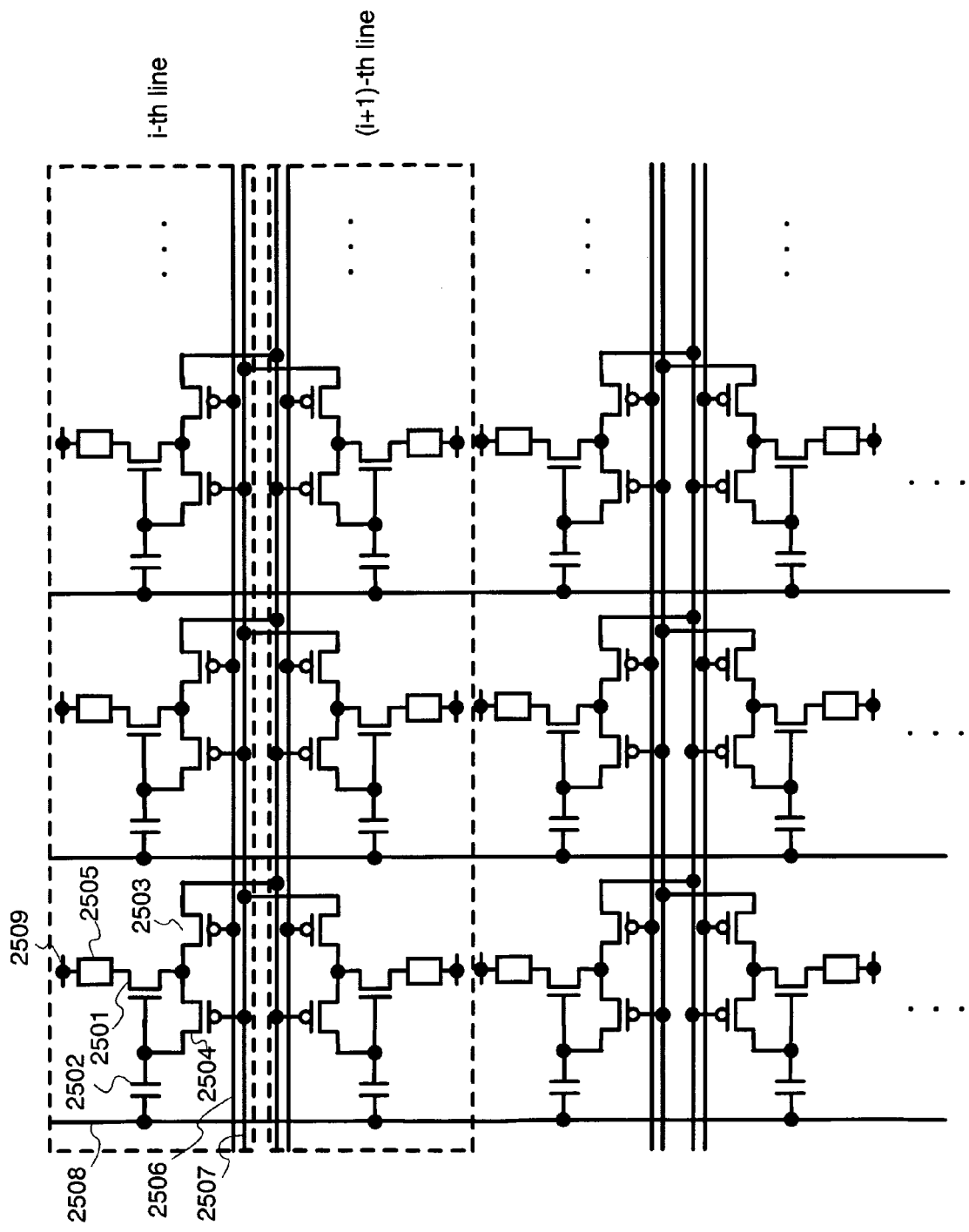
FIG. 25 is a diagram illustrating a display device having a pixel configuration of the invention.

A pixel shown in FIG. 25 comprises a driving transistor 2501, a capacitor 2502, a first switching transistor 2503 which is a p-type transistor, a second switching transistor 2504 which is a p-type transistor, a display element 2505, a first scan line (G1 line) 2506, a second scan line (G2 line) 2507, and a signal line (Data line) 2508. It is to be noted that the driving transistor 2501 is an n-type transistor.

A source terminal of the driving transistor 2501 is connected to an anode of the display element 2505, a gate terminal thereof is connected to the signal line 2508 via the capacitor 2502, and a drain terminal thereof is connected to a drain terminal of the first switching transistor 2503 and a first terminal (a source terminal or a drain terminal) of the second switching transistor 2504. A source terminal of the first switching transistor 2503 is connected to the second scan line 2507 of pixels of another row, and a gate terminal thereof is connected to the first scan line 2506.

Figure 26:
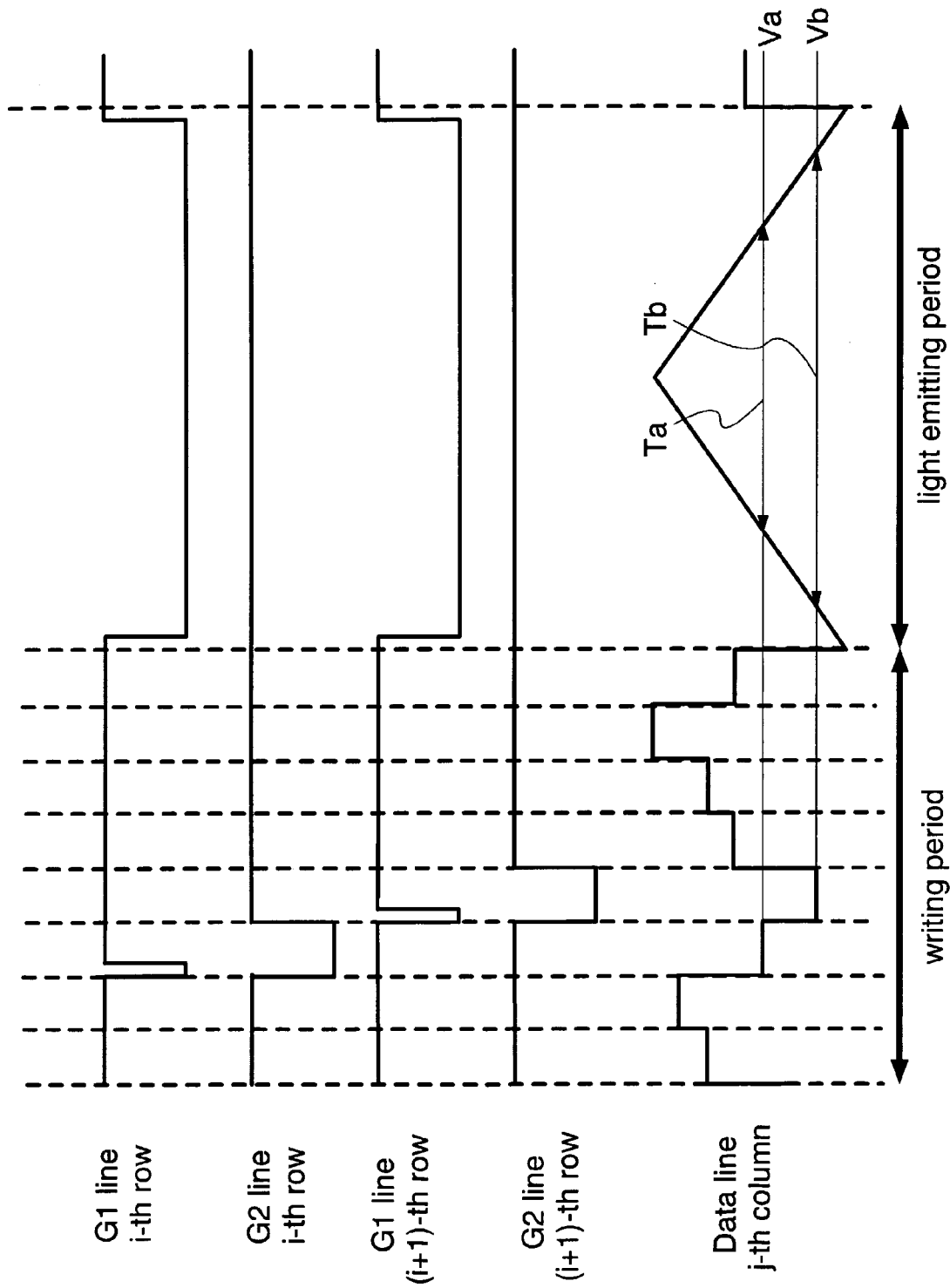
FIG. 26 is a diagram showing a timing chart of a display device having a pixel configuration of the invention.

Therefore, when a signal of L level is supplied to the first scan line 2506 of the i-th row as shown in FIG. 26, the first switching transistor 2503 is turned on. In addition, a second terminal (the source terminal or the drain terminal) of the second switching transistor 2504 is connected to the gate terminal of the driving transistor 2501. Therefore, when a signal of L level is supplied to the second scan line 2507, the second switching transistor 2504 is turned on and the portion between the drain terminal and the gate terminal of the driving transistor 2501 becomes conductive. Then, when the second switching transistor 2504 is turned off, the portion between the gate terminal and the drain terminal of the driving transistor 2501 becomes non-conductive, and a potential difference (a voltage) between a potential of the gate terminal (or the drain terminal) of the driving transistor 2501 and a potential of the signal line 2508 at this moment can be held in the capacitor 2502. Furthermore, a cathode of the display element 2505 is connected to a wire 2509 to which a potential Vss is supplied. It is to be noted that the second scan line 2507 functions as a power supply line of pixels of another row in a period except for a writing period, to which Vdd is supplied as a potential of H level. It is also to be noted that Vss is a potential satisfying Vss<Vdd; for example, there may be Vss=GND (a ground potential).

FIG. 26 is a timing chart of this pixel configuration. The timing chart shown in FIG. 26 is different from that shown in FIG. 3 in that the rectangular waves of G1 line (the first scan line 2506) and G2 line (the second scan line 2507) are inverted from H level to L level. That is, in the pixel configuration shown in FIG. 25, the first switching transistor 2503 is turned on when a signal of the first scan line 2506 falls from H level to L level. Similarly, the second switching transistor 2504 is turned on when a signal of the second scan line 2507 falls from H level to L level.

When a signal of L level is supplied to the first scan line 2506 of the i-th row to turn on the first switching transistor 2503, a potential of H level is supplied to the second scan line 2507 of the (i+1)-th row, thereby the potential of H level (Vdd) can be supplied to the source terminal of the first switching transistor 2503.

In this manner, without separately providing a power supply line for supplying current to the display element 2505, a scan line of another row can be used. It is to be noted that although the source terminal of the first switching transistor 2503 is connected to the second scan line 2507 of the next row, the invention is not limited to this. However, considering a pixel layout, it is preferable to use the second scan line 2507 of pixels of the next row in the case where the second scan line 2507 of another row is used as a power supply line.

In addition, since the current supply capability of the scan line connected to the source terminal of the first switching transistor 2503 is required to be high, it is preferable to provide a buffer in the second scan line 2507.

It is to be noted in this embodiment mode that the source and drain terminals of the driving transistor for driving the display element, and the anode and cathode of the display element mean respective terminals and electrodes when a forward voltage is applied to the display element.

Embodiment Mode 5

Described in this embodiment mode are a pixel configuration which reduces current supplied to a display element, and a driving method thereof in a writing period.

Figure 33:
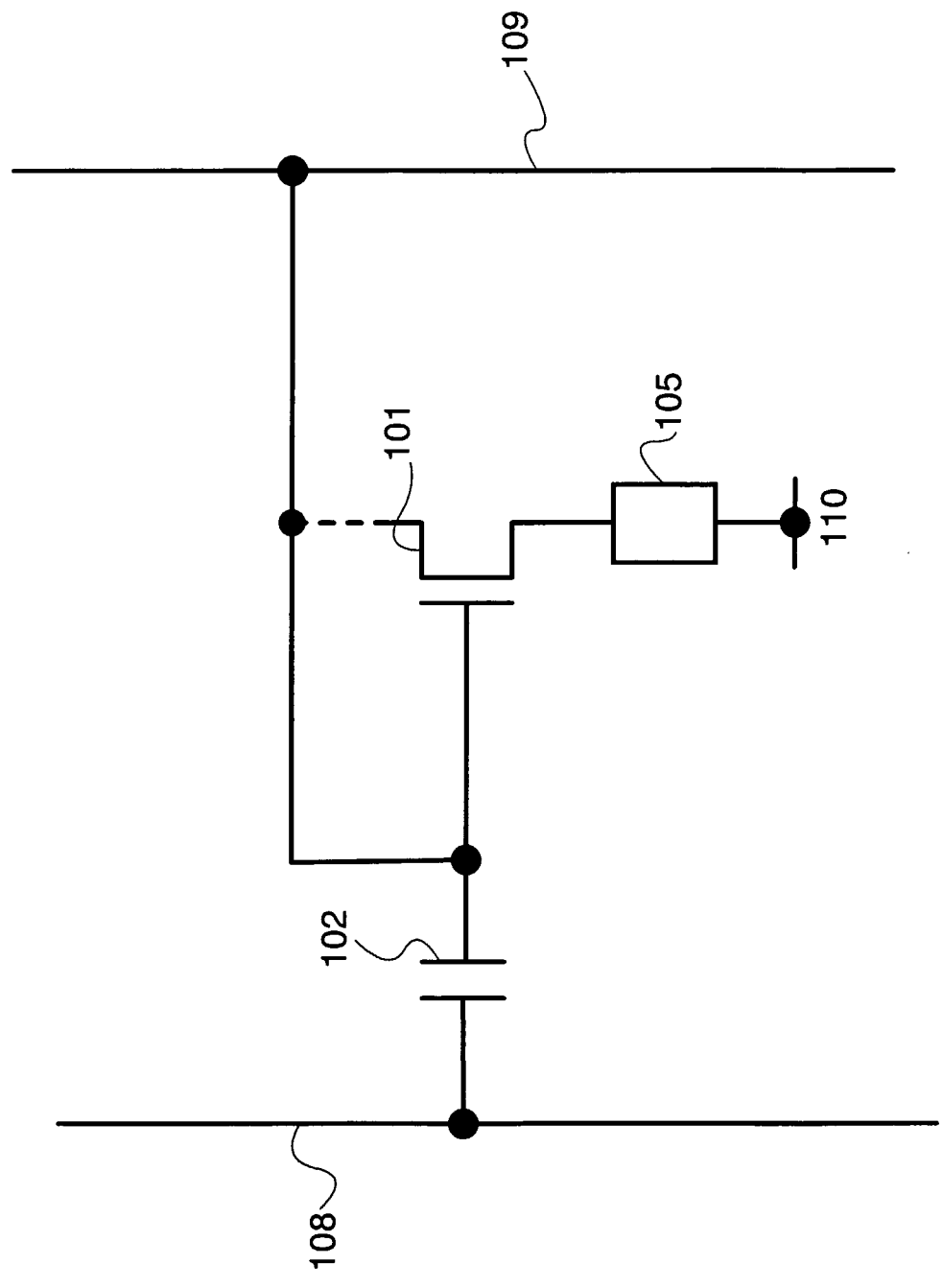
FIG. 33 is a diagram for illustrating connection of a pixel of the invention.

First, using the pixel configuration described in Embodiment Mode 1, operation of the pixel and connection at that time are described. In a writing period of the pixel, when a potential of the gate terminal of the driving transistor 101 to turn on the driving transistor is accumulated in the capacitor 102, the power supply line 109 and the signal line 108 are connected to each other via the capacitor 102 as shown in FIG. 33. At that time, the drain terminal of the driving transistor 101 may be connected to the gate terminal thereof (or the power supply line 109); that is, a portion shown by a dotted line in FIG. 33 may be connected or may not be connected.

Figure 34:
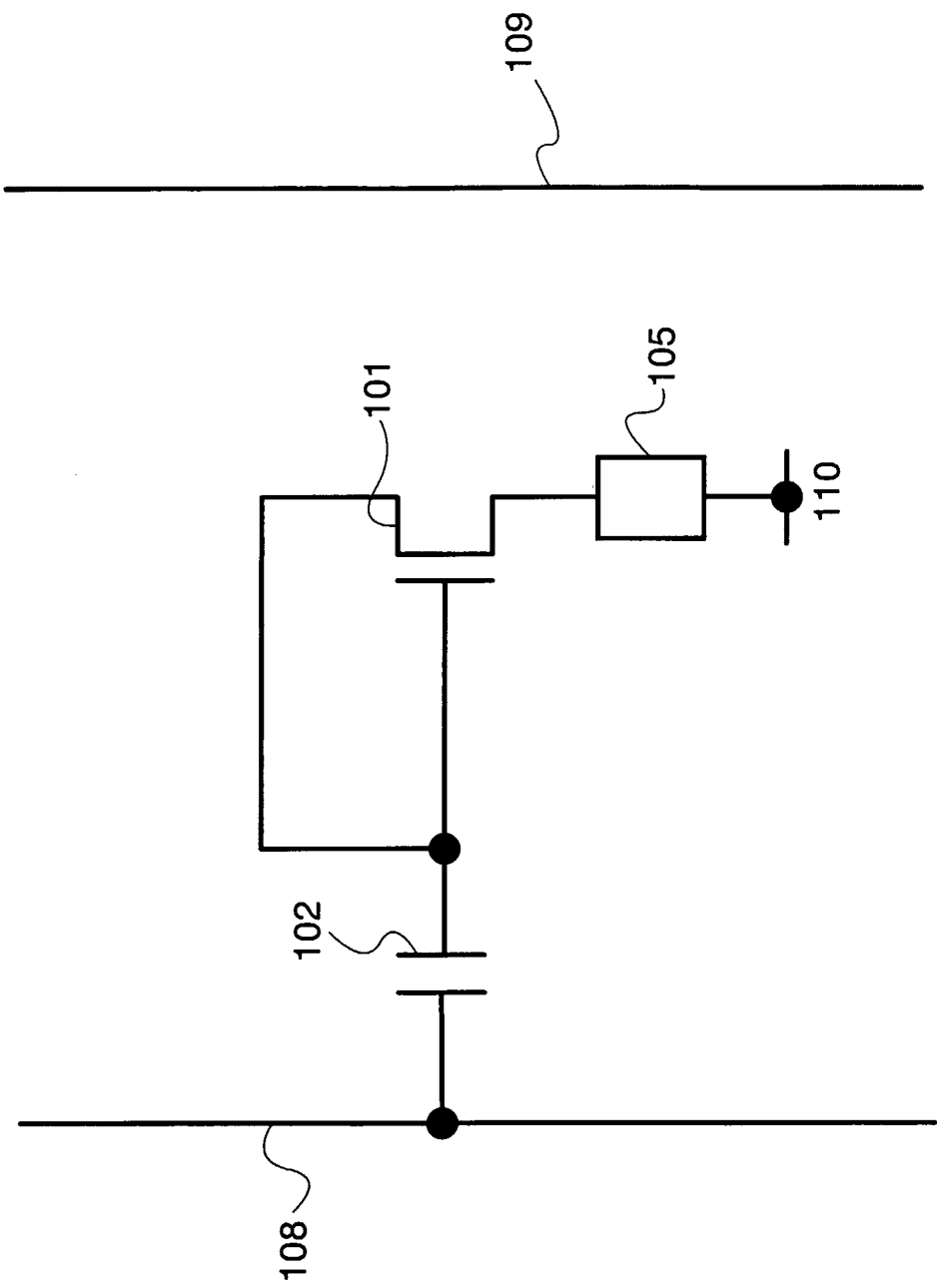
FIG. 34 is a diagram for illustrating connection of a pixel of the invention.

When a gate potential required for controlling on/off of the driving transistor 101 is obtained, the drain terminal and the gate terminal of the driving transistor 101 are connected as shown in FIG. 34. In this manner, a charge corresponding to a potential difference between the potential of the gate terminal in order to change on/off of the driving transistor 101 and an analog signal potential supplied to the signal line 108 at that moment is accumulated in the capacitor 102.

Figure 35:
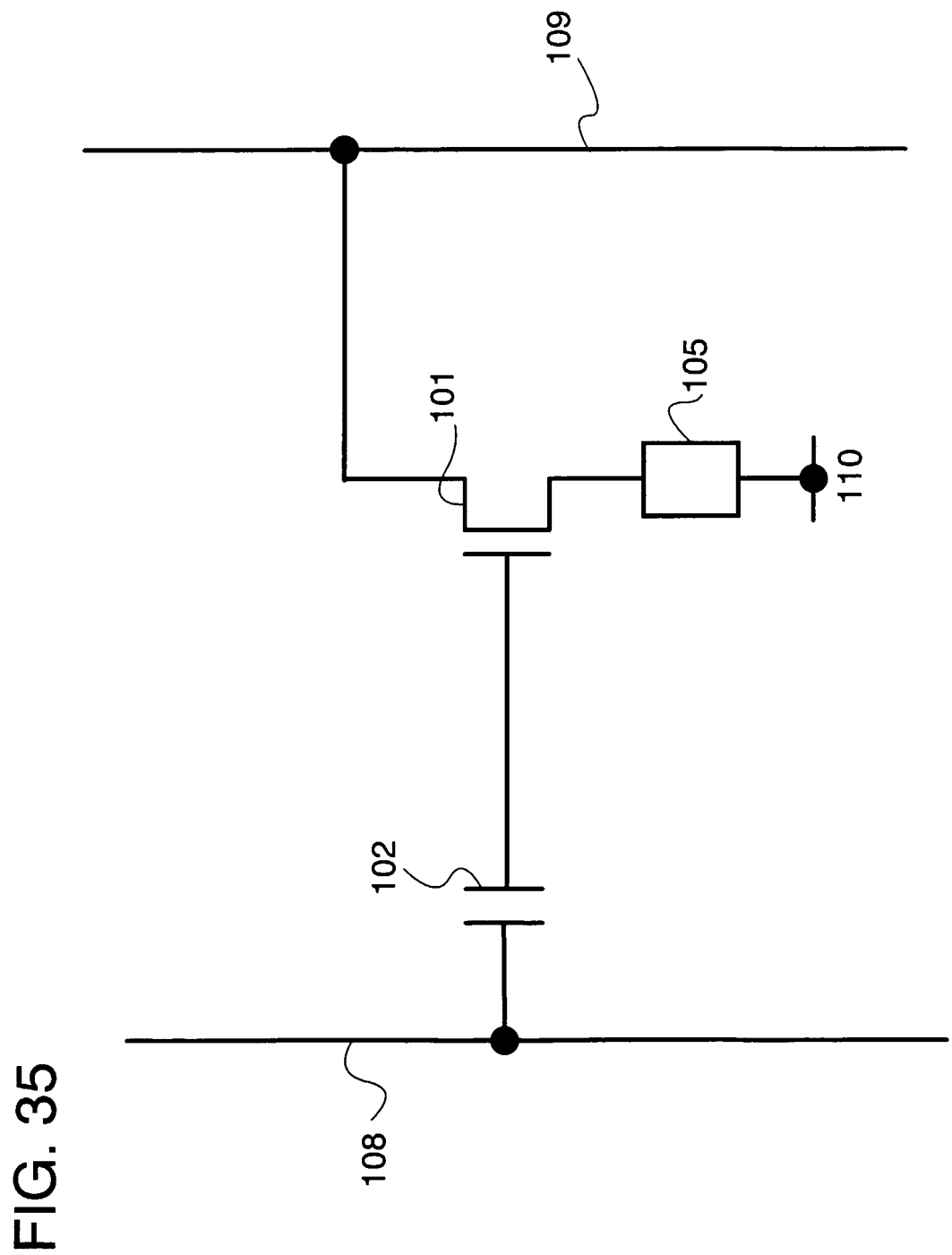
FIG. 35 is a diagram for illustrating connection of a pixel of the invention.

In a light emitting period, the drain terminal of the driving transistor 101 is connected to the power supply line 109 as shown in FIG. 35. The potential of the power supply line 109 can be supplied to the drain terminal of the driving transistor 101 in this manner. Therefore, when the driving transistor 101 is turned on, current can be supplied from the power supply line 109 to the display element 105.

Figure 73:
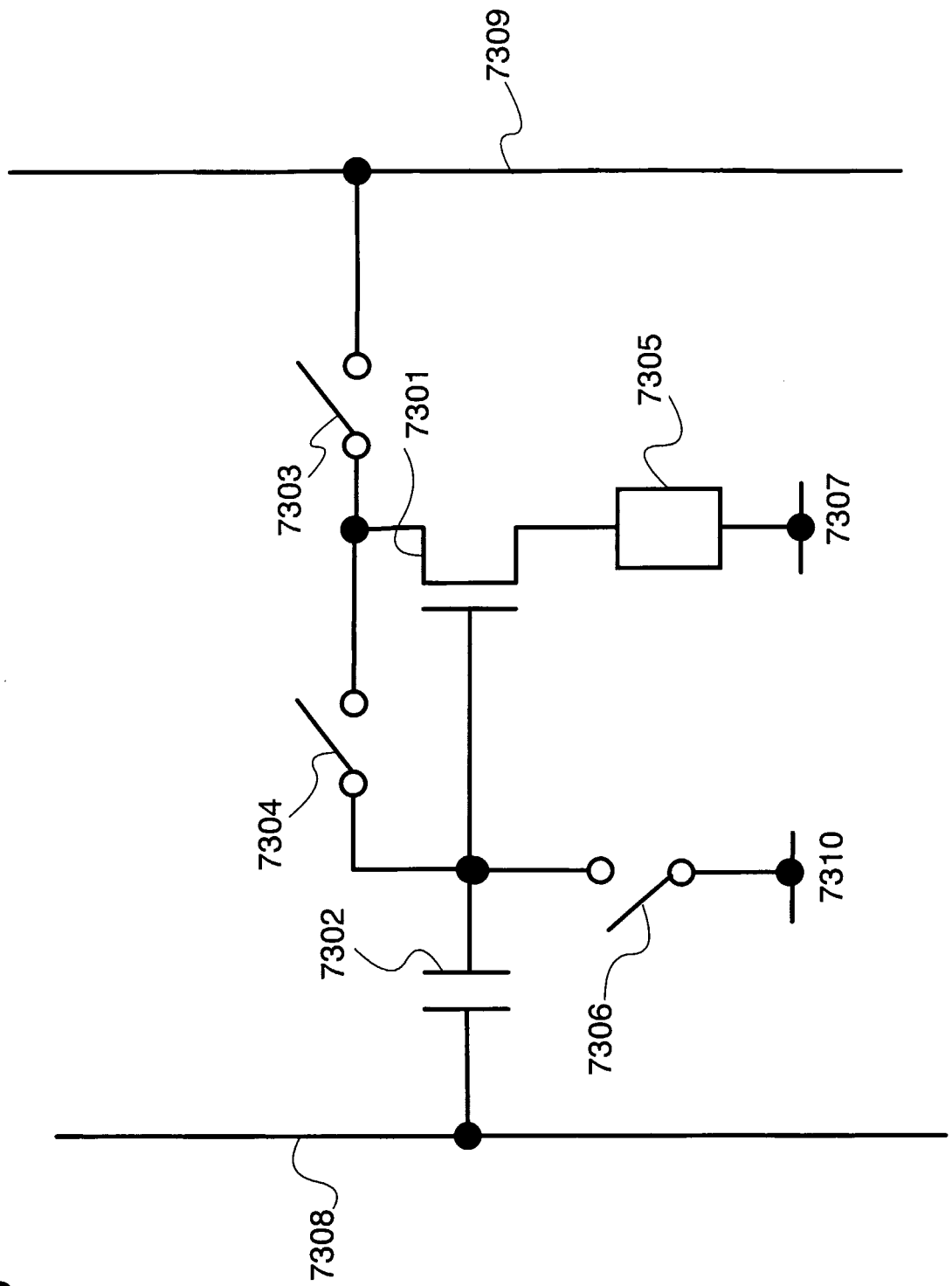
FIG. 73 is a diagram showing a pixel configuration of the invention.

It is to be noted in this embodiment mode that, by not connecting the drain terminal of the driving transistor 101 which is shown by the dotted line in FIG. 33 to the gate terminal thereof and the power supply line 109, current can prevent from flowing into the display element 105 when a potential of the gate terminal of the driving transistor 101 is accumulated in the capacitor 102 in order to turn on the driving transistor 101 sufficiently. Accordingly, power consumption can be reduced. Examples of such a pixel configuration are shown in FIGS. 36, 37, and 73.

Figure 36:
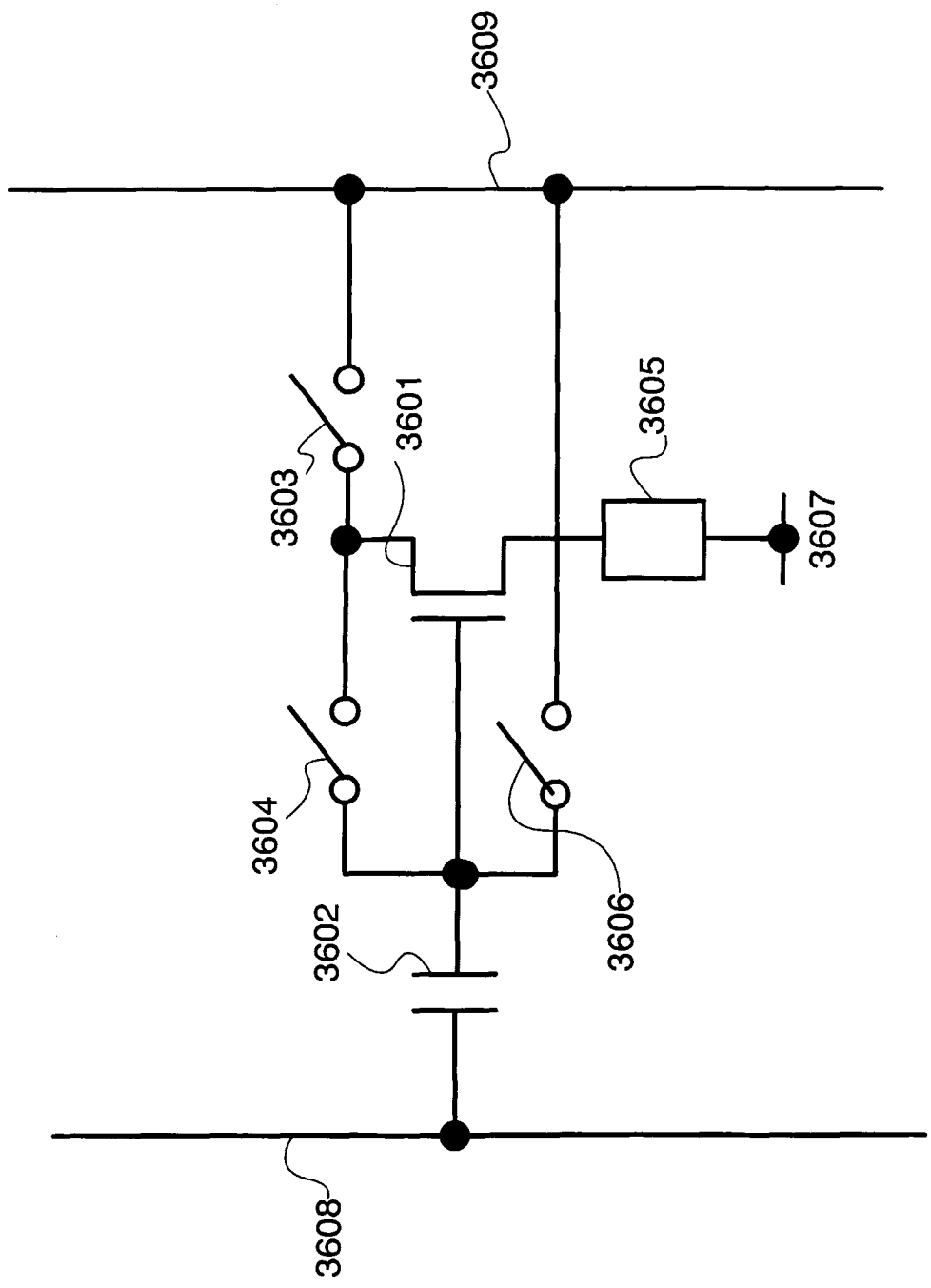
FIG. 36 is a diagram showing a pixel configuration of the invention.
Figure 37:
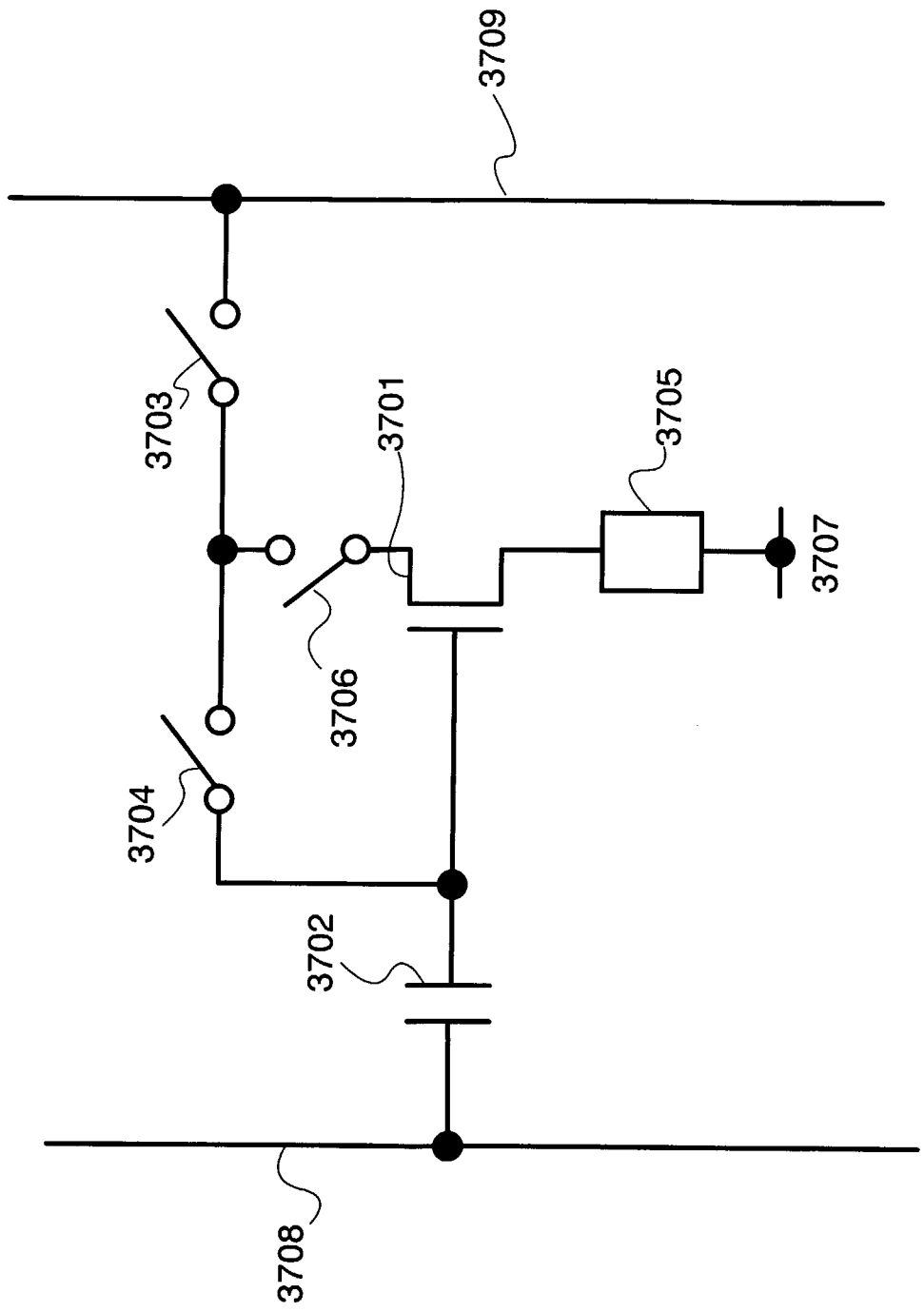
FIG. 37 is a diagram showing a pixel configuration of the invention.

A pixel configuration shown in FIG. 36 is described in detail. A pixel comprises a driving transistor 3601, a capacitor 3602, a first switch 3603, a second switch 3604, a third switch 3606, a display element 3605, a signal line 3608, and a power supply line 3609. It is to be noted that the driving transistor 3601 is an n-type transistor.

A source terminal of the driving transistor 3601 is connected to an anode of the display element 3605, a gate terminal thereof is connected to the signal line 3608 via the capacitor 3602, and a drain terminal thereof is connected to the power supply line 3609 via the first switch 3603. It is to be noted that a power supply potential Vdd is supplied to the power supply line 3609. In addition, the gate terminal of the driving transistor 3601 is connected to the power supply line 3609 via the third switch 3606 and connected to the drain terminal thereof via the second switch 3604. Therefore, when the second switch 3604 is on, the portion between the gate terminal and the drain terminal of the driving transistor 3601 becomes conductive. Then, when the second switch 3604 is turned off, the portion between the gate terminal and the drain terminal of the driving transistor 3601 becomes non-conductive, and a potential difference (a voltage) between a potential of the gate terminal (or the drain terminal) of the driving transistor 3601 and a potential of the signal line 3608 at this moment can be held in the capacitor 3602. Furthermore, a cathode of the display element 3605 is connected to a wire 3607 to which a potential Vss is supplied. It is to be noted that Vss is a potential satisfying Vss<Vdd; for example, there may be Vss=GND (a ground potential). It is also to be noted that the potential supplied to the power supply line 3609 is not limited to Vdd. For example, in the case where full color display is performed using color elements RGB, the power supply potential may be changed per pixel for each color element of RGB.

Next, a principle of operation of the pixel configuration shown in FIG. 36 is described.

In a writing period of the pixel, the third switch 3606 is turned on while the first switch 3603 and the second switch 3604 are off. Then, current flows into the capacitor 3602, and the capacitor 3602 accumulates or discharges charge. It is to be noted that an analog signal potential is supplied to the signal line 3608 in the writing period of the pixel; this analog signal potential corresponds to a video signal.

In this manner, a charge for the potential of the gate terminal required for sufficiently turning on the driving transistor 3601 is accumulated in the capacitor 3602. In this configuration, current does not flow into the display element 3605 at that time.

Subsequently, the third switch 3606 is turned off while the first switch 3603 is off, and the second switch 3604 is turned on. Current starts flowing into the capacitor 3602, the driving transistor 3601, and the display element 3605.

After a while, current stops flowing into the driving transistor 3601 and the capacitor 3602, so that the driving transistor 3601 is turned off. A gate-source voltage Vgs of the driving transistor 3601 is, at this time, approximately equal to a threshold voltage Vth thereof.

Reaching this state, the second switch 3604 is turned off. As a result of this, the capacitor 3602 holds a potential difference (Vp) between a potential of the gate terminal of the driving transistor 3601 to turn off the transistor and an analog signal potential supplied to the signal line 3608 at the moment when the second switch 3604 is turned off. In this manner, an analog signal is written into the pixel.

After an analog signal has been written into the pixel, on/off of the driving transistor 3601 is controlled in accordance with change of a potential of the signal line 3608, based on the analog signal potential which has been supplied to the signal line 3608 when the analog signal is written. That is, in the case where the potential of the signal line 3608 is lower than the analog signal potential when the analog signal is written into the pixel in the writing period, the driving transistor 3601 is turned off while in the case where the potential of the signal line 3608 is higher than the analog signal potential when the analog signal is written into the pixel in the writing period, the driving transistor 3601 is turned on.

The potential difference (Vp) has been held by the capacitor 3602 when an analog signal has been written into the pixel; therefore, in the case where a potential of the signal line 3608 is lower than an analog signal potential when the analog signal has been written into the pixel, a potential of the gate terminal of the driving transistor 3601 also becomes lower than a potential of the gate terminal when the analog signal has been written into the pixel, thereby the driving transistor 3601 is turned off. On the other hand, in the case where the potential of the signal line 3608 is higher than the analog signal potential when the analog signal has been written into the pixel in the writing period, the potential of the gate terminal of the driving transistor 3601 also becomes higher than the potential of the gate terminal when the analog signal has been written into the pixel, thereby the driving transistor 3601 is turned on.

Accordingly, in a light emitting period of the pixel, by changing the potential supplied to the signal line 3608 in an analog manner while the first switch 3603 is turned on and the second switch 3604 and the third switch 3606 are turned off, on/off of the driving transistor 3601 is controlled. It is to be noted that as the potential supplied to the signal line 3608, the waveform 5901, the waveform 5902, the waveform 5903, the waveform 5904, the waveform 5905, the waveform 5906, or the waveform 5907 may be supplied or a plurality of one of them may be supplied in succession as described in Embodiment Mode 1.

By supplying in succession, light emitting time can be dispersed within one frame. Consequently, the frame frequency appears to be improved and screen flicker can be prevented.

In this manner, analog time gradation display of a pixel can be performed by an analog signal potential which is supplied to the signal line 3608 when an analog signal is written into the pixel.

Next, a pixel configuration shown in FIG. 37 is described in detail.

A pixel comprises a driving transistor 3701, a capacitor 3702, a first switch 3703, a second switch 3704, a third switch 3706, a display element 3705, a signal line 3708, and a power supply line 3709. It is to be noted that the driving transistor 3701 is an n-type transistor.

A source terminal of the driving transistor 3701 is connected to an anode of the display element 3705, a gate terminal thereof is connected to the signal line 3708 via the capacitor 3702, and a drain terminal thereof is connected to the power supply line 3709 via the third switch 3706 and the first switch 3703. It is to be noted that a power supply potential Vdd is supplied to the power supply line 3709. In addition, the gate terminal of the driving transistor 3701 is connected to the drain terminal thereof via the second switch 3704 and the third switch 3706. Therefore, when the second switch 3704 and the third switch 3706 are on, the portion between the gate terminal and the drain terminal of the driving transistor 3701 becomes conductive. Then, when the second switch 3704 is turned off, the portion between the gate terminal and the drain terminal of the driving transistor 3701 becomes non-conductive, and a potential difference (a voltage) between a potential of the gate terminal (or the drain terminal) of the driving transistor 3701 and a potential of the signal line 3708 at this moment can be held in the capacitor 3702. Furthermore, a cathode of the display element 3705 is connected to a wire 3707 to which a potential Vss is supplied. It is to be noted that Vss is a potential satisfying Vss<Vdd; for example, there may be Vss=GND (a ground potential). It is also to be noted that the potential supplied to the power supply line is not limited to Vdd. For example, in the case where full color display is performed using color elements RGB, the power supply potential may be changed per pixel for each color element of RGB.

Next, a principle of operation of the pixel configuration shown in FIG. 37 is described.

In a writing period of the pixel, the third switch 3706 is turned off while the first switch 3703 and the second switch 3704 are turned on. Then, current flows into the capacitor 3702, and the capacitor 3702 accumulates or discharges charge. It is to be noted that an analog signal potential is supplied to the signal line 3708 in the writing period of the pixel; this analog signal potential corresponds to a video signal.

After a while, current stops flowing into the capacitor 3702, and the sufficient potential of the gate terminal required for turning on the driving transistor 3701 is stored in the capacitor 3702. In this configuration, current does not flow into the display element 3705 at that time.

Subsequently, the first switch 3703 is turned off while the second switch 3704 is on, and the third switch 3706 is turned on. Current starts flowing into the driving transistor 3701, the display element 3705, and the capacitor 3702, and then stops flowing into them. In this manner, the driving transistor 3701 is turned off.

Reaching this state, the second switch 3704 is turned off. As a result of this, the capacitor 3702 holds a potential difference (Vp) between a potential of the gate terminal of the driving transistor 3701 to turn off the transistor and an analog signal potential supplied to the signal line 3708 at the moment when the second switch 3704 is turned off. In this manner, an analog signal is written into the pixel.

After an analog signal has been written into the pixel, on/off of the driving transistor 3701 is controlled in accordance with change of a potential of the signal line 3708, based on the analog signal potential which has been supplied to the signal line 3708 when the analog signal is written. That is, in the case where the potential of the signal line 3708 is lower than the analog signal potential when the analog signal is written into the pixel in the writing period, the driving transistor 3701 is turned off while in the case where the potential of the signal line 3708 is higher than the analog signal potential when the analog signal is written into the pixel in the writing period, the driving transistor 3701 is turned on.

The potential difference (Vp) has been held by the capacitor 3702 when an analog signal has been written into the pixel; therefore, in the case where a potential of the signal line 3708 is lower than an analog signal potential when the analog signal has been written into the pixel, a potential of the gate terminal of the driving transistor 3701 also becomes lower than a potential of the gate terminal when the analog signal has been written into the pixel, thereby the driving transistor 3701 is turned off. On the other hand, in the case where the potential of the signal line 3708 is higher than the analog signal potential when the analog signal has been written into the pixel in the writing period, the potential of the gate terminal of the driving transistor 3701 also becomes higher than the potential of the gate terminal when the analog signal has been written into the pixel, thereby the driving transistor 3701 is turned on.

Accordingly, in a light emitting period of the pixel, by changing the potential supplied to the signal line 3708 in an analog manner while the first switch 3703 and the third switch 3706 are turned on and the second switch 3704 is turned off, on/off of the driving transistor 3701 is controlled. It is to be noted that as the potential supplied to the signal line 3708, the waveform 5901, the waveform 5902, the waveform 5903, the waveform 5904, the waveform 5905, the waveform 5906, or the waveform 5907 may be supplied or a plurality of one of them may be supplied in succession as described in Embodiment Mode 1.

By supplying in succession, light emitting time can be dispersed within one frame. Consequently, the frame frequency appears to be improved and screen flicker can be prevented.

In this manner, analog time gradation display of a pixel can be performed by an analog signal potential which is supplied to the signal line 3708 when an analog signal is written into the pixel.

Next, a pixel configuration shown in FIG. 73 is described in detail.

A pixel comprises a driving transistor 7301, a capacitor 7302, a first switch 7303, a second switch 7304, a third switch 7306, a display element 7305, a signal line 7308, and a power supply line 7309. It is to be noted that the driving transistor 7301 is an n-type transistor.

A source terminal of the driving transistor 7301 is connected to an anode of the display element 7305, a gate terminal thereof is connected to the signal line 7308 via the capacitor 7302, and a drain terminal thereof is connected to the power supply line 7309 via the first switch 7303. It is to be noted that a power supply potential Vdd is supplied to the power supply line 7309. In addition, the gate terminal and the drain terminal of the driving transistor 7301 are connected to each other via the second switch 7304. Therefore, when the second switch 7304 is on, the portion between the gate terminal and the drain terminal of the driving transistor 7301 becomes conductive. Then, when the second switch 7304 is turned off, the portion between the gate terminal and the drain terminal of the driving transistor 7301 becomes non-conductive, and a potential difference (a voltage) between a potential of the gate terminal (or the drain terminal) of the driving transistor 7301 and an analog signal potential supplied by the signal line 7308 at this moment can be held in the capacitor 7302. Furthermore, a cathode of the display element 7305 is connected to a first wire 7307 to which a potential Vss is supplied. It is to be noted that the potential supplied to the power supply line 7309 is not limited to Vdd. For example, in the case where full color display is performed using color elements RGB, the power supply potential may be changed per pixel for each color element of RGB.

In addition, the gate terminal of the driving transistor 7301 is connected to a second wire 7310 via the third switch 7306. It is to be noted that, to the second wire 7310, a gate potential may be set such that the driving transistor 7301 is sufficiently turned on when the power supply potential Vdd in the writing period is supplied to the drain terminal thereof. Thus, the second wire 7310 may be a scan line for controlling the first switch 7303, the second switch 7304, or the third switch 7306 of the pixel or of pixels of another row.

Next, a principle of operation of the pixel configuration shown in FIG. 73 is described.

In a writing period of the pixel, first, the third switch 7306 is turned on while the first switch 7303 and the second switch 7304 are off. Then, current flows into the capacitor 7302 and charge accumulation or discharge is performed. It is to be noted that an analog signal potential is supplied to the signal line 7308 in the writing period of the pixel; this analog signal potential corresponds to a video signal.

In this manner, a charge for the potential of the gate terminal required for sufficiently turning on the driving transistor 7301 is accumulated in the capacitor 7302. In this configuration, current does not flow into the display element 7305 at that time.

Subsequently, the third switch 7306 is turned off while the first switch 7303 is off, and the second switch 7304 is turned on. Current starts flowing into the capacitor 7302, the driving transistor 7301, and the display element 7305.

After a while, current stops flowing into the driving transistor 7301 and the capacitor 7302, so that the driving transistor 7301 is turned off. A gate-source voltage Vgs of the driving transistor 7301 is, at this time, approximately equal to a threshold voltage Vth thereof.

Reaching this state, the second switch 7304 is turned off. As a result of this, the capacitor 7302 holds a potential difference (Vp) between a potential of the gate terminal of the driving transistor 7301 to turn off the transistor and an analog signal potential supplied to the signal line 7308 at the moment when the second switch 7304 is turned off. In this manner, an analog signal is written into the pixel.

After an analog signal has been written into the pixel, on/off of the driving transistor 7301 is controlled in accordance with change of a potential of the signal line 7308, based on the analog signal potential which has been supplied to the signal line 7308 when the analog signal is written. That is, in the case where the potential of the signal line 7308 is lower than the analog signal potential when the analog signal is written into the pixel in the writing period, the driving transistor 7301 is turned off while in the case where the potential of the signal line 7308 is higher than the analog signal potential when the analog signal is written into the pixel in the writing period, the driving transistor 7301 is turned on.

The potential difference (Vp) has been held by the capacitor 7302 when an analog signal has been written into the pixel; therefore, in the case where a potential of the signal line 7308 is lower than an analog signal potential when the analog signal has been written into the pixel, a potential of the gate terminal of the driving transistor 7301 also becomes lower than a potential of the gate terminal when the analog signal has been written into the pixel, thereby the driving transistor 7301 is turned off. On the other hand, in the case where the potential of the signal line 7308 is higher than the analog signal potential when the analog signal has been written into the pixel in the writing period, the potential of the gate terminal of the driving transistor 7301 also becomes higher than the potential of the gate terminal when the analog signal has been written into the pixel, thereby the driving transistor 7301 is turned on.

Accordingly, in a light emitting period of the pixel, by changing the potential supplied to the signal line 7308 in an analog manner while the first switch 7303 is turned on and the second switch 7304 and the third switch 7306 are turned off, on/off of the driving transistor 7301 is controlled. It is to be noted that as the potential supplied to the signal line 7308, the waveform 5901, the waveform 5902, the waveform 5903, the waveform 5904, the waveform 5905, the waveform 5906, or the waveform 5907 may be supplied or a plurality of one of them may be supplied in succession as described in Embodiment Mode 1.

By supplying in succession, light emitting time can be dispersed within one frame. Consequently, the frame frequency appears to be improved and screen flicker can be prevented.

In this manner, analog time gradation display of a pixel can be performed by an analog signal potential which is supplied to the signal line 7308 when an analog signal is written into the pixel.

Figure 38:
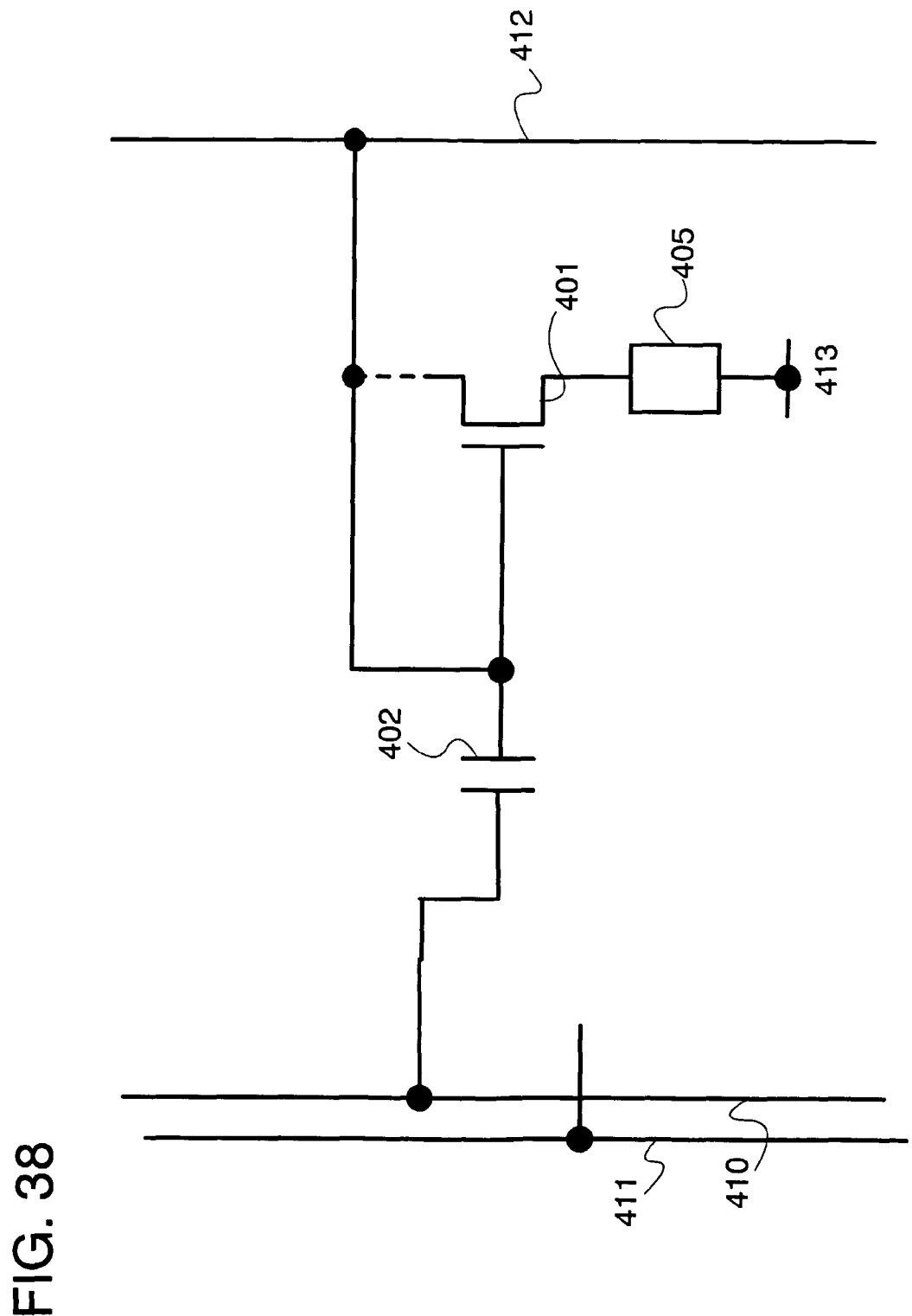
FIG. 38 is a diagram for illustrating connection of a pixel of the invention.

Similarly in the configuration shown in FIG. 4 described in Embodiment Mode 1, when a potential of the gate terminal to turn on the driving transistor 401 is accumulated in the capacitor 402 in the writing period of the pixel, the power supply line 412 and the first signal line 410 are connected to each other via the capacitor 402 as shown in FIG. 38. At this time, the drain terminal of the driving transistor 401 may be connected to the gate terminal thereof (or the power supply line 412); that is, a portion shown by a dotted line in FIG. 38 may be connected or may not be connected.

Figure 39:
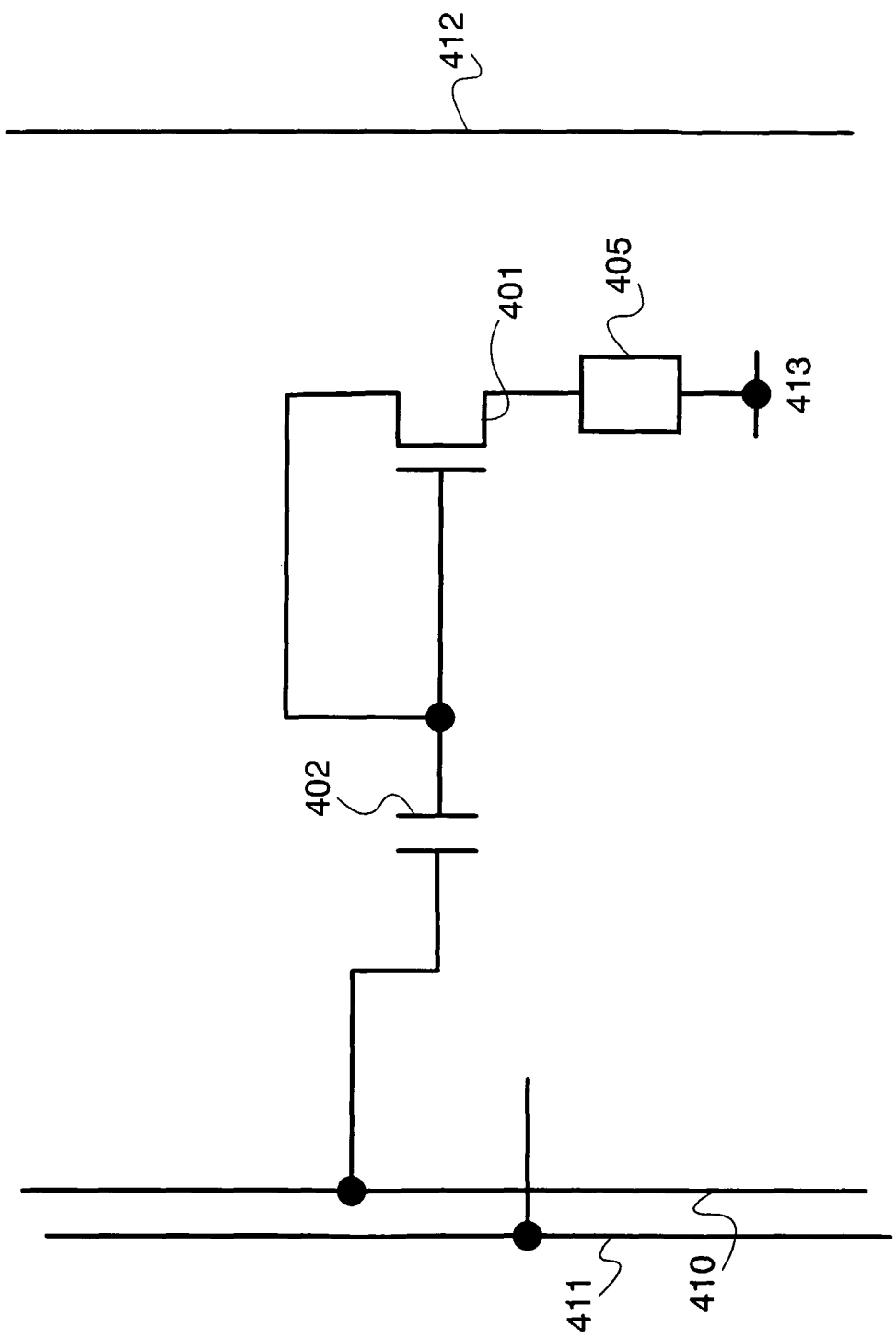
FIG. 39 is a diagram for illustrating connection of a pixel of the invention.

When a gate potential required for controlling on/off of the driving transistor 401 is obtained, the drain terminal and the gate terminal of the driving transistor 401 are connected as shown in FIG. 39. In this manner, a charge corresponding to a potential difference between the potential of the gate terminal in order to change on/off of the driving transistor 401 and an analog signal potential supplied to the first signal line 410 at that moment is accumulated in the capacitor 402.

Figure 40:
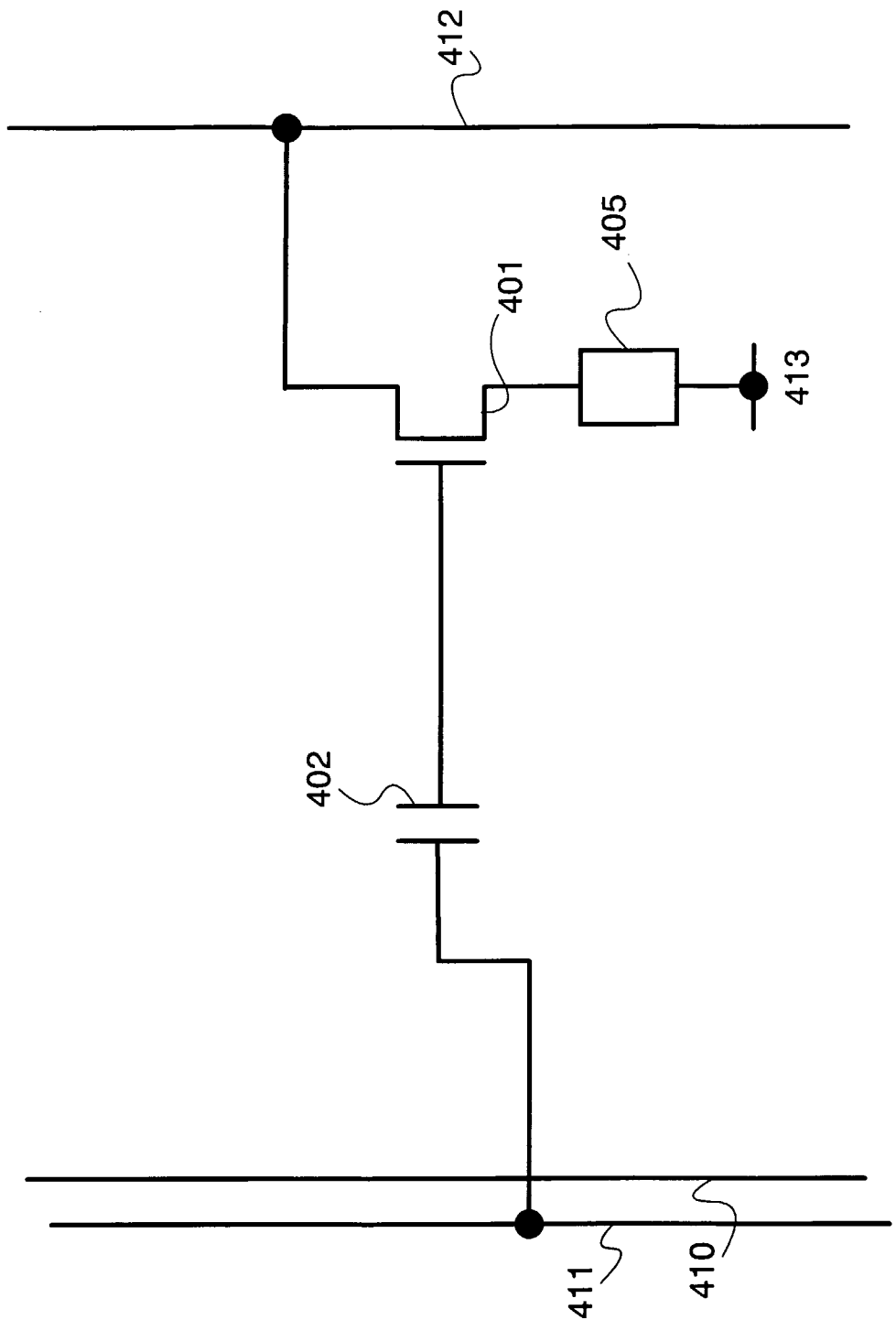
FIG. 40 is a diagram for illustrating connection of a pixel of the invention.

In a light emitting period, the gate terminal of the driving transistor 401 is connected to the second signal line 411 via the capacitor 402, and the drain terminal of the driving transistor 401 is connected to the power supply line 412 as shown in FIG. 40. The potential of the power supply line 412 can be supplied to the drain terminal of the driving transistor 401 in this manner. Therefore, when the driving transistor 401 is turned on, current can be supplied from the power supply line 412 to the display element 405.

Figure 42:
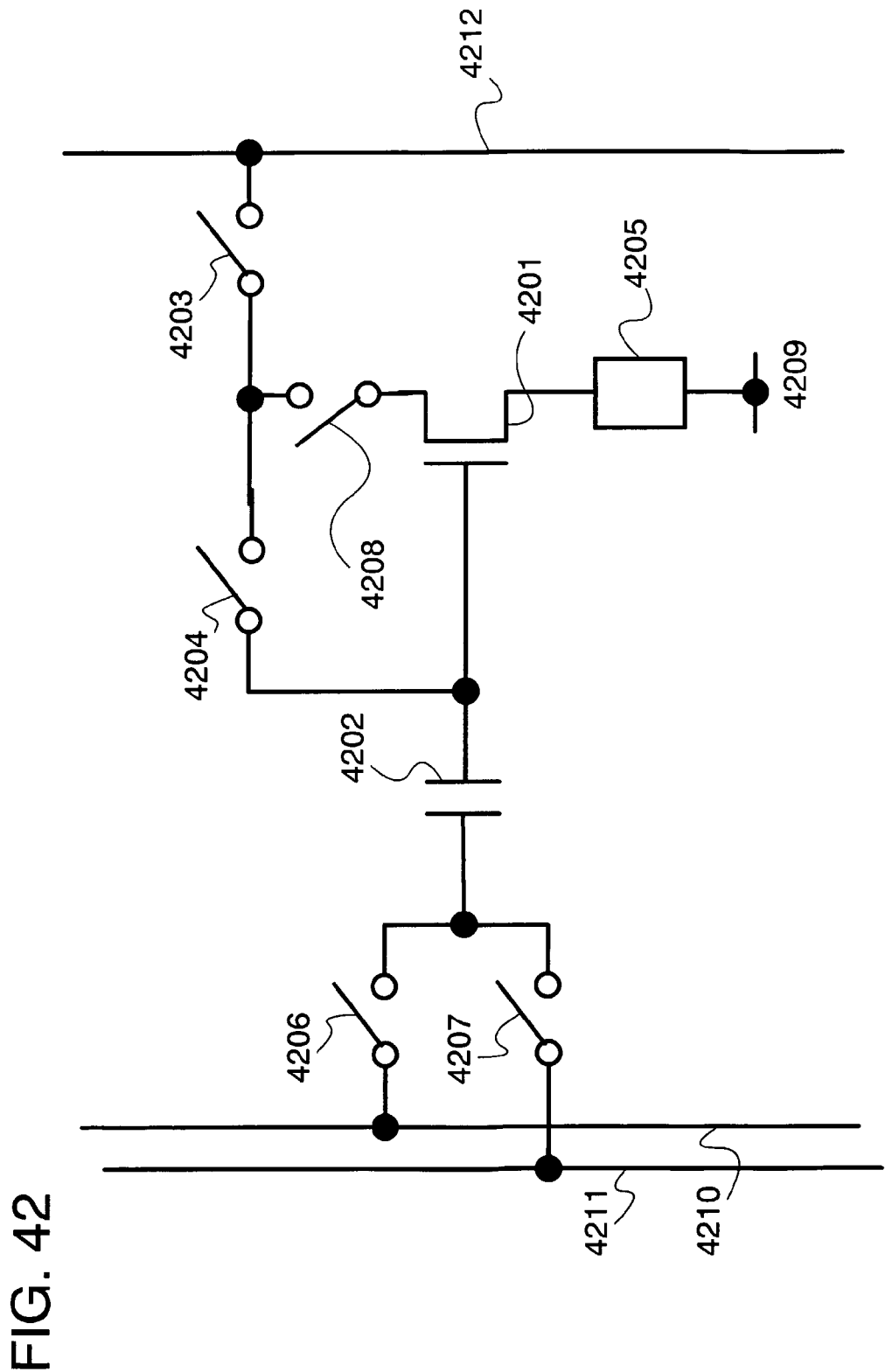
FIG. 42 is a diagram showing a pixel configuration of the invention.
Figure 43:
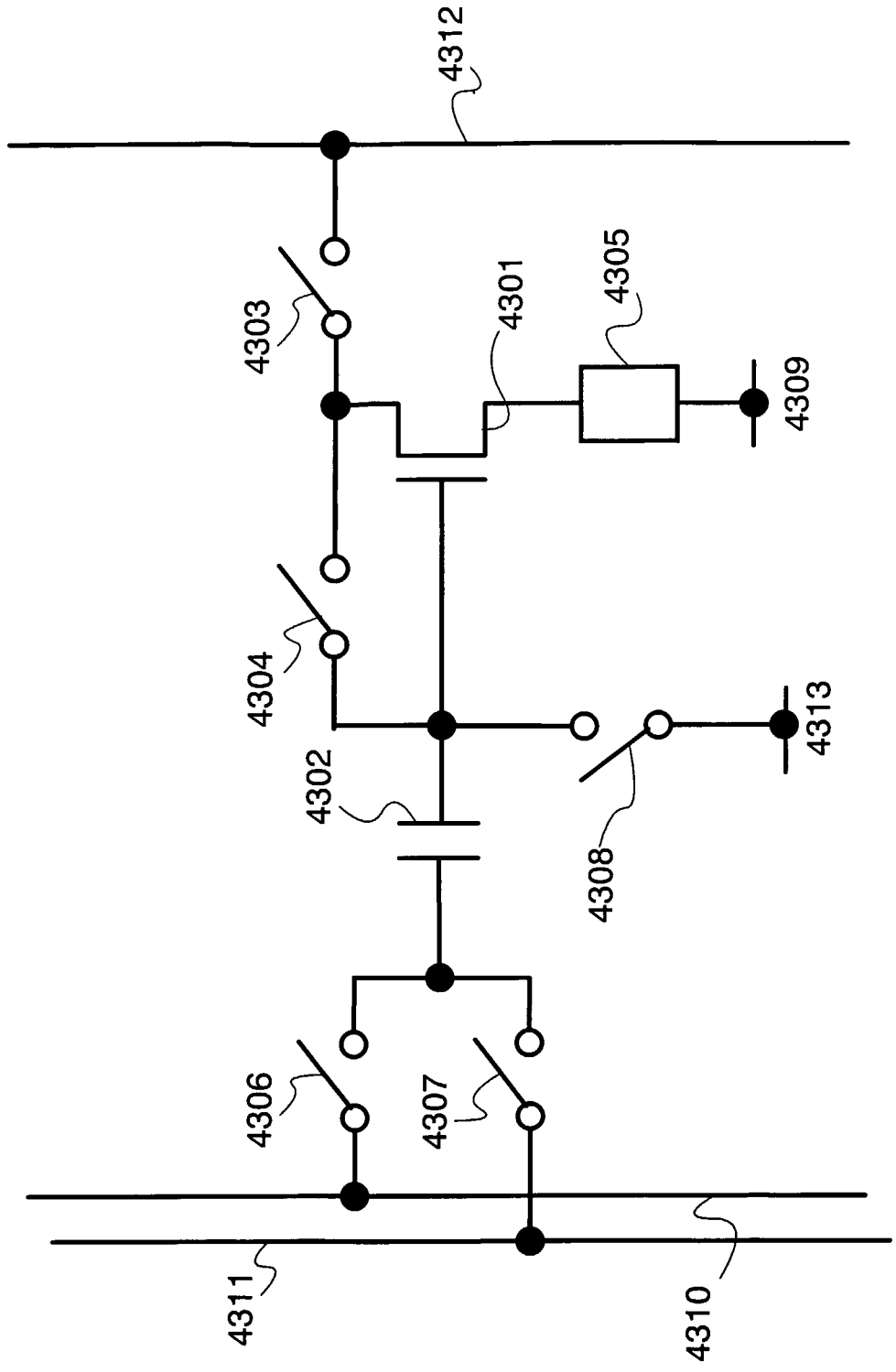
FIG. 43 is a diagram showing a pixel configuration of the invention.

It is to be noted in this embodiment mode that, by not connecting the drain terminal of the driving transistor 401 which is shown by the dotted line in FIG. 38 to the gate terminal thereof and the power supply line 412, current can prevent from flowing into the display element 405 when a potential of the gate terminal of the driving transistor 401 to sufficiently turn on the driving transistor 401 is accumulated in the capacitor 402. Accordingly, power consumption can be reduced. Examples of such a pixel configuration are shown in FIGS. 41, 42, and 43.

Figure 41:
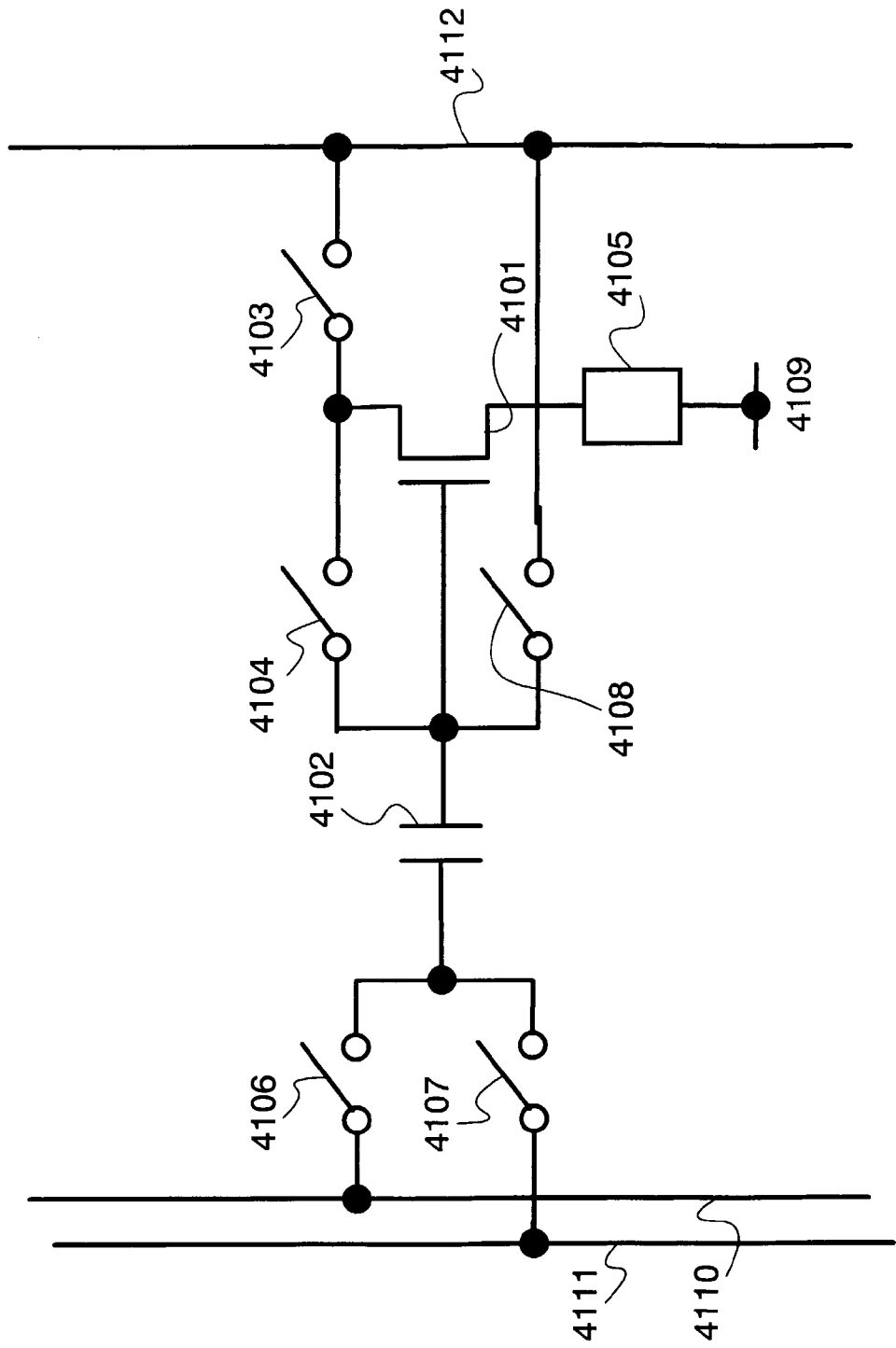
FIG. 41 is a diagram showing a pixel configuration of the invention.

First, a pixel configuration shown in FIG. 41 is described in detail. A pixel comprises a driving transistor 4101, a capacitor 4102, a first switch 4103, a second switch 4104, a display element 4105, a third switch 4106, a fourth switch 4107, a fifth switch 4108, a first signal line (Data1 line) 4110, a second signal line (Data2 line) 4111, and a power supply line (Supply line) 4112. It is to be noted that the driving transistor 4101 is an n-type transistor.

A source terminal of the driving transistor 4101 is connected to an anode of the display element 4105, a gate terminal thereof is connected to one electrode of the capacitor 4102. The other electrode of the capacitor 4102 is connected to the first signal line 4110 via the third switch 4106 and connected to the second signal line 4111 via the fourth switch 4107. A drain terminal of the driving transistor 4101 is connected to the power supply line 4112 via the first switch 4103. It is to be noted that a power supply potential Vdd is supplied to the power supply line 4112. In addition, the gate terminal and the drain terminal of the driving transistor 4101 are connected to each other via the second switch 4104. Therefore, when the second switch 4104 is on, the portion between the gate terminal and the drain terminal of the driving transistor 4101 becomes conductive. Then, when the second switch 4104 is turned off, the portion between the gate terminal and the drain terminal of the driving transistor 4101 becomes non-conductive, and a potential difference (a voltage) between a potential of the gate terminal (or the drain terminal) of the driving transistor 4101 and an analog signal potential supplied from the first signal line 4110 at this moment can be held in the capacitor 4102. Furthermore, the gate terminal of the driving transistor 4101 is connected to the power supply line 4112 via the fifth switch 4108. A cathode of the display element 4105 is connected to a wire 4109 to which a potential Vss is supplied. It is to be noted that Vss is a potential satisfying Vss<Vdd; for example, there may be Vss=GND (a ground potential). It is also to be noted that the potential supplied to the power supply line is not limited to Vdd. For example, in the case where full color display is performed using color elements RGB, the power supply potential may be changed per pixel for each color element of RGB.

Next, a principle of operation of the pixel configuration shown in FIG. 41 is briefly described.

In a writing period of the pixel, the fourth switch 4107, the first switch 4103, and the second switch 4104 are turned off while the third switch 4106 and the fifth switch 4108 are turned on. Then, current flows into the capacitor 4102 and charge accumulation or discharge is performed. It is to be noted that an analog signal potential is supplied to the first signal line 4110 in the writing period of the pixel; this analog signal potential corresponds to a video signal.

In this manner, a potential of the gate terminal required for sufficiently turning on the driving transistor 4101 is accumulated in the capacitor 4102. In this configuration, current does not flow into the display element 4105 at that time.

Subsequently, the fifth switch 4108 is turned off and the second switch 4104 is turned on while the first switch 4103 and the fourth switch 4107 are off and the third switch 4106 is on. Current starts flowing into the capacitor 4102, the driving transistor 4101, and the display element 4105.

After a while, current stops flowing into the driving transistor 4101 and the capacitor 4102, so that the driving transistor 4101 is turned off.

Reaching this state, the second switch 4104 is turned off. As a result of this, the capacitor 4102 holds a potential difference (Vp) between a potential of the gate terminal of the driving transistor 4101 to turn off the transistor and an analog signal potential supplied to the first signal line 4110 at the moment when the second switch 4104 is turned off. In this manner, an analog signal is written into the pixel.

After an analog signal has been written into the pixel, on/off of the driving transistor 4101 is controlled in accordance with change of a potential supplied to the other electrode of the capacitor 4102, based on the analog signal potential which has been supplied to the first signal line 4110 when the analog signal is written. That is, in the case where the potential of the other electrode of the capacitor 4102 is lower than the analog signal potential when the analog signal is written into the pixel in the writing period, the driving transistor 4101 is turned off while in the case where the potential of the other electrode of the capacitor 4102 is higher than the analog signal potential when the analog signal is written into the pixel in the writing period, the driving transistor 4101 is turned on.

The potential difference (Vp) has been held by the capacitor 4102 when an analog signal has been written into the pixel; therefore, in the case where a potential of the other electrode of the capacitor 4102 is lower than an analog signal potential when the analog signal has been written into the pixel, a potential of the gate terminal of the driving transistor 4101 also becomes lower than a potential of the gate terminal when the analog signal has been written into the pixel, thereby the driving transistor 4101 is turned off. On the other hand, in the case where the potential of the other electrode of the capacitor 4102 is higher than the analog signal potential when the analog signal has been written into the pixel in the writing period, the potential of the gate terminal of the driving transistor 4101 also becomes higher than the potential of the gate terminal when the analog signal has been written into the pixel, thereby the driving transistor 4101 is turned on.

Accordingly, in a light emitting period of the pixel, the third switch 4106 is turned off and the first switch 4103 and the fourth switch 4107 are turned on while the second switch 4104 and the fifth switch 4108 are off. Then, by changing the potential supplied to the second signal line 4111 in an analog manner, on/off of the driving transistor 4101 is controlled. It is to be noted that as the potential supplied to the second signal line 4111, the waveform 5901, the waveform 5902, the waveform 5903, the waveform 5904, the waveform 5905, the waveform 5906, or the waveform 5907 may be supplied or a plurality of one of them may be supplied in succession as described in Embodiment Mode 1.

By supplying in succession, light emitting time can be dispersed within one frame. Consequently, the frame frequency appears to be improved and screen flicker can be prevented.

In this manner, analog time gradation display of a pixel can be performed by an analog signal potential which is supplied to the first signal line 4110 when an analog signal is written into the pixel.

Next, a pixel configuration shown in FIG. 42 is described in detail.

A pixel comprises a driving transistor 4201, a capacitor 4202, a first switch 4203, a second switch 4204, a display element 4205, a third switch 4206, a fourth switch 4207, a fifth switch 4208, a first signal line (Data1 line) 4210, a second signal line (Data2 line) 4211, and a power supply line (Supply line) 4212. It is to be noted that the driving transistor 4201 is an n-type transistor.

A source terminal of the driving transistor 4201 is connected to an anode of the display element 4205, a gate terminal thereof is connected to one electrode of the capacitor 4202. The other electrode of the capacitor 4202 is connected to the first signal line 4210 via the third switch 4206 and connected to the second signal line 4211 via the fourth switch 4207. A drain terminal of the driving transistor 4201 is connected to the power supply line 4212 via the fifth switch 4208 and the first switch 4203. In addition, the gate terminal and the drain terminal of the driving transistor 4201 are connected to each other via the second switch 4204 and the fifth switch 4208. Therefore, when the second switch 4204 and the fifth switch 4208 are on, the portion between the gate terminal and the drain terminal of the driving transistor 4201 becomes conductive. Then, when the second switch 4204 and the fifth switch 4208 are turned off, a potential difference (a voltage) between a potential of the gate terminal (or the drain terminal) of the driving transistor 4201 and an analog signal potential supplied from the first signal line 4210 at this moment can be held in the capacitor 4202. Furthermore, a cathode of the display element 4205 is connected to a wire 4209 to which a potential Vss is supplied. It is to be noted that the potential supplied to the power supply line is not limited to Vdd. For example, in the case where full color display is performed using color elements RGB, the power supply potential may be changed per pixel for each color element of RGB.

Next, a principle of operation of the pixel configuration shown in FIG. 42 is briefly described.

In a writing period of the pixel, the third switch 4206, the first switch 4203, and the second switch 4204 are turned on while the fourth switch 4207 and the fifth switch 4208 are turned off. Then, current flows into the capacitor 4202 and charge accumulation or discharge is performed. It is to be noted that an analog signal potential is supplied to the first signal line 4210 in the writing period of the pixel; this analog signal potential corresponds to a video signal.

In this manner, a potential of the gate terminal required for sufficiently turning on the driving transistor 4201 is accumulated in the capacitor 4202. In this configuration, current does not flow into the display element 4205 at that time.

Subsequently, the first switch 4203 is turned off and the fifth switch 4208 is turned on while the third switch 4206 and the second switch 4204 are on and the fourth switch 4207 is off. Current starts flowing into the capacitor 4202, the driving transistor 4201, and the display element 4205.

After a while, current stops flowing into the driving transistor 4201 and the capacitor 4202, so that the driving transistor 4201 is turned off.

Reaching this state, the second switch 4204 is turned off. As a result of this, the capacitor 4202 holds a potential difference (Vp) between a potential of the gate terminal of the driving transistor 4201 to turn off the transistor and an analog signal potential supplied to the first signal line 4210 at the moment when the second switch 4204 is turned off. In this manner, an analog signal is written into the pixel.

After an analog signal has been written into the pixel, on/off of the driving transistor 4201 is controlled in accordance with change of a potential supplied to the other electrode of the capacitor 4202, based on the analog signal potential which has been supplied to the first signal line 4210 when the analog signal is written. That is, in the case where the potential of the other electrode of the capacitor 4202 is lower than the analog signal potential when the analog signal is written into the pixel in the writing period, the driving transistor 4201 is turned off while in the case where the potential of the other electrode of the capacitor 4202 is higher than the analog signal potential when the analog signal is written into the pixel in the writing period, the driving transistor 4201 is turned on.

The potential difference (Vp) has been held by the capacitor 4202 when an analog signal has been written into the pixel; therefore, in the case where a potential of the other electrode of the capacitor 4202 is lower than an analog signal potential when the analog signal has been written into the pixel, a potential of the gate terminal of the driving transistor 4201 also becomes lower than a potential of the gate terminal when the analog signal has been written into the pixel in the writing period, thereby the driving transistor 4201 is turned off. On the other hand, in the case where the potential of the other electrode of the capacitor 4202 is higher than the analog signal potential when the analog signal has been written into the pixel, the potential of the gate terminal of the driving transistor 4201 also becomes higher than the potential of the gate terminal when the analog signal has been written into the pixel, thereby the driving transistor 4201 is turned on.

Accordingly, in a light emitting period of the pixel, the first switch 4203, the fourth switch 4207 and the fifth switch 4208 are turned on while the second switch 4204 and the third switch 4206 are turned off. Then, by changing the potential supplied to the second signal line 4211 in an analog manner, on/off of the driving transistor 4201 is controlled. It is to be noted that as the potential supplied to the second signal line 4211, the waveform 5901, the waveform 5902, the waveform 5903, the waveform 5904, the waveform 5905, the waveform 5906, or the waveform 5907 may be supplied or a plurality of one of them may be supplied in succession as described in Embodiment Mode 1.

By supplying in succession, light emitting time can be dispersed within one frame. Consequently, the frame frequency appears to be improved and screen flicker can be prevented.

In this manner, analog time gradation display of a pixel can be performed by an analog signal potential which is supplied to the first signal line 4210 when an analog signal is written into the pixel.

Next, a pixel configuration shown in FIG. 43 is described in detail.

A pixel comprises a driving transistor 4301, a capacitor 4302, a first switch 4303, a second switch 4304, a display element 4305, a third switch 4306, a fourth switch 4307, a fifth switch 4308, a first signal line (Data1 line) 4310, a second signal line (Data2 line) 4311, and a power supply line (Supply line) 4312. It is to be noted that the driving transistor 4301 is an n-type transistor.

A source terminal of the driving transistor 4301 is connected to an anode of the display element 4305, a gate terminal thereof is connected to one electrode of the capacitor 4302. The other electrode of the capacitor 4302 is connected to the first signal line 4310 via the third switch 4306 and connected to the second signal line 4311 via the fourth switch 4307. A drain terminal of the driving transistor 4301 is connected to the power supply line 4312 via the first switch 4303. It is to be noted that a power supply potential Vdd is supplied to the power supply line 4312. In addition, the gate terminal and the drain terminal of the driving transistor 4301 are connected to each other via the second switch 4304. Therefore, when the second switch 4304 is on, the portion between the gate terminal and the drain terminal of the driving transistor 4301 becomes conductive. Then, when the second switch 4304 is turned off, the portion between the gate terminal and the drain terminal of the driving transistor 4301 becomes non-conductive, and a potential difference (a voltage) between a potential of the gate terminal (or the drain terminal) of the driving transistor 4301 and an analog signal potential supplied from the first signal line 4310 at this moment can be held in the capacitor 4302. Furthermore, a cathode of the display element 4305 is connected to a first wire 4309 to which a potential Vss is supplied. It is to be noted that the potential supplied to the power supply line is not limited to Vdd. For example, in the case where full color display is performed using color elements RGB, the power supply potential may be changed per pixel for each color element of RGB.

In addition, the gate terminal of the driving transistor 4301 is connected to a second wire 4313 via the fifth switch 4308.

It is to be noted that, to the second wire 4313, a gate potential may be set such that the driving transistor 4301 is sufficiently turned on when the power supply potential Vdd is supplied to the drain terminal thereof in the writing period. Thus, the second wire 4313 may be a scan line for controlling the first switch 4303, the second switch 4304, the third switch 4306, the fourth switch 4307, or the fifth switch 4308 of the pixel or of pixels of another row.

Next, a principle of operation of the pixel configuration shown in FIG. 43 is briefly described.

In a writing period of the pixel, the first switch 4303, the second switch 4304, and the fourth switch 4307 are turned off while the third switch 4306 and the fifth switch 4308 are turned on. Then, current flows into the capacitor 4302 and charge accumulation or discharge is performed. It is to be noted that an analog signal potential is supplied to the first signal line 4310 in the writing period of the pixel; this analog signal potential corresponds to a video signal.

In this manner, a potential of the gate terminal required for sufficiently turning on the driving transistor 4301 is accumulated in the capacitor 4302. In this configuration, current does not flow into the display element 4305 at that time.

Subsequently, the fifth switch 4308 is turned off and the second switch 4304 is turned on while the third switch 4306 is on and the fourth switch 4307 and the first switch 4303 are off. Current starts flowing into the capacitor 4302, the driving transistor 4301, and the display element 4305.

After a while, current stops flowing into the driving transistor 4301 and the capacitor 4302, so that the driving transistor 4301 is turned off.

Reaching this state, the second switch 4304 is turned off. As a result of this, the capacitor 4302 holds a potential difference (Vp) between a potential of the gate terminal of the driving transistor 4301 to turn off the transistor and an analog signal potential supplied to the first signal line 4308 at the moment when the second switch 4304 is turned off. In this manner, an analog signal is written into the pixel.

After an analog signal has been written into the pixel, on/off of the driving transistor 4301 is controlled in accordance with change of a potential supplied to the other electrode of the capacitor 4302, based on the analog signal potential which has been supplied to the first signal line 4310 when the analog signal is written. That is, in the case where the potential of the other electrode of the capacitor 4302 is lower than the analog signal potential when the analog signal is written into the pixel in the writing period, the driving transistor 4301 is turned off while in the case where the potential of the other electrode of the capacitor 4302 is higher than the analog signal potential when the analog signal is written into the pixel in the writing period, the driving transistor 4301 is turned on.

The potential difference (Vp) has been held by the capacitor 4302 when an analog signal has been written into the pixel; therefore, in the case where a potential of the other electrode of the capacitor 4302 is lower than an analog signal potential when the analog signal has been written into the pixel, a potential of the gate terminal of the driving transistor 4301 also becomes lower than a potential of the gate terminal when the analog signal has been written into the pixel, thereby the driving transistor 4301 is turned off. On the other hand, in the case where the potential of the other electrode of the capacitor 4302 is higher than the analog signal potential when the analog signal has been written into the pixel in the writing period, the potential of the gate terminal of the driving transistor 4301 also becomes higher than the potential of the gate terminal when the analog signal has been written into the pixel, thereby the driving transistor 4301 is turned on.

Accordingly, in a light emitting period of the pixel, the second switch 4304, the third switch 4306 and the fifth switch 4308 are turned off while the first switch 4303 and the fourth switch 4307 are turned on. Then, by changing the potential supplied to the second signal line 4311 in an analog manner, on/off of the driving transistor 4301 is controlled so that time for supplying current to the display element 4305 is controlled in an analog manner to express gradation.

It is to be noted that as the potential supplied to the second signal line 4311, the waveform 5901, the waveform 5902, the waveform 5903, the waveform 5904, the waveform 5905, the waveform 5906, or the waveform 5907 may be supplied or a plurality of one of them may be supplied in succession as described in Embodiment Mode 1.

By supplying in succession, light emitting time can be dispersed within one frame. Consequently, the frame frequency appears to be improved and screen flicker can be prevented.

In this manner, analog time gradation display of a pixel can be performed by an analog signal potential which is supplied to the first signal line 4310 when an analog signal is written into the pixel.

It is to be noted that the configurations described in Embodiment Mode 1, Embodiment Mode 2, Embodiment Mode 3, and Embodiment Mode 4 can be arbitrarily combined. Accordingly, current consumption in a writing period of the pixel can be reduced, and power consumption can be reduced.

It is to be noted in this embodiment mode that the source and drain terminals of the driving transistor for driving the display element, and the anode and cathode of the display element mean respective terminals and electrodes when a forward voltage is applied to the display element.

Embodiment Mode 6

In this embodiment mode, a driving method which further improves the reliability of the display element of the pixel configuration described in Embodiment Mode 1, and a pixel configuration which further improves the reliability of the display element than the pixel configuration described in Embodiment Mode 1 and a driving method thereof are described.

First, using the pixel configuration shown in FIG. 1 described in Embodiment Mode 1, a driving method of this embodiment mode is described.

According to this embodiment mode, one frame period includes a forward bias period (a writing period and a light emitting period) and a reverse bias period. Operation in the writing period and the light emitting period in the forward bias period is similar to that described in Embodiment Mode 1, and thus description thereof is omitted here.

In the reverse bias period, the potential Vdd supplied to the power supply line 109 and the potential Vss supplied to the wire 110 are reversed to each other; that is, Vss is supplied to the power supply line 109 and Vdd is supplied to the wire 110 in the reverse bias period. In addition, the second switch 104 is turned off while the first switch 103 is turned on. As a result of this, the source terminal and the drain terminal of the driving transistor 101 become opposite to those in the forward bias period respectively. In addition, the anode and the cathode of the display element 105 become opposite as well. At this time, a potential is supplied to the signal line 108 such that the driving transistor 101 is sufficiently turned on.

Figure 68:
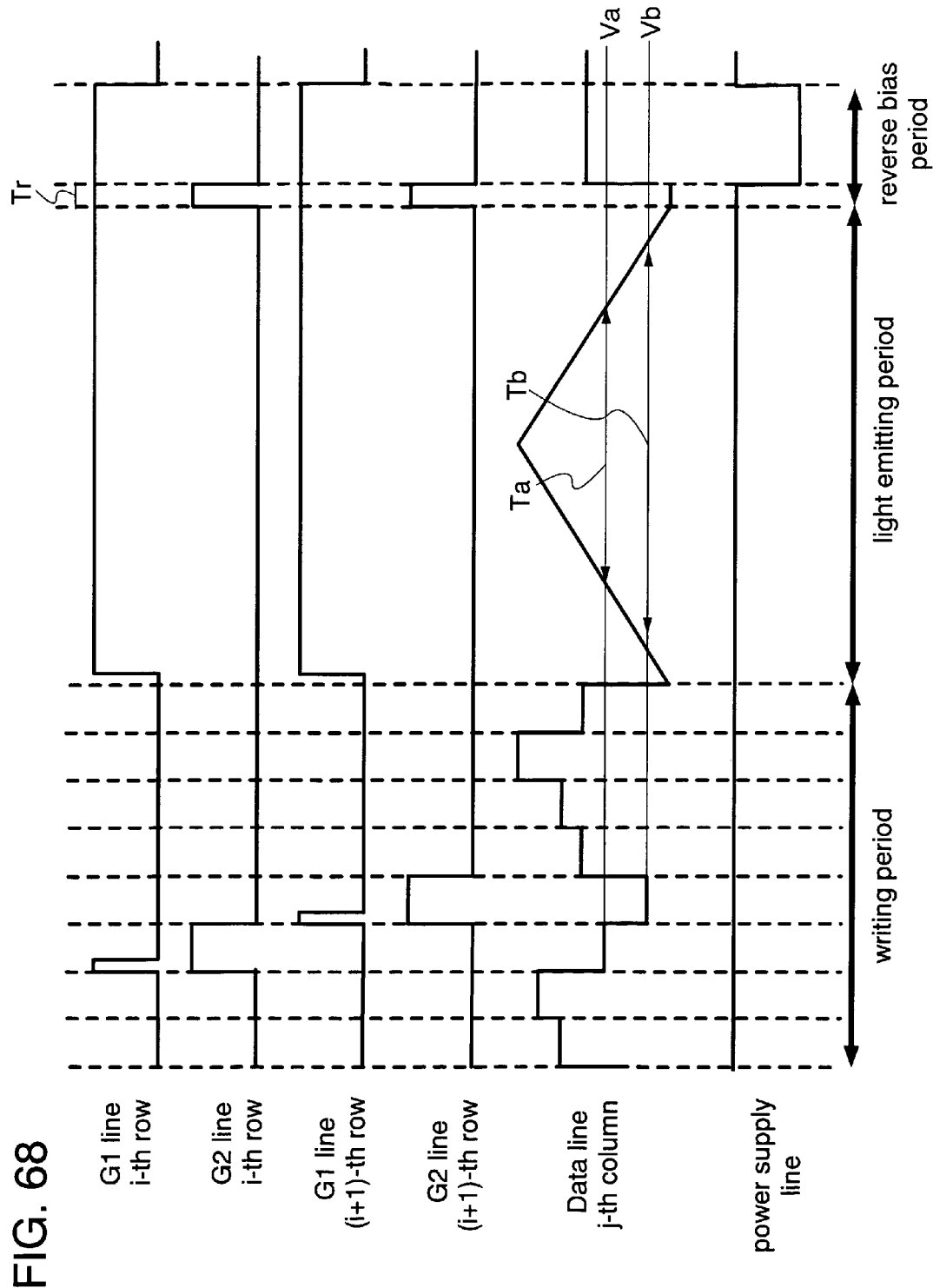
FIG. 68 is a diagram showing a timing chart of a display device having a pixel configuration of the invention.

It is to be noted that the potential of the gate terminal of the driving transistor 101 may be set in the beginning of the reverse bias period. That is, as shown in FIG. 68, a gate potential setting period Tr is provided in the beginning of the reverse bias period. At this time, signals of H level are supplied to the first scan line 106 and the second scan line 107 respectively to turn on the first switch 103 and the second switch 104. Then, the potential of the power supply line 109 is set to Vdd and a potential of L level is supplied to the signal line 108. Consequently, a potential difference between the potential Vdd of the gate terminal of the driving transistor 101 and the potential of L level of the signal line 108 is held in the capacitor 102.

In the reverse bias period, when the gate potential setting period Tr is completed, the potential of the second scan line 107 is changed to L level while the potential of the first scan line 106 is H level, thereby the first switch 103 is turned on and the second switch 104 is turned off. Then, the potential of the signal line 108 changes from L level to H level. As a result of this, since the potential of the signal line 108 is increased while the capacitor 102 keeps holding the potential difference, the potential of the gate terminal of the driving transistor 101 becomes larger than Vdd so that the driving transistor 101 can be sufficiently turned on.

Accordingly, the driving transistor 101 is turned on and a voltage reverse to that in a forward bias period can be applied to the display element 105.

Even if the voltage reverse to that in the forward bias period is applied to the display element 105 in the reverse bias period as described above, current does not flow into the normal display element 105 (or may be flow very little). On the other hand, if there is a short-circuit portion in the display element 105, current flows into the short-circuit portion. Therefore, in the reverse bias period, the reverse voltage is applied such that current flows enough to isolate the short-circuit portion.

Therefore, as described above, the potential supplied to the power supply line 109 in the reverse bias period is not limited to Vss. In addition, the potential supplied to the wire 110 is also not limited to Vdd. That is, it is necessary that current enough to isolate a short-circuit portion of the display element 105 can flow in the reverse bias period.

By isolating the short-circuit portion of the display element 105 as described above, a display defect of the pixel can be improved. Furthermore, lifetime of the display element 105 can be lengthened.

Next, a pixel which improves the reliability of a display element using a pixel configuration different from that described in Embodiment Mode 1 is described with reference to FIG. 66.

A pixel comprises a driving transistor 6601, a capacitor 6602, a first switch 6603, a second switch 6604, a display element 6605, a first scan line (G1 line) 6606, a second scan line (G2 line) 6607, a signal line (Data line) 6608, a power supply line (Supply line) 6609, and a reverse bias switch 6621. It is to be noted that the driving transistor 6601 is an n-type transistor.

A source terminal of the driving transistor 6601 is connected to an anode of the display element 6605, a gate terminal thereof is connected to the signal line 6608 via the capacitor 6602, and a drain terminal thereof is connected to the power supply line 6609 via the first switch 6603. It is to be noted that a power supply potential Vdd is supplied to the power supply line 6609. The potential supplied to the power supply line 6609 is not limited to Vdd. For example, in the case where full color display is performed using color elements RGB, the power supply potential may be changed per pixel for each color element of RGB.

In addition, the gate terminal and the drain terminal of the driving transistor 6601 are connected to each other via the second switch 6604. Therefore, when the second switch 6604 is on, the portion between the gate terminal and the drain terminal of the driving transistor 6601 becomes conductive. Then, when the second switch 6604 is turned off, the portion between the gate terminal and the drain terminal of the driving transistor 6601 becomes non-conductive, and a potential difference (a voltage) between a potential of the gate terminal (or the drain terminal) of the driving transistor 6601 and a potential of the signal line 6608 at that moment can be held in the capacitor 6602. Furthermore, a cathode of the display element 6605 is connected to a first wire 6610 to which a potential Vss is supplied. It is to be noted that Vss is a potential satisfying Vss<Vdd; for example, there may be Vss=GND (a ground potential). In addition, the source terminal of the driving transistor 6601 and the anode of the display element 6605 are connected to a second wire 6622 to which a potential Vss2 is supplied, via the reverse bias switch 6621. It is to be noted that Vss2 is a potential satisfying Vss2<Vss.

Figure 66:
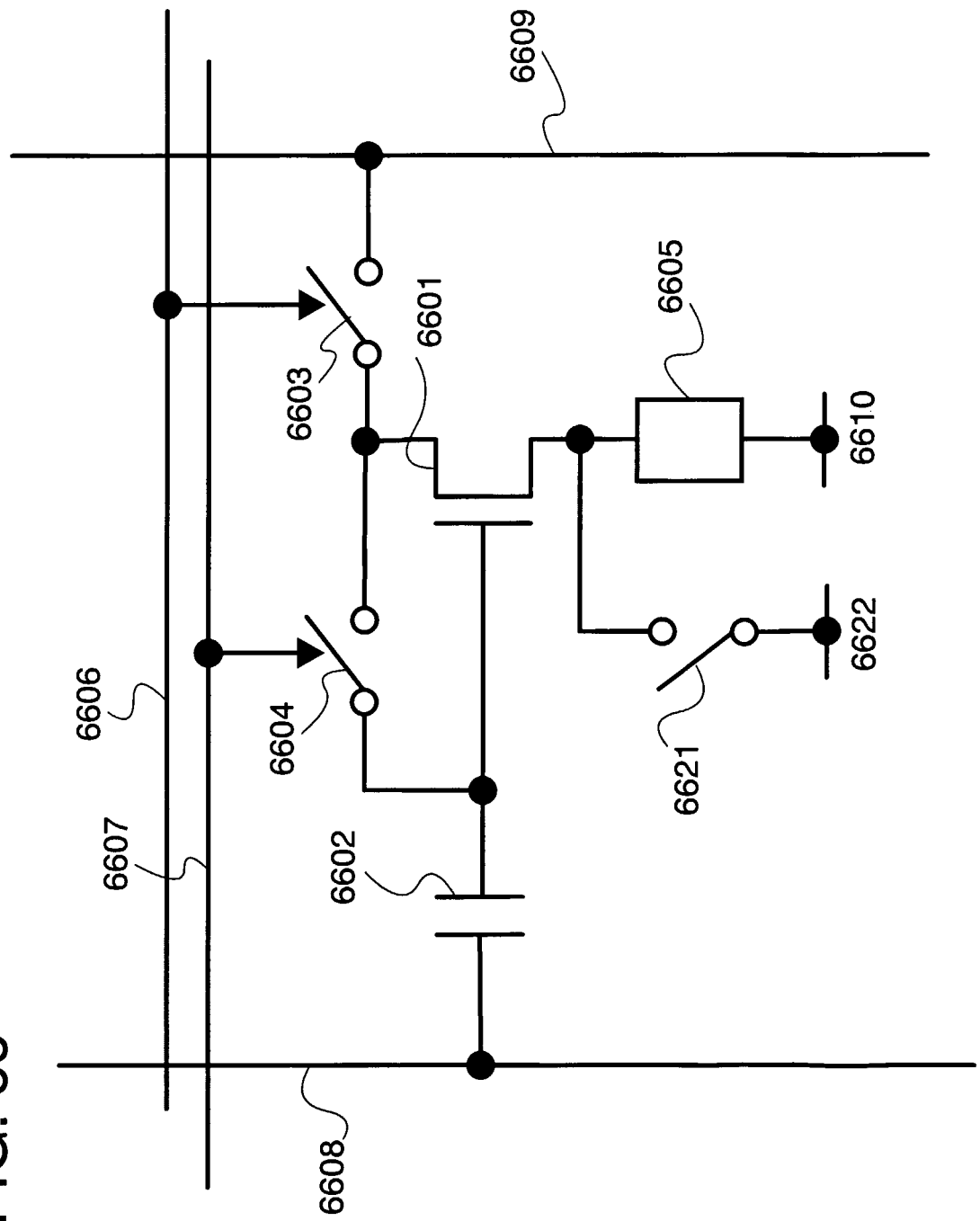
FIG. 66 is a diagram showing a pixel configuration of the invention.

Next, a principle of operation of the pixel configuration shown in FIG. 66 is described.

It is to be noted that according to the pixel configuration described in this embodiment mode, one frame period includes a forward bias period (a writing period and a light emitting period) and a reverse bias period.

In a writing period of the pixel, signals are inputted into the first scan line 6606 and the second scan line 6607 respectively, while the reverse bias switch 6621 is off, to turn on the first switch 6603 and the second switch 6604. Then, a power supply potential (Vdd) of the power supply line 6609 is supplied to the drain terminal and the gate terminal of the driving transistor 6601. Current flows into the capacitor 6602, the driving transistor 6601, and the display element 6605, and the capacitor 6602 accumulates or discharges charge. It is to be noted that an analog signal potential is supplied to the signal line 6608 in the writing period of the pixel; this analog signal potential corresponds to a video signal.

After a while, current stops flowing into the capacitor 6602. Then, current flows into the driving transistor 6601 and the display element 6605. This is because the portion between the gate terminal and the drain terminal of the driving transistor 6601 is conductive by the second switch 6604 so that a potential of the gate terminal becomes the power supply potential (Vdd) and the driving transistor 6601 is turned on.

In this state, the first switch 6603 is turned off, thereby current flows into the driving transistor 6601 and the capacitor 6602, and then stops flowing into them. In this manner, the driving transistor 6601 is turned off. A gate-source voltage Vgs of the driving transistor 6601 is, at this time, approximately equal to a threshold voltage Vth thereof.

Reaching this state, the second switch 6604 is turned off, and the capacitor 6602 holds a potential difference (Vp) between a potential of the gate terminal of the driving transistor 6601 to turn off the transistor and the analog signal potential supplied to the signal line 6608 at the moment when the second switch 6604 is turned off. In this manner, an analog signal is written into the pixel.

It is to be noted that on/off of the first switch 6603 and the second switch 6604 as described above can be controlled by inputting pulse signals into the first scan line 6606 and the second scan line 6607 respectively.

After an analog signal has been written into the pixel, on/off of the driving transistor 6601 is controlled in accordance with change of a potential of the signal line 6608, based on the analog signal potential which has been supplied to the signal line 6608 when the analog signal is written. That is, in the case where the potential of the signal line 6608 is lower than the analog signal potential when the analog signal is written into the pixel in the writing period, the driving transistor 6601 is turned off while in the case where the potential of the signal line 6608 is higher than the analog signal potential when the analog signal is written into the pixel in the writing period, the driving transistor 6601 is turned on.

The potential difference (Vp) has been held by the capacitor 6602 when an analog signal has been written into the pixel; therefore, in the case where a potential of the signal line 6608 is lower than an analog signal potential when the analog signal has been written into the pixel, a potential of the gate terminal of the driving transistor 6601 also becomes lower than a potential of the gate terminal when the analog signal has been written into the pixel, thereby the driving transistor 6601 is turned off. On the other hand, in the case where a potential of the signal line 6608 is higher than the analog signal potential when the analog signal has been written into the pixel in the writing period, the potential of the gate terminal of the driving transistor 6601 also becomes higher than the potential of the gate terminal when the analog signal has been written into the pixel, thereby the driving transistor 6601 is turned on.

Accordingly, in a light emitting period of the pixel, by changing the potential supplied to the signal line 6608 in an analog manner while the reverse bias switch 6621 is off, the second switch 6604 is turned off and the first switch 6603 is turned on, on/off of the driving transistor 6601 is controlled so that time for supplying current, to the display element 6605 is controlled in an analog manner to express gradation.

It is to be noted that as the potential supplied to the signal line 6608, the waveform 5901, the waveform 5902, the waveform 5903, the waveform 5904, the waveform 5905, the waveform 5906, or the waveform 5907 may be supplied or a plurality of one of them may be supplied in succession as described in Embodiment Mode 1.

By supplying in succession, light emitting time can be dispersed within one frame. Consequently, the frame frequency appears to be improved and screen flicker can be prevented.

In the reverse bias period, the first switch 6603 and the second switch 6604 are turned off while the reverse bias switch 6621 is turned on.

The portions between the drain terminal of the driving transistor 6601 and the power supply line 6609 and between the drain terminal of the driving transistor 6601 and the signal line 6608 become, therefore, non-conductive. In addition, the electrode functioning as the anode of the display element 6605 in the forward bias period (also called a writing period and a light emitting period) is connected to the second wire 6622 while the electrode functioning as the cathode is connected to the first wire 6610. Therefore, the height of the respective potentials supplied to the electrodes of the anode and the cathode of the display element 6605 in the forward bias period become reverse in the reverse bias period; that is, in the reverse bias period, a voltage reverse to that in the time gradation display period is applied to the display element 6605.

Even if a voltage reverse to that in the forward bias period is applied to the display element 6605 in the reverse bias period, current does not flow into the normal display element 6605. On the other hand, if there is a short-circuit portion in the display element 6605, current flows into the short-circuit portion. Therefore, in the reverse bias period, the reverse voltage is applied such that current flows enough to isolate the short-circuit portion.

By isolating the short-circuit portion of the display element 6605 as described above, a display defect of the pixel can be improved. Furthermore, lifetime of the display element 6605 can be lengthened.

Figure 67:
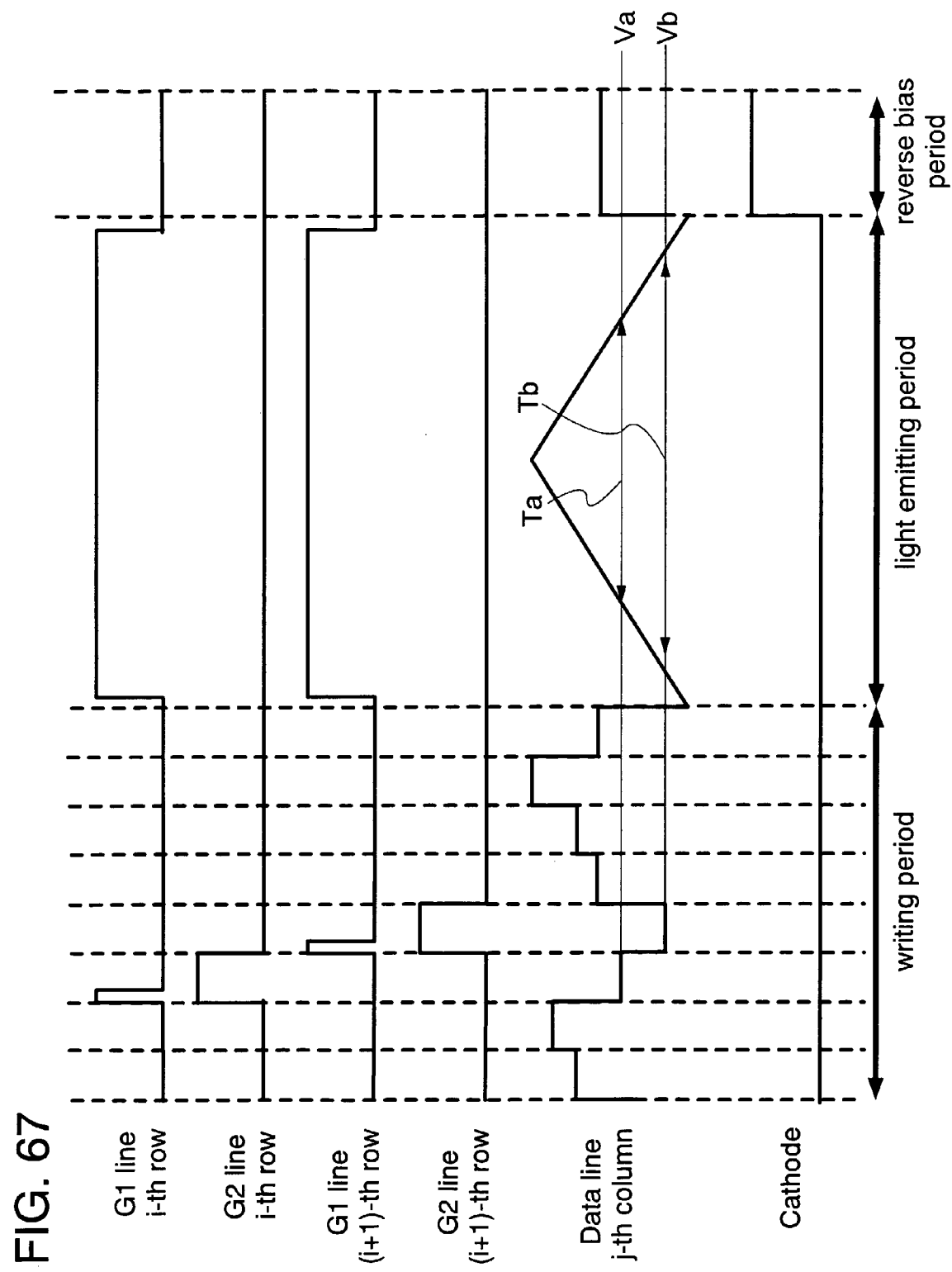
FIG. 67 is a diagram showing a timing chart of a display device having a pixel configuration of the invention.

It is to be noted that as shown in FIG. 67, the potential of the first wire (Cathode) 6610 in the reverse bias period is preferably set to be higher than that in the forward bias period. As a result of this, a voltage enough to isolate the short-circuit portion of the display element 6605 can be easily set.

Embodiment Mode 7

In this embodiment mode, a source follower is employed in a pixel and a p-type transistor is used as a transistor for driving a display element.

A pixel comprises a driving transistor 6901, a capacitor 6902, a first switch 6903, a second switch 6904, a display element 6905, a first scan line (G1 line) 6906, a second scan line (G2 line) 6907, a signal line (Data line) 6908, and a power supply line (Supply line) 6909. It is to be noted that the driving transistor 6901 is a p-type transistor.

A source terminal of the driving transistor 6901 is connected to a cathode of the display element 6905, a gate terminal thereof is connected to the signal line 6908 via the capacitor 6902, and a drain terminal thereof is connected to the power supply line 6909 via the first switch 6903. It is to be noted that a power supply potential Vss is supplied to the power supply line 6909. In addition, the gate terminal and the drain terminal of the driving transistor 6901 are connected to each other via the second switch 6904. Therefore, when the second switch 6904 is on, the portion between the gate terminal and the drain terminal of the driving transistor 6901 becomes conductive. Then, when the second switch 6904 is turned off, the portion between the gate terminal and the drain terminal of the driving transistor 6901 becomes non-conductive, and a potential difference (a voltage) between a potential of the gate terminal (or the drain terminal) of the driving transistor 6901 and a potential of the signal line 6908 at that moment can be held in the capacitor 6902. Furthermore, an anode of the display element 6905 is connected to a wire 6910 to which a potential Vdd is supplied. It is to be noted that Vss is a potential satisfying Vss<Vdd; for example, there may be Vss=GND (a ground potential). It is also to be noted that the potential supplied to the power supply line 6909 is not limited to Vss. For example, in the case where full color display is performed using color elements RGB, the power supply potential may be changed per pixel for each color element of RGB.

Figure 69:
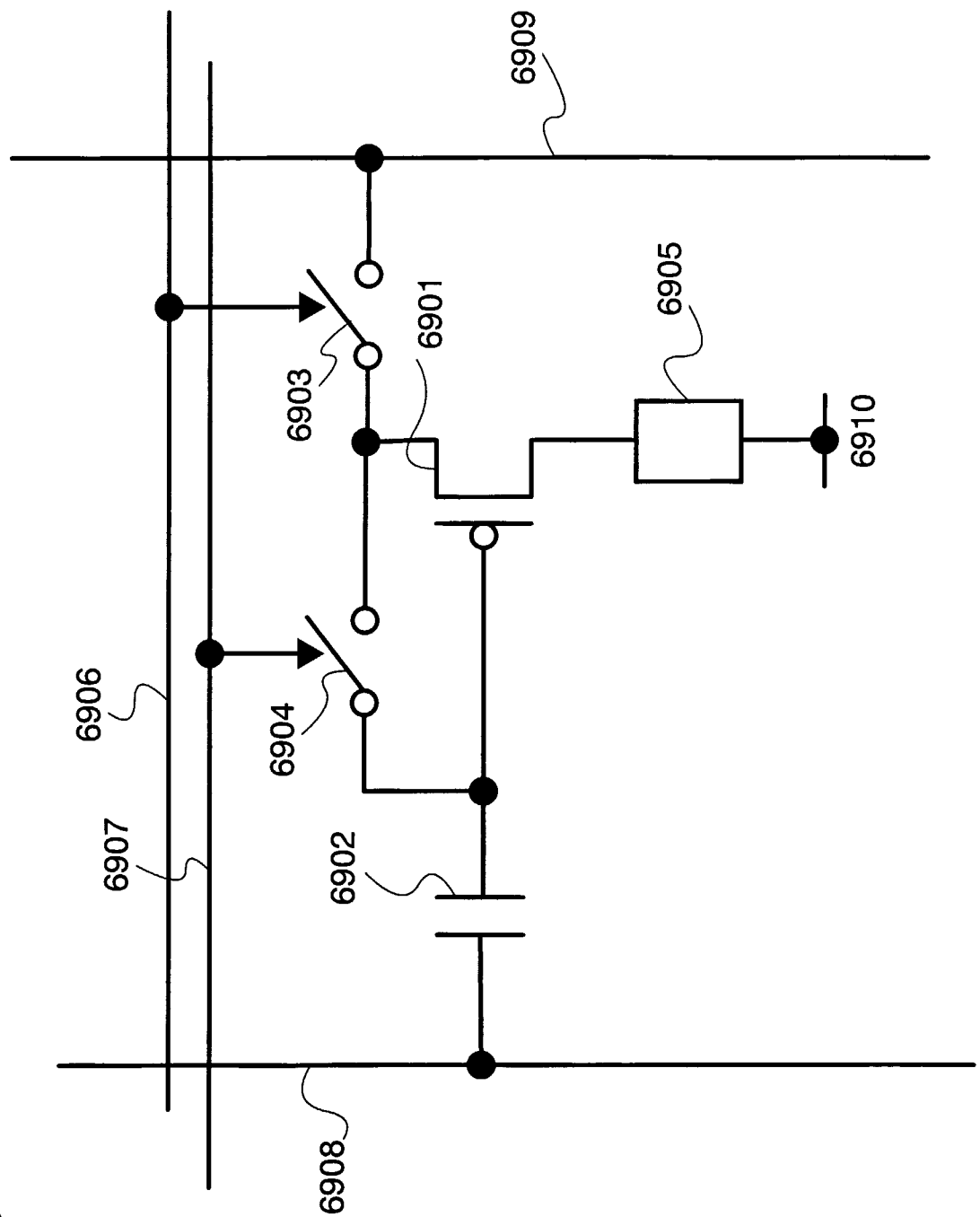
FIG. 69 is a diagram showing a pixel configuration of the invention.

Next, a principle of operation of the pixel configuration shown in FIG. 69 is described.

In a writing period of the pixel, signals are inputted into the first scan line 6906 and the second scan line 6907 respectively to turn on the first switch 6903 and the second switch 6904. Then, the power supply potential (Vss) of the power supply line 6909 is supplied to the drain terminal and the gate terminal of the driving transistor 6901. Current flows into the capacitor 6902, the driving transistor 6901, and the display element 6905, and the capacitor 6902 accumulates or discharges charge. It is to be noted that an analog signal potential is supplied to the signal line 6908 in the writing period of the pixel; this analog signal potential corresponds to a video signal.

After a while, current stops flowing into the capacitor 6902. Then, current flows into the driving transistor 6901 and the display element 6905. This is because the portion between the gate terminal and the drain terminal of the driving transistor 6901 is conductive by the second switch 6904 so that a potential of the gate terminal becomes the power supply potential (Vss) and the driving transistor 6901 is turned on.

In this state, the first switch 6903 is turned off, thereby current flows into the driving transistor 6901 and the capacitor 6902, and then stops flowing into them. In this manner, the driving transistor 6901 is turned off. A gate-source voltage Vgs of the driving transistor 6901 is, at this time, approximately equal to a threshold voltage Vth thereof.

Reaching this state, the second switch 6904 is turned off, and the capacitor 6902 holds a potential difference (Vp) between a potential of the gate terminal of the driving transistor 6901 to turn off the transistor and the analog signal potential supplied to the signal line 6908 at the moment when the second switch 6904 is turned off. In this manner, an analog signal is written into the pixel.

It is to be noted that on/off of the first switch 6903 and the second switch 6904 as described above are controlled by inputting pulse signals into the first scan line 6906 and the second scan line 6907 respectively.

After an analog signal has been written into the pixel, on/off of the driving transistor 6901 is controlled in accordance with change of a potential of the signal line 6908, based on the analog signal potential which has been supplied to the signal line 6908 when the analog signal is written. That is, in the case where the potential of the signal line 6908 is higher than the analog signal potential when the analog signal is written into the pixel in the writing period, the driving transistor 6901 is turned off while in the case where the potential of the signal line 6908 is lower than the analog signal potential when the analog signal is written into the pixel in the writing period, the driving transistor 6901 is turned on.

The potential difference (Vp) has been held by the capacitor 6902 when an analog signal has been written into the pixel; therefore, in the case where a potential of the signal line 6908 is higher than an analog signal potential when the analog signal has been written into the pixel, a potential of the gate terminal of the driving transistor 6901 also becomes higher than a potential of the gate terminal when the analog signal has been written into the pixel, thereby the driving transistor 6901 is turned off. On the other hand, in the case where a potential of the signal line 6908 is lower than the analog signal potential when the analog signal has been written into the pixel in the writing period, the potential of the gate terminal of the driving transistor 6901 also becomes lower than the potential of the gate terminal when the analog signal has been written into the pixel, thereby the driving transistor 6901 is turned on.

Accordingly, in a light emitting period of the pixel, by changing the potential supplied to the signal line 6908 in an analog manner while the second switch 6904 is turned off and the first switch 6903 is turned on, on/off of the driving transistor 6901 is controlled so that time for supplying current to the display element 6905 is controlled in an analog manner to express gradation.

It is to be noted that as the potential supplied to the signal line 6908, the waveform 5901, the waveform 5902, the waveform 5903, the waveform 5904, the waveform 5905, the waveform 5906, or the waveform 5907 may be supplied or a plurality of one of them may be supplied in succession as described in Embodiment Mode 1.

By supplying in succession, light emitting time can be dispersed within one frame. Consequently, the frame frequency appears to be improved and screen flicker can be prevented.

As described in this embodiment mode, by using a p-type transistor as a driving transistor, generation of a hot carrier can be prevented and degradation lifetime of the transistor can be lengthened.

Figure 13A:
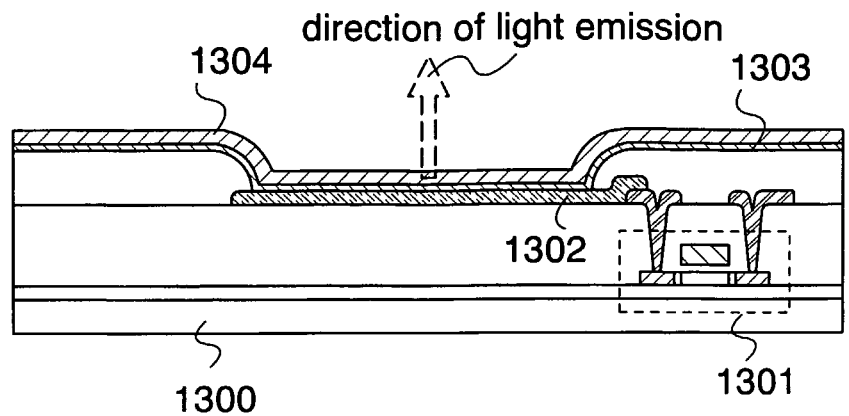
FIGS. 13A to 13C are diagrams each illustrating a light emission structure of a display element.

In addition, by employing a top emission structure as shown in FIG. 13A in a display panel having the pixel configuration described in this embodiment mode, a second electrode 1304 corresponding to an anode can be formed by a light-transmissive conductive film having the high light-transmissivity such as ITO and IZO.

In addition, in the configuration in which a second scan line of pixels of the next row is employed as a power supply line as shown in FIG. 25, a p-type transistor may be used as the driving transistor 2501, and n-type transistors may be used as the first switching transistor 2503 and the second switching transistor 2504. Accordingly, leakage current of the switching transistors can be reduced.

Embodiment Mode 8

In this embodiment mode, constitution of a preferable display device for full color display having the pixel configuration of the invention is described.

In the case of full dolor display, a power supply line (Supply line) is provided per pixel for each color element, and a potential of the power supply line is set for each color element, so that the luminance of the display element can be adjusted for each color. Accordingly, even if the display element for each color has a different luminance characteristic, color tone can be adjusted. For example, in the case of having the pixel shown in FIG. 2, respective potentials can be set to the power supply lines P1 to Pn which include a power supply line to which a potential inputted into the anode of the display element of a pixel of a color element R (red) is supplied, a power supply line to which a potential inputted into the anode of the display element of a pixel of a color element G (green) is supplied, a power supply line to which a potential inputted into the anode of the display element of a pixel of a color element B (blue) is supplied, and a power supply line to which a potential inputted into the anode of the display element of a pixel of a color element W (white) is supplied, in accordance with the respective luminous characteristics for colors.

In addition, as another constitution, a display element for white (W) is used as a display element of a pixel for example, and a color filter is used to perform full color display, so that the luminance obtained from each color element can be approximately equivalent.

Figure 74:
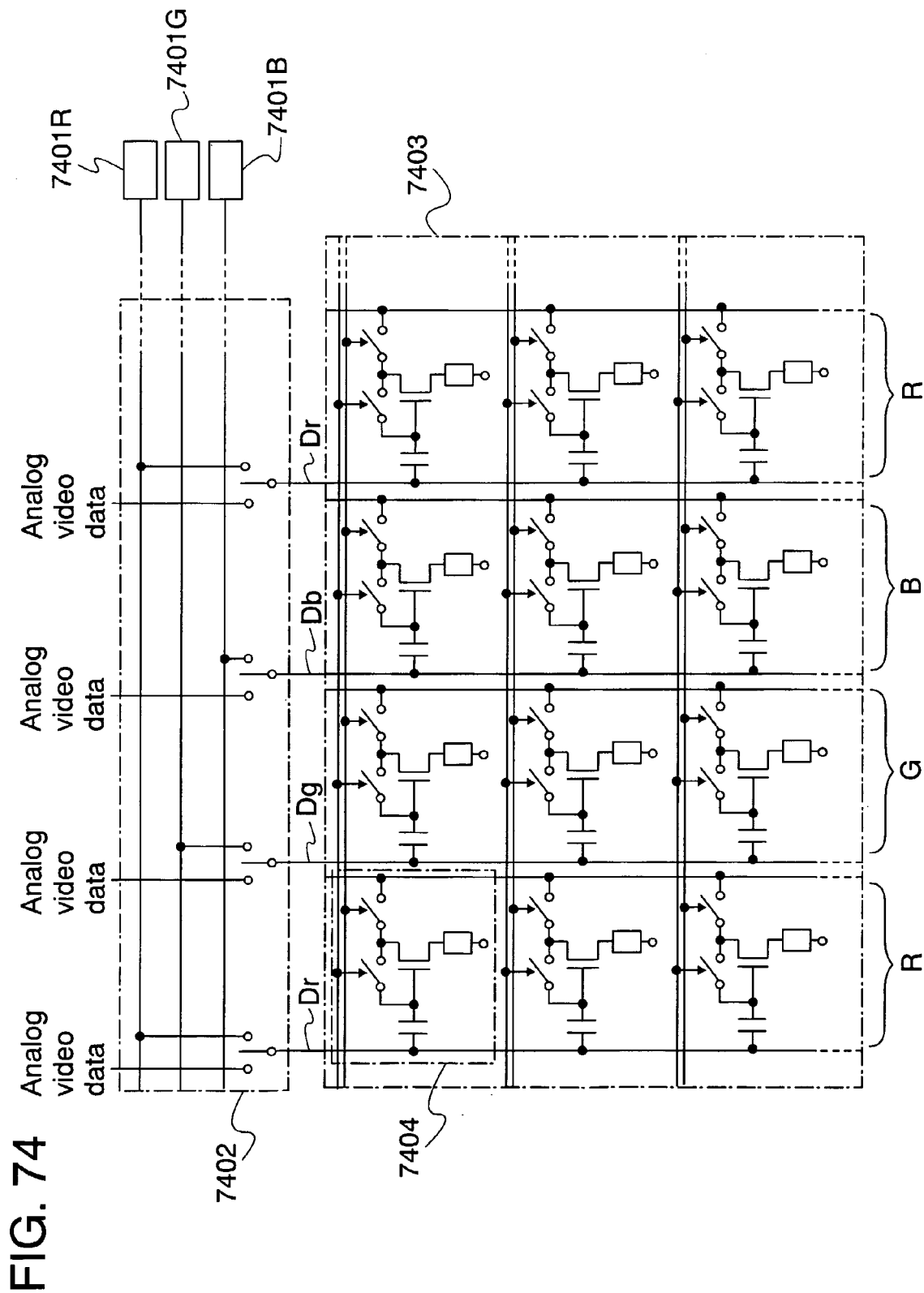
FIG. 74 is a pattern diagram of a display device of the invention.

In addition, as another constitution, a pattern diagram of a display device in this embodiment mode is shown in FIG. 74. It is to be noted that FIG. 74 is a pattern diagram of a full-color display device which has pixels for each color element using each display element of RGB, for example. The display device comprises a triangular wave potential generating circuits 7401R, 7401G, and 7401B, a switching circuit 7402, and a pixel region 7403. A plurality of pixels 7404 is disposed in matrix in the pixel region 7403. A signal is inputted from a signal line Dr into a pixel column of R, from a signal line Dg into a pixel column of G, and from a signal line Db into a pixel column of B. It is to be noted that although the pixel configuration shown in FIG. 1 is applied to the pixel 7404, the invention is not limited to this and the pixels of the invention can be applied approximately.

In addition, the triangular wave potential generating circuit 7401R generates a triangular wave potential for the pixel column of a color element R. The triangular wave potential generating circuit 7401G generates a triangular wave potential for the pixel column of a color element G, and the triangular wave potential generating circuit 7401B generates a triangular wave potential for the pixel column of a color element B.

In a writing period of the pixel, terminals to which a video signal (Analog video data) is inputted and the signal lines Dr, Dg, and Db are connected respectively by the switching circuit 7402. Then, in a light emitting period, a terminal to which a triangular wave is inputted from the triangular wave potential generating circuit 7401R is connected to the signal line Dr, a terminal to which a triangular wave is inputted from the triangular wave potential generating circuit 7401G is connected to the signal line Dg, and a terminal to which a triangular wave is inputted from the triangular wave potential generating circuit 7401B is connected to the signal line Db by the switching circuit 7402.

In this manner, a different triangular wave can be supplied for pixels of each color. Accordingly, light emitting time can be controlled in accordance with the luminance characteristic of a display element for each color, thereby clear full color display can be performed. Furthermore, there is no need to provide a wire for pixels of each color element in the pixel region 7403, thereby the opening ratio can be increased.

Figure 75:
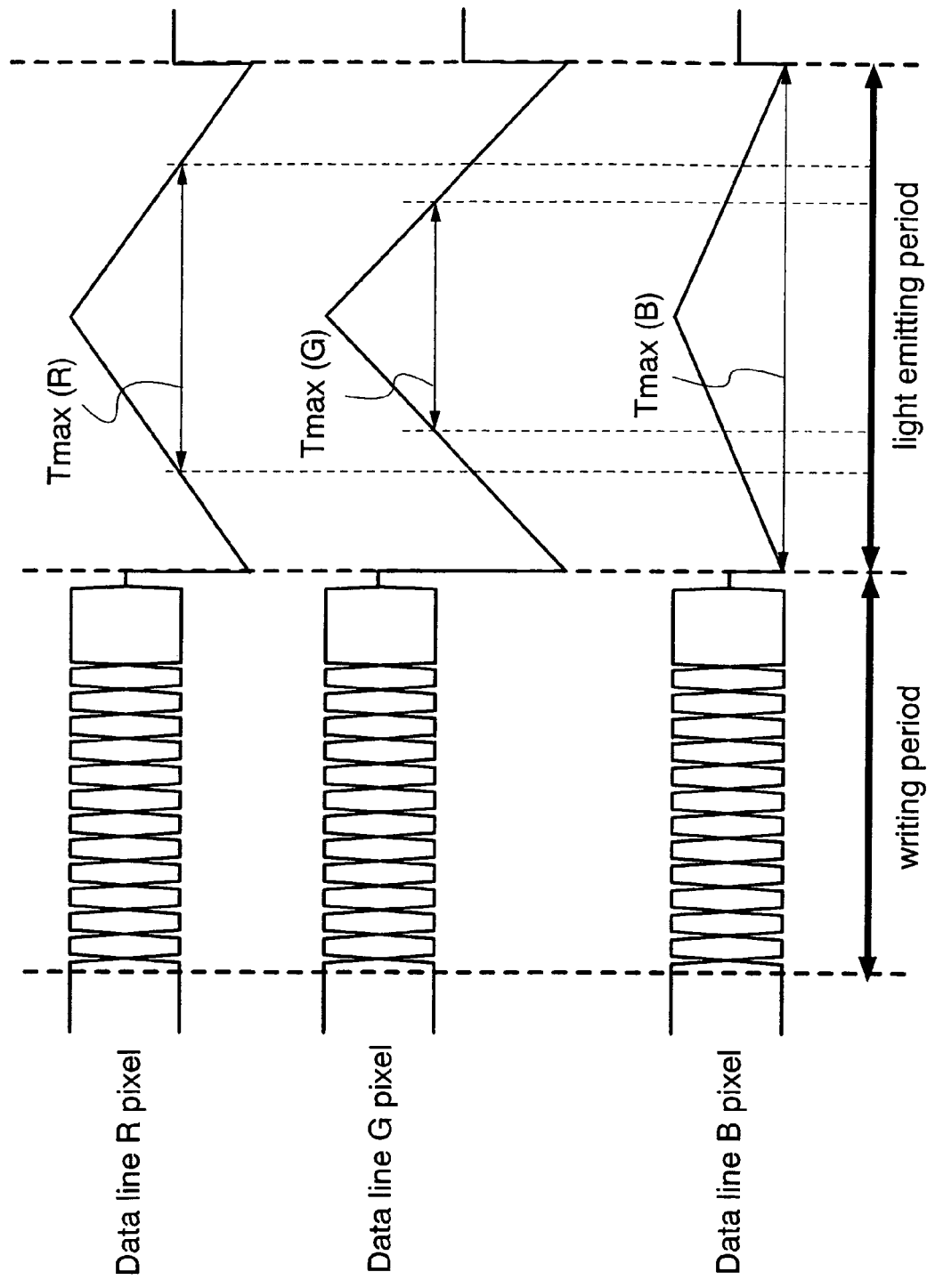
FIG. 75 is a diagram illustrating a signal and a potential supplied to a signal line.

A correlation between a luminance characteristic of the display element and a triangular wave inputted into the signal line is described with reference to FIG. 75. For example, the case where the luminance obtained from the display element of a pixel for a color element G is lower while the luminance obtained from the display element of a pixel for a color element B is higher when the luminance characteristic of the display element of a pixel for a color element R is regarded as a standard is described.

In this case, when a triangular wave potential inputted into the signal line Dr (Data line R pixel) is regarded as a standard, a triangular wave potential inputted into the signal line Dg (Data line G pixel) is sloped sharply; that is, the amplitude of the potential of the triangular wave is increased. On the other hand, a triangular wave potential inputted into the signal line Db (Data line B pixel) is sloped gently; that is, the amplitude of the triangular wave potential is decreased.

As a result of this, light emitting time can be changed for a pixel for each color element when the same gradation is displayed. For example, a display period for the highest gradation within one frame period of a pixel of R is Tmax(R), a display period for the highest gradation within one frame period of a pixel of G is Tmax(G), and a display period for the highest gradation within one frame period of a pixel of B is Tmax(B).

Figure 76:
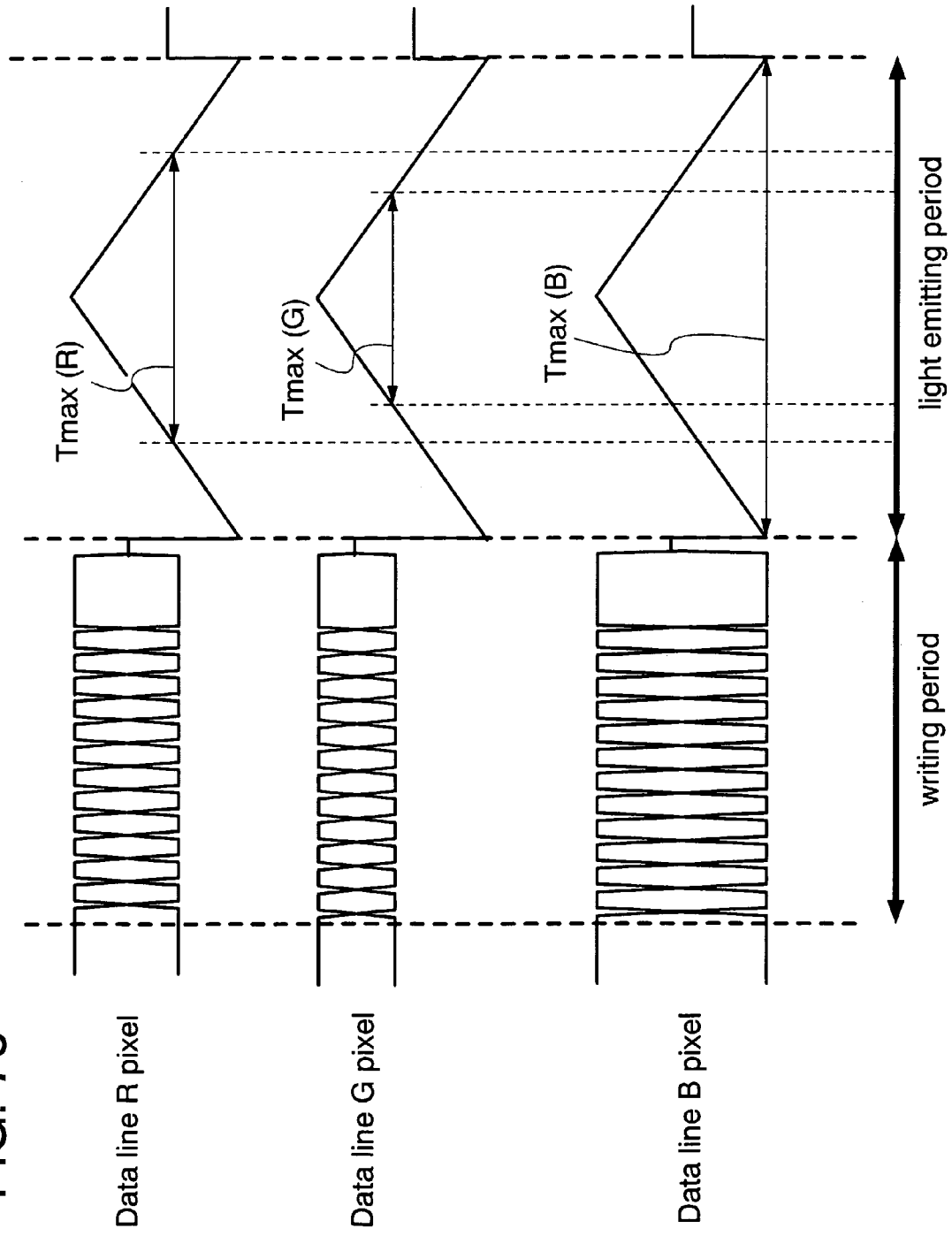
FIG. 76 is a diagram illustrating a signal and a potential supplied to a signal line.

In addition, as another structure, the width of a potential of a video signal may be changed for each color element. That is, as shown in FIG. 76, when a pixel for a color element R is regarded as a standard, the width of a video signal of G is decreased in the case where the luminance obtained from the display element of a pixel for a color element G is low. Meanwhile, the width of a video signal of B is increased in the case where the luminance obtained from the display element of a pixel for a color element B is high. In this manner, light emitting time can be changed for a pixel for each color element when the same gradation is displayed. For example, a display period for the highest gradation within one frame period of a pixel of R is Tmax(R), a display period for the highest gradation within one frame period of a pixel of G is Tmax(G), and a display period for the highest gradation within one frame period of a pixel of B is Tmax(B).

In addition, as another structure, a structure for shifting for each color element a potential corresponding to each gradation of a video signal and a structure for changing for each color element the amplitude of a triangular wave potential may be combined. As a result of this, the amplitude can be reduced and reduction in power consumption can be achieved.

Embodiment Mode 9

Subsequently, a cross sectional structure of preferable constitution of a display panel having the pixel shown in FIG. 73 is described with reference to a cross sectional diagram FIG. 77.

A base film 7702 is formed on a substrate 7701. As the substrate 7701, an insulating substrate such as a glass substrate, a quartz substrate, a plastic substrate, and a ceramic substrate, a metal substrate, a semiconductor substrate, or the like may be used. The base film 7702 can be formed by CVD or sputtering. For example, a silicon oxide film, a silicon nitride film, a silicon oxynitride film, or the like formed by CVD using $SiH_4$, $N_2O$, $NH_3$, or the like as a source material can be used. Alternatively, these films may be stacked. It is to be noted that the base film 7702 is provided to prevent an impurity from entering a semiconductor layer from the substrate 7701; therefore, the base film 7702 may not be provided when a glass substrate or a quartz substrate is used as the substrate 7701.

Next, an island-shaped semiconductor layer is formed on the base film 7702. In the semiconductor layer, a channel forming region 7703, an impurity region 7704 to form a source region and a drain region, and a low-concentration impurity region (an LDD region) 7705 of a transistor 7727, and a channel forming region 7706, an impurity region 7707 to form a source region and a drain region, and a low-concentration impurity region (an LDD region) 7708 of a transistor 7728 are formed. A gate electrode 7710 and a gate electrode 7711 are formed above the channel forming region 7703 and the channel forming region 7706 respectively with a gate insulating film 7709 interposed therebetween. The gate insulating film 7709 can be formed of a silicon oxide film, a silicon nitride film, a silicon oxynitride film, or the like by CVD or sputtering. In addition, the gate electrode 7710 and the gate electrode 7711 can be formed of an aluminum (Al) film, a copper (Cu) film, a thin film containing aluminum or copper as its main component, a chromium (Cr) film, a tantalum (Ta) film, a tantalum nitride (TaN) film, a titanium (Ti) film, a tungsten (W) film, a molybdenum (Mo) film, or the like.

Sidewalls 7712 are formed on the sides of the gate electrode 7710 and sidewalls 7713 are formed on the sides of the gate electrode 7711. The sidewalls 7712 and 7713 can be formed by forming a silicon compound film such as a silicon oxide film, a silicon nitride film, or a silicon oxynitride film to cover the gate electrode 7710 and the gate electrode 7711, and etching back it.

It is to be noted that the low-concentration impurity regions 7705 and 7708 are provided below the sidewalls 7712 and 7713 respectively. That is, the low-concentration impurity regions 7705 and 7708 are formed in a self-aligned manner. It is to be noted that the sidewalls 7712 and 7713 are provided to form the low-concentration impurity regions 7705 and 7708 in a self-aligned manner, and they may not be provided.

A first interlayer insulating film is formed on the gate electrode 7710, the gate electrode 7711, the sidewall 7712, the sidewall 7713, and the gate insulating film 7709. The first interlayer insulating film is structured by a lower layer of an inorganic insulating film 7714 and an upper layer of a resin film 7715. As the inorganic insulating film 7714, a silicon nitride film, a silicon oxide film, or a silicon oxynitride film, or a film obtained by stacking them can be used. The resin film 7715 can be formed of polyimide, polyamide, acrylic, polyimide-amide, epoxy, or the like.

A wire 7716, a wire 7717, a wire 7718, and a wire 7719 are formed on the first interlayer insulating film. The wire 7716 and the wire 7717 are electrically connected to the impurity region 7704 through contact holes, and the 7718 and the wire 7719 are electrically connected to the impurity region 7707 through contact holes. As the wires 7716, 7717, 7718, and 7719, a titanium (Ti) film, an aluminum (Al) film, a copper (Cu) film, an aluminum film containing Ti, or the like can be used. It is to be noted that copper which has low resistance is preferably used in the case where a wire such as a signal line is provided in the same layer as that of the wires 7716, 7717, 7718, and 7719.

On the wires 7716, 7717, 7718, and 7719, and the first interlayer insulating film, a second interlayer insulating film 7720 is formed. As the second interlayer insulating film 7720, an inorganic insulating film or a resin film, or a layer obtained by stacking them can be used. As the inorganic insulating film, a silicon nitride film, a silicon oxide film, or a silicon oxynitride film, or a layer obtained by stacking them can be used. The resin film can be formed of polyimide, polyamide, acrylic, polyimide-amide, epoxy, or the like.

On the second interlayer insulating film 7720, a pixel electrode 7721 and a wire 7722 are formed, which are formed of the same material, that is, they are formed in the same layer at the same time. The material of the pixel electrode 7721 and the wire 7722 has preferably a large work function. For example, a single-layer film such as a titanium nitride (TiN) film, a chromium (Cr) film, a tungsten (W) film, a zinc (Zn) film, or a platinum (Pt) film, a stacked layer of a titanium nitride film and a film containing aluminum as its main component, a three-layer structure of a titanium nitride film, a film containing aluminum as its main component and a titanium nitride film, or the like can be used. It is to be noted that if a stacked-layer structure is employed here, the resistance as the wire can be low, a good ohmic contact can be obtained, and besides, it can function as an anode. By using a light-reflective metal film, an anode which does not transmit light can be formed.

An insulator 7723 is provided so as to cover the end portions of the pixel electrode 7721 and the wire 7722. For example, a positive type photosensitive acrylic resin film can be used as the insulator 7723.

On the pixel electrode 7721, a layer containing an organic compound 7724 is formed and partially overlaps the insulator 7723. It is to be noted that the layer containing an organic compound 7724 is not formed on the wire 7722.

On the layer containing an organic compound 7724, the insulator 7723, and the wire 7722, an opposing electrode 7725 is provided. The material of the opposing electrode 7725 has preferably a low work function. For example, a metal thin film of aluminum (Al), silver (Ag), lithium (Li), calcium (Ca), an alloy thereof such as MgAg, MgIn, AlLi, $CaF_2$, CaN, or the like can be used. By using the thin metal film as described above, a cathode which can transmit light can be formed.

A display element 7726 is formed in a region where the layer containing an organic compound 7724 is sandwiched between the opposing electrode 7725 and the pixel electrode 7721.

In a region where the layer containing an organic compound 7724 is separated by the insulator 7723, a junction 7729 is formed in which the opposing electrode 7725 and the wire 7722 contact each other. Therefore, the wire 7722 functions as an auxiliary electrode of the opposing electrode 7725, and the resistance of the opposing electrode 7725 can be reduced. Consequently, the thickness of the opposing electrode 7725 can be made thin and the light transmission can be increased. Accordingly, the display panel having a structure of taking out light of the display element 7726 from the top surface can exhibit high luminance.

It is to be noted that the opposing electrode 7725 may be formed of a stacked layer of a metal thin film and a transparent conductive film (indium tin oxide (ITO), indium zinc oxide (IZO), zinc oxide (ZnO), or the like) in order to further reduce the resistance thereof. By using the thin metal film and the transparent conductive film as described above, a cathode which can transmit light can be formed.

It is to be noted that the impurity region 7704 and the impurity region 7707 are doped with an n-type impurity. Therefore, the transistor 7727 and the transistor 7728 are n-type transistors.

That is, the transistor 7727 corresponds to the driving transistor 7301 of the pixel shown in FIG. 73, and the transistor 7728 corresponds to the switch 7306 of the pixel in FIG. 73. In addition, the wire 7722 corresponds to the wire 7310 of the pixel in FIG. 73, and the opposing electrode 7725 corresponds to the cathode of the display element 7305 of the pixel in FIG. 73. Thus, the wire 7310 and the cathode of the display element 7305 are connected to each other in the pixel shown in FIG. 73.

Figure 77:
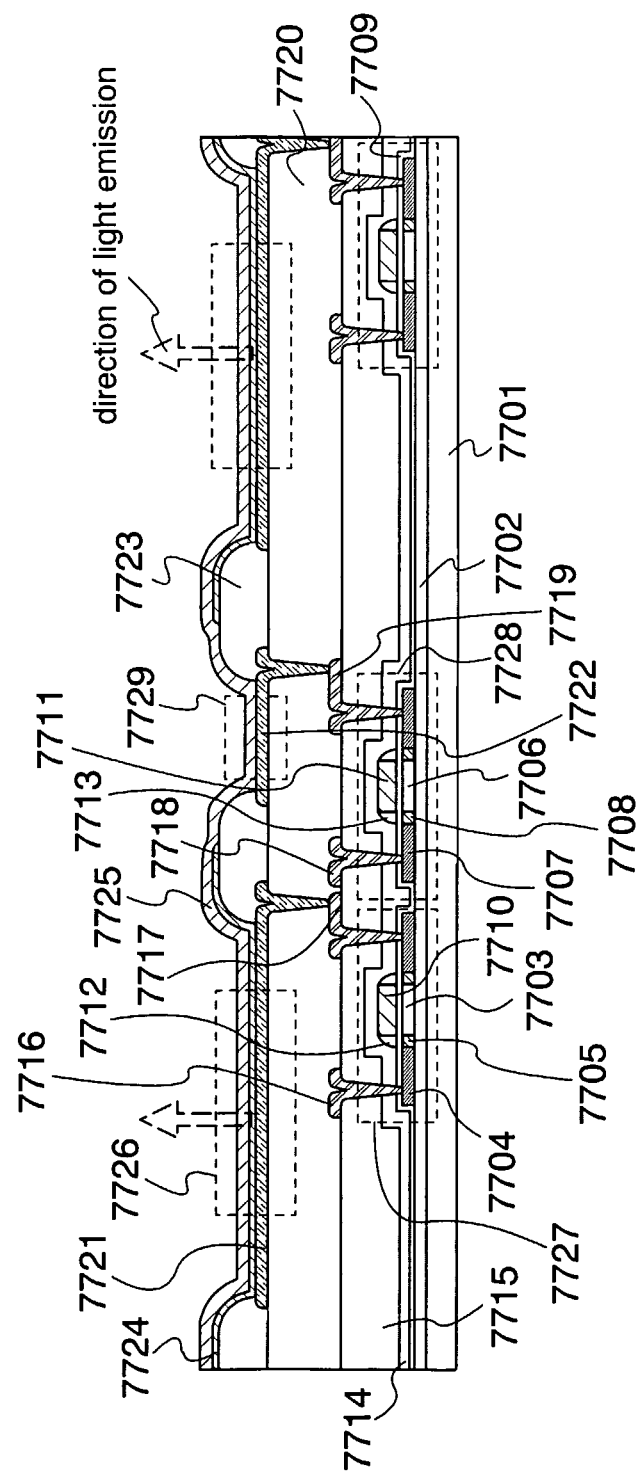
FIG. 77 is a partial cross sectional diagram of a display panel.

It is to be noted that the thickness of the opposing electrode 7725 can be made thin in the display panel illustrated in FIG. 77, thereby the translucency of light emitted from the top surface is high. Accordingly, the luminance of the top emission can be increased. In addition, by connecting the opposing electrode 7725 and the wire 7722 to each other, the resistance of the opposing electrode 7725 and the wire 7722 can be reduced, thereby reduction in power consumption can be achieved.

Next, constitution of the display panel is described with reference to top pattern diagrams FIGS. 78A and 78B of display panels respectively. A signal line driver circuit 7801, a scan line driver circuit 7802, and a pixel region 7803 are formed on a substrate 7800. It is to be noted that the substrate 7800 is connected to an FPC (Flexible Printed Circuit) 7804, and signals such as a video signal, a clock signal, or a start signal inputted into the signal line driver circuit 7801 and the scan line driver circuit 7802 are supplied through the FPC 7804 which is an external input terminal. Onto the junction between the FPC 7804 and the substrate 7800, an IC chip (a semiconductor chip provided with a memory circuit, a buffer circuit, or the like) 7805 is mounted by COG (Chip On Glass) or the like. It is to be noted that although only the FPC 7804 is illustrated here, a printed wiring board (PWB) may be attached to the FPC 7804. The display device in this specification includes not only a main body of the display panel, but also the main body of the display panel provided with an FPC or a PWB, and besides, the main body of the display panel mounted with an IC chip or the like.

Figure 78B:
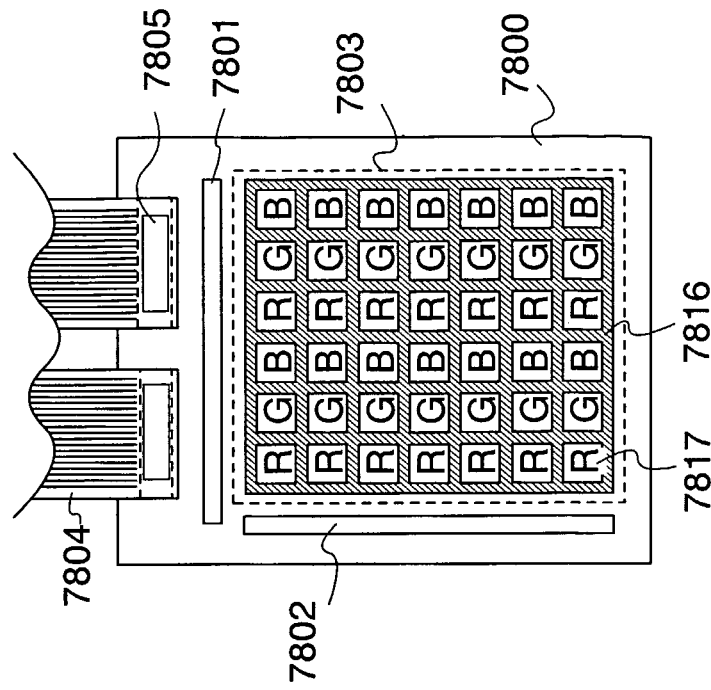
FIGS. 78A and 78B are pattern diagrams respectively of a display device of the invention.
Figure 78A:
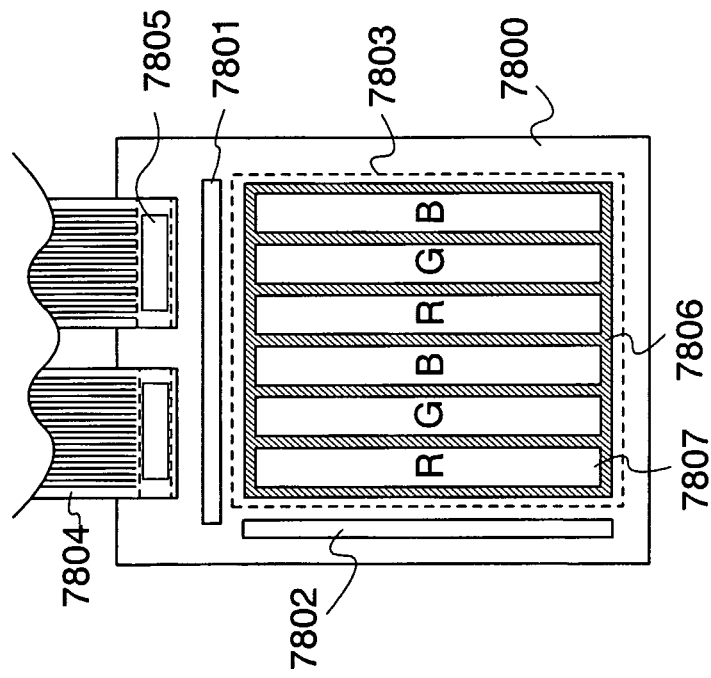
Figure 79:
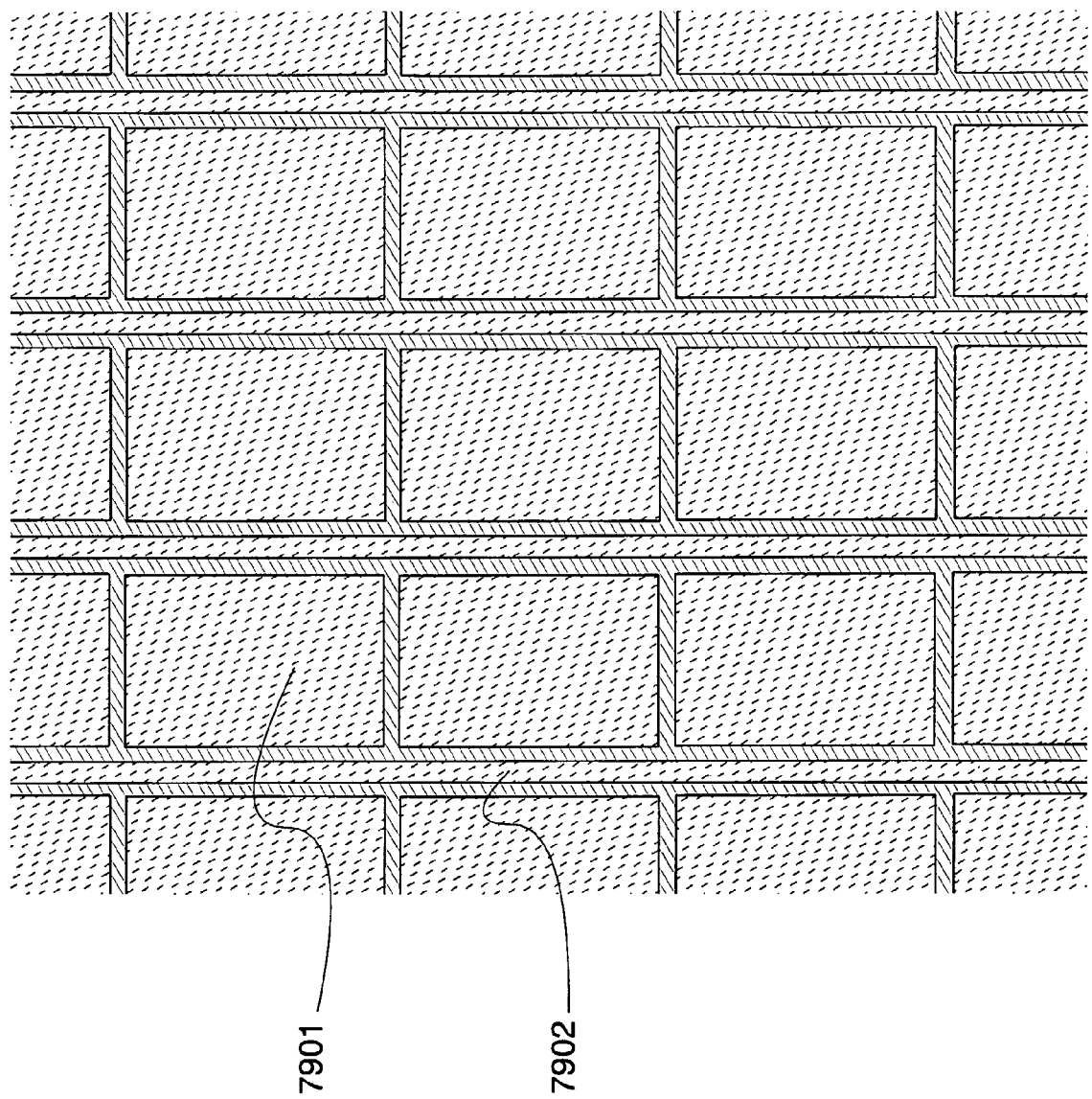
FIG. 79 is a pattern diagram of a pixel region of a display device of the invention.

Pixels are arranged in matrix in the pixel region 7803 of the display panel shown in FIG. 78A so as to form pixel columns for each color element. A layer containing an organic compound 7807 is provided for pixels of one column for each color. In addition, in a region 7806 other than the region where the layers containing an organic compound 7807 are provided, a junction between a wire formed of the same material as a pixel electrode and an opposing electrode is formed in the pixel region. That is, the junction 7729 in the cross sectional diagram FIG. 77 is formed in the region 7806 in FIG. 78A. FIG. 79 is a top pattern diagram of the pixel region. In FIG. 79, a wire 7902 is formed of the same material as a pixel electrode 7901. In addition, the pixel electrode 7901 corresponds to the pixel electrode 7721 in FIG. 77 and the wire 7902 corresponds to the wire 7722 in FIG. 77. A layer containing an organic compound is formed for the pixel electrodes 7901 of one column, and a display element is formed in a region where the layer containing an organic compound is sandwiched between the pixel electrode 7901 and an opposing electrode. In a junction where the opposing electrode and the wire 7902 contact each other, the resistance of the opposing electrode can be reduced. That is, the wire 7902 functions as an auxiliary electrode of the opposing electrode. It is to be noted that by applying the configuration of a pixel region as shown in FIG. 79, a display panel which has a high opening ratio and reduces the resistance of the opposing electrode can be provided.

Figure 80:
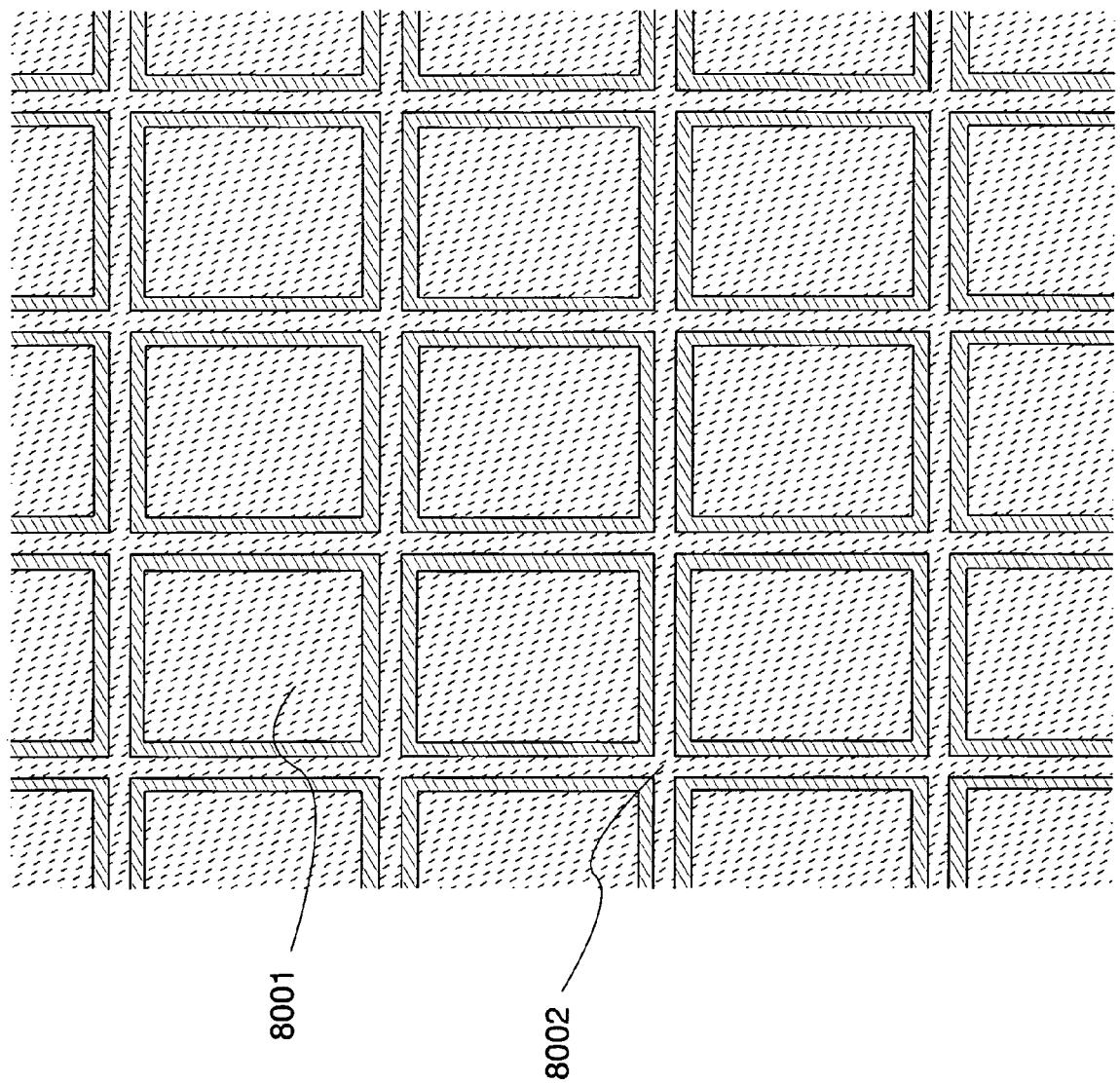
FIG. 80 is a pattern diagram of a pixel region of a display device of the invention.

Pixels are arranged in matrix in the pixel region 7803 of the display panel shown in FIG. 78B so as to form pixel columns for each color element. A layer containing an organic compound 7817 is provided for each pixel of one column for each color. In addition, in a region 7816 other than the region where the layers containing an organic compound 7817 are provided, a junction between a wire formed of the same material as a pixel electrode and an opposing electrode is formed in the pixel region. That is, the junction 7729 in the cross sectional diagram FIG. 77 is formed in the region 7816 in FIG. 78B. FIG. 80 is a top pattern diagram of the pixel region. In FIG. 80, a wire 8002 is formed of the same material as a pixel electrode 8001. In addition, the pixel electrode 8001 corresponds to the pixel electrode 7721 in FIG. 77 and the wire 8002 corresponds to the wire 7722 in FIG. 77. A layer containing an organic compound is formed for each pixel electrode 8001, and a display element is formed in a region where the layer containing an organic compound is sandwiched between the pixel electrode 8001 and an opposing electrode. In a junction where the opposing electrode and the wire 8002 contact each other, the resistance of the opposing electrode can be reduced. That is, the wire 8002 functions as an auxiliary electrode of the opposing electrode. It is to be noted that by applying the configuration of a pixel region as shown in FIG. 80, a display panel which reduces the resistance of the opposing electrode can be provided.

The display panel described in this embodiment mode has high translucency of the opposing electrode and a high opening ratio of the pixel, so that necessary brightness can be obtained even if the luminance is reduced. Therefore, the reliability of the display element can be improved. In addition, reduction in resistance of the opposing electrode can be achieved as well, thereby power consumption can be reduced.

Embodiment Mode 10

In this embodiment mode, a driving method in a case where a predetermined potential is supplied to a signal line (Data line) in a light emitting period without changing in an analog manner is described. It is to be noted that a driving method described in this embodiment mode can be applied to the display devices described in Embodiment Modes 1 to 9.

Figure 81:
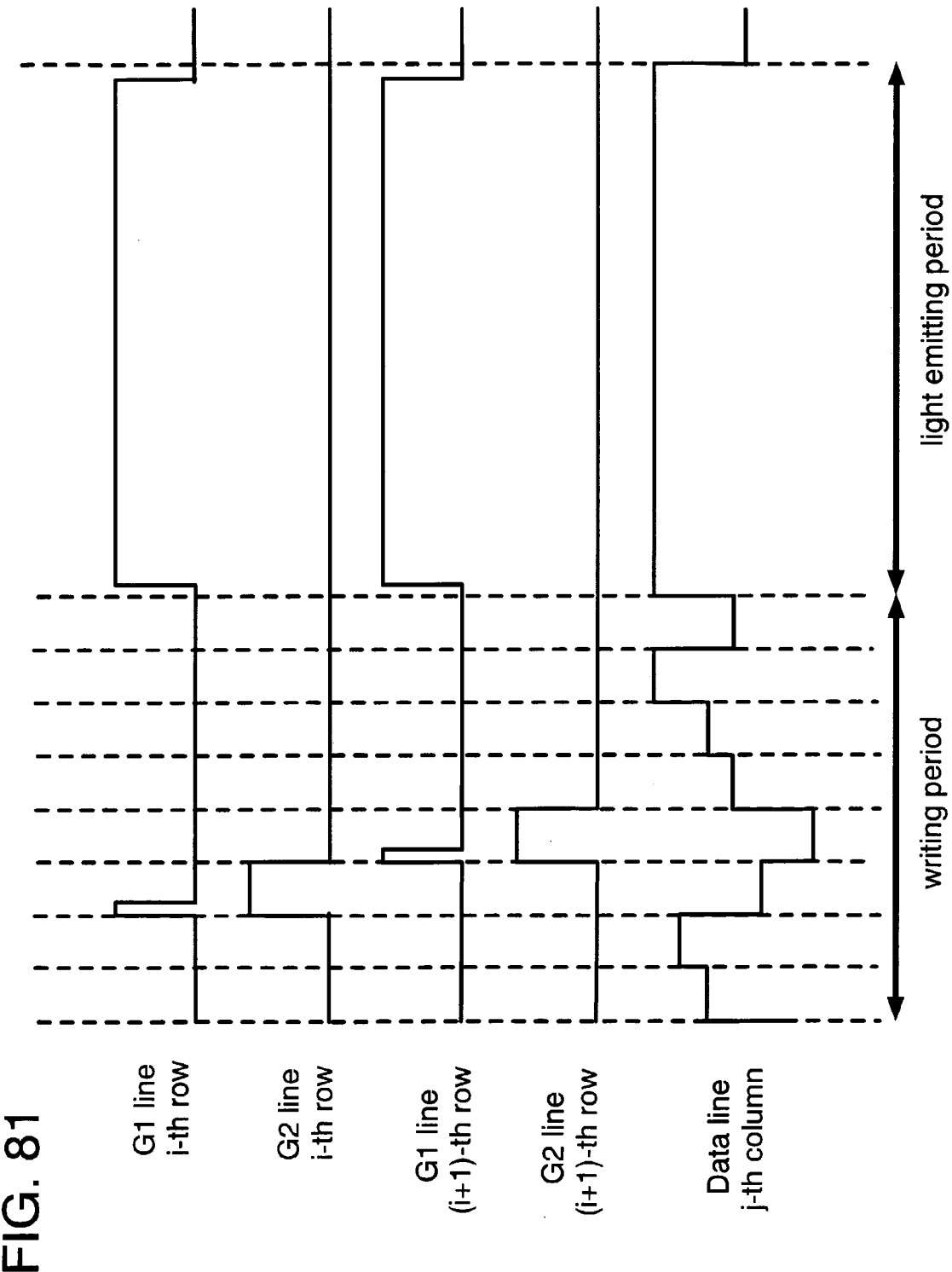
FIG. 81 is a diagram showing a timing chart of a display device having a pixel configuration of the invention.

As one example, the case where a driving method in this embodiment mode is applied to the display device shown in FIG. 2 described in Embodiment Mode 1 is described in detail with reference to a timing chart shown in FIG. 81. FIG. 81 is a diagram showing a timing chart of one pixel column (the j-th column) in the pixel region 204 of the display device shown in FIG. 2. It is to be noted that a driving transistor, a capacitor, a first switch, a second switch, and a display element of each pixel are denoted by the same reference numerals of the pixel 205 for description since the plurality of pixels arranged in the pixel region 204 has the same configuration as the pixel 205.

As shown in FIG. 81, an analog signal potential is inputted into Data line (the signal line Dj) of pixels of the j-th column in a writing period. When pulse signals are inputted into G1 line (the first signal line G1$a_i$) and G2 line (the second signal line G2$b_i$) respectively to turn on the first switch 208 and the second switch 209, a power supply potential (Vdd) from the power supply line Pj is supplied to the drain terminal of the driving transistor 206 of the pixel of the i-th row, and current flows into the capacitor 207, the driving transistor 206, and the display element 210. Then, the capacitor 207 accumulates or discharges charge; specifically, depending on the correlation between charge stored originally in the capacitor 207 and a potential (Va) supplied to Data line (the signal line Dj), either charge accumulation or discharge is performed. Then, since the pulse width of the pulse signal inputted into the second scan line G2$b_i$ is longer than that of the pulse signal inputted into the first scan line G1$a_i$, the first switch 208 is turned off while the second switch 209 is on. At the moment when the first switch 208 is turned off, the driving transistor 206 is on because the power supply potential (Vdd) is supplied to the gate terminal thereof; thus, current flows into the driving transistor 206, the display element 210, and the capacitor 207. After a while, current stops flowing into the driving transistor 206, the display element 210, and the capacitor 207; that is, the steady state is reached. Consequently, the driving transistor 206 is turned off. A gate-source voltage Vgs of the driving transistor 206 is, at this time, approximately equal to a threshold voltage Vth thereof. It is to be noted that a complete steady state may not be reached if a gate potential necessary to control on/off of the driving transistor 206 may be obtained. Subsequently, the second switch 209 is turned off, and the capacitor 207 holds a potential difference between a potential of the gate terminal of the driving transistor 206 to turn off the transistor and the analog signal potential supplied to the signal line Dj at the moment when the second switch 209 is turned off. In this manner, an analog signal is written into the pixel of the i-th row and the j-th column from Data line (the signal line Dj). It is to be noted that, at this time, analog signal potentials are supplied to all pixel columns from Data lines (the signal lines D1 to Dn) respectively and each analog signal is written into the pixel of the i-th row of each column.

Next, pulse signals are inputted into G1 line of the (i+1)-th row (the first scan line G1$a_{i+1}$) and G2 line of the (i+1)-th row (the second scan line G2$b_{i+1}$) respectively, a potential (Vb) is inputted into Data line (the signal line Dj) of the pixel of the (i+1)-th row and the j-th column, and an analog signal is written into the pixel. It is to be noted that, at this time, analog signal potentials are supplied to all pixel columns from Data lines (the signal lines D1 to Dn) respectively and each analog signal is written into the pixel of the (i+1)-th row of each column.

In this manner, pulse signals are inputted into G1 lines (the first scan lines G1$a_1$ to G1$a_m$) and G2 lines (the second scan lines G2$b_1$ to G2$b_m$) of all rows of pixels respectively, and an analog signal is written into each pixel, so that a period for writing analog signals into the pixel region 204 for one frame period is completed.

Subsequently, a light emitting period is described. Signals are inputted into the first scan lines G1$a_1$ to G1$a_m$ and the second scan lines G2$b_1$ to G2$b_m$ respectively so as to turn on the first switches 208 of pixels of all rows while turn off the second switches 209 thereof. A predetermined potential is supplied to Data line (the signal lines D1 to Dn) as shown in FIG. 81. It is to be noted that the predetermined potential at this time is preferably approximately equal to an analog signal potential corresponding to a video signal when the pixel does not emit light.

Accordingly, the gate terminal of the driving transistor 206 of the pixel into which the video signal not to emit light is inputted has a potential approximately equal to the analog signal potential inputted into the signal line in the writing period. Therefore, a gate-source voltage of the driving transistor 206 of the pixel becomes approximately a threshold voltage thereof and the pixel does not emit light.

On the other hand, the gate terminal of the driving transistor 206 of a pixel into which a video signal to emit light is inputted has a potential higher than the analog signal potential inputted into the signal line in the writing period. Therefore, a gate-source voltage of the driving transistor 206 becomes higher than the threshold voltage thereof and the pixel emits light. The gate-source voltage of the driving transistor 206 of each pixel becomes, at this time, higher as the analog signal potential supplied to the signal line in the writing period becomes lower.

Figure 82:
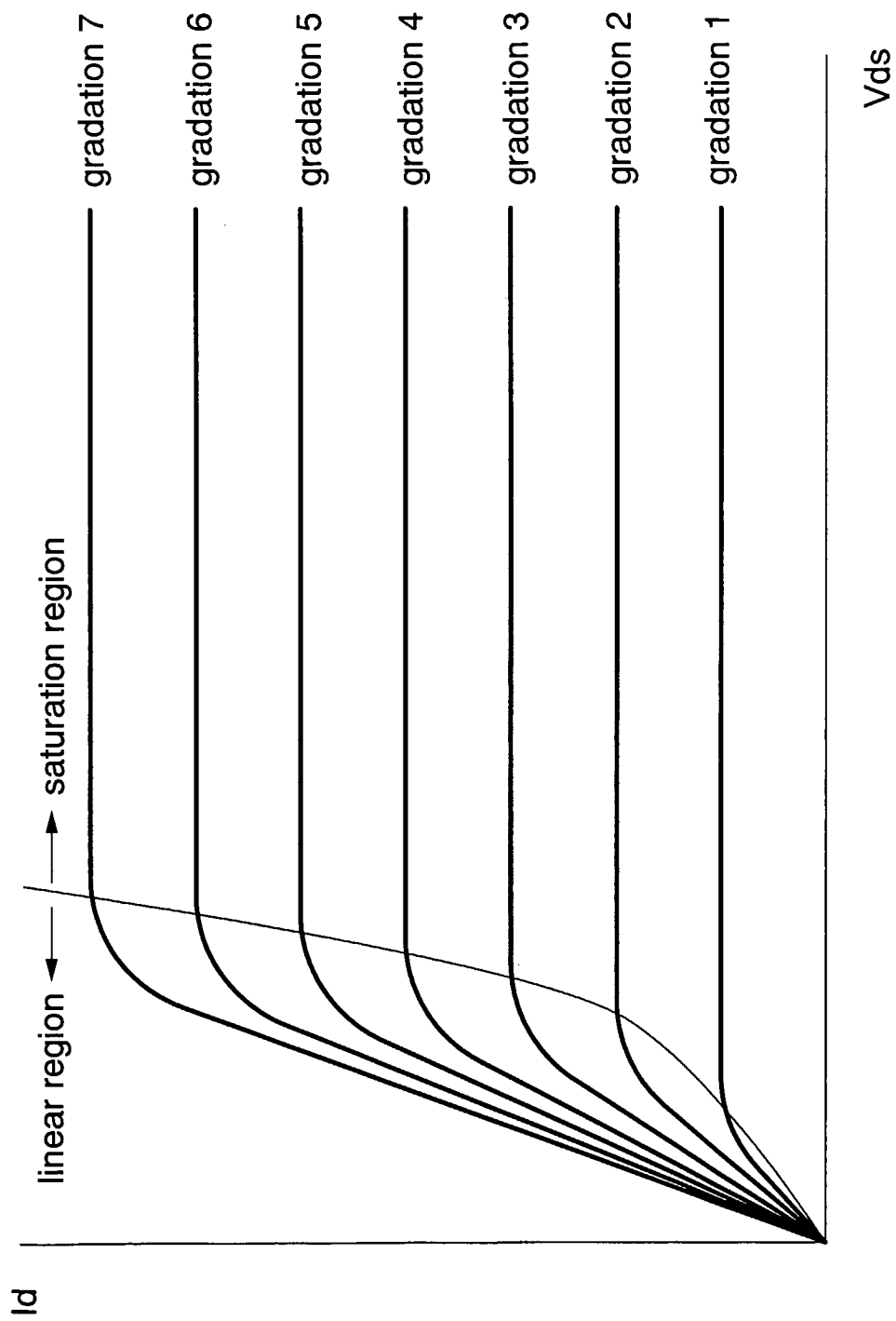
FIG. 82 is a diagram illustrating an operation region of a transistor.

For example, as shown in FIG. 82, the driving transistor of the pixel is operated in a saturation region, and the gate-source voltage of the driving transistor is increased in order of gradation 1, gradation 2, . . . , and gradation 7 in the case of 8-gradation display, a current Id flowing into the display element 210 can be controlled in accordance with the gradation of the pixel. It is to be noted that the gate-source voltage of the driving transistor 206 of the pixel in the case of gradation 0 is made lower than the threshold voltage thereof so that the current Id is 0.

By employing the driving method described in this embodiment mode, the emission intensity of the pixel can be controlled in an analog manner to express gradation. Accordingly, screen flicker can be prevented.

Embodiment Mode 11

In this embodiment mode, more preferable constitution of a display device having the pixel configurations described in Embodiment Mode 1, Embodiment Mode 2, Embodiment Mode 3, Embodiment Mode 4, Embodiment Mode 5, Embodiment Mode 6, and Embodiment Mode 7 is described.

According to a display device in this embodiment mode, a buffer is provided in the scan line and the signal line. That is, a signal from the scan line driver circuit is inputted into the buffer, and a signal is outputted from the buffer to the scan line. In addition, a signal from the signal line driver circuit is inputted into the buffer, and a signal is outputted from the buffer to the signal line. In this manner, impedance transformation of an output signal of the scan line driver circuit and the signal line driver circuit is performed to improve the current supply capability.

It is to be noted that instead of providing a buffer in the scan line or the signal line, a buffer may be provided in the scan line driver circuit or the signal line driver circuit so that the current supply capability of an output of these driver circuits may be improved.

Basic constitution of the display device described in this embodiment mode is described with reference to FIG. 8. In Embodiment Mode 1, the same reference numerals are used for the portions identical to those in the display device described with reference to FIG. 2.

The first scan lines G1$a_1$ to G1$a_1$ and the second scan lines G2$b_1$ to G2$b_m$ control the switches of pixels of respective rows. For example, in the case where a transistor is used as the switch, gate terminals of the switching transistors of the pixels of respective rows are connected to the first scan lines G1$a_1$ to G1$a_m$ and the second scan lines G2$b_1$ to G2$b_m$. In addition, the switching transistors of one row are required to be turned on all at once. In particular, as the resolution is increased, the number of transistors to be turned on all at once is increased. Therefore, a buffer used in this Embodiment Mode preferably has high current supply capability.

Figure 8:
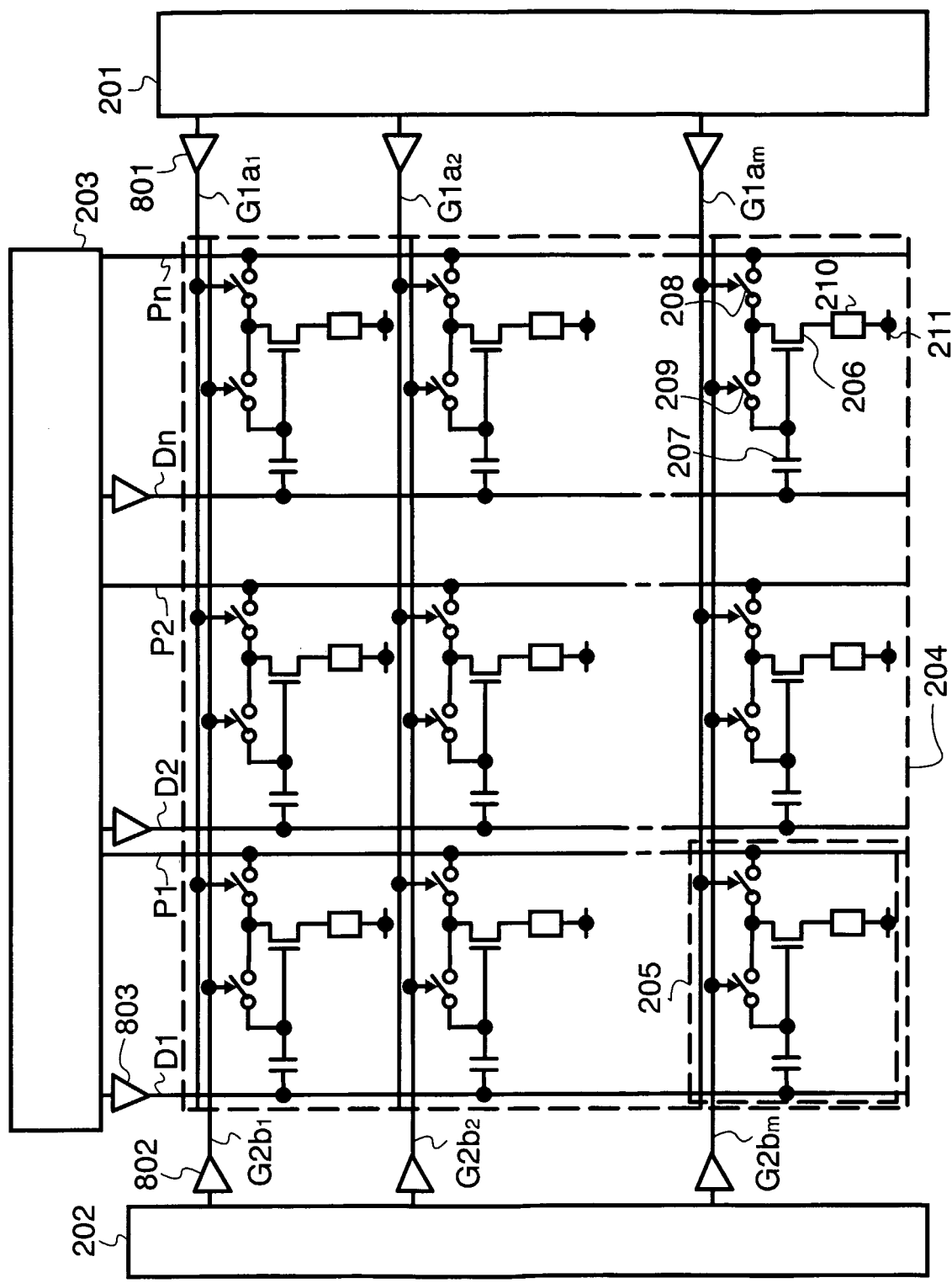
FIG. 8 is a diagram showing an example of constitution of a display device having a pixel configuration of the invention.
Figure 19:
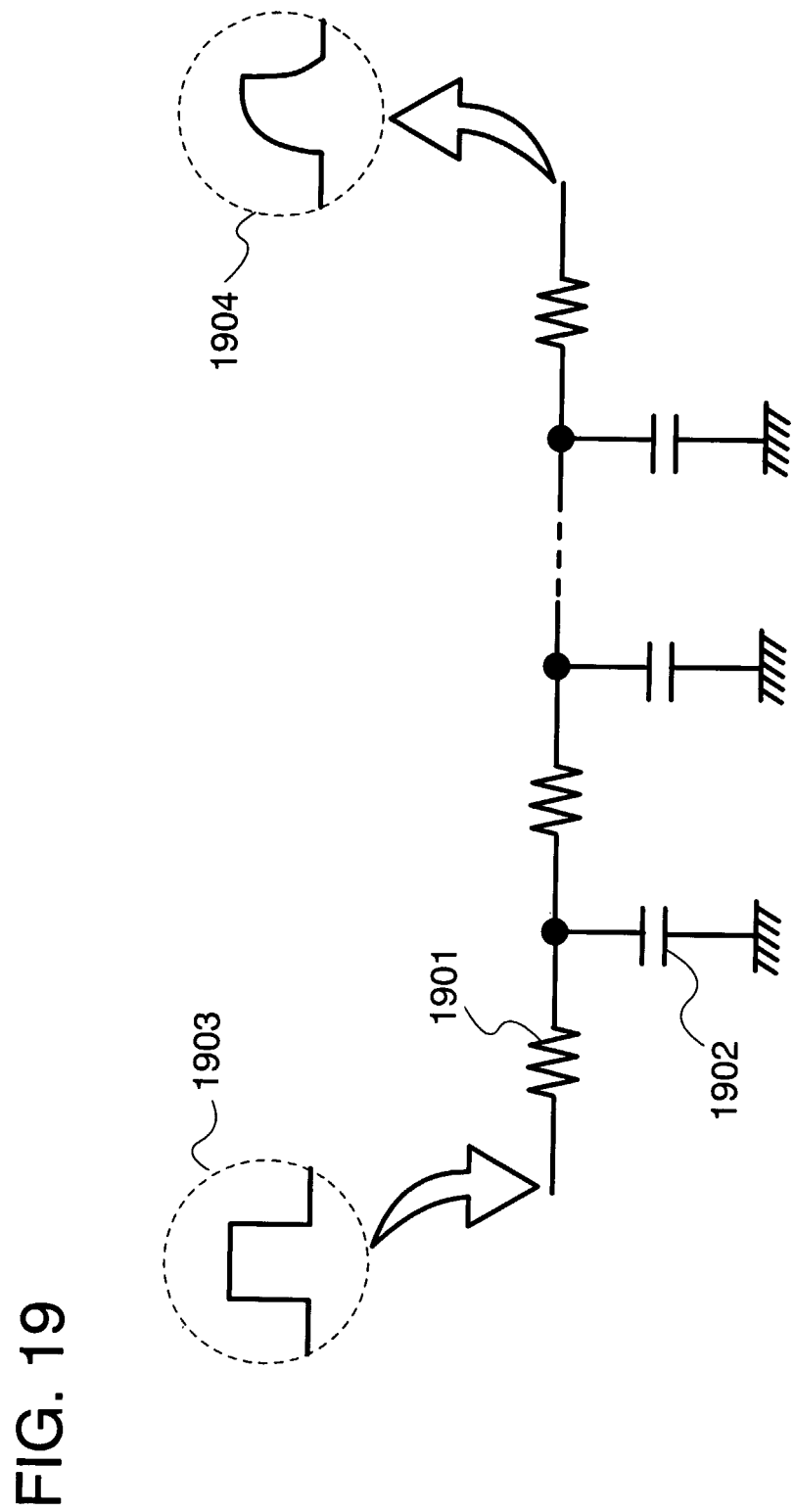
FIG. 19 is a diagram illustrating generation of signal delay in rising and falling.

In addition, each of the first scan lines G1$a_1$ to G1$a_m$ of the display device shown in FIG. 8 has wire resistance, and parasitic capacitance (intersection capacitance) is formed at an intersection between the signal lines D1 to Dn and the power supply lines P1 to Pn. Therefore, each of the first scan lines G1$a_1$ to G1$a_m$ can be expressed by an equivalent circuit as shown in FIG. 19 using a resistor 1901 and a capacitor 1902.

If an input pulse having a rectangular waveform 1903 is inputted into the equivalent circuit, a response wave thereof has a waveform having the dullness as an output pulse 1904. That is, rising and falling of the pulse are delayed. Consequently, the first switch 208 does not turn on at the normal timing, so that accurate writing of an analog signal into the pixel cannot be performed. In the display device in this embodiment mode, therefore, the dullness of the signal outputted from the first scan line can be reduced by improving the current supply capability with a buffer. Similarly, the same can be applied to the second scan lines G2$b_1$ to G2$b_m$.

Similarly, if parasitic capacitance is formed in the signal lines D1 to Dn, supply of an analog signal potential corresponding to an image signal is delayed, so that accurate writing of a signal into the pixel cannot be performed. Therefore, in the display device described in this embodiment mode, it is preferable to flow the signal outputted from the signal line through a buffer as well so that the current supply capability is improved.

In the display device shown in FIG. 8, signals outputted from the first scan line driver circuit 201 are inputted into the first scan lines G1$a_1$ to G1$a_m$ via buffers 801 respectively. That is, by flowing through the buffer 801, current supply capability of the signal outputted from the first scan line driver circuit 201 is increased. Similarly, buffers 802 are provided in the second scan lines G2$b_1$ to G2$b_m$ respectively. In addition, buffers 803 are provided in the signal lines D1 to Dn respectively. It is to be noted that analog buffers are used as the buffers 803.

Consequently, signals outputted from the scan line driver circuits have high current supply capability, so that the dullness of a pulse signal as described above is reduced and switching transistors of pixels of one row can be turned on quickly. Accordingly, a writing period of pixels can be shortened.

Described next is an example of a buffer which can be used in this embodiment mode. Hereinafter, as for a buffer, a terminal into which an input potential Vin is inputted is called an input terminal while a terminal from which an output potential Vout is outputted is called an output terminal.

For example, an input terminal of a voltage follower circuit 901 as shown in FIG. 9A is connected to an output terminal of a signal line driver circuit while an output terminal of the voltage follower circuit 901 is connected to a signal line. The voltage follower circuit used as a buffer is preferably formed on an IC chip which can form transistors the variation of the characteristics thereof is small. It is to be noted in this specification that an IC chip means a separated integrated circuit on a chip after being formed over a substrate. In particular, an IC chip is preferably formed by forming a circuit over a single-crystalline silicon wafer used as a substrate, by element separation and the like, and then cutting the single-crystalline silicon wafer in an arbitrary shape.

Accordingly, when the voltage follower circuit 901 is used as a buffer, an IC chip provided with the buffer in addition to a scan line driver circuit and a signal line driver circuit is preferably mounted onto a display panel by COG (Chip On Glass) or the like. It is to be noted that although the voltage follower circuit can be applied to the buffer 801, the buffer 802, and the buffer 803 in the display device shown in FIG. 8, which functions as an analog buffer is particularly suitable for the buffer 803.

Alternatively, an inverter which is constituted by an n-type transistor 902 and a p-type transistor 903 as shown in FIG. 9B may be used as a buffer. A gate terminal of the n-type transistor 902 and a gate terminal of the p-type transistor 903 are both connected to an input terminal, into which an input potential Vin is inputted. A source terminal of the n-type transistor 902 is connected to a power supply potential Vss, and a drain terminal thereof and a drain terminal of the p-type transistor 903 are connected to an output terminal. The output terminal outputs an output potential Vout. A plurality of inverters connected in series can be used as a buffer. In this case, the current supply capability of the inverter in the next stage into which the output potential Vout outputted from the inverter is preferably three times, thereby current supply capability can be improved efficiently; that is, in the case where a potential outputted from an inverter inputted first is inputted into an inverter of the next stage, an inverter having the current supply capability which is three times larger is connected in series. Even numbers of inverters connected in this manner can be used as a buffer. It is to be noted that the current supply capability can be controlled by controlling the ratio of the channel width to the channel length, W/L when the n-type transistor 902 and the p-type transistor 903 are designed. It is to be noted that a buffer using the inverter as shown in FIG. 9B can be applied to the buffer 801 and the buffer 802 in the display device in FIG. 8. Such a buffer using the inverter can be structured simply, and the buffer can be provided over the same substrate in the case where a scan line driver circuit and a signal line, driver circuit are formed over the same substrate in addition to pixels to manufacture a display panel having thin film transistors. By forming the buffer over the same substrate, cost reduction can be realized. In addition, in a CMOS inverter constituted by the n-type transistor 902 and the p-type transistor 903 as shown in FIG. 9B, current flows through the n-type transistor 902 and the p-type transistor 903 when a potential near a logic threshold value Vinv of the inverter is inputted into the input terminal; however, one transistor among them is turned off when a potential of H level or L level is inputted into the input terminal, so that wasteful consumption of power can be prevented. Accordingly, reduction of power consumption can be realized by using a CMOS inverter as shown in FIG. 9B.

Further alternatively, a buffer can be formed using a source follower circuit as shown in FIG. 9C. It comprises a source follower transistor 904 and a current source 905, in which a gate terminal of the source follower transistor 904 is connected to an input terminal, a drain terminal thereof is connected to a wire to which a power supply potential Vdd is supplied, and a source terminal thereof is connected to one terminal of the current source 905 and an output terminal. The other terminal of the current source 905 is connected to a wire to which a low potential Vss is supplied. An output voltage Vout of the buffer is expressed by the following formula (1), using a gate-source voltage Vgs of the source follower transistor 904.

$$Vout = Vin - Vgs \tag{1}$$

Vgs is a voltage required for flowing a current $I_0$ through the source follower transistor 904.

Therefore, the output voltage Vout is lower than the input potential Vin by Vgs. However, if a signal inputted as an input potential Vin is a digital signal, the source follower circuit can be used as a buffer even when there are variations of the gate-source voltage Vgs of the source follower transistor 904. Accordingly, the source follower circuit can be used as the buffer 801 or the buffer 802 in the display device shown in FIG. 8.

Such a source follower circuit as shown in FIG. 9C has a simple structure and can be manufactured easily using a thin film transistor. Therefore, the buffer can be provided over the same substrate in the case where a scan line driver circuit and a signal line driver circuit are formed over the same substrate in addition to pixels to manufacture a display panel having thin film transistors. By forming the buffer over the same substrate, cost reduction can be realized.

Furthermore, by using an n-type transistor as the source follower transistor 904 as shown in FIG. 9C, in the case of forming a display panel provided with pixels, a scan line driver circuit, a signal line driver circuit, and a buffer over the same substrate, a display panel having a single conductivity type which is constituted only by n-type transistors can be manufactured.

In the case where a source follower circuit is used as a buffer also, by forming a source follower transistor 906 to have a dual gate as shown in FIG. 9D, the threshold voltage of the transistor can be reduced. It is to be noted that constitution other than the source follower transistor 906 is identical to FIG. 9C, and therefore, they are denoted by the same reference numerals and description thereof is omitted.

If the threshold voltage Vth is reduced, and variations of transistors each constituting a source follower transistor is reduced, the source follower circuit as shown in FIG. 9D can also be used as an analog buffer. Therefore, the source follower circuit as shown in FIG. 9D can be applied not only to the buffer 801 and the buffer 802, but also to the buffer 803 in the display device shown in FIG. 8.

Figure 10B:
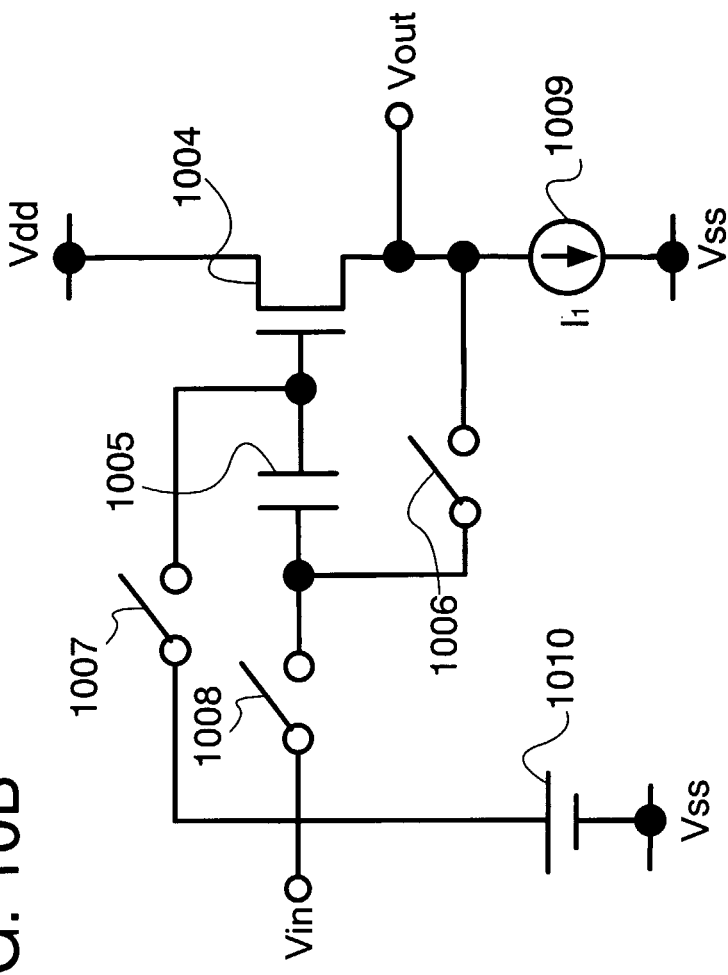
FIGS. 10A and 10B are diagrams each showing a buffer applicable in a display device having a pixel configuration of the invention.

Alternatively, a configuration shown in FIG. 10B can be applied to a buffer. A source follower circuit comprises a source follower transistor 1004, a capacitor 1005, a first switch 1006, a second switch 1007, a third switch 1008, a current source 1009, and a voltage source 1010. A drain terminal of the source follower transistor 1004 is connected to a wire to which a power supply potential Vdd is supplied, and a source terminal thereof is connected to a wire to which a low potential Vss is supplied via the current source 1009, and connected to an output terminal and one terminal of the first switch 1006. The other terminal of the first switch 1006 is connected to one terminal of the capacitor 1005, and to an input terminal via the third switch 1008. The other terminal of the capacitor 1005 is connected to a gate terminal of the source follower transistor 1004, and to the wire to which the low potential Vss is supplied via the second switch 1007 and the voltage source 1010.

Operation of the source follower circuit shown in FIG. 10B is described briefly. The first switch 1006 and the second switch 1007 are turned on in a precharging period. Then, the capacitor 1005 accumulates charge such that the source follower transistor 1004 has a gate-source voltage Vgs required for flowing a current $I_0$. Subsequently, the first switch 1006 and the second switch 1007 are turned off, thereby the capacitor 1005 holds the gate-source voltage Vgs of the source follower transistor 1004. Then, the third switch 1008 is turned on, so that an input potential Vin is inputted into the input terminal while the capacitor 1005 holds the gate-source voltage Vgs. Accordingly, to the gate terminal of the source follower transistor 1004 which is connected to the other terminal of the capacitor 1005, a potential obtained by adding the gate-source voltage Vgs to the input potential Vin is supplied. On the other hand, an output potential Vout outputted from the output terminal is a potential obtained by subtracting the gate-source voltage Vgs from a potential of the gate terminal of the source follower transistor 1004. Consequently, the potential outputted from the output terminal and the potential inputted into the input terminal become equal to each other, namely Vin=Vout.

Therefore, the source follower circuit as shown in FIG. 10B can be applied not only to the buffer 801 and the buffer 802, but also to the buffer 803 which improves the current supply capability of an analog signal in the display device shown in FIG. 8.

In addition, the source follower circuit shown in FIG. 10B can be structured more simply than a voltage follower circuit, so that in the case of forming a display panel provided with pixels, a scan line driver circuit, and a signal line driver circuit over the same substrate, it can be formed over the same substrate as a buffer. Furthermore, the source follower circuit shown in FIG. 10B can be configured by transistors having the same conductivity type, and therefore, a display panel having a single conductivity type can be manufactured.

It is to be noted that as the current sources 905 shown in FIGS. 9C and 9D and the current source 1009 shown in FIG. 10B, a transistor which operates in a saturation region, a resistor, or a rectifying element can be used. As the rectifying element, specifically, a pn junction diode or a diode connected transistor can be used as well.

Figure 10A:
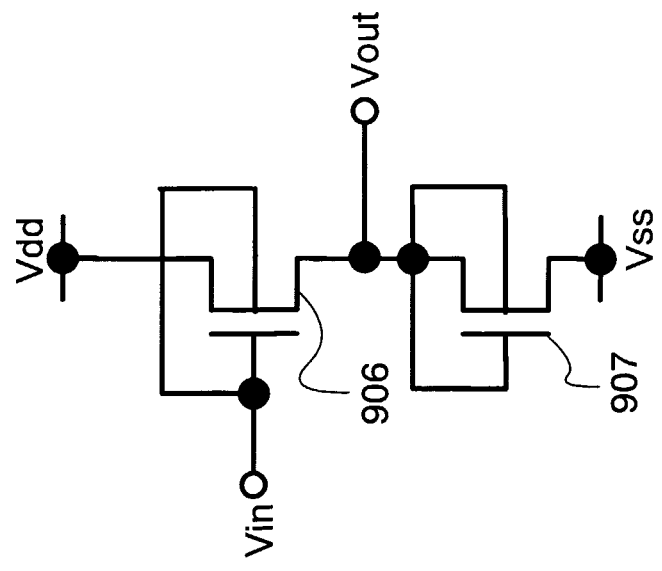

In the case where a diode connected transistor is applied to the current source 905 in FIG. 9D is described with reference to FIG. 10A. It comprises the source follower transistor 906 and a diode connected transistor 907. A drain terminal of the source follower transistor 906 is connected to the wire to which the power supply potential Vdd is supplied, and a source terminal thereof is connected to a drain terminal of the diode connected transistor 907 and the output terminal. In addition, the drain terminal and a gate terminal of the diode connected transistor 907 are connected to each other, and a source terminal thereof is connected to the wire to which the low potential Vss is supplied.

The pixel configuration applicable in the display device in this embodiment mode is not limited to the configuration shown in FIG. 8, and various pixel configurations described in Embodiment Mode 2, Embodiment Mode 3, Embodiment Mode 4, Embodiment Mode 5, Embodiment Mode 6, and Embodiment Mode 7 can be applied. In addition, a buffer may not be provided in all of scan lines or signal lines into which output of a scan line driver circuit or a signal line driver circuit is inputted, and can be provided arbitrarily. In particular, since the case where the pulse width of a rectangular wave is short affects adversely, in the configuration shown in FIG. 8 for example, only the buffers 801 on the first scan line driver circuit side may be provided.

Embodiment Mode 12

In this embodiment mode, a scan line driver circuit and a signal line driver circuit of a display device having the pixel configuration of the invention are described. That is, a scan line driver circuit and a signal line driver circuit described in this embodiment mode can be arbitrarily used in a display device having the pixel configuration described in Embodiment Mode 1, Embodiment Mode 2, Embodiment Mode 3, Embodiment Mode 4, Embodiment Mode 5, Embodiment Mode 6, or Embodiment Mode 7. Furthermore, they can be applied to a scan line driver circuit and a signal line driver circuit of the display device described in Embodiment Mode 8.

Figure 44A:
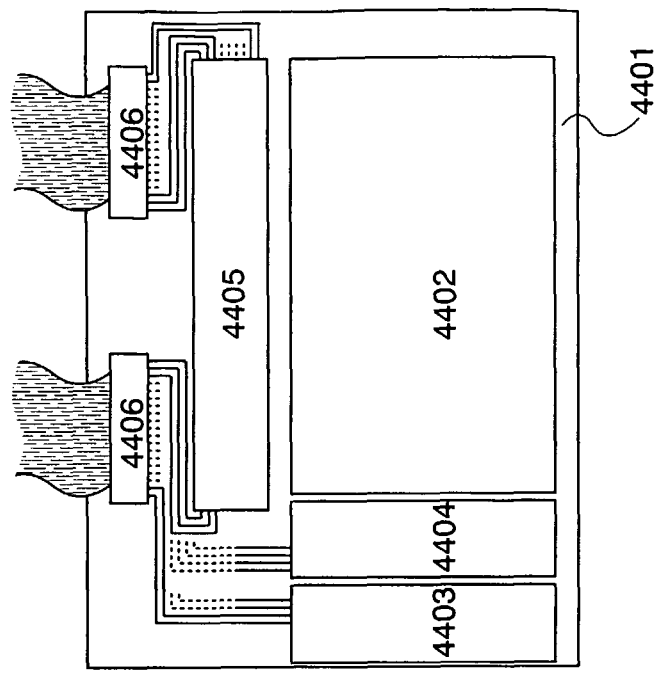
FIGS. 44A and 44B are pattern diagrams respectively of a display device of the invention.

In a display device shown in FIG. 44A, a pixel region 4402 provided with a plurality of pixels is formed over a substrate 4401, and a first scan line driver circuit 4403, a second scan line driver circuit 4404, and a signal line driver circuit 4405 are formed in the periphery of the pixel region 4402. The first scan line driver circuit 4403 corresponds to the first scan line driver circuit 201 in FIG. 2, the second scan line driver circuit 4404 corresponds to the second scan line driver circuit 202 in FIG. 2, and the signal line driver circuit 4405 corresponds to the signal line driver circuit 203 in FIG. 2.

Signals are supplied to the first scan line driver circuit 4403, the second scan line driver circuit 4404, and the signal line driver circuit 4405 externally through FPCs (Flexible Print Circuits) 4406.

It is to be noted that an IC chip may be mounted onto the FPCs 4406 by COG (Chip On Glass), TAB (Tape Automated Bonding), or the like, although not shown. That is, a part of memories, buffers, or the like of the first scan line driver circuit 4403, the second scan line driver circuit 4404, and the signal line driver circuit 4405 which are difficult to be formed over the same substrate as the pixel region 4402 may be formed on an IC chip to be mounted in a display device.

Figure 44B:
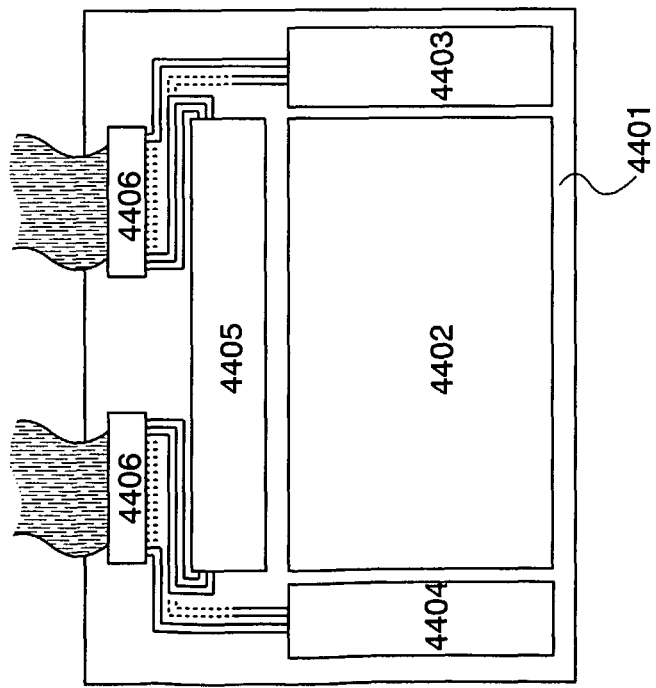

In addition, as shown in FIG. 44B, the first scan line driver circuit 4403 and the second scan line driver circuit 4404 may be provided on one side of the pixel region 4402. It is to be noted that the display device shown in FIG. 44B is different from the display device shown in FIG. 44A only in the arrangement of the first scan line driver circuit 4403, and therefore, the same reference numerals are used. In addition, constitution in which one scan line driver circuit performs a function of the first scan line driver circuit 4403 and the second scan line driver circuit 4404 may be adopted Subsequently, constitution examples of the signal line driver circuit 4405 of the display devices shown in FIGS. 44A and 44B are described. The signal line driver circuit is a driver circuit for supplying signals to the signal lines (D1 to Dn) of the display device shown in FIG. 2. A signal line driver circuit shown in FIG. 45A includes a pulse output circuit 4501, a first latch circuit 4502, a second latch circuit 4503, a D/A converter circuit (a digital/analog converter circuit) 4504, a writing period/light emitting period selection circuit 4505, and an analog buffer circuit 4506.

Figure 45A:
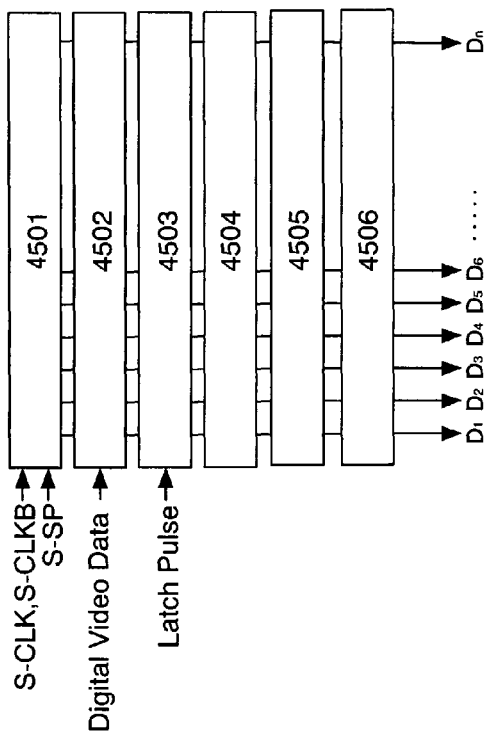
FIGS. 45A and 45B show examples of a signal line driver circuit applicable in a display device of the invention.
Figure 47:
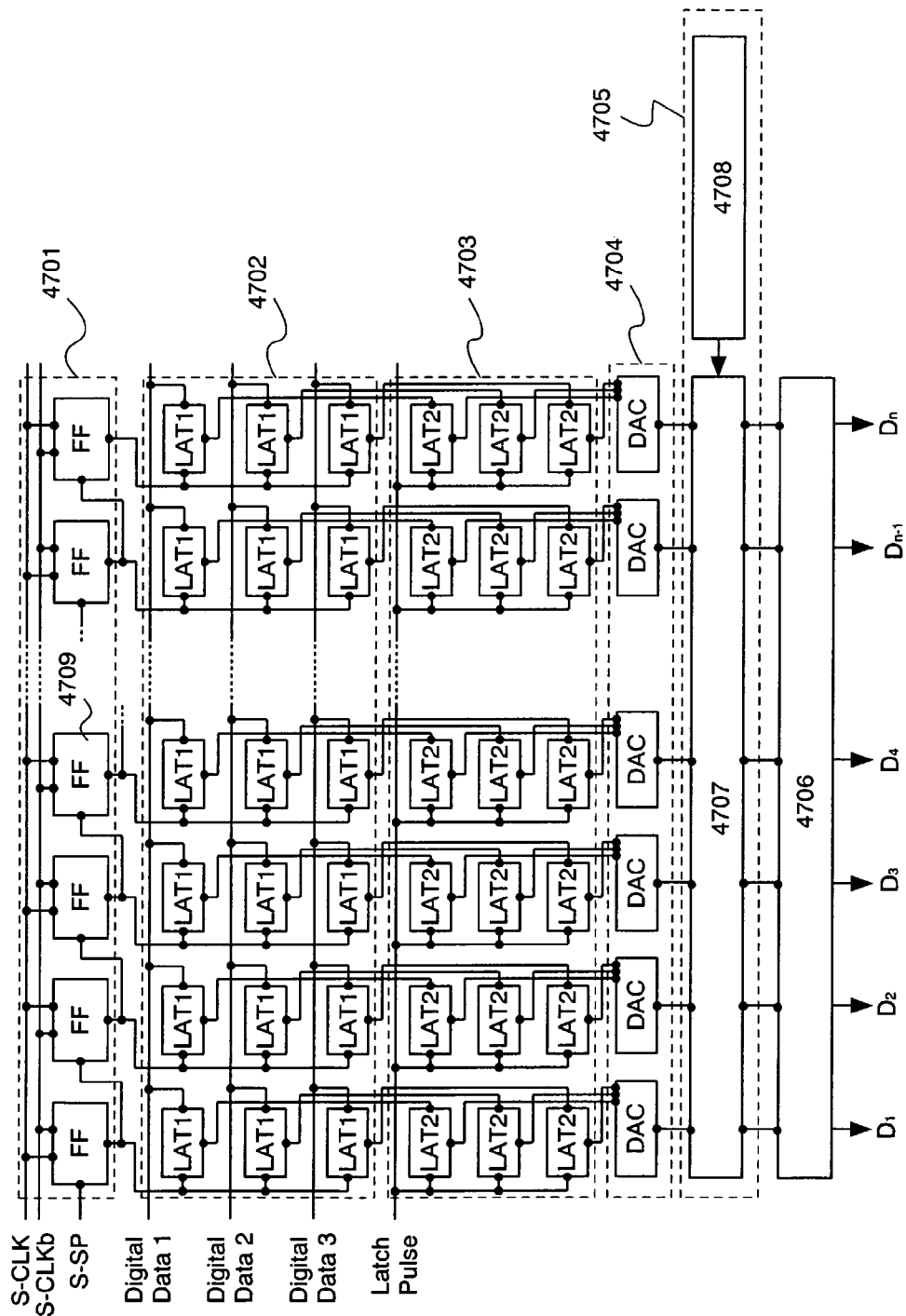
FIG. 47 shows an example of a signal line driver circuit applicable in a display device of the invention.

Operation of the signal line driver circuit shown in FIG. 45A is described using specific constitution shown in FIG. 47.

A pulse output circuit 4701 is constituted by a plurality of stages of flip-flop circuits (FFs) 4709 or the like, into which a clock signal (S-CLK), a clock inverted signal (S-CLKB), and a start pulse signal (S-SP) are inputted. A sampling pulse is outputted sequentially in accordance with the timing of these signals.

The sampling pulse outputted from the pulse output circuit 4701 is inputted into a first latch circuit 4702. A digital video signal is inputted into the first latch circuit 4702, and held in each stage at the timing that the sampling pulse is inputted. Here, the digital video signals are inputted by three bits for each stage. The video signal at each bit are held in the first latch circuit 4702. Three latch circuits of each stage are operated in parallel by one sampling pulse.

When the first latch circuit 4702 finishes to hold the digital video signals up to the last stage, a latch pulse (Latch Pulse) is inputted into a second latch circuit 4703 in a horizontal retrace period, and the digital video signals held in the first latch circuit 4702 are transferred to the second latch circuit 4703 all at once. After that, the digital video signals held in the second latch circuit 4703 for one row are inputted into a DAC (a D/A converter circuit) 4704 simultaneously.

The DAC 4704 converts the inputted digital video signals into video signals having analog potential, and inputs them into a switching circuit 4707 included in a writing period/light emitting period selection circuit 4705.

While the digital video signals held in the second latch circuit 4703 are being inputted into the DAC 4704, the pulse output circuit 4701 again outputs sampling pulses. The above-described operation is repeated in a writing period to process video signals for one frame.

The writing period/light emitting period selection circuit 4705 also includes a triangular wave potential generating circuit 4708. In a light emitting period, a triangular wave potential generated by the triangular wave potential generating circuit 4708 is inputted into the switching circuit 4707.

In this manner, the switching circuit 4707 is inputted with the video signal from the DAC 4704 in the writing period and inputted with the triangular wave potential from the triangular wave potential generating circuit 4708 in the light emitting period. Then, the switching circuit 4707 inputs the video signal in the writing period and inputs the triangular wave potential in the light emitting period into an analog buffer circuit 4706.

Impedance transformation is performed in the analog buffer circuit 4706 so that the same potential as the inputted potential is supplied to signal lines D1 to Dn. That is, the current supply capability of the video signal is improved in the analog buffer circuit 4706, and then supplied to the signal lines D1 to Dn as an analog signal potential. It is to be noted that the signal lines D1 to Dn correspond to, for example, the signal lines D1 to Dn of the display devices shown in FIGS. 2 and 8.

Figure 45B:
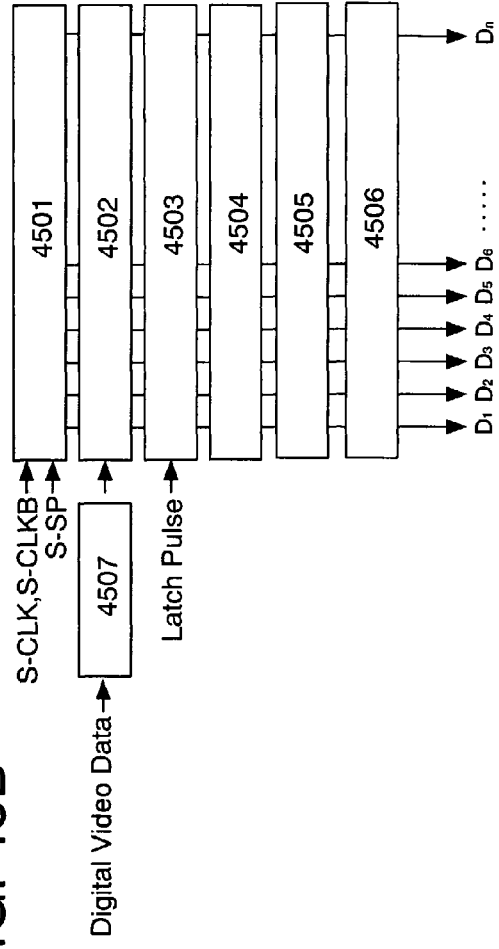

In FIG. 45A, the inputted Digital Video Data is preferable to be corrected prior to being converted into an analog signal in some cases. Therefore, as shown in FIG. 45B, it is preferable that Digital Video Data be inputted into the first latch circuit 4502 after being corrected by a correction circuit 4507. For example, gamma correction or the like can be performed in the correction circuit 4507.

Figure 64:
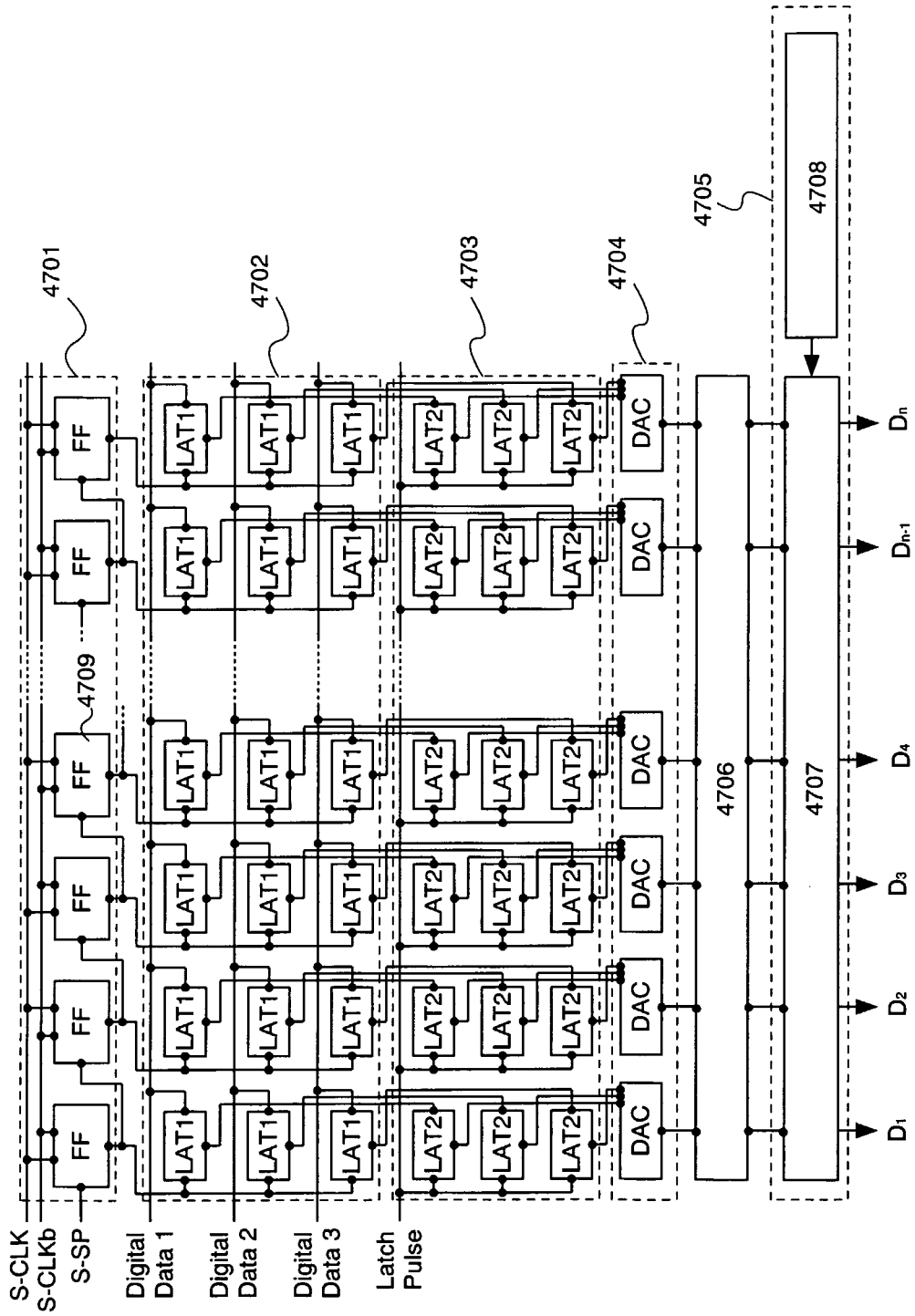
FIG. 64 shows an example of a signal line driver circuit applicable in a display device of the invention.

In addition, the impedance conversion may be performed prior to inputting the output of the D/A converter circuit into the writing period/light emitting period selection circuit. That is, in the constitution shown in FIG. 45A, constitution in which the output of the D/A converter circuit 4504 is inputted into the writing period/light emitting period selection circuit 4505 after converted its impedance can be adopted, which is shown in FIG. 62A. In that case, the constitution of FIG. 47 which shows the constitution of FIG. 45A in detail adopts constitution shown in FIG. 64. Further, in the constitution shown in FIG. 45B, constitution in which the output of the D/A converter circuit 4504 is inputted into the writing period/light emitting period selection circuit 4505 after converted its impedance can be adopted, which is shown in FIG. 62B.

Description is made on the case where a digital video signal is inputted into the signal line driver circuit with reference to FIGS. 45A, 45B, and 47. The case where an analog video signal is inputted is described below with reference to FIGS. 46A, 46B, and 48. In that case, a D/A converter circuit may not be provided unlike those in FIGS. 45A and 45B. In addition, a first analog latch circuit and a second analog latch circuit for holding analog video signals may be provided for one bit in each stage. As shown in FIG. 46A, a pulse output circuit 4601, a first analog latch circuit 4602, a second analog latch circuit 4603, a writing period/light emitting period selection circuit 4604, and an analog buffer circuit 4605 are included.

Figure 48:
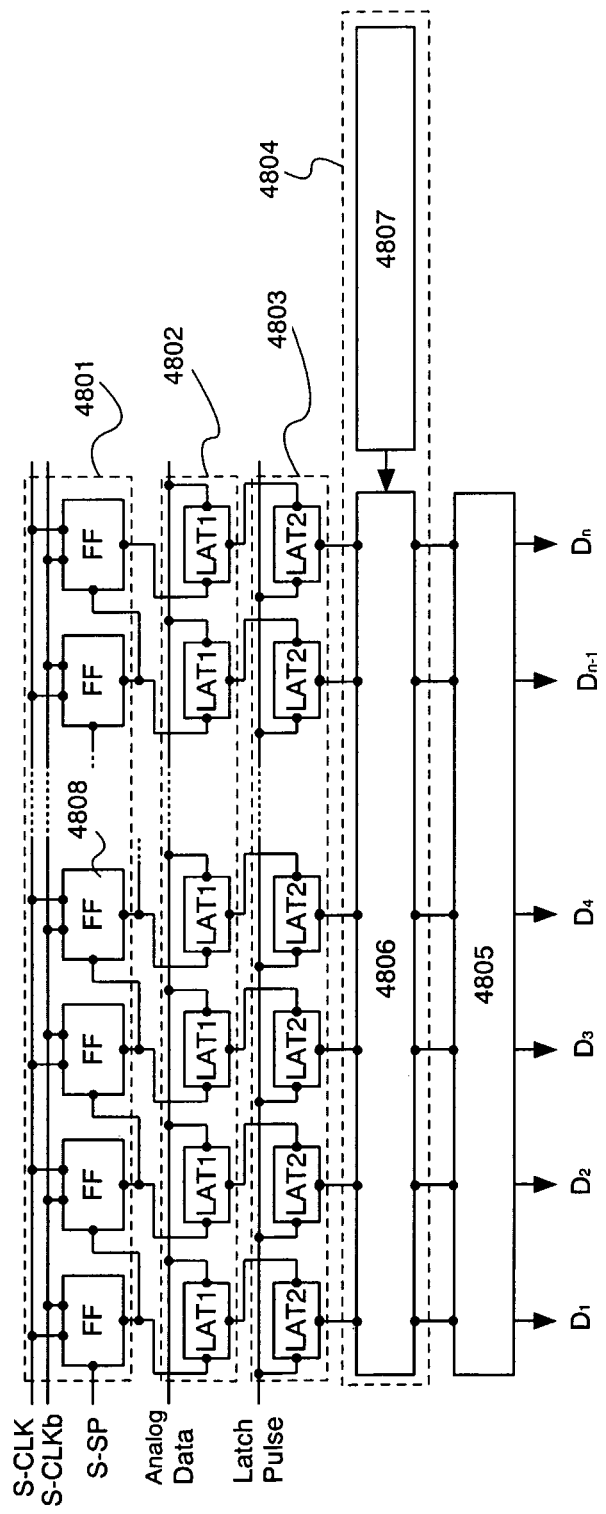
FIG. 48 shows an example of a signal line driver circuit applicable in a display device of the invention.

Operation of the signal line driver circuit shown in FIG. 46A is described using specific constitution shown in FIG. 48.

A pulse output circuit 4801 is constituted by a plurality of stages of flip-flop circuits (FFs) 4808 or the like, into which a clock signal (S-CLK), a clock inverted signal (S-CLKB), and a start pulse signal (S-SP) are inputted. A sampling pulse is outputted sequentially in accordance with the timing of these signals.

The sampling pulse outputted from the pulse output circuit 4801 is inputted into a first analog latch circuit 4802. An analog video signal is inputted into the first analog latch circuit 4802, and held in each stage at the timing that the sampling pulse is inputted. Here, the analog video signals are inputted by one bit for each stage. The video signals at each bit are held in the first analog latch circuit 4802 for each stage.

When the first analog latch circuit 4802 finishes to hold the analog video signals up to the last stage, a latch pulse (Latch Pulse) is inputted into a second analog latch circuit 4803 in a horizontal retrace period, and the analog video signals held in the first analog latch circuit 4802 are transferred to the second analog latch circuit 4803 all at once. After that, the analog video signals held in the second analog latch circuit 4803 for one row are inputted into a switching circuit 4806 included in a writing period/light emitting period selection circuit 4804 simultaneously.

Then, in a writing period, the switching circuit 4806 inputs the video signals inputted from the second analog latch circuit 4803 into an analog buffer circuit 4805, and the analog buffer circuit 4805 converts its impedance and supplies respective analog signal potentials to signal lines D1 to Dn. It is to be noted that the signal lines D1 to Dn correspond to, for example, the signal lines D1 to Dn of the display devices shown in FIGS. 2 and 8.

While the analog signal potentials for one pixel row are being inputted into the signal lines D1 to Dn, the pulse output circuit 4801 again outputs sampling pulses. The above-described operation is repeated in the writing period to process video signals for one frame.

The writing period/light emitting period selection circuit 4804 also includes a triangular wave potential generating circuit 4807. In a light emitting period, a triangular wave potential generated by the triangular wave potential generating circuit 4807 is inputted into the switching circuit 4806. Impedance transformation is performed in the analog buffer circuit 4805 so that the same potential as the inputted triangular wave potential is supplied to the signal lines D1 to Dn in the light emitting period. That is, the current supply capability is improved in the analog buffer circuit.

In this manner, the switching circuit 4806 is inputted with the video signal from the second analog latch circuit 4803 in the writing period and inputted with the triangular wave potential from the triangular wave potential generating circuit 4807 in the light emitting period. Then, the switching circuit 4806 inputs the video signal in the writing period and inputs the triangular wave potential in the light emitting period into the analog buffer circuit 4805.

In the case where the external video signal is a digital video signal, the digital video signal may be inputted into the first analog latch circuit 4602 after converted into an analog video signal in a D/A converter circuit 4606 as shown in FIG. 46B.

Figure 63A:
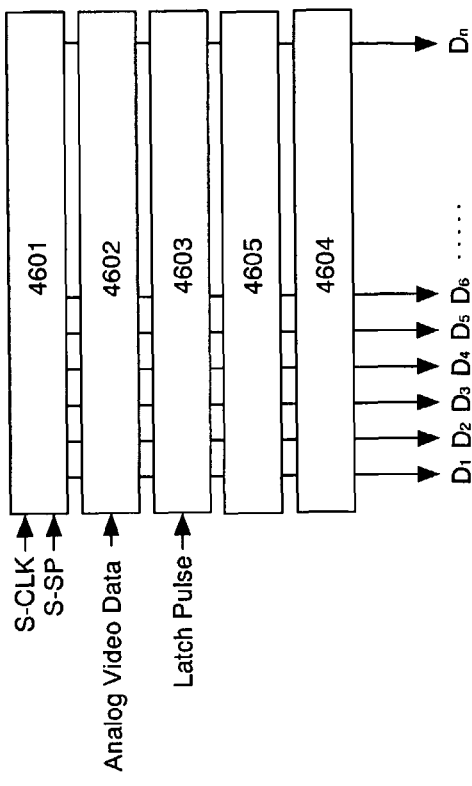
FIGS. 63A and 63B show examples of a signal line driver circuit applicable in a display device of the invention.
Figure 63B:
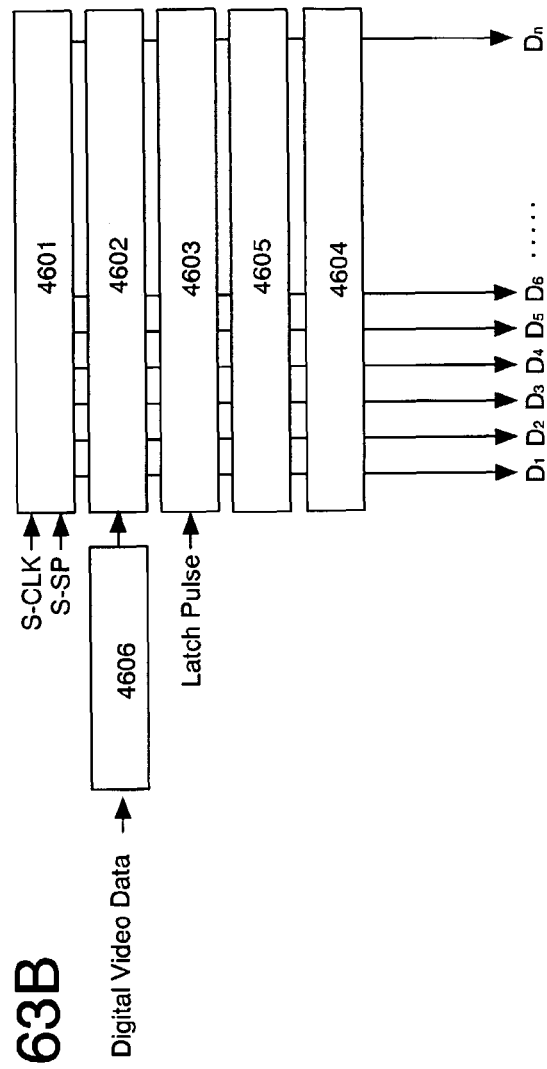
Figure 65:
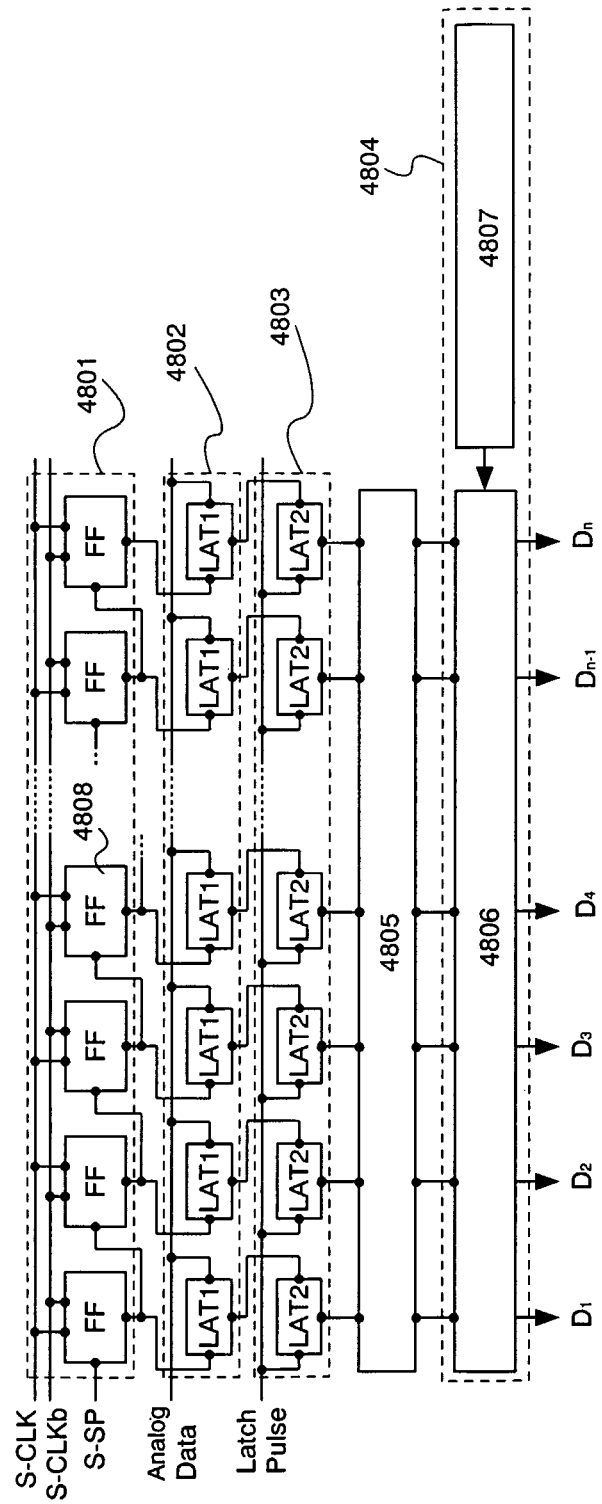
FIG. 65 shows an example of a signal line driver circuit applicable in a display device of the invention.

In addition, the impedance conversion may be performed prior to inputting the output of the second latch circuit into the writing period/light emitting period selection circuit. That is, in the constitution shown in FIG. 46A, constitution in which the output of the second analog latch circuit 4603 is inputted into the writing period/light emitting period selection circuit 4604 after converted its impedance can be adopted, which is shown in FIG. 63A. In that case, the constitution of FIG. 48 which shows the constitution of FIG. 46A in detail adopts constitution shown in FIG. 65. Further, in the constitution shown in FIG. 46B, constitution in which the output of the second analog latch circuit 4603 is inputted into the writing period/light emitting period selection circuit 4604 after converted its impedance can be adopted, which is shown in FIG. 63B.

In addition, a signal line driver circuit which can be applied in a display device having such pixel configuration that an analog signal potential corresponding to a video signal and a potential varying in an analog manner for controlling on/off of a driving transistor are inputted through different signal lines into the pixel (e.g., the pixel configurations shown in FIGS. 4, 18, 22, and 23) are described next with reference to FIGS. 71 and 72.

Figure 71:
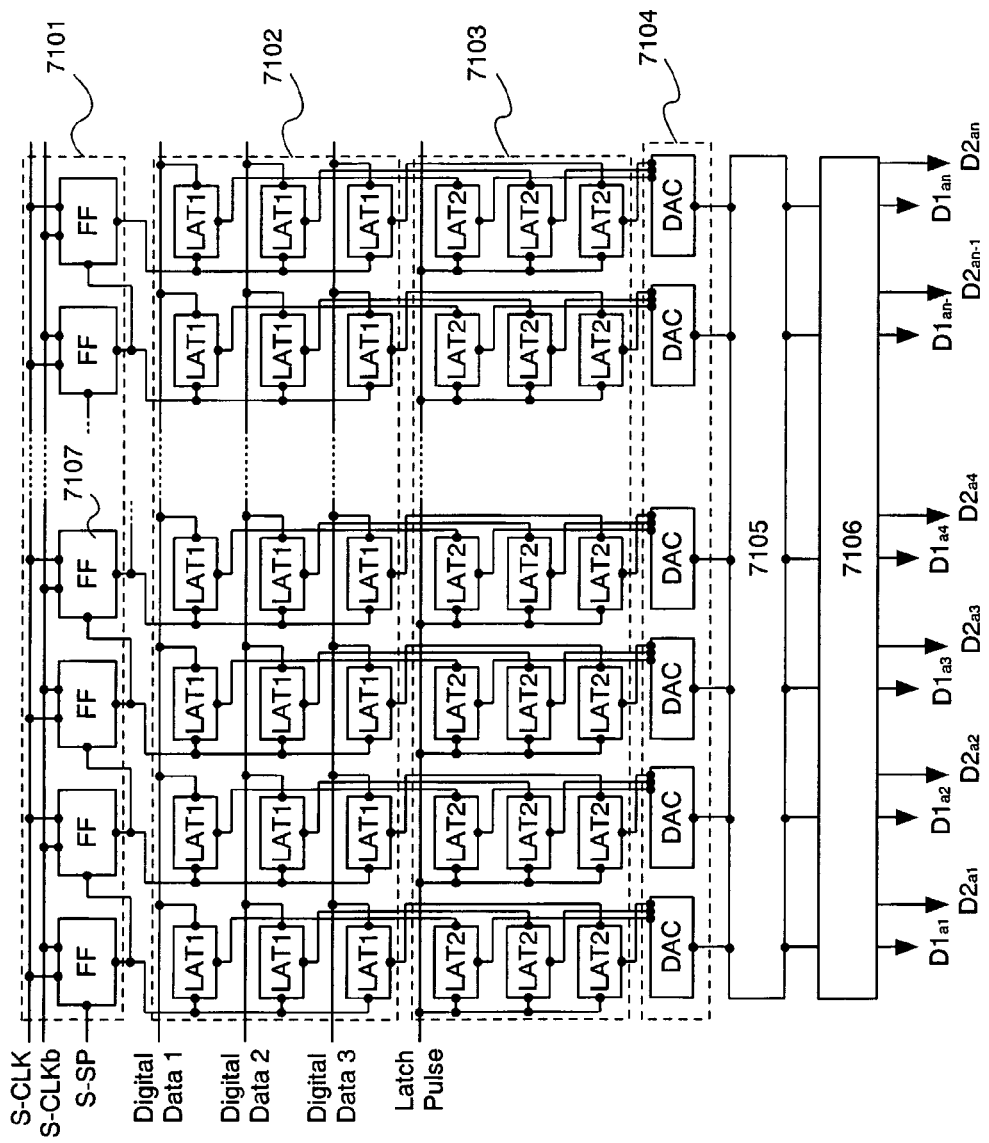
FIG. 71 shows an example of a signal line driver circuit applicable in a display device of the invention.

First, constitution shown in FIG. 71 is described.

A pulse output circuit 7101 is constituted by a plurality of stages of flip-flop circuits (FFs) 7107 or the like, into which a clock signal (S-CLK), a clock inverted signal (S-CLKB), and a start pulse signal (S-SP) are inputted. A sampling pulse is outputted sequentially in accordance with the timing of these signals.

The sampling pulse outputted from the pulse output circuit 7101 is inputted into a first latch circuit 7102. A digital video signal is inputted into the first latch circuit 7102, and held in each stage at the timing that the sampling pulse is inputted. Here, the digital video signals are inputted by three bits for each stage. The video signals at each bit are held in the first latch circuit 7102 for each stage. Three latch circuits of each stage in the first latch circuit 7102 are operated in parallel by one sampling pulse.

When the first latch circuit 7102 finishes to hold the digital video signals up to the last stage, a latch pulse (Latch Pulse) is inputted into a second latch circuit 7103 in a horizontal retrace period, and the digital video signals held in the first latch circuit 7102 are transferred to the second latch circuit 7103 all at once. After that, the digital video signals held in the second latch circuit 7103 for one row are inputted into a DAC (a D/A converter circuit) 7104 simultaneously.

The DAC 7104 converts the inputted digital video signals into video signals having analog potential, and inputs them into an analog buffer circuit 7105.

Respective analog signal potentials are supplied to signal lines $D1a_1$ to $D1a_n$ from the analog buffer circuit 7105. At the same time, respective triangular wave potentials are set to signal lines $D2a_1$ to $D2a_n$ from a triangular wave potential generating circuit 7106. It is to be noted that each of the signal lines $D1a_1$ to $D1a_n$ corresponds to the first signal line 410 or the first signal line 710 of a display device having the pixel shown in FIG. 4 or FIG. 7. Each of the signal lines $D2a_1$ to $D2a_n$ corresponds to the second signal line 411 or the second signal line 711 of the display device having the pixel shown in FIG. 4 or FIG. 7.

Figure 72:
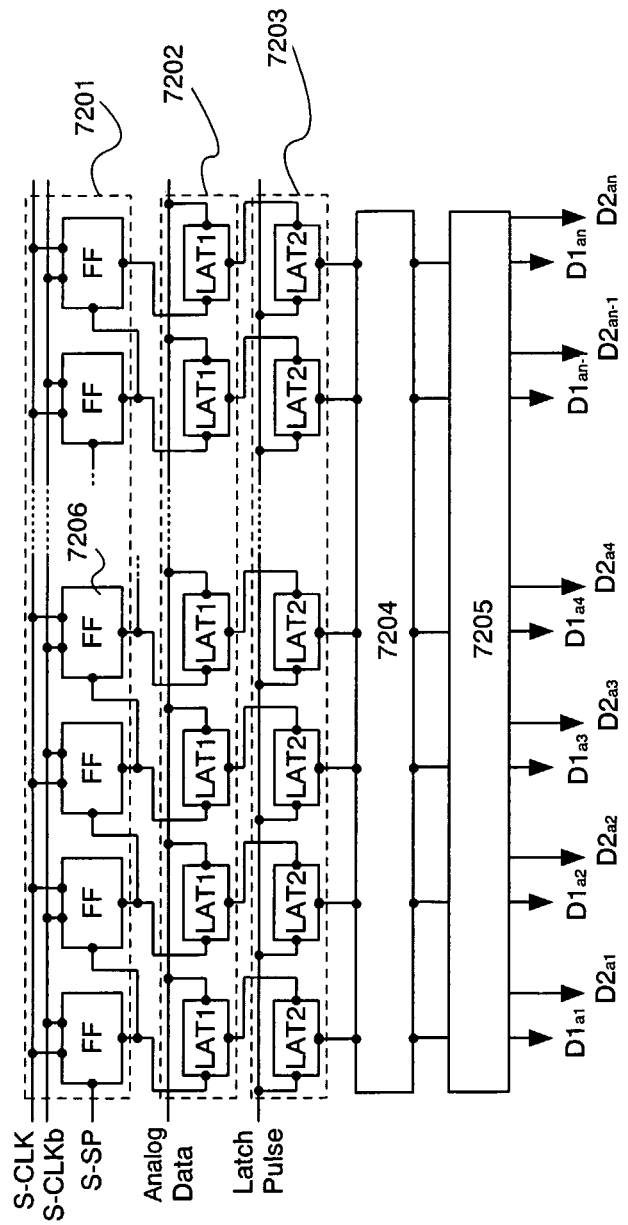
FIG. 72 shows an example of a signal line driver circuit applicable in a display device of the invention.

Next, constitution shown in FIG. 72 is described.

A pulse output circuit 7201 is constituted by a plurality of stages of flip-flop circuits (FFs) 7206 or the like, into which a clock signal (S-CLK), a clock inverted signal (S-CLKB), and a start pulse signal (S-SP) are inputted. A sampling pulse is outputted sequentially in accordance with the timing of these signals.

The sampling pulse outputted from the pulse output circuit 7201 is inputted into a first analog latch circuit 7202. An analog video signal (Analog Data) is inputted into the first analog latch circuit 7202, and held in each stage at the timing that the sampling pulse is inputted. Here, the analog video signals are inputted by one bit for each stage. The video signals at each bit are held in the first analog latch circuit 7202 for each stage.

When the first analog latch circuit 7202 finishes to hold the analog video signals up to the last stage, a latch pulse (Latch Pulse) is inputted into a second analog latch circuit 7203 in a horizontal retrace period, and the analog video signals held in the first analog latch circuit 7202 are transferred to the second analog latch circuit 7203 all at once. After that, the analog video signals held in the second analog latch circuit 7203 for one row are inputted into an analog buffer circuit 7204 simultaneously.

Respective analog signal potentials are supplied to signal lines $D1a_1$ to $D1a_n$ from the analog buffer circuit 7204. At the same time, respective triangular wave potentials are supplied to signal lines $D2a_1$ to $D2a_n$ from a triangular wave potential generating circuit 7205.

Although the description is made on the signal line driver circuit in the case where signals are written into pixels of a selected row all at once (also called a line sequential method), a video signal inputted into a signal line driver circuit may be written into a pixel directly in accordance with a signal outputted from a pulse output circuit (also called a dot sequential method).

A signal line driver circuit employing a dot sequential method which can be applied for the pixel configuration described in Embodiment Mode 1 is described with reference to FIG. 61A. A pulse output circuit 6101, a first switch group 6102, and a second switch group 6103 are included. Each of the first switch group 6102 and the second switch group 6103 includes a plurality of stages of switches. The plurality of stages correspond to signal lines respectively.

A switch of each stage in the first switch group 6102 has one terminal connected to a wire into which Analog Video Data corresponding to a video signal is inputted and the other terminal connected to a corresponding signal line. In addition, a switch of each stage in the second switch group 6103 has one terminal connected to a wire into which a triangular wave potential is supplied and the other terminal connected to a corresponding signal line.

In a writing period of pixels, a clock signal (S-CLK), a clock inverted signal (S-CLKB), and a start pulse signal (S-SP) are inputted into the pulse output circuit 6101. A sampling pulse is outputted sequentially in accordance with the timing of these signals. It is to be noted that, at this time, a control signal for controlling on/off of the second switch group 6103 is set so as to turn off the switches of all stages.

Then, the switches in the first switch group 6102 are turned on one stage by one stage in accordance with the output of the sampling pulse.

In the writing period, therefore, Analog Video Data is inputted into a signal line corresponding to the stage of the switch turned on in the first switch group 6102. In this manner, the switch of each stage in the first switch group 6102 is sequentially turned on so that the Analog Video Data is written into pixels of a selected row sequentially.

Subsequently, the next pixel row is selected and a signal is written into the pixels similarly. Signal writing is performed into pixels of all rows to complete the writing period.

A light emitting period follows the writing period of pixels. In the light emitting period of pixels, a sampling pulse is not outputted from the pulse output circuit 6101. That is, an output of the pulse output circuit 6101 may not be inputted into the first switch group 6102 or a start pulse signal (S-SP) may not be inputted into the pulse output circuit 6101; thus, switches in the first switch group 6102 are turned off.

In addition, a control signal is inputted so as to turn on all switches in the second switch group 6103. Consequently, a triangular wave potential is supplied to all signal lines. It is to be noted that, in the light emitting period, a triangular wave potential can be supplied to pixels of all rows since the pixels of all rows are selected. The triangular wave potential is inputted.

One frame period is completed when the light emitting period is terminated in this manner.

A signal line driver circuit employing a dot sequential method which can be applied for the pixel configuration described in Embodiment Mode 2 is described with reference to FIG. 61B. A pulse output circuit 6111 and a switch group

6112 are included. The switch group 6112 includes a plurality of stages of switches. The plurality of stages correspond to first signal lines respectively.

A switch of each stage in the switch group 6112 has one terminal connected to a wire into which Analog Video Data corresponding to a video signal is inputted and the other terminal connected to a first signal line corresponding to a pixel column. In addition, a wire into which a triangular wave potential is supplied is connected to second signal lines corresponding to pixel columns respectively.

In a writing period of pixels, a clock signal (S-CLK), a clock inverted signal (S-CLKB), and a start pulse signal (S-SP) are inputted into the pulse output circuit 6111. A sampling pulse is outputted sequentially in accordance with the timing of these signals.

Then, switches in the switch group 6112 are turned on one stage by one stage in accordance with the output of the sampling pulse.

In the writing period of pixels, therefore, Analog Video Data is inputted into a signal line corresponding to the stage of the switch turned on in the switch group 6112. In this manner, the switch of each stage in the switch group 6112 is sequentially turned on so that the Analog Video Data is written into pixels of a selected row sequentially.

It is to be noted that pixels of unselected rows are connected to the second signal lines and be in a light emitting period.

As described above, the constitution shown in FIG. 61B can be applied for such pixels described in Embodiment Mode 2 that a writing period is set for each pixel row and when one pixel row is in the writing period, the other pixel rows are in a light emitting period.

Described next is constitution of a scan line driver circuit. Description is made on constitution of one scan line driver circuit performing a function of the first scan line driver circuit 4403 and the second scan line driver circuit 4404 shown in FIG. 44B.

Figure 49A:
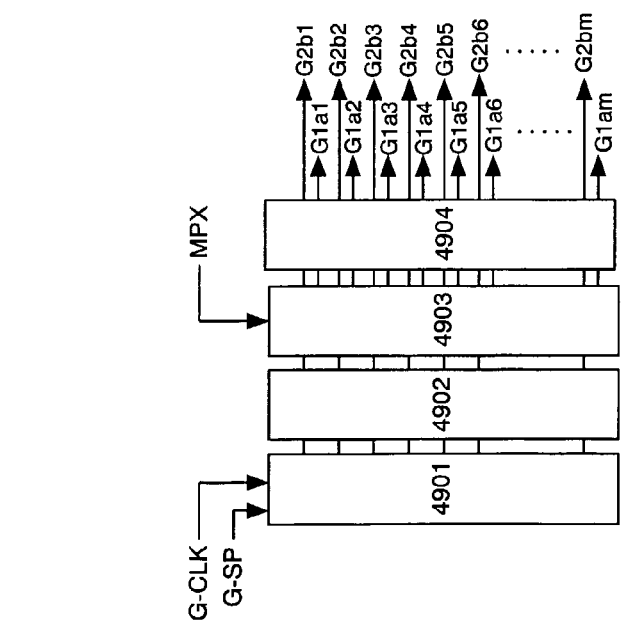
FIGS. 49A and 49B show examples of a signal line driver circuit applicable in a display device of the invention.

A scan line driver circuit shown in FIG. 49A includes a pulse output circuit 4901, a buffer 4902, a pulse dividing circuit 4903, and a switching circuit 4904. It is to be noted that each of the first scan line driver circuit 4403 and the second scan line driver circuit 4404 shown in FIGS. 44A and 44B can be constituted by the pulse output circuit 4901 and the buffer 4902.

Figure 49B:
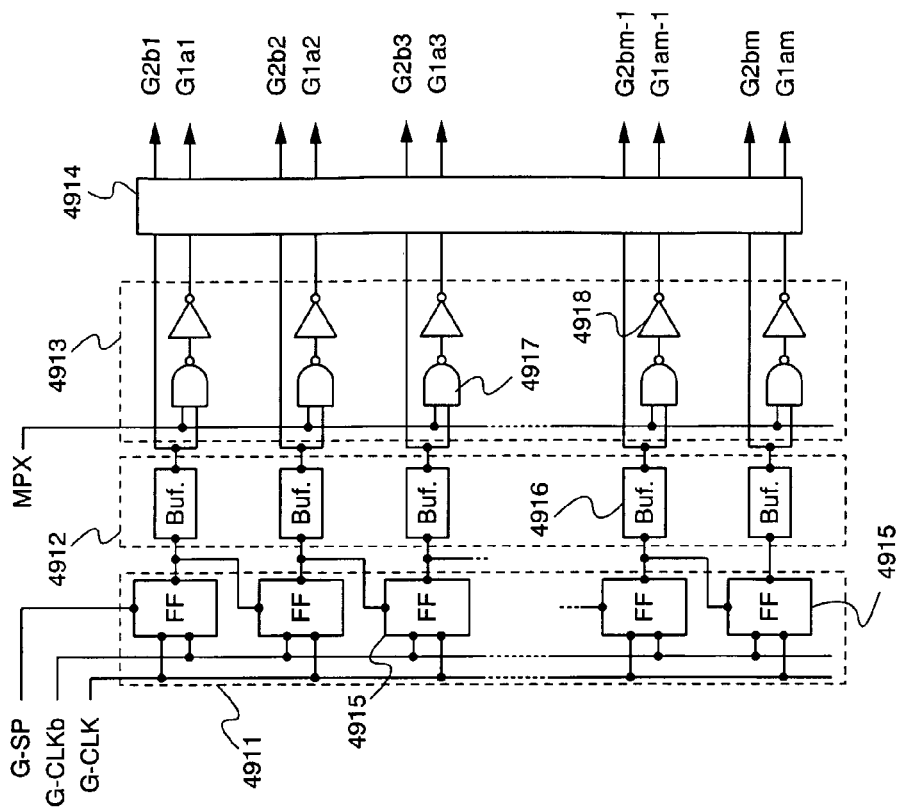

The scan line driver circuit shown in FIG. 49A is described in detail using specific constitution shown in FIG. 49B.

A pulse output circuit 4911 is constituted by a plurality of stages of flip-flop circuits (FFs) 4915 or the like, into which a clock signal (G-CLK), a clock inverted signal (G-CLKB), and a start pulse signal (G-SP) are inputted. A sampling pulse is outputted sequentially in accordance with the timing of these signals.

The sampling pulse outputted from the pulse output circuit 4911 is inputted into a buffer 4916 of each stage in a buffer 4912, then the current supply capability is increased and outputted from the buffer 4916.

Sampling pulse outputted from the buffer 4912 is inputted into a pulse dividing circuit 4913. The pulse dividing circuit 4913 is constituted by a plurality of stages each including a NAND 4917 and an inverter 4918. By outputting the output of the buffer 4916 and a NAND of the output of the buffer 4916 and a division signal (MPX) inputted from the outside, two scan lines controlled using different pulses can be controlled by one scan line driver circuit. That is, in the case of FIG. 2, the first scan lines $G1a_1$ to $G1a_m$ and the second scan lines $G2b_1$ to $G2b_m$ can be controlled by one scan line driver circuit.

By constituting the first scan line driver circuit 4403 and the second scan line driver circuit 4404 shown in FIG. 44B by one scan line driver circuit, space of a driver circuit is reduced and frame size can be reduced.

Described next is constitution which can be applied to the D/A converter circuit in this Embodiment Mode.

Figure 31:
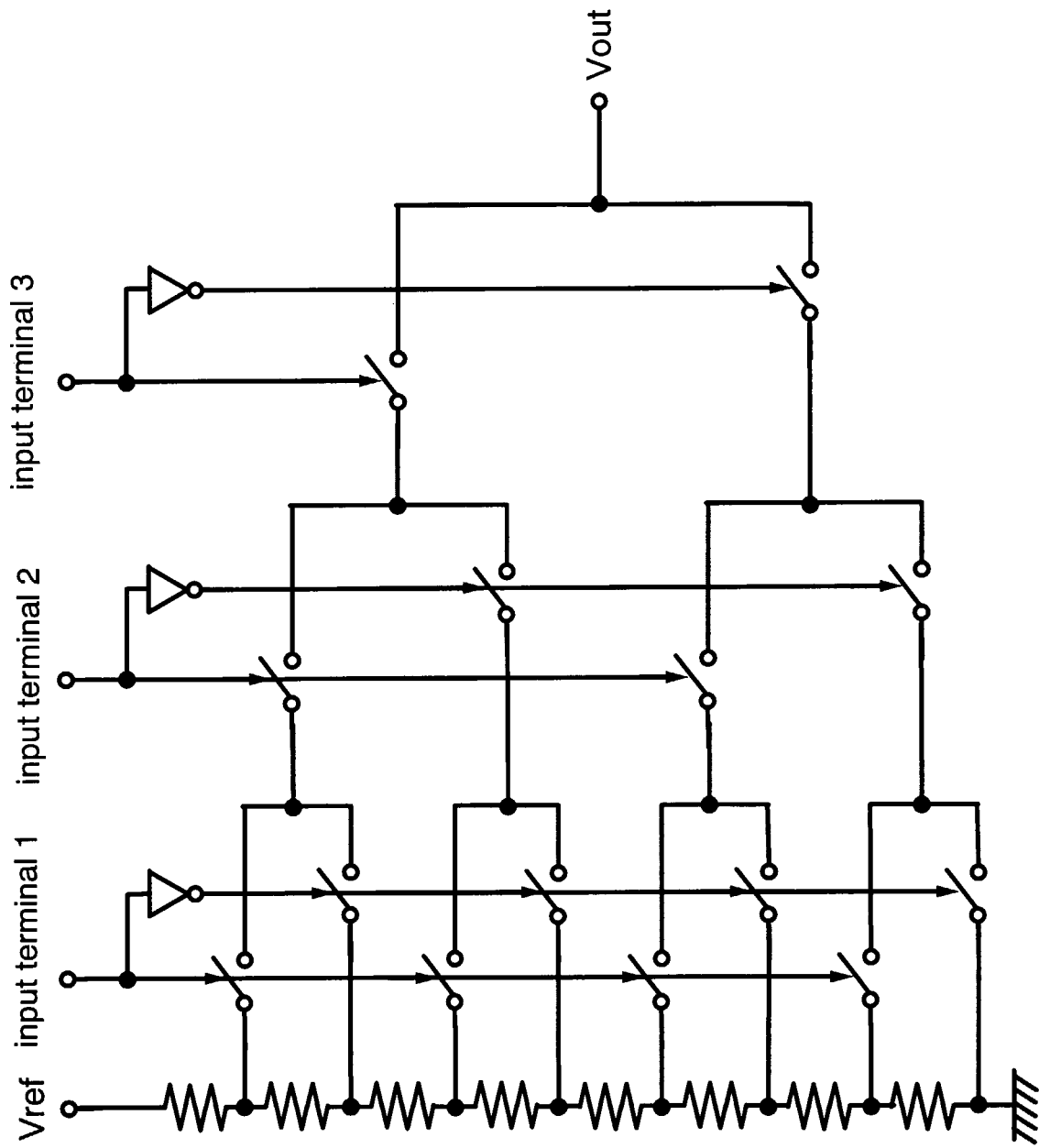
FIG. 31 is a diagram showing an example of a D/A converter circuit applicable in a display device having a pixel configuration of the invention.

FIG. 31 shows a resistor string D/A converter circuit which can convert a digital signal of three bits into an analog signal.

A plurality of resistors is connected in series. A reference power supply potential Vref is supplied to one terminal of the resistor group while a low potential (e.g., GND) is supplied to the other terminal thereof. Current flows through the resistor group and respective potentials of both terminals of each resistor are different due to voltage drop. In accordance with signals inputted into an input terminal 1, an input terminal 2, and an input terminal 3 respectively, on/off of switches are selected to provide eight kinds of potentials from an output terminal. In specific, either of a higher-potential group of four potentials and a lower-potential group of four potentials from eight kinds of potentials is selected by a signal inputted into the input terminal 3. Then, either of a higher-potential group of two potentials and a lower-potential group of two potentials from the four potentials selected by the input terminal 3 is selected by a signal inputted into the input terminal 2. Further, either of a higher potential and a lower potential group from the two potentials selected by the input terminal 2 is selected by a signal inputted into the input terminal 1. One potential is selected from eight kinds of potentials in this manner. Therefore, digital signals inputted into the input terminal 1, the input terminal 2, and the input terminal 3 can be converted into an analog signal potential.

Figure 32:
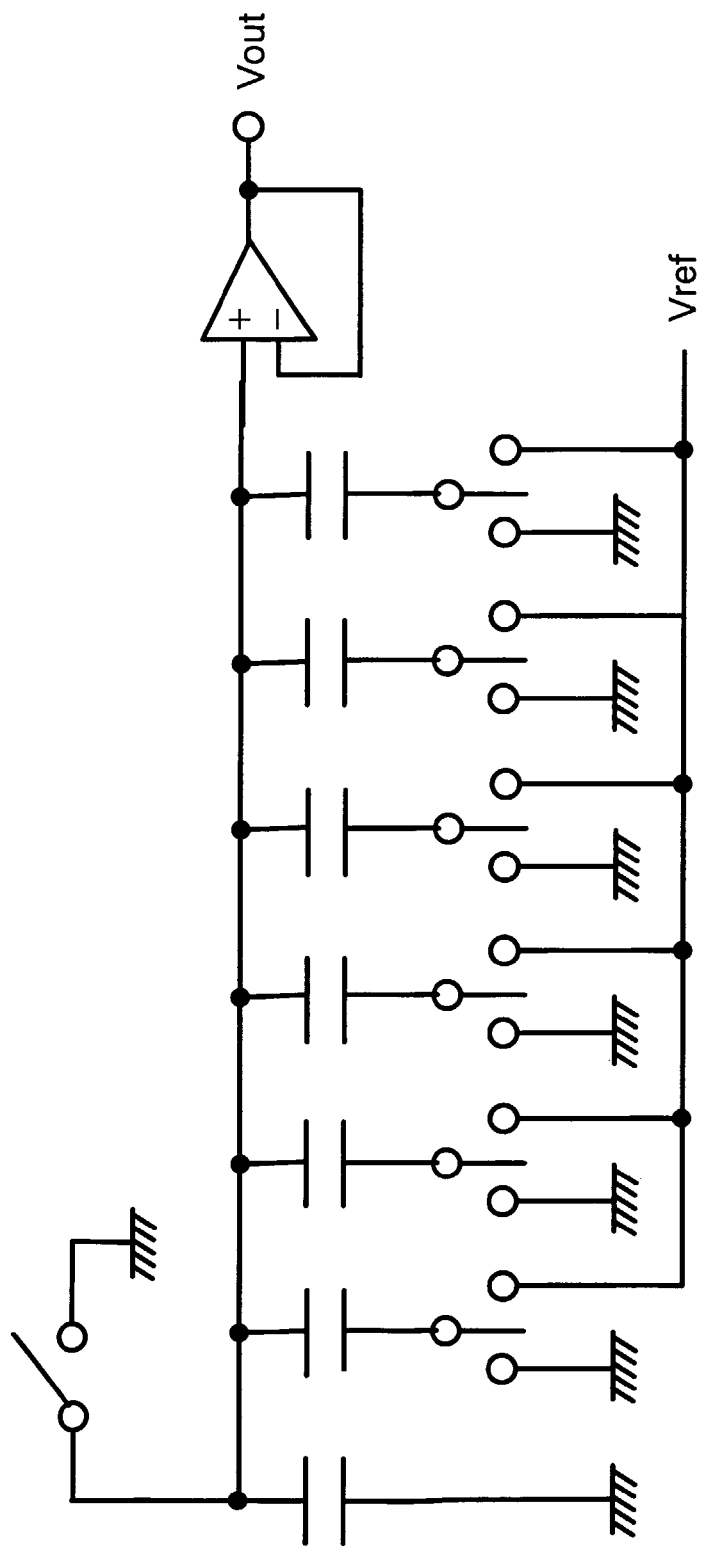
FIG. 32 is a diagram showing an example of a D/A converter circuit applicable in a display device having a pixel configuration of the invention.

FIG. 32 shows a capacitor array D/A converter circuit which can convert a digital signal of six bits into an analog signal.

A plurality of capacitors each having different electrostatic capacitance is connected in parallel. On/off of switches 1 to 6 are controlled in accordance with a digital signal to store a charge for a potential difference between a reference power supply potential Vref and a low potential (e.g., GND) in an arbitrary capacitor from the capacitors. After that, the stored charge is distributed among the plurality of capacitors. Consequently, voltage of the plurality of capacitors is stabilized at a certain value. By detecting one potential using an amplifier according to this voltage, the digital signal can be converted into an analog signal.

In addition, a D/A converter circuit which combines the resistor string type and the capacitor array type with each other may be used as well. The above-described D/A converter circuits are only examples, and various D/A converter circuits can be used arbitrarily.

Embodiment Mode 13

In this embodiment mode, a structure of a display panel having the pixel configuration described in Embodiment Mode 1, Embodiment Mode 2, Embodiment Mode 3, Embodiment Mode 4, Embodiment Mode 5, Embodiment Mode 6, or Embodiment Mode 7 is described with reference to FIGS. 11A and 11B.

In this embodiment mode, a display panel which has the pixel configuration of the invention in a pixel region is described with reference to FIGS. 11A and 11B. FIG. 11A is a top view of the display panel, and FIG. 11B is a sectional view taken on line A-A' of FIG. 11A. A signal line (Data line) driver circuit 1101, a pixel region 1102, a first scan line (G1 line) driver circuit 1103, and a second scan line (G2 line) driver circuit 1106 which are shown by a dotted line are provided. In addition, a sealing substrate 1104 and a sealant 1105 are provided. Inside surrounded by the sealant 1105 is a space 1107.

A wire 1108 is a wire for transmitting signals inputted into the first scan line driver circuit 1103, the second scan line driver circuit 1106, and the signal line driver circuit 1101. The wire 1108 receives a video signal, a clock signal, a start signal, or the like from an FPC (Flexible Printed Circuit) 1109 which is an external input terminal. Over a connecting portion between the FPC 1109 and the display panel, an IC chip (a semiconductor chip provided with a memory circuit, a buffer circuit, or the like) is mounted by COG (Chip On Glass) or the like. It is to be noted that although only the FPC is shown here, a printed wiring board (PWB) may be attached to the FPC. The display device in this specification includes not only a main body of the display panel, but also the main body of the display panel provided with an FPC or a PWB, and besides, the main body of the display panel mounted with an IC chip or the like.

A sectional structure thereof is described with reference to FIG. 11B. The pixel region 1102 and peripheral driver circuits (the first scan line driver circuit 1103, the second scan line driver circuit 1106, and the signal line driver circuit 1101) are formed over the substrate 1110. The signal line driver circuit 1101 and the pixel region 1102 are illustrated here.

It is to be noted here that the signal line driver circuit 1101 is constituted by transistors having the same conductivity type, such as an n-type TFT 1120 and an n-type TFT 1121. In addition, it is preferable that the first scan line driver circuit 1103 and the second scan line driver circuit 1106 be also constituted by n-type transistors. It is to be noted a display panel having a single conductivity type can be manufactured by applying the pixel configuration of the invention to constitute by transistors having the same conductivity type. Although the peripheral driver circuits are formed over the same substrate in the display panel in this embodiment mode, the invention is not limited to this and the whole or a part of the peripheral driver circuits may be formed on an IC chip and then mounted by COG or the like. In that case, the driver circuit is not required to be a single conductivity type and a p-type transistor may be used in combination. In addition, although the buffer 801, the buffer 802, and the buffer 803 in the display device shown in FIG. 8 are not illustrated in the display panel described in this embodiment mode, respective buffers are provided in the peripheral driver circuits.

The pixel region 1102 has a plurality of circuits each forming a pixel including a switching TFT 1111 and a driving TFT 1112. A source electrode of the driving TFT 1112 is connected to a first electrode 1113. In addition, an insulator 1114 is formed so as to cover end portions of the first electrode 1113; it is formed using a positive photosensitive acrylic resin film here.

In order to improve the coverage, the upper edge portion or the bottom edge portion of the insulator 1114 is formed to have a curved surface having curvature. For example, in the case where a positive photosensitive acrylic is used as a material for the insulator 1114, it is preferable that only the upper edge portion of the insulator 1114 be formed to have a curved surface having a radius of curvature (from 0.2 μm to 3 μm). Either a negative type resin that is insoluble in etchant due to light or a positive type resin that is dissoluble in etchant due to light can be used as the insulator 1114.

On the first electrode 1113, a layer containing an organic compound 1116 and a second electrode 1117 are formed. The first electrode 1113 which functions as an anode is preferably formed using a material having a high work function. For example, a single-layer film such as an ITO (indium tin oxide) film, an indium zinc oxide (IZO) film, a titanium nitride film, a chromium film, a tungsten film, a Zn film, or a Pt film, a stacked layer of a titanium nitride film and a film containing aluminum as a main component, or a three-layer structure of a titanium nitride film, a film containing aluminum as a main component and a titanium nitride film can be used. It is to be noted that a laminated structure makes it possible to reduce the resistance as a wire and realize a good ohmic contact, and to function as an anode.

The layer containing an organic compound 1116 is formed by vapor deposition using an evaporation mask or ink jetting. As the layer containing an organic compound 1116, a metal complex of the fourth group of the periodic system is partially used, and either a low molecular weight material or a high molecular weight material may be used in combination with such a metal complex. Generally, an organic compound is used as a single layer or a stacked layer in many cases as a material for the layer containing an organic compound; however, the structure in which an inorganic compound is used partially in a film formed of an organic compound is included in this embodiment mode. Moreover, a known triplet material can be used as well.

As a material for the second electrode (a cathode) 1117 formed on the layer containing an organic compound 1116, a material having a low work function (Al, Ag, Li, Ca, or an alloy of these elements such as MgAg, MgIn, AlLi, $CaF_2$, or CaN) can be used. In the case where light generated in the electroluminescent layer 1116 is emitted through the second electrode 1117, a stacked layer of a metal thin film, and a transparent conductive film (e.g., ITO (an alloy of indium oxide and tin oxide indium), an alloy of indium oxide and zinc oxide ($In_2O_3$—ZnO), or zinc oxide (ZnO)) is preferably used as the second electrode (the cathode) 1117.

Subsequently, the sealing substrate 1104 is attached to the substrate 1110 with the sealant 1105, so that a display element 1118 is provided in the space 1107 surrounded by the substrate 1110, the sealing substrate 1104, and the sealant 1105. It is to be noted that the space 1107 may be filled with an inert gas (e.g., nitride or argon) or the sealant 1105.

It is to be noted that an epoxy resin is preferably used for the sealant 1105. In addition, it is preferable that the material do not transmit moisture and oxygen as much as possible. As the sealing substrate 1104, a glass substrate, a quartz substrate, or a plastic substrate formed of FRP (Fiberglass-Reinforced Plastics), PVF (polyvinyl fluoride), mylar, polyester, acrylic, or the like can be used.

Accordingly, a display panel having the pixel configuration of the invention can be formed.

By forming the signal line driver circuit 1101, the pixel region 1102, the first scan line driver circuit 1103, and the second scan line driver circuit 1106 over the same substrate as shown in FIG. 11, cost reduction of a display device can be realized. In that case also, by using transistors having the same conductivity type for the signal line driver circuit 1101, the pixel region 1102, the first scan line driver circuit 1103, and the second scan line driver circuit 1106, manufacturing process can be simplified, thereby further cost reduction can be realized. Moreover, by using amorphous silicon for respective semiconductor layers of the transistor used in the signal line driver circuit 1101, the pixel region 1102, the first scan line driver circuit 1103, and the second scan line driver circuit 1106, further cost reduction can be realized.

Figure 53A:
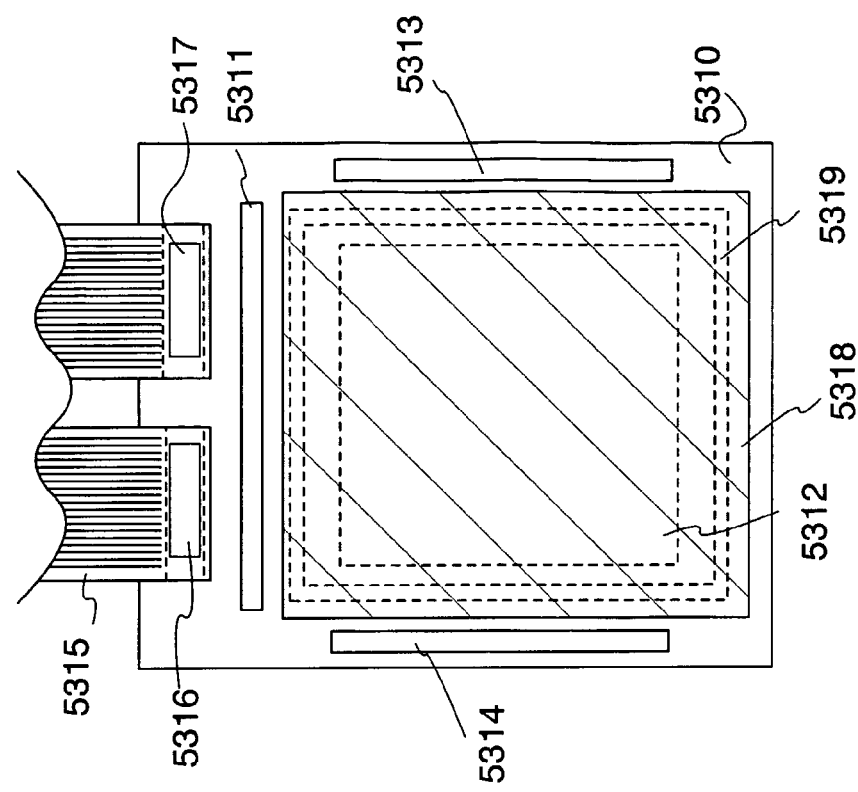
FIGS. 53A and 53B are diagrams each illustrating constitution of a display device having a pixel configuration of the invention.

It is to be noted that constitution of the display panel is not limited to the constitution shown in FIG. 11A where the signal line driver circuit 1101, the pixel region 1102, the first scan line driver circuit 1103, and the second scan line driver circuit 1106 are formed over the same substrate, and the constitution where a signal line driver circuit 5301 shown in FIG. 53A corresponding to the signal line driver circuit 1101 is formed on an IC chip and mounted onto the display panel by COG or the like may be employed. It is to be noted that a substrate 5300, a pixel region 5302, a first scan line driver circuit 5303, a second scan line driver circuit 5304, an FPC 5305, an IC chip 5306, an IC chip 5307, a sealing substrate 5308, and a sealant 5309 in FIG. 53A correspond to the substrate 1110, the pixel region 1102, the first scan line driver circuit 1103, the second scan line driver circuit 1106, the FPC 1109, the IC chip 1118, the IC chip 1119, the sealing substrate 1104, and the sealant 1105 in FIG. 11A respectively.

That is, only a signal line driver circuit whose driver circuit is required to operate rapidly may be formed using a CMOS or the like on an IC chip in order to reduce power consumption. Moreover, by using a semiconductor chip such as a silicon wafer as the IC chip, further high-speed operation and low power consumption can be achieved.

In addition, by forming the scan lines driver circuits and the pixel region over the same substrate, cost reduction can be achieved. Moreover, by constituting the scan line driver circuits and the pixel region by transistors having the same conductivity type, further cost reduction can be realized. The pixel included in the pixel region can be constituted by an n-type transistor as described in Embodiment Mode 3. In addition, by using amorphous silicon for a semiconductor layer of the transistor, manufacturing process can be simplified and further cost reduction can be realized.

In this manner, cost reduction of a high definition display device can be realized. In addition, by mounting an IC chip provided with a functional circuit (a memory or a buffer) onto a connecting portion between the FPC 5305 and the substrate 5300, substrate area can be utilized efficiently.

Figure 53B:
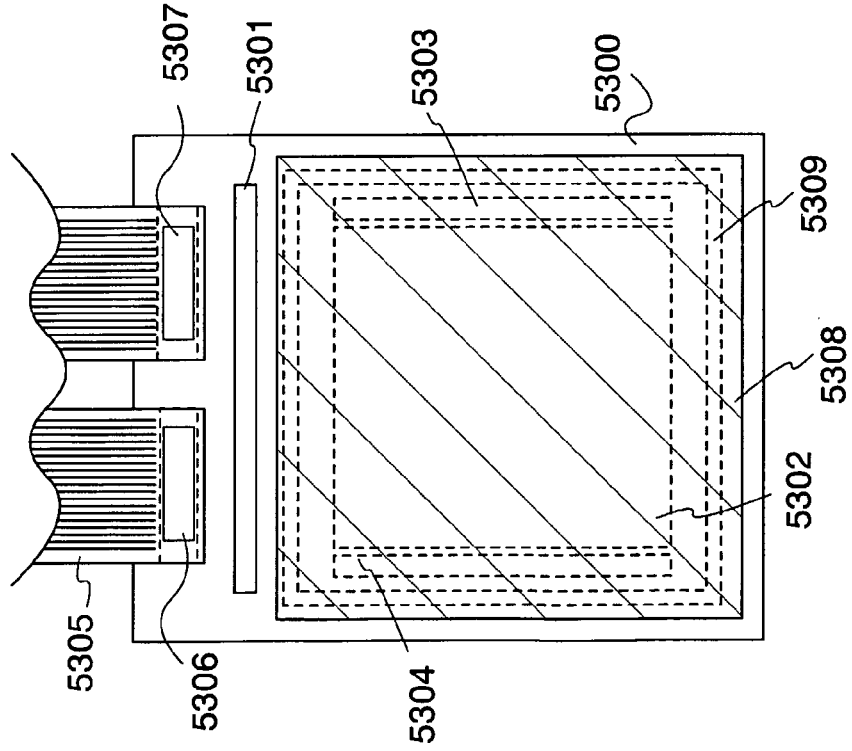

In addition, a signal line driver circuit 5311, a first scan line driver circuit 5313, and a second scan line driver circuit 5314 in FIG. 53B corresponding to the signal line driver circuit 1101, the first scan line driver circuit 1103, and the second scan line driver circuit 1106 in FIG. 11A respectively may be formed on an IC chip, and then mounted onto a display panel by COG or the like as well. In that case, the power consumption of a high definition display device can be further reduced. Therefore, in order to further reduce the power consumption of the display device, it is preferable to use polysilicon for a semiconductor layer of a transistor used in a pixel region. It is to be noted that a substrate 5310, a pixel region 5312, an FPC 5315, an IC chip 5316, an IC chip 5317, a sealing substrate 5318, and a sealant 5319 in FIG. 53B correspond to the substrate 1110, the pixel region 1102, the FPC 1109, the IC chip 1118, the IC chip 1119, the sealing substrate 1104, and the sealant 1105 in FIG. 11A respectively.

Alternatively, by using amorphous silicon for the semiconductor layer of the transistor used in the pixel region 5312, cost reduction can be achieved. Further, a large display panel can be manufactured.

Figure 56B:
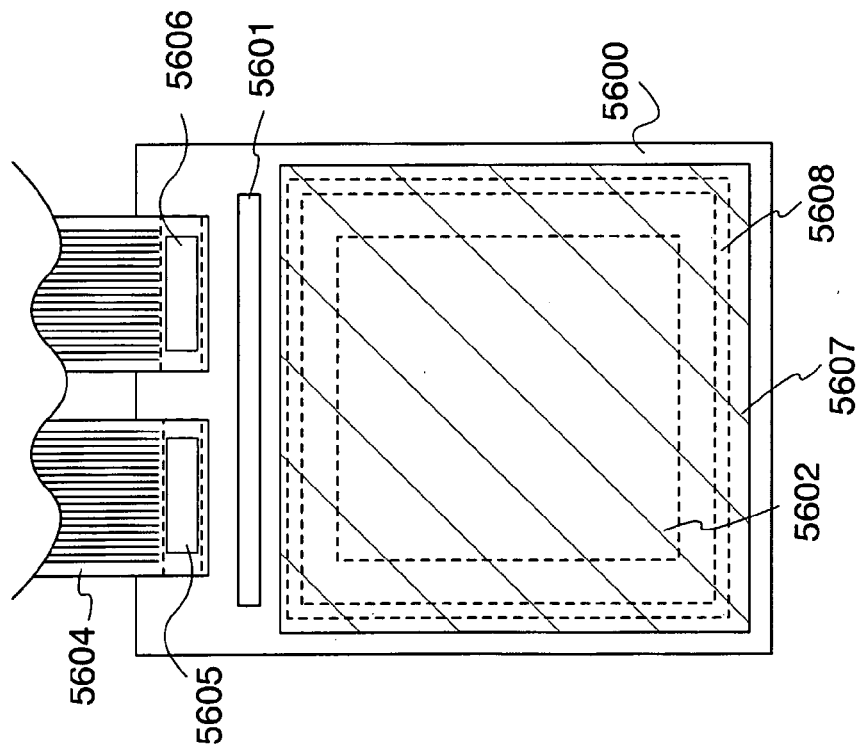
FIGS. 56A and 56B are diagrams each illustrating constitution of a display device having a pixel configuration of the invention.
Figure 56A:
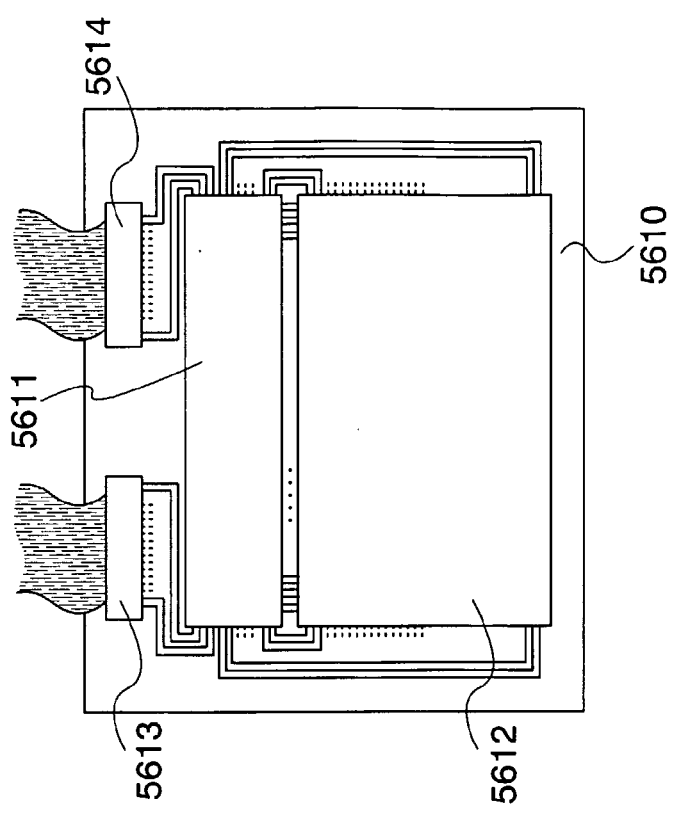

In addition, the scan line driver circuit and the signal line driver circuit may not be provided in the row direction and the column direction of pixels. For example, as shown in FIG. 56A, a peripheral driver circuit 5601 formed on an IC chip may have a function of the first scan line driver circuit 5313, the second scan line driver circuit 5314, and the signal line driver circuit 5311 shown in FIG. 53B. It is to be noted that a substrate 5600, a pixel region 5602, an FPC 5604, an IC chip 5605, an IC chip 5606, a sealing substrate 5607, and a sealant 5608 in FIG. 56A correspond to the substrate 1110, the pixel region 1102, the FPC 1109, the IC chip 1118, the IC chip 1119, the sealing substrate 1104, and the sealant 1105 in FIG. 11A respectively.

Connection of signal lines of the display device shown in FIG. 56A is described with reference to a pattern diagram shown in FIG. 56B. A substrate 5610, a peripheral driver circuit 5611, a pixel region 5612, an FPC 5613, and an FPC 5614 are included. An external signal and a power supply potential are inputted into the peripheral driver circuit 5611 through the FPC 5613. An output of the peripheral driver circuit 5611 is inputted into signal lines in the row direction and the column direction connected to pixels in the pixel region 5612 respectively.

Figure 12:
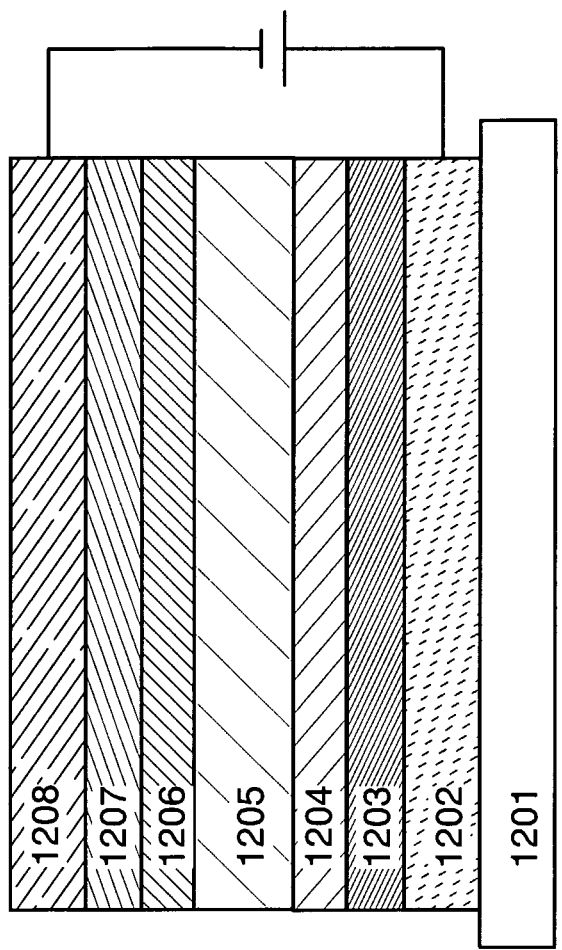
FIG. 12 is a diagram showing an example of a display element applicable in a display device having a pixel configuration of the invention.

An example of a display element applicable to the display element 1118 is shown in FIG. 12. That is, a structure of a display element which can be applied in the pixel described in Embodiment Mode 1, Embodiment Mode 2, Embodiment Mode 3, Embodiment Mode 4, Embodiment Mode 5, Embodiment Mode 6, Embodiment Mode 7, Embodiment Mode 8, or Embodiment Mode 9 is described with reference to FIG. 12.

In an element structure, an anode 1202, a hole injecting layer 1203 formed of a hole injecting material, a hole transporting layer 1204 formed of a hole transporting material, a light-emitting layer 1205, an electron transporting layer 1206 formed of an electron transporting material, an electron injecting layer 1207 formed of an electron injecting material, and a cathode 1208 are stacked on a substrate 1201 in this order. Here, the light-emitting layer 1205 is sometimes formed of only one kind of a light emitting material, but may be formed of two or more materials. In addition, an element structure of the invention is not limited to this structure.

In addition to the stacked layer structure in which the functional layers are stacked as shown in FIG. 12, various elements can be applied such as an element using a polymer compound or a high efficiency element in which a light emitting layer is formed using a triplet light emitting material emitted from a triplet excited state. In addition, a white display element realized by dividing a light emitting region into two regions by controlling a carrier recombination region by a hole blocking layer, or the like can be applied as well.

In a manufacturing method of the element of the invention shown in FIG. 12, the hole injecting material, the hole transporting material, and the light emitting material are deposited in this order on the substrate 1201 provided with the anode (ITO) 1202, first. Then, the electron transporting material and the electron injecting material are deposited, and the cathode 1208 is lastly formed by deposition.

Described below are materials suitable for the hole injecting material, the hole transporting material, the electron transporting material, the electron injecting material, and the light emitting material respectively.

As the hole injecting material, a porphyrin compound, phthalocyanine (hereinafter referred to as "$H_2Pc$"), copper phthalocyanine (hereinafter referred to as "CuPc"), or the like is efficient among organic compounds. In addition, a material that has a smaller value of an ionization potential than the hole transporting material to be used and has a hole transporting function can also be used as the hole injecting material. There is also a material of a conductive polymer chemically doped, which includes polyethylene dioxythiophene (hereinafter referred to as "PEDOT") doped with polystyrene sulfonate (hereinafter referred to as "PSS"), polyaniline, and the like. In addition, an insulating polymer is efficient in terms of planarization of an anode, and polyimide (hereinafter referred to as "PI") is often used. Further, an inorganic compound is also used, which includes an extra-thin film of aluminum oxide (hereinafter referred to as "alumina") as well as a thin film of a metal such as gold or platinum.

As the hole transporting material, it is an aromatic amine-based compound (that is, a compound having a bond of benzene ring-nitrogen) that is most widely used. The materials that are widely used include 4,4'-bis(diphenylamino)-biphenyl (hereinafter referred to as "TAD"), derivatives thereof such as 4,4'-bis[N'-(3-methylphenyl)-N-phenyl-amino]-biphenyl (hereinafter referred to as "TPD") or 4,4'-bis[N-(1-naphthyl)-N-phenyl-amino]-biphenyl (hereinafter referred to as "a-NPD"), and besides, star burst aromatic amine compounds such as 4,4', 4"-tris (N,N-diphenyl-amino)-triphenylamine (hereinafter referred to as "TDATA") and 4,4',4"-tris [N-(3-methylphenyl)-N-phenyl-amino]-triphenylamine (hereinafter referred to as "MTDATA").

As the electron transporting material, a metal complex is often used, which includes a metal complex having a quinoline skeleton or a benzoquinoline skeleton such as Alq, BAlq, tris(4-methyl-8-quinolinolato)aluminum (hereinafter referred to as "Almq"), or bis(10-hydroxybenzo[h]-quinolinato)beryllium (hereinafter referred to as "Bebq"), and besides, a metal complex having an oxazole-based or a thiazole-based ligand such as bis[2-(2-hydroxyphenyl)-benzoxazolato]zinc (hereinafter referred to as "Zn(BOX)$_2$") or bis [2-(2-hydroxyphenyl)-benzothiazolato]zinc (hereinafter referred to as "Zn(BTZ)$_2$"). Further, other than the metal complexes, oxadiazole derivatives such as 2-(4-biphenylyl)-5-(4-tert-butylphenyl)-1,3,4-oxadiazole (hereinafter referred to as "PBD") and OXD-7, triazole derivatives such as TAZ and 3-(4-tert-butylphenyl)-4-(4-ethylphenyl)-5-(4-biphenylyl)-1,2,4-triazole (hereinafter referred to as "p-EtTAZ"), and phenanthroline derivatives such as bathophenanthroline (hereinafter referred to as "BPhen") and BCP have an electron transporting property.

As the electron injecting material, the above-described electron transporting materials can be used. In addition, an extra-thin film of an insulator, such as metal halide such as calcium fluoride, lithium fluoride, or cesium fluoride, or alkali metal-oxide such as lithium oxide, is often used. Further, an alkali-metal complex such as lithium acetyl acetonate (hereinafter referred to as "Li(acac)") or 8-quinolinolato-lithium (hereinafter referred to as "Liq") is also efficient.

As the light emitting material, other than the above-described metal complexes such as Alq, Almq, BeBq, BAlq, Zn(BOX)$_2$, and Zn(BTZ)$_2$, various fluorescent pigments are efficient. The fluorescent pigments include 4,4'-bis(2,2-diphenyl-vinyl)-biphenyl which is blue, 4-(dicyanomethylene)-2-methyl-6-(p-dimethylaminostyryl)-4H-pyran which is red-orange, and the like. Also, a triplet light emitting material is available, which is mainly a complex with platinum or iridium as a central metal. As the triplet light emitting material, tris(2-phenylpyridine)iridium, bis(2-(4'-tryl)pyridinato-N,C$^{2'}$)acetylacetonato iridium (hereinafter referred to as "acacIr(tpy)$_2$"), 2,3,7,8,12,13,17,18-octaethyl-21H,23H porphyrin-platinum, and the like are known.

By combining the above-described materials that have respective functions, a display element with high reliability can be manufactured.

Figure 70:
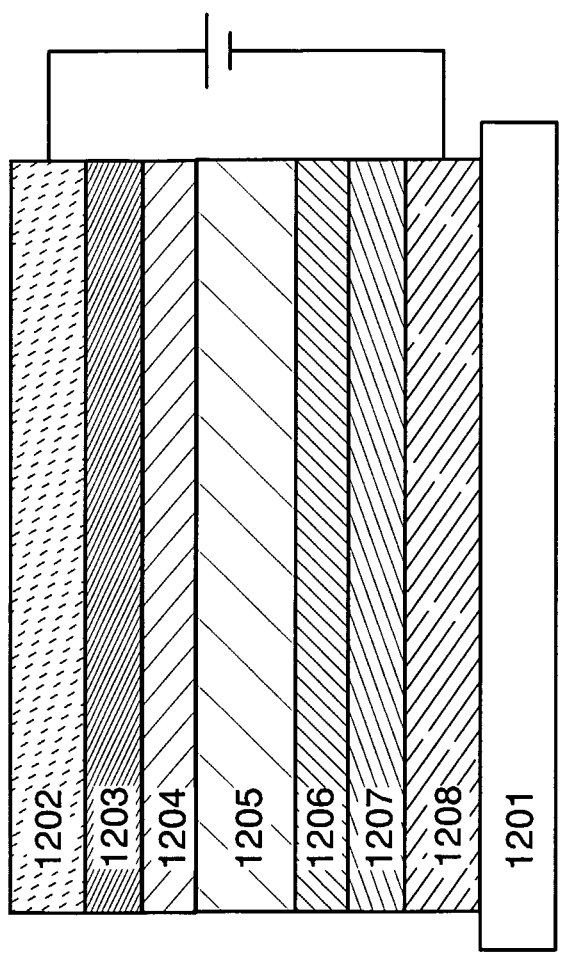
FIG. 70 is a diagram showing an example of a display element applicable in a display device having a pixel configuration of the invention.

In the case of the pixel shown in FIG. 69 described in Embodiment Mode 7, in addition, a display element shown in FIG. 70 having the layers stacked in an order opposite to that in FIG. 12 can be applied. That is, in an element structure, the cathode 1208, the electron injecting layer 1207 formed of an electron injecting material, the electron transporting layer 1206 formed of an electron transporting material, the light-emitting layer 1205, the hole transporting layer 1204 formed of a hole transporting material, the hole injecting layer 1203 formed of a hole injecting material, and the anode 1202 are stacked on the substrate 1201 in this order.

In addition, in order to take out light emission of a display element, at least one of an anode and a cathode is required to be transparent. A TFT and a display element are formed over a substrate; and there are display elements having a top emission structure in which light emission is taken out through a surface opposite to the substrate, having a bottom emission structure in which light emission is taken out through a surface on the substrate side, and having a dual emission structure in which light emission is taken out through a surface opposite to the substrate and a surface on the substrate side, respectively. The pixel configuration of the invention can be applied for the display element having any emission structure.

A display element having a top emission structure is described with reference to FIG. 13A.

On a substrate 1300, a driver TFT 1301 is formed, and a first electrode 1302 is formed so as to contact a source electrode of the driver TFT 1301. A layer containing an organic compound 1303 and a second electrode 1304 are formed thereon.

It is to be noted that the first electrode 1302 is an anode of a display element while the second electrode 1304 is a cathode of the display element. That is, a display element is formed in a region where the layer containing an organic compound 1303 is sandwiched between the first electrode 1302 and the second electrode 1304.

The first electrode 1302 which functions as an anode is preferably formed using a material having a high work function. For example, a single-layer film such as a titanium nitride film, a chromium film, a tungsten film, a Zn film, or a Pt film, a stacked layer of a titanium nitride film and a film containing aluminum as a main component, or a three-layer structure of a titanium nitride film, a film containing aluminum as a main component and a titanium nitride film can be used. It is to be noted that a stacked-layer structure makes it possible to reduce the resistance as a wire and realize a good ohmic contact, and to function as an anode. By using a light-reflective metal film, an anode which does not transmit light can be formed.

The second electrode 1304 which functions as a cathode is preferably formed using a stacked layer of a metal thin film formed of a material having a low work function (Al, Ag, Li, Ca, an alloy thereof such as MgAg, MgIn, AlLi, CaF$_2$, or CaN) and a transparent conductive film (indium tin oxide (ITO), indium zinc oxide (IZO), zinc oxide (ZnO), or the like). By using the thin metal film and the transparent conductive film as described above, a cathode which can transmit light can be formed.

Accordingly, light of the display element can be taken out from a top surface as shown by an arrow in FIG. 13A. That is, in the case where the display element is applied in the display panel shown in FIGS. 11A and 11B, light is emitted toward the sealing substrate 1104 side. Therefore, when a display element having a top emission structure is used in the display device, a substrate which transmits light is used as the sealing substrate 1104.

In addition, if an optical film is provided, the optical film may be provided on the sealing substrate 1104.

It is to be noted that in the case of the pixel configuration shown in FIG. 69 described in Embodiment Mode 7, the first electrode 1302 may be formed using a metal film formed of a material having a low work function such as MgAg, MgIn, or AlLi to function as a cathode. In addition, the second electrode 1304 may be formed using a transparent conductive film such as an ITO (indium tin oxide) film or an indium zinc oxide (IZO) film. Consequently, the transmissivity of the top emission can be improved.

A display element having a bottom emission structure is described with reference to FIG. 13B. The same reference numerals as FIG. 13A are used since a structure except for its emission structure is identical.

The first electrode 1302 which functions as an anode is preferably formed using a material having a high work function. For example, a transparent conductive film such as an ITO (indium tin oxide) film or an indium zinc oxide (IZO) film can be used. By using a transparent conductive film, an anode which can transmit light can be formed.

The second electrode 1304 which functions as a cathode is preferably formed using a metal film formed of a material having a low work function (Al, Ag, Li, Ca, an alloy thereof such as MgAg, MgIn, AlLi, $CaF_2$, or CaN). By using a light-reflective metal film as described above, a cathode which does not transmit light can be formed.

Figure 13B:
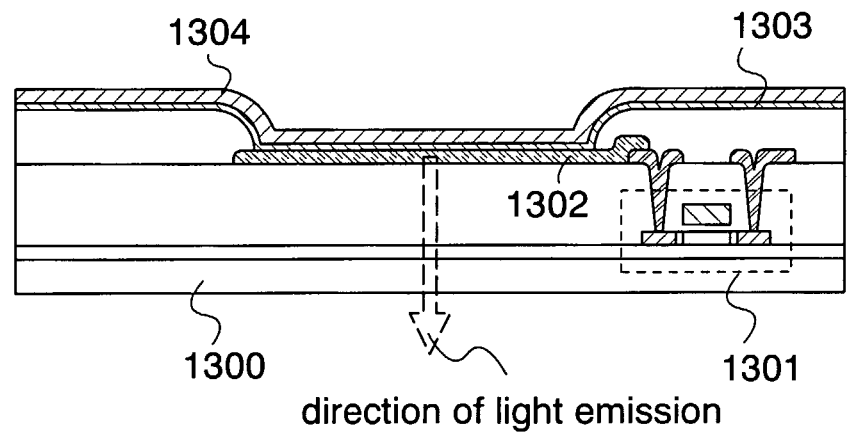

Accordingly, light of the display element can be taken out from a bottom surface as shown by an arrow in FIG. 13B. That is, in the case where the display element is applied in the display panel shown in FIGS. 11A and 11B, light is emitted toward the substrate 1110 side. Therefore, when a display element having a bottom emission structure is used in the display device, a substrate which transmits light is used as the substrate 1110.

In addition, if an optical film is provided, the optical film may be provided over the substrate 1110.

A display element having a dual emission structure is described with reference to FIG. 13C. The same reference numerals as FIG. 13A are used since a structure except for its emission structure is identical.

The first electrode 1302 which functions as an anode is preferably formed using a material having a high work function. For example, a transparent conductive film such as an ITO (indium tin oxide) film or an indium zinc oxide (IZO) film can be used. By using a transparent conductive film, an anode which can transmit light can be formed.

The second electrode 1304 which functions as a cathode is preferably formed using a stacked layer of a metal thin film formed of a material having a low work function (Al, Ag, Li, Ca, an alloy thereof such as MgAg, MgIn, AlLi, $CaF_2$, or CaN) and a transparent conductive film (indium tin oxide (ITO), an alloy of indium oxide and zinc oxide ($In_2O_3$—ZnO), zinc oxide (ZnO), or the like). By using the thin metal film and the transparent conductive film as described above, a cathode which can transmit light can be formed.

Figure 13C:
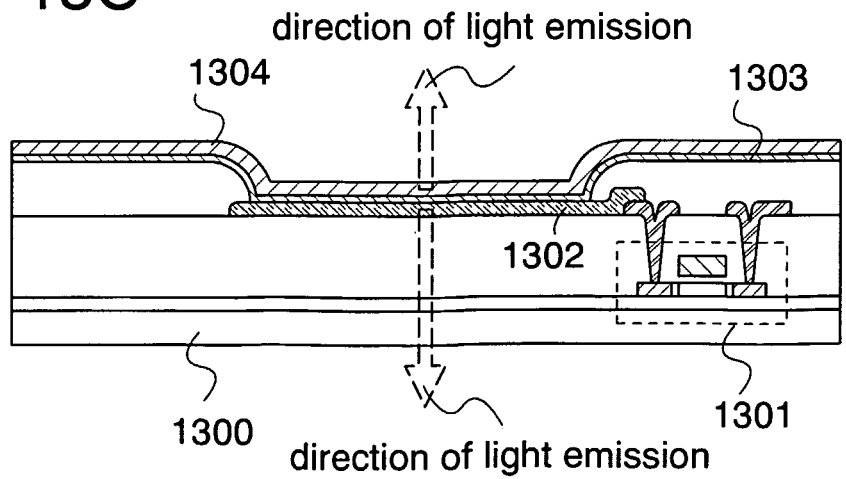

Accordingly, light of the display element can be taken out from both surfaces as shown by arrows in FIG. 13C. That is, in the case where the display element is applied in the display panel shown in FIGS. 11A and 11B, light is emitted toward the substrate 1110 side and the sealing substrate 1104 side. Therefore, when a display element having a dual emission structure is used in the display device, substrates which transmit light are used as the substrate 1110 and the sealing substrate 1104 respectively.

In addition, if an optical film is provided, the optical films may be provided over the substrate 1110 and the sealing substrate 1104 respectively.

In addition, the invention can be applied in a display device which achieves a full-color display by using a white display element and a color filter.

Figure 14:
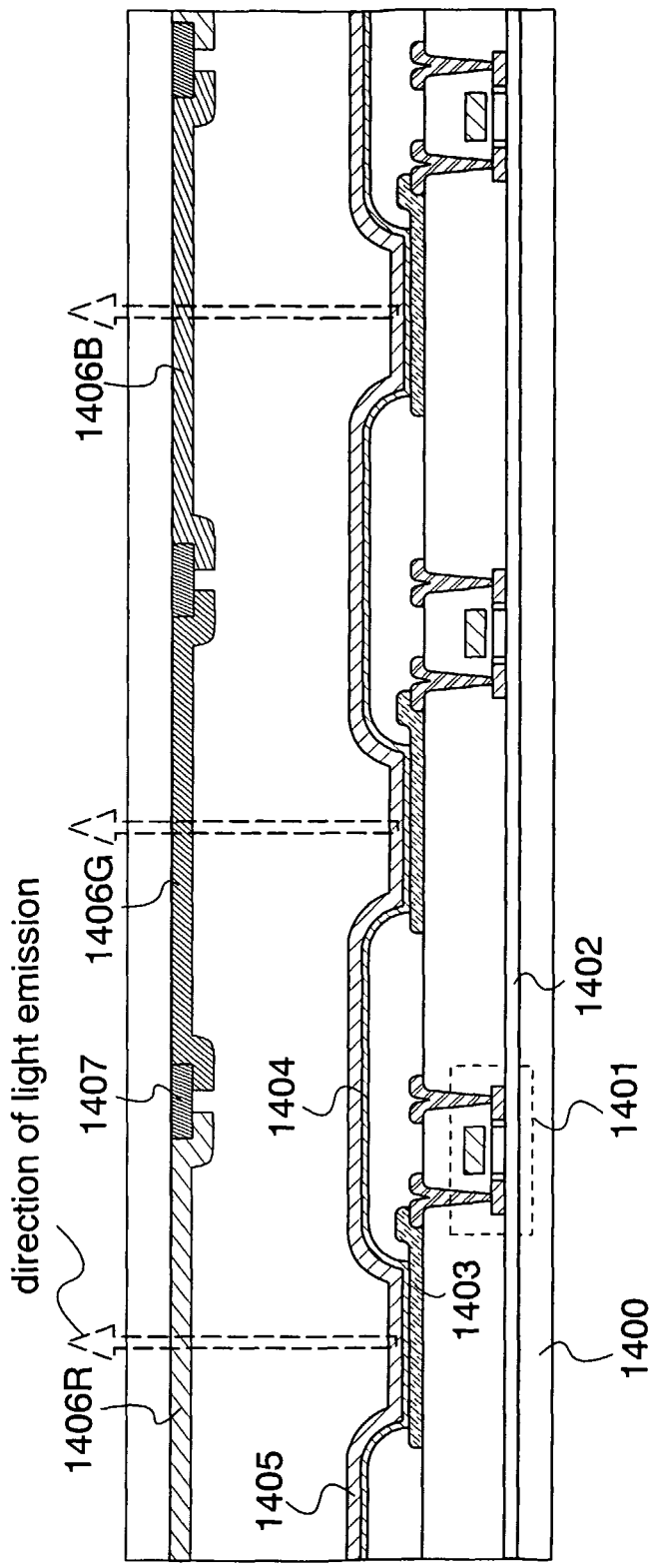
FIG. 14 is a cross sectional diagram of a display panel for performing full color display using a color filter.

As shown in FIG. 14, on a substrate 1400, a driver TFT 1401 is formed, and a first electrode 1403 is formed so as to contact a source electrode of the driver TFT 1401. A layer containing an organic compound 1404 and a second electrode 1405 are formed thereon.

It is to be noted that the first electrode 1403 is an anode of a display element while the second electrode 1405 is a cathode of the display element. That is, a display element is formed in a region where the layer containing an organic compound 1404 is sandwiched between the first electrode 1403 and the second electrode 1405. White light is emitted in the structure shown in FIG. 14. A red color filter 1406R, a green color filter 1406G, and a blue color filter 1406B are provided above the display elements respectively to provide a full-color display. In addition, a black matrix (also called a "BM") 1407 which separates these color filters is provided.

The above-described structures of a display element can be used in combination and can be applied in a display device having the pixel configuration of the invention. It is to be noted that the constitution of a display panel and the display elements described above are only examples, and it is needles to say that the pixel configuration of the invention can be applied in a display device having another constitution.

Described next is a partial cross sectional diagram of a pixel region of a display panel.

First, the case where a polysilicon (p-Si:H) film is used as a semiconductor layer of a transistor is described with reference to FIGS. 15A, 15B, 16A, and 16B.

For example, in order to form the semiconductor layer, an amorphous silicon (a-Si) film is formed on a substrate by a known film formation method here. It is to be noted that any semiconductor film having an amorphous structure (including a microcrystalline semiconductor film) may be used other than the amorphous silicon film. Further, a compound semiconductor film having an amorphous structure such as an amorphous silicon germanium film may be used as well.

Subsequently, the amorphous silicon film is crystallized by a laser crystallization method, a thermal crystallization method using RTA or an annealing furnace, or a thermal crystallization method using a metal element for promoting the crystallization. It is needless to say that the above-described methods may be performed in combination.

As a result of the above-described crystallization, a crystallized region is formed partially in the amorphous semiconductor film.

Next, the crystalline semiconductor film in which the crystallinity is partially enhanced is patterned into a desired shape to form an island-shaped semiconductor film from the crystallized region. This semiconductor film is used as a semiconductor layer of a transistor.

As shown in FIGS. 15A and 15B, a base film 15102 is formed on a substrate 15101, and a semiconductor layer is formed thereon. The semiconductor layers include a channel forming region 15103, an LDD region 15104, and an impurity region 15105 which forms a source region or a drain region of a driving transistor 15118, and include a channel forming region 15106, an LDD region 15107, and an impurity region 15108 which form a bottom electrode of a capacitor 15119, respectively. It is to be noted that channel doping may be performed to the channel forming region 15103 and the channel forming region 15106.

As the substrate, a glass substrate, a quartz substrate, a ceramic substrate, or the like can be used. The base film 15102 can be formed using a single layer of aluminum nitride (AlN), silicon oxide ($SiO_2$), silicon oxynitride ($SiO_xN_y$), or the like, or a stacked layer thereof.

A gate electrode 15110 and a top electrode 15111 of a capacitor are formed over the semiconductor layers respectively with a gate insulating film 15109 interposed therebetween.

An interlayer insulating film 15112 is formed to cover the driving transistor 15118 and the capacitor 15119. A contact hole is opened in the interlayer insulating film 15112, through which a wire 15113 contact the impurity region 15105. A pixel electrode 15114 is formed to contact the wire 15113, and an insulator 15115 is formed to cover an end portion of the pixel electrode 15114 and the wire 15113; it is formed using a positive photosensitive acrylic resin film here. Then, a layer containing an organic compound 15116 and an opposing electrode 15117 are formed on the pixel electrode 15114. A display element 15120 is formed in a region where the layer containing an organic compound 15116 is sandwiched between the pixel electrode 15114 and the opposing electrode 15117.

In addition, as shown in FIG. 15B, an LDD region 15202, which forms a part of the bottom electrode of the capacitor 15118, may be provided so as to overlap the top electrode 15111. It is to be noted that the same reference numerals as FIG. 15A are used for the identical portions, and description thereof is omitted.

In addition, as shown in FIG. 16A, a second top electrode 15301 may be provided which is formed in the same layer as the wire 15113 contacting the impurity region 15105 of the driving transistor 15118. It is to be noted that the same reference numerals as FIG. 15A are used for the identical portions, and description thereof is omitted. A second capacitor is formed by sandwiching the interlayer insulating film 15112 between the second top electrode 15301 and the top electrode 15111. In addition, the second top electrode 15301 contacts the impurity region 15108, so that a first capacitor in which the gate insulating film 15102 is sandwiched between the top electrode 15111 and the channel forming region 15106 and the second capacitor in which the interlayer insulating film 15112 is sandwiched between the top electrode 15111 and the second top electrode 15301 are connected in parallel to form a capacitor 15302 constituted by the first capacitor and the second capacitor. The capacitor 15302 has a synthesis capacitance of capacitances of the first capacitor and the second capacitor, thereby the capacitor having a large capacitance can be formed in a small area. That is, by using the capacitor in the pixel configuration of the invention, the opening ratio can be further improved.

Further alternatively, a structure of a capacitor as shown in FIG. 16B may be adopted as well. A base film 16102 is formed on a substrate 16101, and a semiconductor layer is formed thereon. The semiconductor layer includes a channel forming region 16103, an LDD region 16104, and an impurity region 16105 to form a source region or a drain region of a driving transistor 16118. It is to be noted that channel doping may be performed to the channel forming region 16103.

As the substrate, a glass substrate, a quartz substrate, a ceramic substrate, or the like can be used. The base film 16102 can be formed using a single layer of aluminum nitride (AlN), silicon oxide ($SiO_2$), silicon oxynitride ($SiO_xN_y$), or the like, or a stacked layer thereof.

A gate electrode 16107 and a first electrode 16108 are formed over the semiconductor layers respectively with a gate insulating film 16106 interposed therebetween.

A first interlayer insulating film 16109 is formed to cover the driving transistor 16118 and the first electrode 16108. A contact hole is opened in the first interlayer insulating film 16109, through which a wire 16110 contacts the impurity region 16105. In addition, a second electrode 16111 is formed in the same layer formed of the same material as the wire 16110.

Then, a second interlayer insulating film 16112 is formed to cover the wire 16110 and the second electrode 16111. A contact hole is opened in the second interlayer insulating film 16112, through which a pixel electrode 16113 is formed to contact the wire 16110. A third electrode 16114 is formed in the same layer formed of the same material as the pixel electrode 16113. Accordingly, a capacitor 16119 is constituted by the first electrode 16108, the second electrode 16111, and the third electrode 16114.

An insulator 16115 is formed so as to cover an end portion of the pixel electrode 16113 and the third electrode 16114. Then, a layer containing an organic compound 16116 and an opposing electrode 16117 are formed on the pixel electrode 16113. A display element 16120 is formed in a region where the layer containing an organic compound 16116 is sandwiched between the pixel electrode 16113 and the opposing electrode 16117.

As set forth above, there are the structures shown in FIGS. 15A, 15B, 16A, and 16B as a structure of a transistor using a crystalline semiconductor film as its semiconductor layer. It is to be noted that FIGS. 15A, 15B, 16A, and 16B are transistors having a top gate structure. That is, the LDD region may overlap the gate electrode or may not overlap the gate electrode, or the LDD region may partially overlap the gate electrode. Further, the gate electrode may have a tapered shape and the LDD region may be provided under the tapered portion of the gate electrode in a self-aligned manner. In addition, the number of gate electrodes is not limited to two, a multi-gate structure having three or more gate electrodes may be employed, or a single gate structure may be employed.

Figure 2:
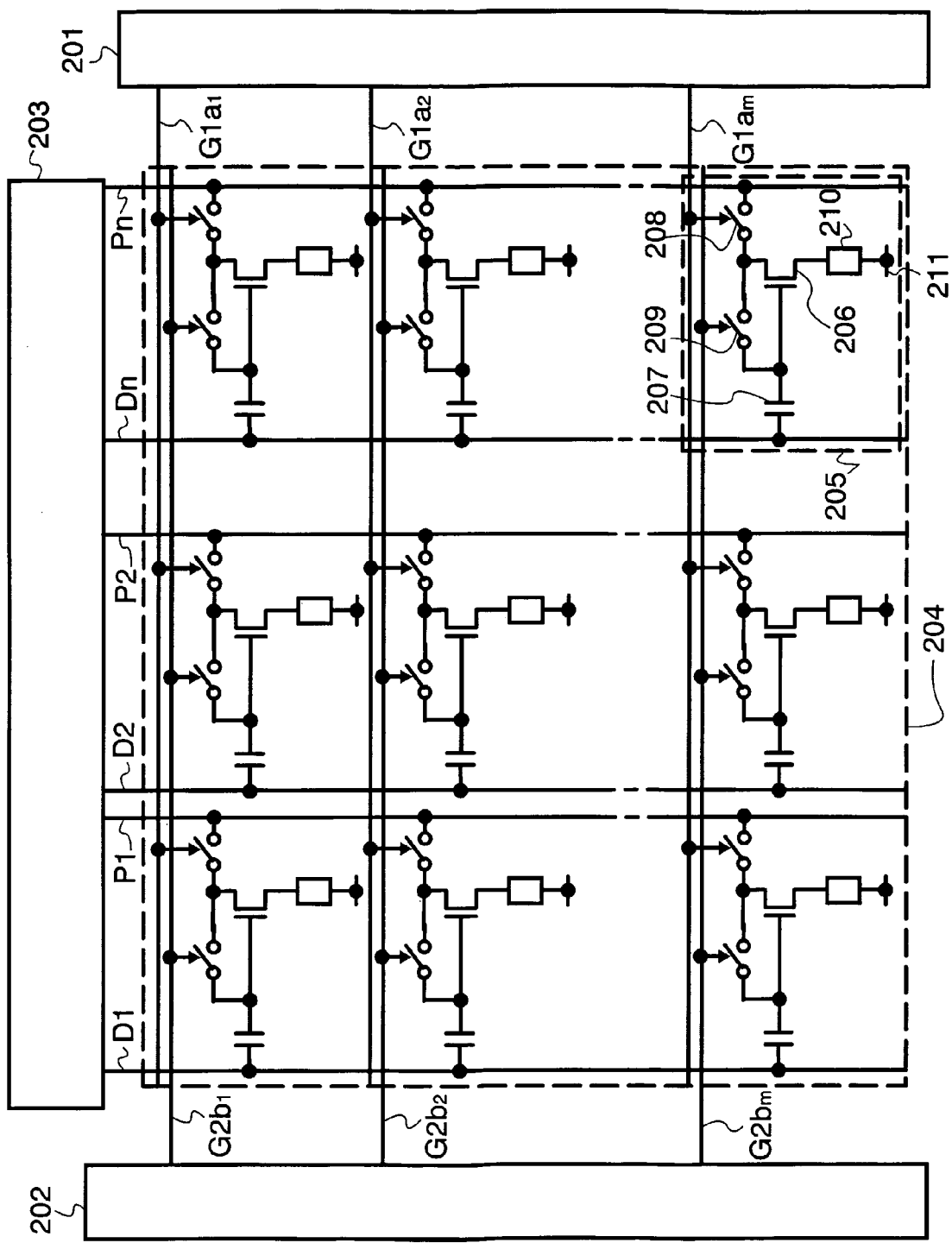
FIG. 2 is a diagram illustrating a display device having a pixel configuration of the invention.
Figure 3:
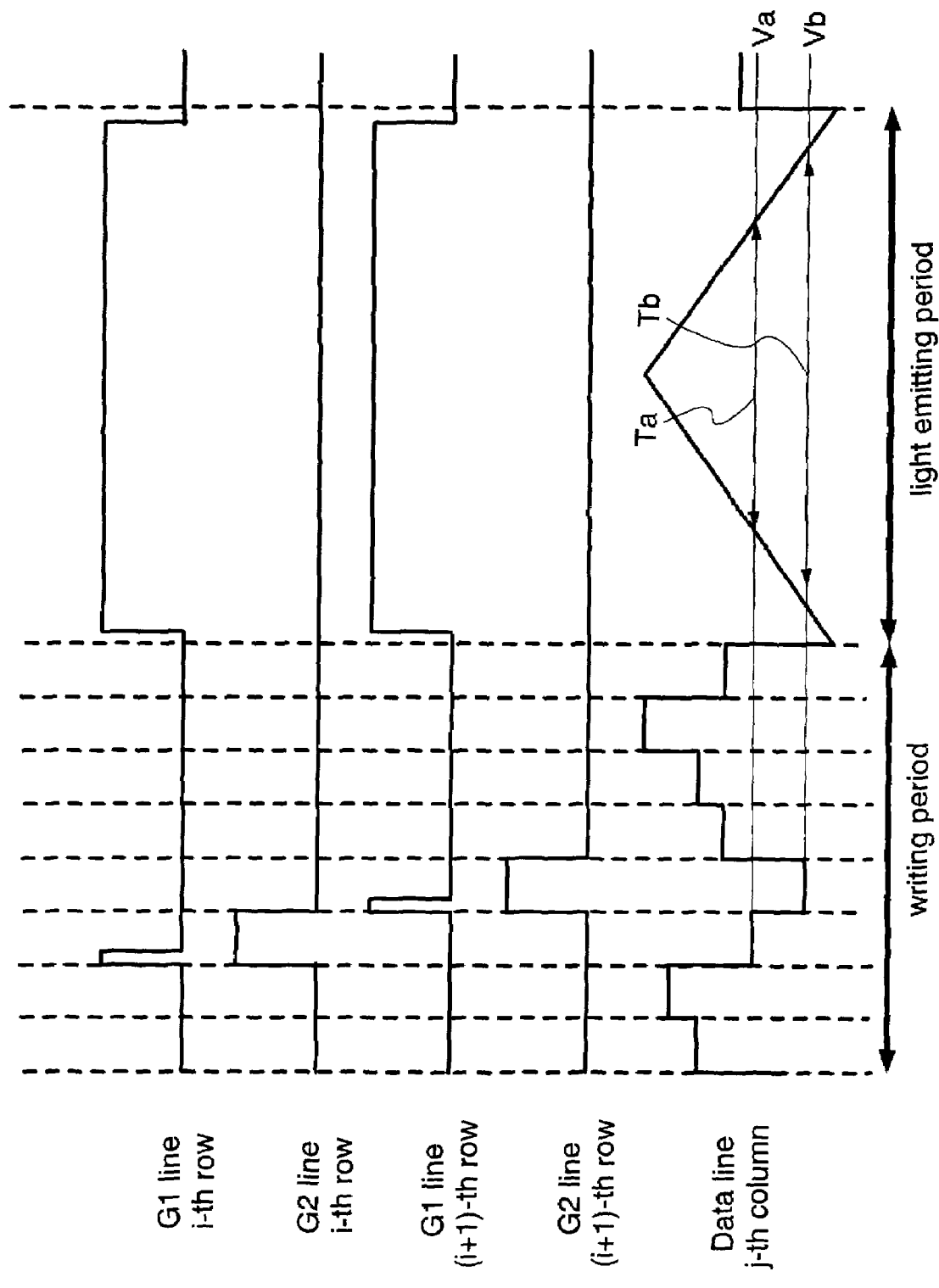
FIG. 3 is a diagram showing a timing chart of a display device having a pixel configuration of the invention.

By using a crystalline semiconductor film as a semiconductor layer (e.g., a channel forming region, a source region, and a drain region) of a transistor constituting the pixel of the invention, the first scan line driver circuit 210, the second scan line driver circuit 202, and the signal line driver circuit 203 can be easily formed over the same substrate as the pixel region 204 in FIG. 2, for example. Further, in the constitution shown in FIG. 8, the buffers 801, 802, and 803 can also be formed easily over the substrate. In addition, a part of the signal line driver circuit 203 shown in FIG. 8 may be formed over the same substrate as the pixel region 204, and the other part thereof may be formed on an IC chip to be mounted onto the substrate by COG or the like as is in the display panel shown in FIGS. 11A and 11B. In this manner, manufacturing cost can be reduced.

Figure 27A:
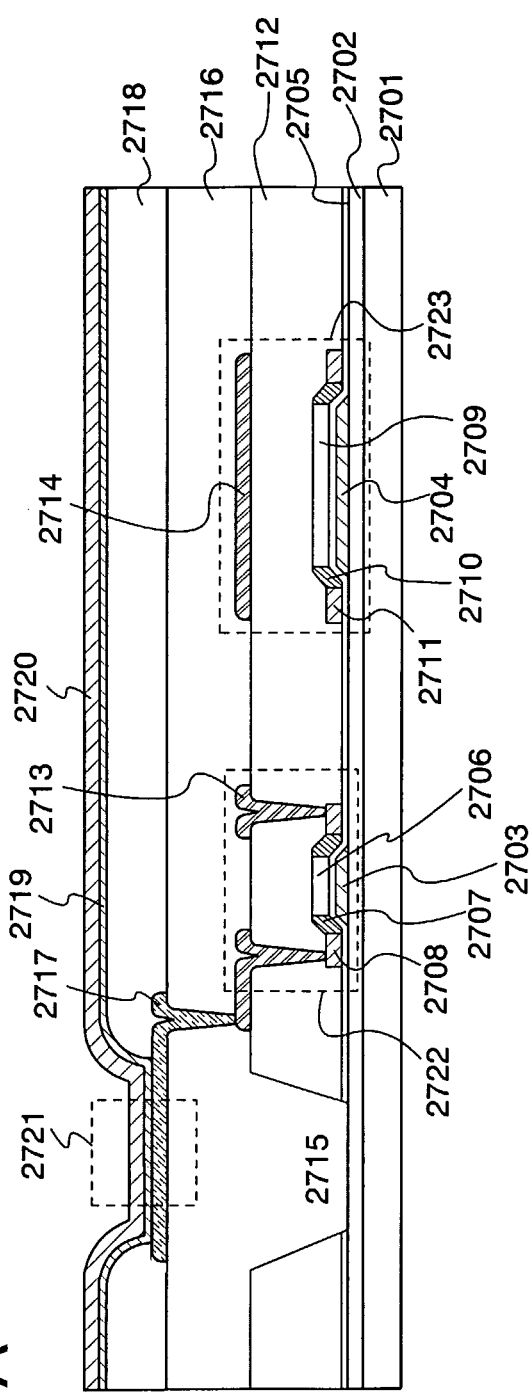
FIGS. 27A and 27B are partial cross sectional diagrams respectively of a display panel.
Figure 27B:
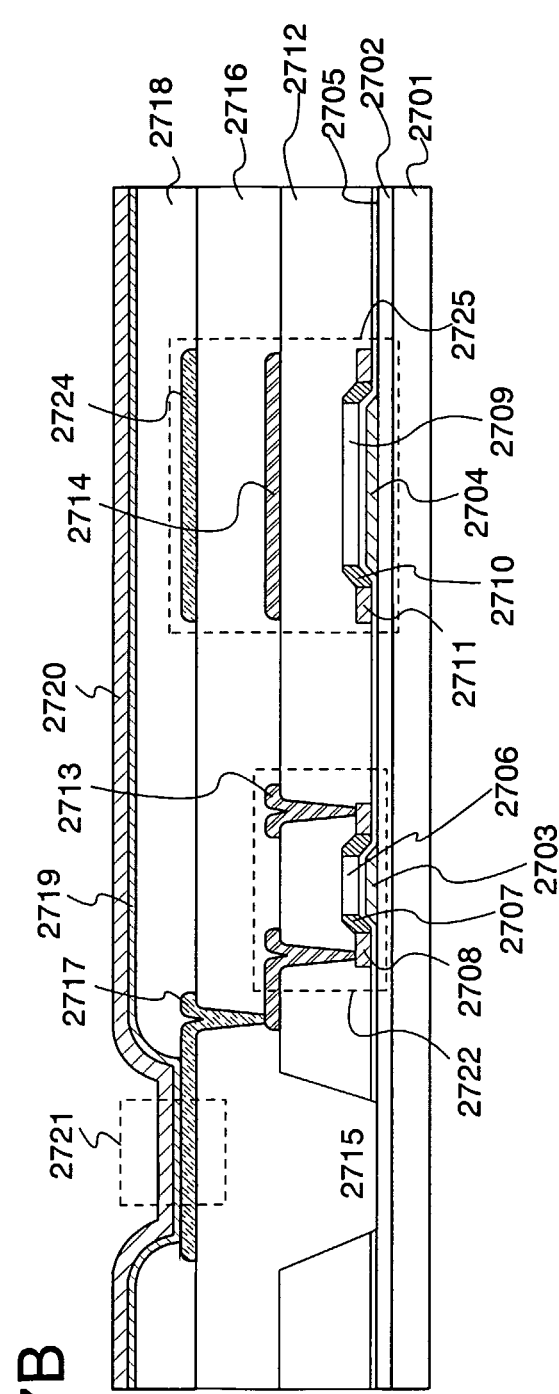

Next, in a structure of a transistor using a polysilicon (p-Si: H) film as its semiconductor layer, FIGS. 27A and 27B are partial cross sectional diagrams each of a display panel in which a transistor having a structure in which a gate electrode is sandwiched between a substrate and a semiconductor layer, namely a bottom gate structure in which a gate electrode is disposed under a semiconductor layer is applied.

A base film 2702 is formed on a substrate 2701. Then, a gate electrode 2703 is formed on the base film 2702. A first electrode 2704 is formed in the same layer formed of the same material as the gate electrode. As a material for the gate electrode 2703, phosphorus-added polycrystalline silicon can be used. Other than phosphorus-added polycrystalline silicon, silicide that is a compound of metal and silicon may be used as well.

Then, a gate insulating film 2705 is formed to cover the gate electrode 2703 and the first electrode 2704. The gate insulating film 2705 is formed using a silicon oxide film, a silicon nitride film, or the like.

On the gate insulating film 2705, a semiconductor layer is formed. The semiconductor layers include a channel forming region 2706, an LDD region 2707, and an impurity region 2708 which forms a source region or a drain region of a driving transistor 2722, and include a channel forming region 2709, an LDD region 2710, and an impurity region 2711 which form a second electrode of a capacitor 2723, respectively. It is to be noted that channel doping may be performed to the channel forming region 2706 and the channel forming region 2709.

As the substrate, a glass substrate, a quartz substrate, a ceramic substrate, or the like can be used. The base film 2702 can be formed using a single layer of aluminum nitride (AlN), silicon oxide ($SiO_2$), silicon oxynitride ($SiO_xN_y$), or the like, or a stacked layer thereof.

An first interlayer insulating film 2712 is formed to cover the semiconductor layer. A contact hole is opened in the first interlayer insulating film 2712, through which a wire 2713 contacts the impurity region 2708. A third electrode 2714 is formed in the same layer formed of the same material as the wire 2713. The capacitor 2723 is constituted by the first electrode 2704, the second electrode, and the third electrode 2714.

In addition, an opening 2715 is formed in the first interlayer insulating film 2712. A second interlayer insulating film 2716 is formed so as to cover the driving transistor 2722, the capacitor 2723, and the opening 2715. A pixel electrode 2717 is formed through a contact hole on the second interlayer insulating film 2716. Then, an insulator 2718 is formed so as to cover end portions of the pixel electrode 2717. For example, a positive photosensitive acrylic resin film can be used. Subsequently, a layer containing an organic compound 2719 and an opposing electrode 2720 are formed on the pixel electrode 2717, and a display element 2721 is formed in a region where the layer containing an organic compound 2719 is sandwiched between the pixel electrode 2717 and the opposing electrode 2720. The opening 2715 is disposed under the display element 2721; accordingly, in the case where light emission from the display element 2721 is taken out from the substrate side, the transmissivity can be improved due to the existence of the opening 2715.

Furthermore, a fourth electrode 2724 may be formed in the same layer formed of the same material as the pixel electrode 2717 in FIG. 27A, which is shown in FIG. 27B. In that case, a capacitor 2725 can be constituted by the first electrode 2704, the second electrode, the third electrode 2714, and the fourth electrode 2724.

Subsequently, the case where an amorphous silicon (a-Si:H) film is used as a semiconductor layer of a transistor is described. FIGS. 28A and 28B show transistors having a top gate structure while FIGS. 29A, 29B, 30A, and 30B show transistors having a bottom gate structure.

FIG. 28A is a cross sectional diagram of a transistor having a top gate structure having amorphous silicon as its semiconductor layer. As shown in FIG. 28A, a base film 2802 is formed on a substrate 2801. On the base film 2802, a pixel electrode 2803 is formed. In addition, a first electrode 2804 is formed in the same layer formed of the same material as the pixel electrode 2803.

As the substrate, a glass substrate, a quartz substrate, a ceramic substrate, or the like can be used. The base film 2802 can be formed using a single layer of aluminum nitride (AlN), silicon oxide ($SiO_2$), silicon oxynitride ($SiO_xN_y$), or the like, or a stacked layer thereof.

A wire 2805 and a wire 2806 are formed on the base film 2802, and an end portion of the pixel electrode 2803 is covered with the wire 2805. On the wire 2805 and the wire 2806, an n-type semiconductor layer 2807 and an n-type semiconductor layer 2808 having n-type conductivity are formed respectively. In addition, a semiconductor layer 2809 is formed between the wire 2805 and the wire 2806 on the base film 2802, which is partially extended to the n-type semiconductor layer 2807 and the n-type semiconductor layer 2808. It is to be noted that this semiconductor layer is formed using an amorphous semiconductor film such as amorphous silicon (a-Si:H) or a microcrystalline semiconductor (μ-Si:H). Then, a gate insulating film 2810 is formed on the semiconductor layer 2809, and an insulating film 2811 is formed in the same layer formed of the same material as the gate insulating film 2810, on the first electrode 2804. It is to be noted that a silicon oxide film, a silicon nitride film, or the like is used as the gate insulating film 2810.

On the gate insulating film 2810, a gate electrode 2812 is formed. In addition, a second electrode 2813 is formed in the same layer formed of the same material as the gate electrode, over the first electrode 2804 with the insulating film 2811 sandwiched therebetween. A capacitor 2819 is formed by sandwiching the insulating film 2811 between the first electrode 2804 and the second electrode 2813. An interlayer insulating film 2814 is formed to cover an end portion of the pixel electrode 2803, the driving transistor 2818, and the capacitor 2819.

On the interlayer insulating film 2814 and the pixel electrode 2803 corresponding to an opening of the interlayer insulating film 2814, a layer containing an organic compound 2815 and an opposing electrode 2816 are formed. A display element 2817 is formed in a region where the layer containing an organic compound 2815 is sandwiched between the pixel electrode 2803 and the opposing electrode 2816.

The first electrode 2804 in FIG. 28A may be a first electrode 2820 as shown in FIG. 28B. The first electrode 2820 is formed in the same layer formed of the same material as the wires 2805 and 2806.

FIGS. 29A and 29B are partial cross sectional diagrams of display panels provided with a transistor having a bottom gate structure having amorphous silicon as its semiconductor layer.

A base film 2902 is formed on a substrate 2901. On the base film 2902, a gate electrode 2903 is formed. In addition, a first electrode 2904 is formed in the same layer formed of the same material as the gate electrode. As a material for the gate electrode 2903, phosphorus-added polycrystalline silicon can be used. Other than polycrystalline silicon, silicide that is a compound of metal and silicon may be used as well.

Then, a gate insulating film 2905 is formed to cover the gate electrode 2903 and the first electrode 2904. The gate insulating film 2905 is formed using a silicon oxide film, a silicon nitride film, or the like.

A semiconductor layer 2906 is formed on the gate insulating film 2905. In addition, a semiconductor layer 2907 is formed in the same layer formed of the same material as the semiconductor layer 2906.

As the substrate, a glass substrate, a quartz substrate, a ceramic substrate, or the like can be used. The base film 2902 can be formed using a single layer of aluminum nitride (AlN), silicon oxide ($SiO_2$), silicon oxynitride ($SiO_xN_y$), or the like, or a stacked layer thereof.

N-type semiconductor layers 2908 and 2909 having n-type conductivity are formed on the semiconductor layer 2906 while an n-type semiconductor layer 2910 is formed on the semiconductor layer 2907.

Wires 2911 and 2912 are formed on the n-type semiconductor layers 2908 and 2909 respectively while a conductive layer 2913 is formed in the same layer formed of the same material as the wires 2911 and 2912, on the n-type semiconductor layer 2910.

The semiconductor layer 2907, the n-type semiconductor layer 2910, and the conductive layer 2913 constitute a second electrode. It is to be noted that a capacitor 2920 is formed by sandwiching the gate insulating film 2905 between the second electrode and the first electrode 2904.

One end portion of the wire 2911 is extended, and a pixel electrode 2914 is formed on the extended wire 2911.

An insulator 2915 is formed so as to cover end portions of the pixel electrode 2914, a driving transistor 2919, and the capacitor 2920.

Then, a layer containing an organic compound 2916 and an opposing electrode 2917 are formed on the pixel electrode 2914 and the insulator 2915. A display element 2918 is formed in a region where the layer containing an organic compound 2916 is sandwiched between the pixel electrode 2914 and the opposing electrode 2917.

The semiconductor layer 2907 and the n-type semiconductor layer 2910 which form a part of the second electrode of the capacitor may not be provided. That is, the second electrode may be constituted only by the conductive layer 2913, so that the capacitor may be formed by sandwiching the gate insulating film between the first electrode 2904 and the conductive layer 2913.

In addition, the pixel electrode 2914 may be formed prior to forming the wire 2911 in FIG. 29A, a capacitor 2922 can be formed by sandwiching the gate insulating film 2905 between a second electrode 2921 which is formed of the pixel electrode 2914 and the first electrode 2904 as shown in FIG. 29B.

It is to be noted that FIGS. 29A and 29B show inversely staggered, channel etch type transistors; however, a channel protective type transistor may be used. The case of a channel protective type transistor is described with reference to FIGS. 30A and 30B.

A channel protective type transistor shown in FIG. 30A is different from the driving transistor of the channel etch type 2919 shown in FIG. 29A in that an insulator 3001 which is an etching mask is provided on the channel forming region in the semiconductor layer 2906. The other portions identical to FIG. 29A are denoted by the same reference numerals.

Similarly, a channel protective type transistor shown in FIG. 30B is different from the driving transistor of the channel etch type 2919 shown in FIG. 29B in that the insulator 3001 which is an etching mask is provided on the channel forming region in the semiconductor layer 2906. The other portions identical to FIG. 29B are denoted by the same reference numerals.

By using an amorphous semiconductor film as a semiconductor layer (e.g., a channel forming region, a source region, and a drain region) of a transistor constituting the pixel of the invention, manufacturing cost can be reduced. For example, by employing the pixel configuration shown in FIG. 6 or 7, the amorphous semiconductor film can be used.

It is to be noted that a structure of a transistor and a structure of a capacitor applicable in the pixel configuration of the invention are not limited to the above-described structures, and various structures can be used.

Embodiment Mode 14

In this embodiment mode, constitution in which a plurality of signal lines each for writing a video signal into pixels arranged in column are provided for one pixel column is described. It is to be noted that the pixels arranged in column are not required to be arranged linearly, and they may have delta arrangement. In addition, in the case of the delta arrangement, the signal lines may be arranged in column in zigzag.

Figure 60:
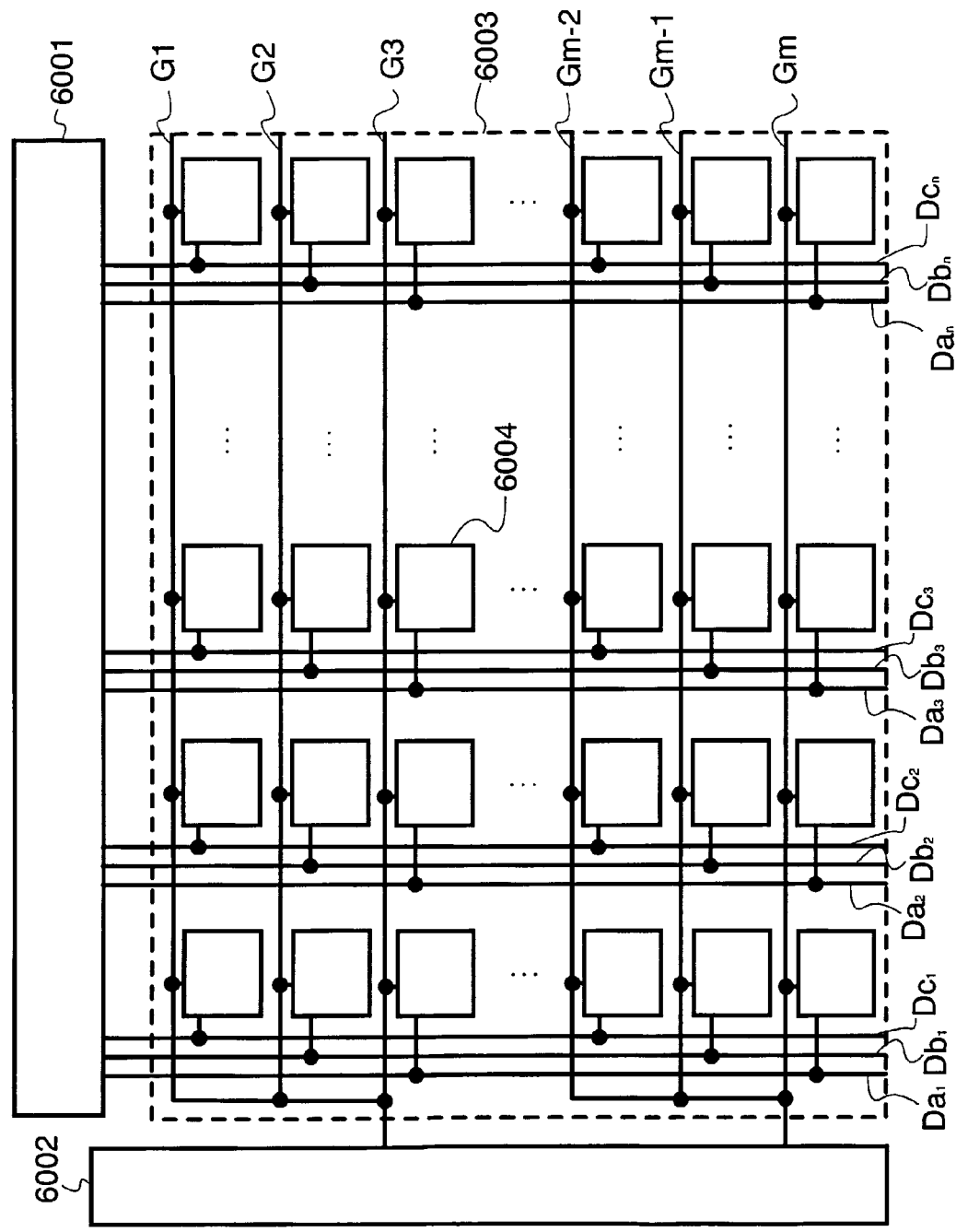
FIG. 60 shows an example of constitution of a display device capable of writing a signal simultaneously into pixels of a plurality of rows.

A display device shown in FIG. 60 includes a signal line driver circuit 6001, a scan line driver circuit 6002, and a pixel region 6003. Pixels 6004 are arranged in matrix in the pixel region 6003. The signal line driver circuit 6001 outputs video signals to signal lines of $Da_1$, $Db_1$, and $Dc_1$ to $Da_n$, $Db_n$, and $Dc_n$, and the scan line driver circuit 6002 outputs signals for selecting a row of pixels 6004 to scan lines G1 to Gm. Into the pixel row selected by the signal outputted from the scan line driver circuit 6002, the video signal from the signal line driver circuit 6001 is written.

In the display device shown in FIG. 60, video signals are outputted from the signal line driver circuit 6001 into three signal lines $Da_1$, $Db_1$, and $Dc_1$ for pixels of the first column. Video signals are outputted into signal lines $Da_2$, $Db_2$, and $Dc_2$ for pixels of the second column and into signal lines $Da_n$, $Db_n$, and $Dc_n$ for pixels of the n-th column respectively.

Furthermore, the number of rows of pixels selected at the same time by a signal outputted from the scan line driver circuit 6002 is equal to the number of signal lines for writing signals into pixels of one column. That is, in the display device shown in FIG. 60, pixels of three rows are selected at the same time, into which video signals are inputted from three signal lines each corresponding to each column. Accordingly, signals are written into pixels for three rows at the same time.

Comparing to the case where signal writing is performed into pixels per row, the case where signals are written into pixels of three rows at the same time can, therefore, make a signal writing speed for one pixel three times if the writing period of one frame period is the same. Therefore, according to the constitution shown in FIG. 60, it is not necessary to write signals into pixels at high speed. In addition, if a writing period of one pixel is the same, a writing period of one frame period becomes one third. Consequently, a light emitting period of a pixel can be made long, so that the moment luminance of the display element can be reduced and reliability of the display element can be improved.

Embodiment Mode 15

The invention can be applied in various electronic apparatuses, specifically a display portion of electronic apparatuses. The electronic apparatuses include a video camera, a digital camera, a goggle-type display, a navigation system, a sound reproduction apparatus (e.g., a car audio system and an audio component system), a computer, a game machine, a portable information terminal (e.g., a mobile computer, a mobile phone, a portable game machine, and an electronic book), an image reproduction apparatus provided with a recording medium (specifically, an apparatus which can reproduce a recording medium such as a digital versatile disc (DVD), and comprises a display for displaying it) and the like.

Figure 17A:
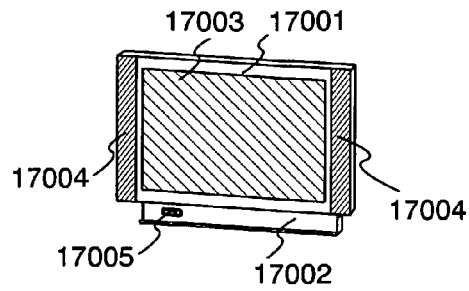
FIGS. 17A to 17H are views each illustrating an example of an electronic apparatus in which a display device having a pixel configuration of the invention can be applied in its display portion.

FIG. 17A shows a display which includes a housing 17001, a supporting base 17002, a display portion 17003, a speaker portion 17004, a video input terminal 17005, and the like. A display device having the pixel configuration of the invention can be used in the display portion 17003. It is to be noted that the display means all display devices for displaying information, including ones for personal computers, for TV broadcasting reception, and for advertisement.

In recent years, the need to increase the size of a display has been increased. In accordance with the enlargement of a display, there has occurred a problem of a price advance. Therefore, it is an object that the manufacturing cost is reduced and a high quality product is provided at low price.

For example, by applying the pixel configuration of the invention in the pixel region of the display panel, the display panel can be constituted by transistors having the same conductivity type. Consequently, the number of steps can be reduced and the manufacturing cost can be reduced.

In addition, by forming the pixel region and the peripheral driver circuit over the same substrate as shown in FIG. 11A, the display panel can be constituted by circuits including transistors having the same conductivity type. By applying this display panel in the display portion of a large display, manufacturing cost of the display can be reduced.

In addition, by using an amorphous semiconductor (e.g., amorphous silicon (a-Si:H)) as a semiconductor layer of a transistor in a circuit constituting the pixel region, manufacturing process can be simplified and further cost reduction can be realized. In that case, it is preferable that a driver circuit in the periphery of the pixel region be formed on an IC chip and mounted onto the display panel by COG or the like. In this manner, the size of the display can be easily increased by using an amorphous semiconductor.

Figure 17B:
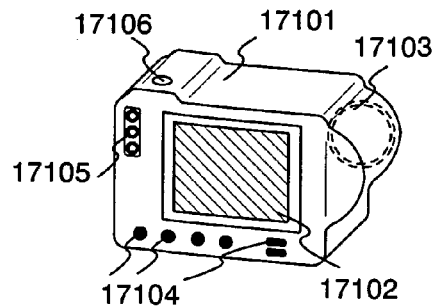

FIG. 17B shows a camera which includes a main body 17101, a display portion 17102, an image receiving portion 17103, operating keys 17104, an external connection port 17105, a shutter 17106, and the like.

In recent years, in accordance with functional advance of a digital camera and the like, competitive manufacturing thereof has been heated. Thus, it is a problem that a high functional product is provided at low price.

By applying the pixel configuration of the invention in the pixel region, the pixel region can be constituted by transistors having the same conductivity type. In addition, as shown in FIG. 53A, by forming a signal line driver circuit whose operating speed is high on an IC chip, and forming a scan line driver circuit whose operating speed is relatively low constituted by transistors having the same conductivity type over the same substrate as the pixel region, high function can be realized and cost reduction can be achieved. In addition, by using an amorphous semiconductor such as amorphous silicon for a semiconductor layer of a transistor in the pixel region and the scan line driver circuit formed over the same substrate as the pixel region, further cost reduction can be achieved.

Figure 17C:
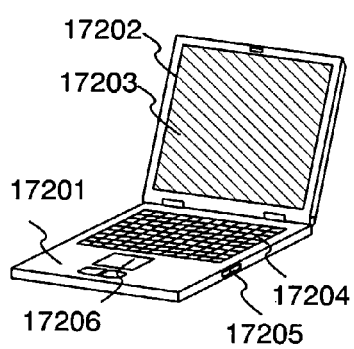

FIG. 17C shows a computer which includes a main body 17201, a housing 17202, a display portion 17203, a keyboard 17204, an external connection port 17205, a pointing mouse 17206, and the like. Opening ratio of a pixel is increased in the computer applying the invention in the display portion 17203 and high definition display can be performed. In addition, cost reduction can be achieved.

Figure 17D:
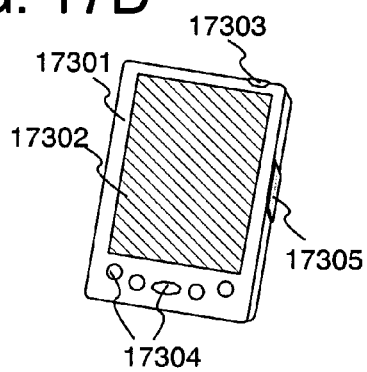

FIG. 17D shows a mobile computer which includes a main body 17301, a display portion 17302, a switch 17303, operating keys 17304, an infrared port 17305, and the like. Opening ratio of a pixel is increased in the mobile computer applying the invention in the display portion 17302 and high definition display can be performed. In addition, cost reduction can be achieved.

Figure 17E:
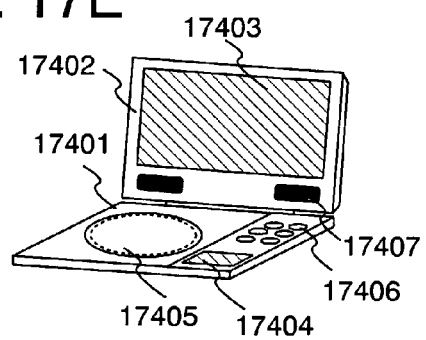

FIG. 17E shows a portable image reproducing device provided with a recording medium (specifically, a DVD player), which includes a main body 17401, a housing 17402, a display portion A 17403, a display portion B 17404, a recording medium (DVD or the like) reading portion 17405, operating keys 17406, a speaker portion 17407, and the like. The display portion A 17403 mainly displays image information and the display portion B 17404 mainly displays text information. Opening ratio of a pixel is increased in the image reproducing device applying the invention in the display portion A 17403 and the display portion B 17404, and high definition display can be performed. In addition, cost reduction can be achieved.

Figure 17F:
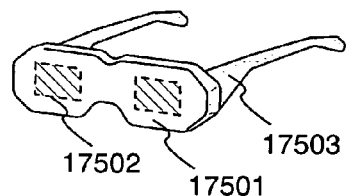

FIG. 17F shows a goggle-type display which includes a main body 17501, a display portion 17502, and an arm portion 17503. Opening ratio of a pixel is increased in the goggle-type display applying the invention in the display portion 17502, and high definition display can be performed. In addition, cost reduction can be achieved.

Figure 17G:
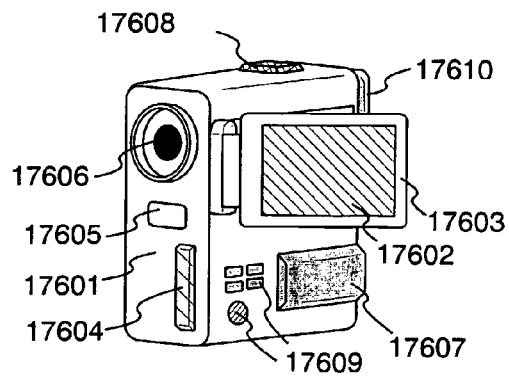

FIG. 17G shows a video camera which includes a main body 17601, a display portion 17602, a housing 17603, an external connection port 17604, a remote control receiving portion 17605, an image receiving portion 17606, a battery 17607, an audio input portion 17608, operating keys 17609, and the like. Opening ratio of a pixel is increased in the video camera applying the invention in the display portion 17602, and high definition display can be performed. In addition, cost reduction can be achieved.

Figure 17H:
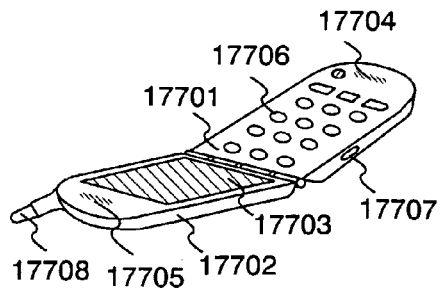

FIG. 17H shows a mobile phone which includes a main body 17701, a housing 17702, a display portion 17703, an audio input portion 17704, an audio output portion 17705, operating keys 17706, an external connection port 17707, an antenna 17708, and the like.

In recent years, a mobile phone is provided with a game function, a camera function, an electronic money function, or the like, and the need of a high-value added mobile phone has been increased. Further, a high definition display has been demanded.

For example, by applying the pixel configuration of the invention in the pixel region, opening ratio of a pixel can be improved. In specific, by using an n-type transistor as a driving transistor for driving a display element, opening ratio of the pixel is increased. Consequently, a mobile phone having a high definition display portion can be provided.

In addition, since the opening ratio is improved, a high-value added mobile phone having a high definition display portion can be provided by applying the display device having a dual emission structure as shown in FIG. 13C in the display portion.

While a mobile phone has been multifunctional and frequency of use thereof has been increased, the life per charge has been required to be long.

For example, by forming a peripheral driver circuit on an IC chip as shown in FIG. 53B and using a CMOS or the like, power consumption can be reduced.

As set forth above, the invention can be applied in various electronic apparatuses.

Embodiment 1

Figure 51:
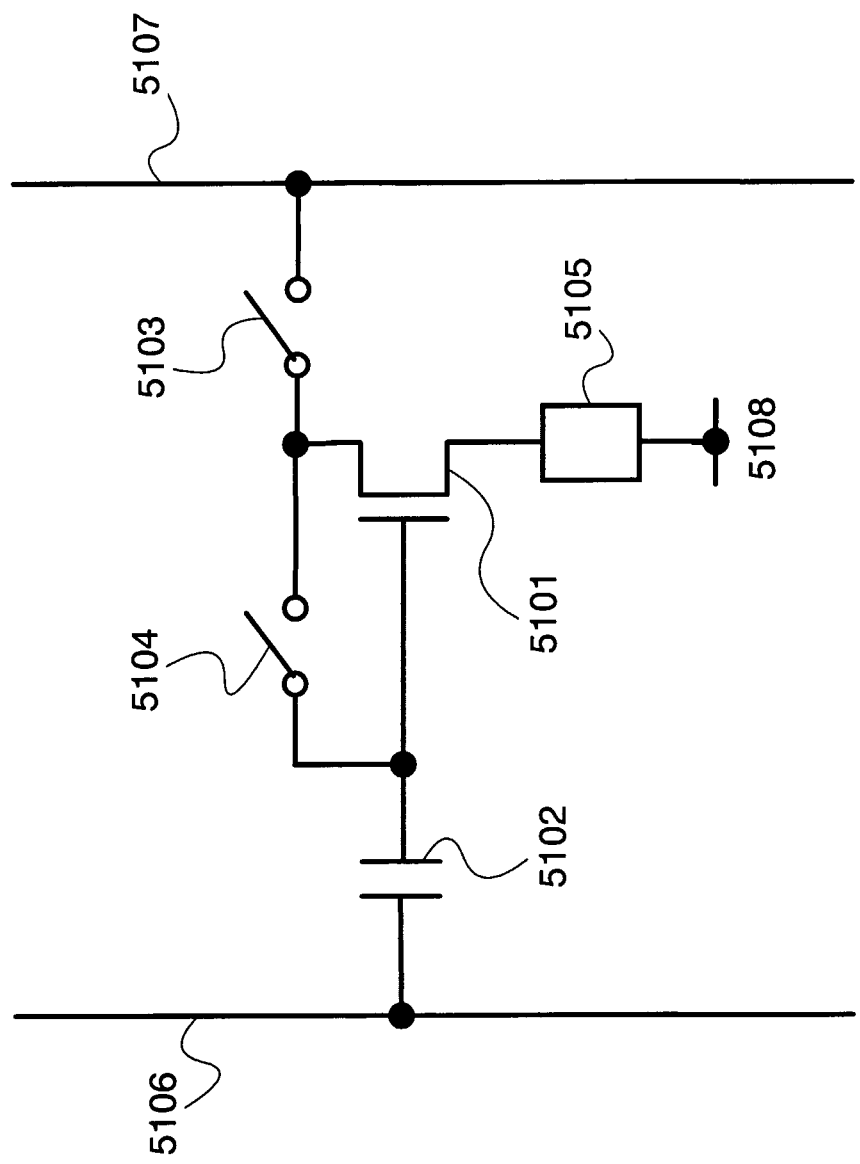
FIG. 51 is a diagram illustrating a pixel configuration of the invention.

In this embodiment, a driving method is described further in detail. FIG. 51 shows a pixel configuration of the invention. A pixel comprises a driving transistor 5101, a capacitor 5102, a first switch 5103, a second switch 5104, a display element 5105, a signal line (Data line) 5106, and a power supply line (Supply line) 5107. It is to be noted that the driving transistor 5101 is an n-type transistor.

A source terminal of the driving transistor 5101 is connected to an anode of the display element 5105, a gate terminal thereof is connected to the signal line 5106 via the capacitor 5102, and a drain terminal thereof is connected to the power supply line 5107 via the first switch 5103. The gate terminal and the drain terminal of the driving transistor 5101 are connected to each other via the second switch 5104. Therefore, when the second switch 5104 is on, the portion between the gate terminal and the drain terminal of the driving transistor 5101 becomes conductive. Then, when the second switch 5104 is turned off, the portion between the gate terminal and the drain terminal of the driving transistor 5101 becomes non-conductive, and a potential difference (a voltage) between a potential of the gate terminal (or the drain terminal) of the driving transistor 5101 and a potential of the signal line 5106 at this moment can be held in the capacitor 5102. Furthermore, a cathode of the display element 5105 is connected to a wire 5108 to which a potential Vss is supplied.

Operation in the pixel configuration shown in FIG. 51 is described with reference to FIGS. 52A to 52F, and FIG. 50. In this embodiment, a power supply potential Vdd is 8 V. An analog signal potential $V_{sig}$ is supplied to the signal line 5106 so as to express eight gradations at the pixel.

Figure 50:
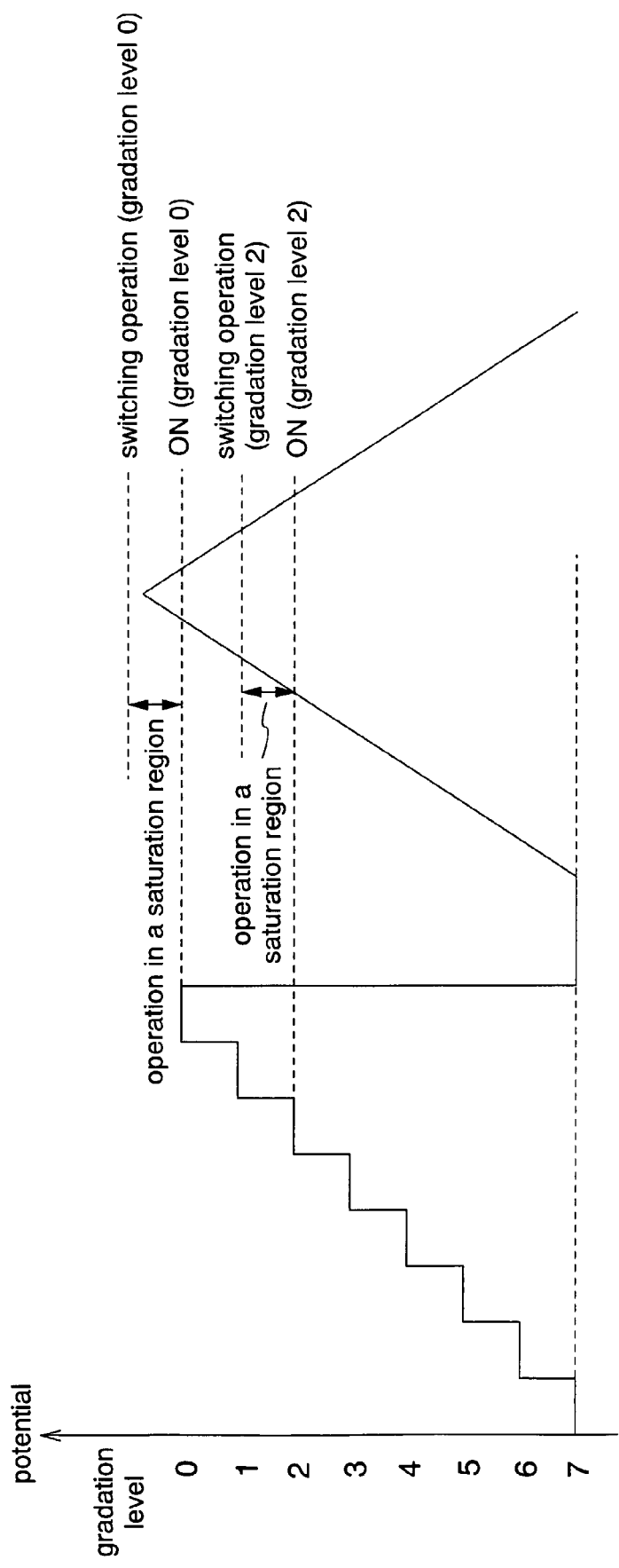
FIG. 50 is a diagram illustrating a triangular wave potential.

FIG. 50 is a diagram showing an analog signal potential $V_{sig}$ supplied to the signal line 5106 in a writing period of pixels and a light emitting period. The value is 7 V in the case of a gradation level of 1, 6 V in the case of a gradation level of 2, 5 V in the case of a gradation level of 3, 4 V in the case of a gradations level of 4, 3 V in the case of a gradation level of 5, 2 V in the case of a gradation level of 6, 1 V in the case of a gradations level of 7, and 0 V in the case of a gradation level of 8 here.

The case where a signal for expressing a gradation level of 2 ($V_{sig}$=6 V) is written into the pixel through the signal line 5106 is described. It is to be noted that a voltage value, a potential, and the gradation level is described in this embodiment are specific examples, and the invention is not limited thereto.

First, the first switch 5103 and the second switch 5104 are turned on. Current flows into the capacitor 5102, the driving transistor 5101, and the display element 5105 as shown by an arrow in FIG. 52A.

After a while, a potential of one electrode of the capacitor 5102 connected to the gate terminal of the driving transistor 5101 becomes 8 V and the other electrode of the capacitor 5102 connected to the signal line 5106 becomes 6 V, so that a charge corresponding to a potential difference of 2 V is accumulated in the capacitor 5102. Then, current stops flowing into the capacitor 5102. Accordingly, a current value flowing through the driving transistor 5101 and the display element 5105 is stabilized as shown in FIG. 52B. That is the steady state is reached.

Reaching the steady state, the first switch 5103 is turned off while the second switch 5104 is on. As a result of this, the charge stored in the capacitor 5102 in FIG. 52B is discharged so that current can flow through the driving transistor 5101 and the display element 5105 as shown in FIG. 52C. It is to be noted that although the first switch 5103 is turned off after the steady state is obtained, the first switch may be turned off before the steady state is obtained if the driving transistor 5101 has a potential of the gate terminal to turn on.

Then, the driving transistor 5101 is turned off when a potential of the gate terminal thereof becomes Va and a potential of the source terminal thereof becomes Vb. At that time, the capacitor stores a charge corresponding to a potential difference between a potential of 6 V of the signal line 5106 and the potential Va of the gate terminal of the driving transistor 5101. Reaching this state, as shown in FIG. 52D, the second switch 5104 is turned off while the first switch 5103 is off. That is, when current stops flowing through the driving transistor 5101 and the display element 5105, the second switch 5104 is turned off. It is to be noted that the driving transistor 5101 is turned off before the source terminal thereof becomes 0 V because the display element 5105 has a threshold value.

In this manner, writing into the pixel is completed. Similarly, writing into the other pixels of the row is completed at the same time. Analog signal potentials for expressing respective gradation levels are supplied to the signal line 5106 for each pixel column to perform the writing. When the writing is finished into all rows in this manner, a writing period is completed.

Described subsequently is operation in a light emitting period of the pixel. In the light emitting period of the pixel, the first switch 5103 is turned on while the second switch 5104 is off as shown in FIG. 52E. Then, a triangular wave potential as shown in a light emitting period in FIG. 50 is supplied to the signal line 5106. Consequently, the driving transistor 5101 keeps off until the potential of the signal line 5106 becomes 6 V as shown in FIG. 52E, and current does not flow.

When the potential of the signal line 5106 becomes higher than 6 V, the driving transistor 5101 is turned on, so that current flows from the power supply line 5107 through the driving transistor 5101 and the display element 5105 as shown in FIG. 52F.

It is to be noted that, generally, an operation region of a transistor (an NMOS transistor is used here for simplicity) can be divided into a linear region and a saturation region. Where a drain-source voltage of a transistor is Vds, a gate-source voltage thereof is Vgs, and a threshold voltage thereof is Vth, the transistor operates in a saturation region when Vds>(Vgs−Vth) and the current value is, ideally, not so much affected by change of Vds. That is the current value is determined only by Vgs. Meanwhile, the transistor operates in a linear region when Vds<(Vgs−Vth) and the current value is determined by Vds and Vgs. That is, when Vds=Vgs−Vth is a boundary between the operation in the saturation region and the operation in the linear region. Therefore, by the drain-source voltage (Vds), the gate-source voltage (Vgs), and the threshold voltage (Vth) of the driving transistor 5101, the operation region of the driving transistor 5101 is determined.

In the light emitting period, when a potential supplied to the signal line 5106 is $V_{sig}$+a, the potential of the gate terminal of the driving transistor 5101 becomes Va+a. In addition, Va+a<Vdd when a is small. It is therefore found that Vds>(Vgs−Vth) is satisfied by the formulas Vds=Vdd−Vb, and Vgs−Vth=Va+a−Vb−Vth. That is, the driving transistor 5101 operates in the saturation region when a is small.

Therefore, in a light emitting period, a triangular wave potential is supplied to the signal line 5106, and the driving transistor 5106 operating in the saturation region just after it is turned on does not sufficiently function as a switch. That is, depending on the potential change of the gate terminal of the driving transistor 5101, the potential of the source terminal thereof is largely changed. Therefore, a voltage applied to the display element 5105 is changed and the amount of current flowing thereto is changed when the driving transistor 5101 operates in the saturation region. Accordingly, it is difficult to perform an analog time gradation method of expressing gradations by changing a light emitting period within one frame.

It is to be noted that the gate-source voltage Vgs=Va−Vb of the driving transistor 5101 in the case of FIG. 52D is an offset voltage (Voff) of a source follower circuit. This offset voltage (Voff) is expressed by the threshold voltage Vth and a function of W/L which is a ratio of channel width to channel length of the driving transistor 5101, or the like. Generally, the offset voltage (Voff) of a source follower circuit can be expressed by the following formula (1).

$$Voff = Vth + \sqrt{(Iref/k)} \tag{1}$$

In the formula (1), k=0.5×μ×Cox×(W/L). Here, μ is the mobility and Cox is the capacitance of the gate insulating film. Iref is the amount of current flowing into the driving transistor 5101.

It is to be noted that μ, Cox, and Vth can be determined in the manufacturing process and W/L can be controlled in designing.

In addition, it is to be noted that Iref changes depending on a voltage-current characteristic of the display element, a voltage-current characteristic (in particular, whether the saturation region operation or the linear region operation) of the Driving transistor 5101, or the like.

Accordingly, the above-described values are determined by the manufacturing process and the design so that a light emitting period of the display element 5105 is short and the luminance thereof is low when the driving transistor 5101 operates in the saturation region.

In addition, the light emitting period is set by light emission of the display element 5105 when the driving transistor 5101 operates in the linear region. Therefore, the amplitude of a triangular wave potential supplied in a light emitting period is set to be larger than the amplitude of an analog signal potential supplied in a writing period. That is, the amplitude of a triangular wave potential in a light emitting period is set to be a range of a potential lower than an analog signal potential for the highest gradation level in a writing period to a potential higher than an analog signal potential for the lowest gradation level in the writing period. More preferably, it is set such that the lower limit of the amplitude is equal to an analog signal potential for the highest gradation level while the uppermost limit thereof is between an analog signal potential for the lowest gradation level and a potential for operating the pixel for the lowest gradation level in a linearly region.

Figure 55:
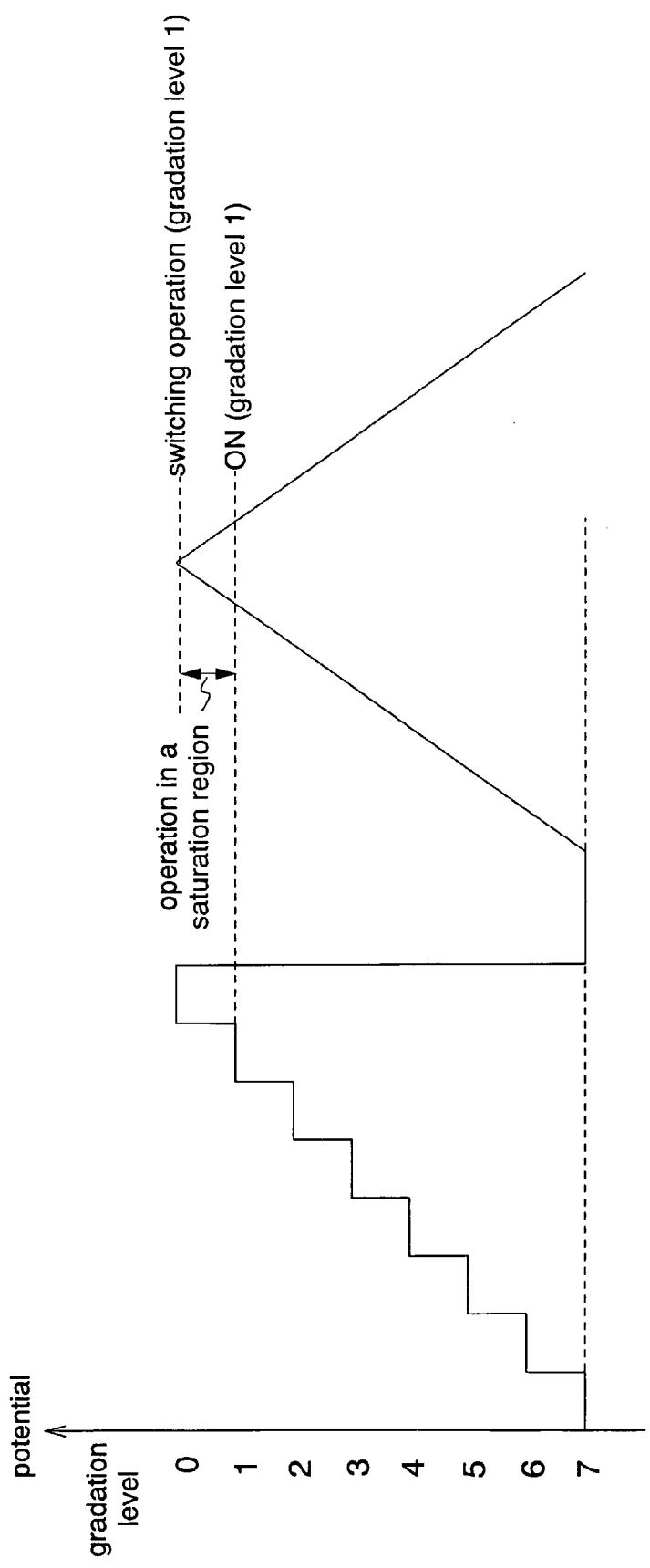
FIG. 55 is a diagram illustrating a triangular wave potential.

For example, if the uppermost limit of a triangular wave potential is equal to an analog signal potential for a gradation level of 0 as shown in FIG. 55, a period of operation (switching operation) of a driving transistor in a pixel for a gradation level of 1, in a linearly region becomes short, so that gradation between the pixel for a gradation level of 1 and a pixel for a gradation level of 0 cannot be expressed. It is thus found that the uppermost limit of the triangular wave potential is preferably set to be higher than the analog signal potential for a gradation level of 0 as shown in FIG. 50. However, if the uppermost limit of the triangular wave potential is set to be too high, a driving transistor of the pixel for a gradation level of 0 also performs switching operation so that a pixel which emits no light cannot be obtained. Accordingly, it is preferable that the uppermost limit of the triangular wave potential be a potential as high as possible not to operate the driving transistor of the pixel for a gradation level of 0 as a switch.

More preferably, the analog signal potential for a gradation level of 0 is preferably set to be a little higher. That is, the width of the analog signal potential between a gradation level of 0 to a gradation level of 1 is preferably larger than that between a gradation level of 1 to a gradation level of 2. Consequently, non-light emission can be realized when the gradation level is 0 and an operating period in a linearly region can be obtained when the gradation level is 1. In that case, it is to be noted that the uppermost limit of the triangular wave potential is preferably equal to the analog signal potential for a gradation level of 0.

Meanwhile, the lower limit of the triangular wave potential may be equal to an analog signal potential for a gradation level of 7 since a pixel for a gradation level of 7 does not emit light. It is needless to say that the lower limit of the triangular wave potential may be lower than the potential; however, the analog signal potential for a gradation level of 7 is suitable in that power consumption can be reduced as the amplitude of the triangular wave potential is smaller.

Embodiment 2

Figure 54:
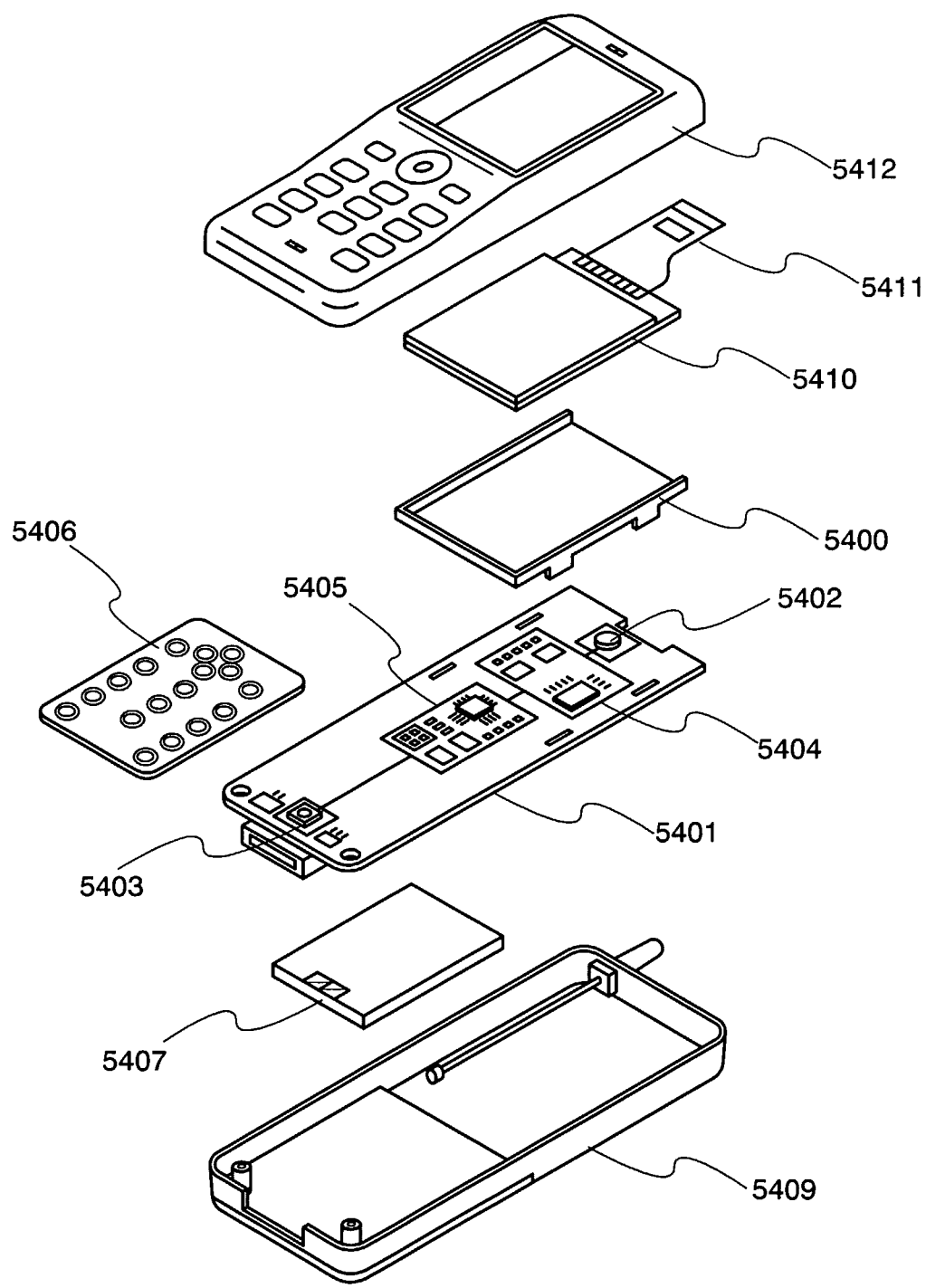
FIG. 54 illustrates an example of a mobile phone to which the invention can be applied.

In this embodiment, described is an example of a structure of a mobile phone which has a display portion employing a display device using the pixel configuration of the invention with reference to FIG. 54.

A display panel 5410 is incorporated in a housing 5400 so as to be detachable. The form and size of the housing 5400 can be changed in accordance with the size of the display panel 5410. The housing 5400 provided with the display panel 5410 is fitted in a printed circuit board 5401 to constitute a module.

The display panel 5410 is connected to the printed circuit board 5401 via an FPC 5411. On the printed circuit board 5401, a speaker 5402, a microphone 5403, a transmitting and receiving circuit 5404, and a signal processing circuit 5405 including a CPU, a controller, and the like are formed. Such module, an inputting means 5406, and a buttery 5407 are combined, which is stored in a case 5409. A pixel region of the display panel 5410 is disposed so as to be seen from a window formed in a case 5412.

The display panel 5410 may be formed by that a pixel region and a part of peripheral driver circuits (a driver circuit of which operation frequency is low among a plurality of driver circuits) are formed using TFTs over the same substrate, a part of the peripheral driver circuits (a driver circuit of which operation frequency is high among the plurality of driver circuits) is formed on an IC chip, and the IC chip is mounted onto the display panel 5410 by COG (Chip On Glass). The IC chip may be, alternatively, connected to a glass substrate by using TAB (Tape Automated Bonding) or a printed circuit board. It is to be noted that FIG. 53A shows an example of constitution of such a display panel that a part of peripheral driver circuits is formed over the same substrate as a pixel region and an IC chip provided with the other part of the peripheral driver circuits is mounted by COG or the like. By employing the above-described constitution, power consumption of a display device can be reduced and the life per charge of a mobile phone can be long. In addition, cost reduction of the mobile phone can be achieved.

In the pixel region, the configurations described in Embodiment Modes 1 to 7 can be arbitrarily applied.

For example, by applying the pixel configuration described in Embodiment Mode 3, the manufacturing process can be reduced by constituting the pixel region and the peripheral driver circuit formed over the same substrate as the pixel region by transistors having the same conductivity type in order to achieve cost reduction.

Alternatively, by applying the pixel configuration described in Embodiment Mode 2, the light emitting time can be made long, so that the moment luminance of the display element can be reduced and reliability of the display element can be improved.

Alternatively, by applying the pixel configuration described in Embodiment Mode 4, the signal amplitude can be reduced and power consumption can be reduced.

Alternatively, by applying the pixel configuration described in Embodiment Mode 5, wasteful current consumption can be prevented in the writing period and power consumption can be reduced.

In addition, by converting the impedance of a signal supplied to a scan line or a signal line by using a buffer to improve the current supply capability, signal delay is prevented and a writing period of pixels of one row can be shortened. Accordingly, a high definition display device can be provided.

In addition, in order to further reduce the power consumption, the pixel region may be formed using TFTs over a substrate, all of the peripheral driver circuits may be formed on an IC chip, and the IC chip may be mounted onto the display panel by COG (Chip On Glass) or the like.

It is to be noted that the constitution described in this embodiment is an example of a mobile phone, and the pixel configuration of the invention can be applied not only in a mobile phone having the above-described constitution but also to mobile phones having various constitution.

Embodiment 3

Figure 57:
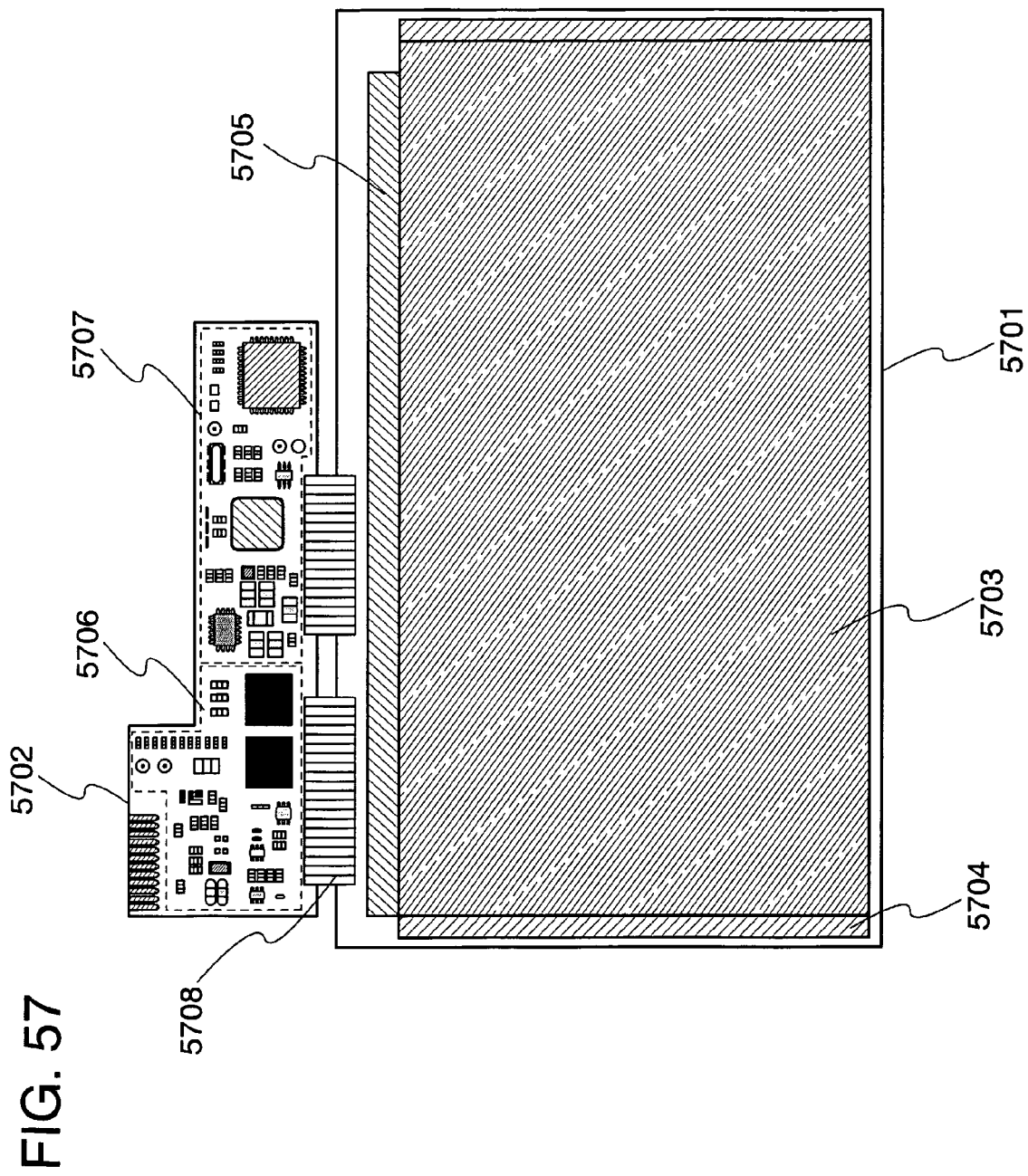
FIG. 57 shows an example of an EL module.

FIG. 57 shows an EL module combining a display panel 5701 and a circuit board 5702. The display panel 5701 includes a pixel region 5703, a scan line driver circuit 5704, and a signal line driver circuit 5705. Over the circuit board 5,702, a control circuit 5706, a signal dividing circuit 5707, and the like are formed. The display panel 5701 and the circuit board 5702 are connected to each other by a connecting wire 5708. As the connecting wire, an FPC or the like can be used.

The display panel 5701 may be formed by that a pixel region and a part of peripheral driver circuits (a driver circuit of which operation frequency is low among a plurality of driver circuits) are formed using TFTs over the same substrate, a part of the peripheral driver circuits (a driver circuit of which operation frequency is high among the plurality of driver circuits) is formed on an IC chip, and the IC chip is mounted onto the display panel 5701 by COG (Chip On Glass) or the like. The IC chip may be, alternatively, mounted onto the display panel 5701 by using TAB (Tape Automated Bonding) or a printed circuit board. It is to be noted that FIG. 53A shows an example of constitution of such a display panel that a part of peripheral driver circuits is formed over the same substrate as a pixel region and an IC chip provided with the other part of the peripheral driver circuits is mounted by COG or the like. By employing the above-described constitution, power consumption of a display device can be reduced and the life per charge of a mobile phone can be long. In addition, cost reduction of the mobile phone can be achieved.

In the pixel region, the configurations described in Embodiment Modes 1 to 5 can be arbitrarily applied.

For example, by applying the pixel configuration described in Embodiment Mode 3, the manufacturing process can be reduced by constituting the pixel region and the peripheral driver circuit formed over the same substrate as the pixel region by transistors having the same conductivity type in order to achieve cost reduction.

Alternatively, by applying the pixel configuration described in Embodiment Mode 2, the light emitting time can be made long, so that the moment luminance of the display element can be reduced and reliability of the display element can be improved.

Alternatively, by applying the pixel configuration described in Embodiment Mode 4, the signal amplitude can be reduced and power consumption can be reduced.

Alternatively, by applying the pixel configuration described in Embodiment Mode 5, wasteful current consumption can be prevented in the writing period and power consumption can be reduced.

In addition, by converting the impedance of a signal supplied to a scan line or a signal line by using a buffer to improve the current supply capability, signal delay is prevented and a writing period of pixels of one row can be shortened. Accordingly, a high definition display device can be provided.

In addition, in order to further reduce the power consumption, the pixel region may be formed using TFTs over a glass substrate, all of the signal line driver circuits may be formed on an IC chip, and the IC chip may be mounted onto the display panel by COG (Chip On Glass) or the like.

In addition, by applying the pixel configuration described in Embodiment Mode 3, pixels can be constituted only by n-type transistors, so that a non-crystalline semiconductor (e.g., amorphous silicon) can be used as a semiconductor layer of a transistor. That is, a large display device where it is difficult to form a uniform crystalline semiconductor film can be manufactured. By using a non-crystalline semiconductor as a semiconductor film of a transistor constituting a pixel, in addition, the manufacturing process can be reduced and reduction of the manufacturing cost can be achieved.

It is preferable that, in the case where a non-crystalline semiconductor film is applied to a semiconductor layer of a transistor constituting a pixel, the pixel region be formed using TFTs over a substrate, all of the peripheral driver circuits be formed on an IC chip, and the IC chip be mounted onto the display panel by COG (Chip On Glass). FIG. 53B shows an example of such constitution that a pixel region is formed over a substrate and an IC chip provided with a signal line driver circuit is mounted onto the substrate by COG or the like.

Figure 58:
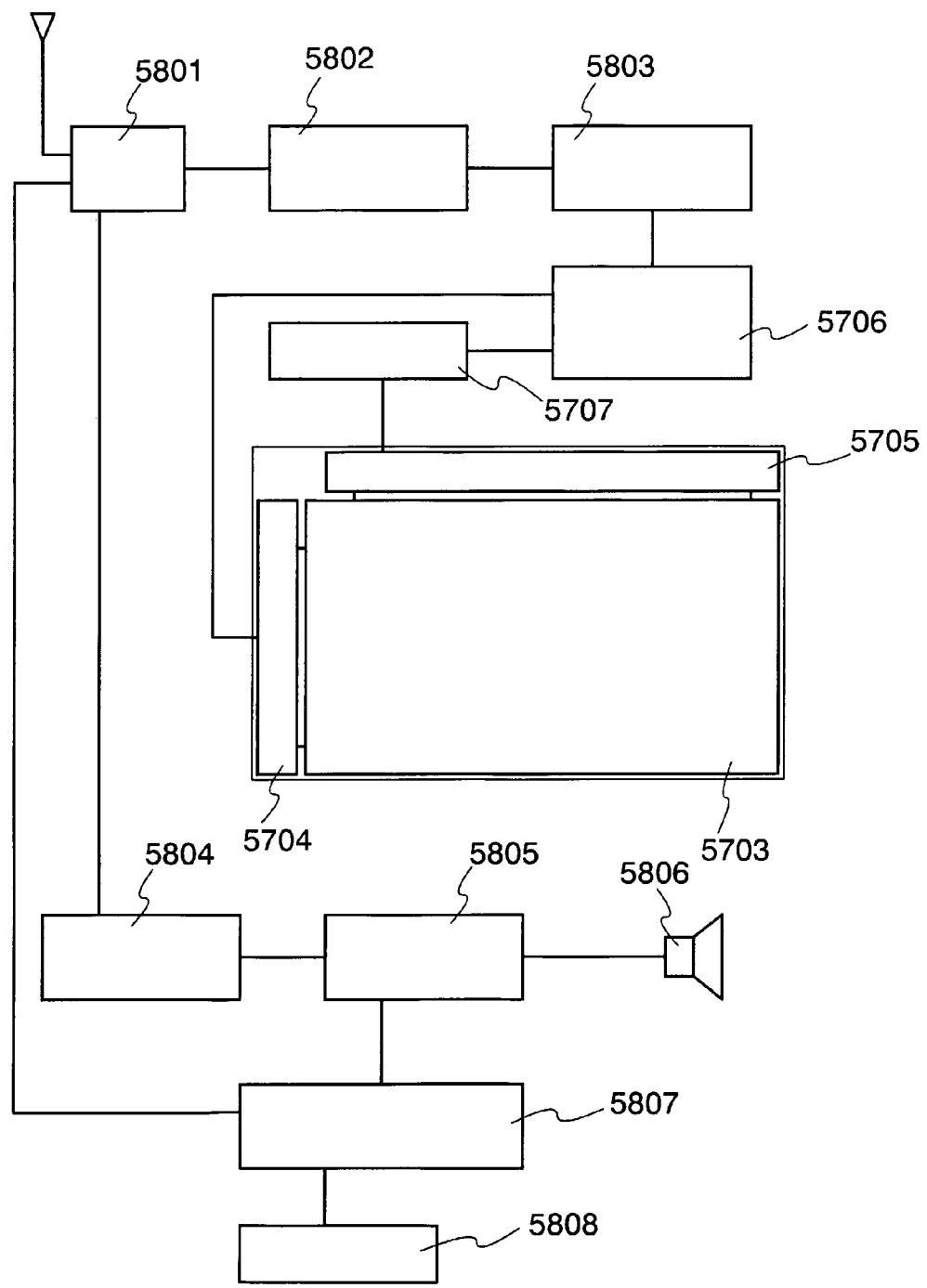
FIG. 58 is a block diagram showing main constitution of an EL TV receiver.

An EL TV receiver can be completed with the above-described EL module. FIG. 58 is a block diagram showing main constitution of an EL TV receiver. A tuner 5801 receives a video signal and an audio signal. The video signals are processed by a video signal amplifier circuit 5802, a video signal processing circuit 5803 for converting a signal outputted from the video signal amplifier circuit 5802 into a color signal corresponding to each color of red, green and blue, and the control circuit 5706 for converting the video signal into the input specification of a driver circuit. The control circuit 5706 outputs a signal to each of the scan line side and the signal line side. In the case of driving in digital manner, constitution in which the signal dividing circuit 5707 is provided on the signal line side to supply an input digital signal dividing into m signals may be adopted.

An audio signal received by the tuner 5801 is transmitted to an audio signal amplifier circuit 5804, an output of which is supplied to a speaker 5806 through an audio signal processing circuit 5805. A control circuit 5807 receives receiving station (received frequency) data and volume control data from an input portion 5808, and transmits signals to the tuner 5801 and the audio signal processing circuit 5805.

By incorporating the EL module into the housing 17001, a TV receiver can be completed as shown in FIG. 17A. The display portion 17003 is constituted by the EL module. In addition, the speaker portion 17004, the video input terminal 17005, and the like are provided arbitrarily.

It is needless to say that the invention can be applied to various apparatuses other than the TV receiver, such as a monitor of a personal computer, and in particular a large display medium such as an information display panel in the station or the airport, and an advertisement board on the street.

This application is based on Japanese Patent Application serial no. 2004-347502 filed in Japan Patent Office on 30 Nov. 2004, and the entire contents of which are hereby incorporated by reference.

The invention claimed is:
1. A semiconductor device comprising:
a pixel, the pixel comprising:
   a light emitting element;
   a transistor;
   a capacitor;
   a first switch;
   a second switch;
   a third switch;
   a second line;
   a first line;
   a third line, and
   a fourth line;
wherein a gate of the transistor is electrically connected to the second line via the capacitor,
wherein one of a source and a drain of the transistor is electrically connected to an electrode of the light emitting element and electrically connected to the third line via the third switch,
wherein the other of the source and the drain of the transistor is electrically connected to the first line via the first switch and electrically connected to the gate of the transistor via the second switch, and wherein the fourth line is electrically connected to the first switch.

2. A semiconductor device comprising:
a pixel, the pixel comprising:
- a light emitting element;
- a transistor;
- a capacitor having two electrodes;
- a first switch;
- a second switch;
- a third switch;
- a fourth switch;
- a third line;
- a second line;
- a first line; and
- a fourth line, wherein a gate of the transistor is connected to one electrode of the capacitor, wherein the other electrode of the capacitor is connected to the third line via the third switch and connected to the second line via the fourth switch, wherein one of a source and a drain of the transistor is electrically connected to an electrode of the light emitting element, wherein the other of the source and the drain of the transistor is connected to the first line via the first switch and connected to the gate of the transistor via the second switch, and wherein the fourth line is electrically connected to the first switch.

3. The semiconductor device according to any one of claims 1 and 2, wherein the first switch and the second switch are n-type transistors.

4. The semiconductor device according to any one of claims 1 and 2, wherein the first switch is a p-type transistor while the second switch is an n-type transistor.

5. The semiconductor device according to any one of claims 1 and 2, wherein a potential supplied to the first line is different per pixel for each element of RGB.

6. The semiconductor device according to any one of claims 1 and 2, wherein a plurality of the pixels have delta arrangement.

7. An electronic apparatus having the semiconductor device according to any one of claims 1 and 2.

8. The electronic apparatus according to claim 7, wherein the electronic apparatus is a display, a camera such as a video camera, a computer such as a mobile computer, an image reproducing device, a goggle-type display, or a mobile phone.

9. The semiconductor device according to any one of claims 1 and 2, wherein a potential of the first line is higher than a potential supplied to an opposing electrode of the light emitting element.

10. The semiconductor device according to any one of claims 1 and 2, wherein the transistor is an n-type transistor.

11. The semiconductor device according to claim 1, wherein the first line is a power supply line.

12. The semiconductor device according to claim 1, wherein the second line is a signal line configured to be inputted with an analog signal potential.

13. The semiconductor device according to claim 2, wherein the first line is a power supply line.

14. The semiconductor device according to claim 2, wherein the third line is a first signal line configured to be inputted with a first analog signal potential.

15. The semiconductor device according to claim 2, wherein the second line is a second signal line configured to be inputted with a second analog signal potential having a regular waveform.

16. The semiconductor device according to claim 1, wherein the first switch is configured to be in an on state or an off state in accordance with an electric potential of the fourth line.

17. The semiconductor device according to claim 2, wherein the first switch is a switching transistor, wherein the fourth line is electrically connected to a gate of the switching transistor.

18. The semiconductor device according to claim 1, wherein the capacitor is directly electrically connected to the second line, without an intervening electronic component.

19. The semiconductor according to claim 2, wherein the fourth switch is directly connected to the second line, without an intervening electronic component.

20. The semiconductor device according to claim 2, wherein the first switch is configured to be in an on state or an off state in accordance with an electric potential of the fourth line.

21. The semiconductor device according to claim 1, wherein, in the pixel, the gate of the transistor and the one of the source and the drain of the transistor are electrically insulated from each other.

22. The semiconductor device according to claim 2, wherein, in the pixel, the gate of the transistor and the one of the source and the drain of the transistor are electrically insulated from each other.

* * * * *

UNITED STATES PATENT AND TRADEMARK OFFICE
CERTIFICATE OF CORRECTION

| | | |
|---|---|---|
| PATENT NO. | : 8,426,866 B2 | Page 1 of 1 |
| APPLICATION NO. | : 11/667194 | |
| DATED | : April 23, 2013 | |
| INVENTOR(S) | : Kimura et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1282 days.

Signed and Sealed this
Ninth Day of December, 2014

Michelle K. Lee
*Deputy Director of the United States Patent and Trademark Office*